US010693041B2

(12) United States Patent
Cich et al.

(10) Patent No.: US 10,693,041 B2
(45) Date of Patent: Jun. 23, 2020

(54) HIGH-PERFORMANCE LED FABRICATION

(71) Applicant: SORAA, INC., Fremont, CA (US)

(72) Inventors: Michael J. Cich, Fremont, CA (US); Aurelien J. F. David, San Francisco, CA (US); Christophe Hurni, Fremont, CA (US); Rafael Aldaz, Pleasanton, CA (US); Michael Ragan Krames, Mountain View, CA (US)

(73) Assignee: SORAA, INC., Fremont, CA (US)

( * ) Notice: Subject to any disclaimer, the term of this patent is extended or adjusted under 35 U.S.C. 154(b) by 10 days.

(21) Appl. No.: 16/168,311

(22) Filed: Oct. 23, 2018

(65) Prior Publication Data

US 2019/0165212 A1    May 30, 2019

Related U.S. Application Data

(63) Continuation of application No. 15/785,950, filed on Oct. 17, 2017, now Pat. No. 10,115,865, which is a
(Continued)

(51) Int. Cl.
*H01L 33/02*    (2010.01)
*H01L 33/32*    (2010.01)
(Continued)

(52) U.S. Cl.
CPC .............. *H01L 33/32* (2013.01); *F21V 29/70* (2015.01); *H01L 33/02* (2013.01); *H01L 33/16* (2013.01);
(Continued)

(58) Field of Classification Search
CPC ......... H01L 33/32; H01L 33/02; H01L 33/16; H01L 33/20; H01L 33/405; H01L 33/486;
(Continued)

(56) References Cited

U.S. PATENT DOCUMENTS

| 3,647,522 A | 3/1972 | Single |
| 4,065,688 A | 12/1977 | Thornton |

(Continued)

FOREIGN PATENT DOCUMENTS

| CN | 101027783 A | 8/2007 |
| CN | 101297410 A | 10/2008 |

(Continued)

OTHER PUBLICATIONS

Abare, 'Cleaved and Etched Facet Nitride Laser Diodes,' IEEE Journal of Selected Topics in Quantum Electronics, vol. 4, No. 3, 1998, pp. 505-509.

(Continued)

*Primary Examiner* — Jimmy T Vu
(74) *Attorney, Agent, or Firm* — Fisherbroyles LLP

(57) ABSTRACT

High-performance light-emitting diode together with apparatus and method embodiments thereto are disclosed. The light emitting diode devices emit at a wavelength of 390 nm to 470 nm or at a wavelength of 405 nm to 430 nm. Light emitting diode devices are characterized by having a geometric relationship (e.g., aspect ratio) between a lateral dimension of the device and a vertical dimension of the device such that the geometric aspect ratio forms a volumetric light emitting diode that delivers a substantially flat current density across the device (e.g., as measured across a lateral dimension of the active region). The light emitting diode devices are characterized by having a current density in the active region of greater than about 175 Amps/cm$^2$.

20 Claims, 101 Drawing Sheets

Related U.S. Application Data continuation of application No. 15/418,268, filed on Jan. 27, 2017, now Pat. No. 9,831,388, which is a continuation of application No. 14/615,315, filed on Feb. 5, 2015, now Pat. No. 9,583,678, which is a continuation of application No. 14/040,379, filed on Sep. 27, 2013, now Pat. No. 9,293,644, which is a continuation-in-part of application No. 13/931,359, filed on Jun. 28, 2013, now Pat. No. 8,686,458, which is a continuation of application No. 12/936,238, filed as application No. PCT/US2010/049531 on Sep. 20, 2010, now Pat. No. 8,502,465.

(60) Provisional application No. 62/093,855, filed on Dec. 18, 2014, provisional application No. 61/989,693, filed on May 7, 2014, provisional application No. 61/936,000, filed on Feb. 5, 2014, provisional application No. 61/778,002, filed on Mar. 12, 2013, provisional application No. 61/243,988, filed on Sep. 18, 2009.

(51) Int. Cl.
*H01L 33/60* (2010.01)
*F21V 29/70* (2015.01)
*H01L 33/16* (2010.01)
*H01L 33/20* (2010.01)
*H01L 33/40* (2010.01)
*H01L 33/48* (2010.01)
*H01L 33/62* (2010.01)

(52) U.S. Cl.
CPC ............ *H01L 33/20* (2013.01); *H01L 33/405* (2013.01); *H01L 33/486* (2013.01); *H01L 33/60* (2013.01); *H01L 33/62* (2013.01); *H01L 2224/14* (2013.01); *H01L 2933/0033* (2013.01); *H01L 2933/0066* (2013.01)

(58) Field of Classification Search
CPC ..... H01L 33/60; H01L 33/62; H01L 2224/14; H01L 2933/0033; H01L 2933/0066; F21V 29/70

See application file for complete search history.

(56) References Cited

U.S. PATENT DOCUMENTS

| | | |
|---|---|---|
| 4,341,592 A | 7/1982 | Shortes |
| 4,860,687 A | 8/1989 | Frijlink |
| 4,870,045 A | 9/1989 | Gasper |
| 4,873,696 A | 10/1989 | Coldren |
| 5,331,654 A | 7/1994 | Jewell |
| 5,334,277 A | 8/1994 | Nakamura |
| 5,366,953 A | 11/1994 | Char |
| 5,449,930 A | 9/1995 | Zhou |
| 5,523,589 A | 6/1996 | Edmond |
| 5,527,417 A | 6/1996 | Iida |
| 5,536,953 A | 7/1996 | Dreifus |
| 5,560,700 A | 10/1996 | Levens |
| 5,607,899 A | 3/1997 | Yoshida |
| 5,632,812 A | 5/1997 | Hirabayashi |
| 5,685,885 A | 11/1997 | Khandros |
| 5,696,389 A | 12/1997 | Ishikawa |
| 5,764,674 A | 6/1998 | Hibbs-Brenner |
| 5,813,753 A | 9/1998 | Vriens |
| 5,821,555 A | 10/1998 | Saito |
| 5,888,907 A | 3/1999 | Tomoyasu |
| 5,926,493 A | 7/1999 | O'Brien |
| 6,069,394 A | 5/2000 | Hashimoto |
| 6,072,197 A | 6/2000 | Horino |
| 6,147,953 A | 11/2000 | Duncan |
| 6,153,010 A | 11/2000 | Kiyoku |
| 6,195,381 B1 | 2/2001 | Botez |
| 6,300,557 B1 | 10/2001 | Wanlass |
| 6,335,771 B1 | 1/2002 | Hiraishi |
| 6,379,985 B1 | 4/2002 | Cervantes |
| 6,451,157 B1 | 9/2002 | Hubacek |
| 6,468,882 B2 | 10/2002 | Motoki |
| 6,498,355 B1 | 12/2002 | Harrah |
| 6,501,154 B2 | 12/2002 | Morita |
| 6,509,651 B1 | 1/2003 | Matsubara et al. |
| 6,533,874 B1 | 3/2003 | Vaudo |
| 6,547,249 B2 | 4/2003 | Collins, III |
| 6,573,537 B1 | 6/2003 | Steigerwald |
| 6,586,762 B2 | 7/2003 | Kozaki |
| 6,680,959 B2 | 1/2004 | Tanabe |
| 6,734,461 B1 | 5/2004 | Shiomi |
| 6,755,932 B2 | 6/2004 | Masuda |
| 6,809,781 B2 | 10/2004 | Setlur |
| 6,814,811 B2 | 11/2004 | Ose |
| 6,833,564 B2 | 12/2004 | Shen |
| 6,855,959 B2 | 2/2005 | Yamaguchi |
| 6,858,081 B2 | 2/2005 | Biwa |
| 6,860,628 B2 | 3/2005 | Robertson |
| 6,920,166 B2 | 7/2005 | Akasaka |
| 6,956,246 B1 | 10/2005 | Epler |
| 7,009,199 B2 | 3/2006 | Hall |
| 7,012,279 B2 | 3/2006 | Wierer, Jr. |
| 7,019,325 B2 | 3/2006 | Li |
| 7,053,413 B2 | 5/2006 | D Evelyn |
| 7,063,741 B2 | 6/2006 | D Evelyn |
| 7,128,849 B2 | 10/2006 | Setlur |
| 7,193,246 B1 | 3/2007 | Tanizawa |
| 7,208,096 B2 | 4/2007 | Akkipeddi |
| 7,211,822 B2 | 5/2007 | Nagahama |
| 7,220,324 B2 | 5/2007 | Baker |
| 7,285,801 B2 | 10/2007 | Eliashevich |
| 7,303,630 B2 | 12/2007 | Motoki |
| 7,312,156 B2 | 12/2007 | Granneman |
| 7,323,723 B2 | 1/2008 | Ohtsuka |
| 7,338,828 B2 | 3/2008 | Imer |
| 7,341,880 B2 | 3/2008 | Erchak |
| 7,348,600 B2 | 3/2008 | Narukawa |
| 7,358,542 B2 | 4/2008 | Radkov |
| 7,358,543 B2 | 4/2008 | Chua |
| 7,390,359 B2 | 6/2008 | Miyanaga |
| 7,419,281 B2 | 9/2008 | Porchia et al. |
| 7,470,555 B2 | 12/2008 | Matsumura |
| 7,470,938 B2 | 12/2008 | Lee |
| 7,483,466 B2 | 1/2009 | Uchida |
| 7,489,441 B2 | 2/2009 | Scheible |
| 7,491,984 B2 | 2/2009 | Koike |
| 7,518,159 B2 | 4/2009 | Masui |
| 7,535,082 B2 | 5/2009 | Nakayama |
| 7,550,305 B2 | 6/2009 | Yamagata |
| 7,555,025 B2 | 6/2009 | Yoshida |
| 7,566,639 B2 | 7/2009 | Kohda |
| 7,598,104 B2 | 10/2009 | Teng |
| 7,622,742 B2 | 11/2009 | Kim |
| 7,718,454 B2 | 5/2010 | Nakamura |
| 7,727,332 B2 | 6/2010 | Habel |
| 7,733,571 B1 | 6/2010 | Li |
| 7,749,326 B2 | 7/2010 | Kim |
| 7,772,585 B2 | 8/2010 | Uematsu |
| 7,786,488 B2 | 8/2010 | Nakayama |
| 7,806,078 B2 | 10/2010 | Yoshida |
| 7,816,238 B2 | 10/2010 | Osada |
| 7,858,408 B2 | 12/2010 | Mueller |
| 7,862,761 B2 | 1/2011 | Okushima |
| 7,871,839 B2 | 1/2011 | Lee |
| 7,884,538 B2 | 2/2011 | Mitsuishi |
| 7,897,988 B2 | 3/2011 | Chen |
| 7,923,741 B1 | 4/2011 | Zhai |
| 7,968,864 B2 | 6/2011 | Akita |
| 7,976,630 B2 | 7/2011 | Poblenz |
| 8,008,165 B2 | 8/2011 | Nakayama |
| 8,017,932 B2 | 9/2011 | Okamoto |
| 8,018,139 B2 | 9/2011 | Chou |
| 8,044,412 B2 | 10/2011 | Murphy |
| 8,142,566 B2 | 3/2012 | Kiyomi |
| 8,148,180 B2 | 4/2012 | Felker |

(56) References Cited

U.S. PATENT DOCUMENTS

| | | |
|---|---|---|
| 8,148,801 B2 | 4/2012 | D Evelyn |
| 8,153,475 B1 | 4/2012 | Shum |
| 8,188,504 B2 | 5/2012 | Lee |
| 8,198,643 B2 | 6/2012 | Lee |
| 8,207,548 B2 | 6/2012 | Nagai |
| 8,207,554 B2 | 6/2012 | Shum |
| D662,899 S | 7/2012 | Shum |
| D662,900 S | 7/2012 | Shum |
| 8,247,886 B1 | 8/2012 | Sharma |
| 8,247,887 B1 | 8/2012 | Raring |
| 8,252,662 B1 | 8/2012 | Poblenz |
| 8,268,643 B2 | 9/2012 | Matsumoto |
| 8,269,245 B1 | 9/2012 | Shum |
| 8,293,551 B2 | 10/2012 | Sharma |
| 8,304,265 B2 | 11/2012 | Nakamura |
| 8,310,143 B2 | 11/2012 | Van De Ven |
| 8,313,964 B2 | 11/2012 | Sharma |
| 8,314,429 B1 | 11/2012 | Raring |
| 8,324,835 B2 | 12/2012 | Shum |
| 8,350,273 B2 | 1/2013 | Vielemeyer |
| 8,351,478 B2 | 1/2013 | Raring |
| 8,355,418 B2 | 1/2013 | Raring |
| 8,389,305 B2 | 3/2013 | Felker |
| 8,431,942 B2 | 4/2013 | Butterworth |
| 8,455,894 B1 | 6/2013 | D Evelyn |
| 8,477,259 B2 | 7/2013 | Kubota |
| 8,502,465 B2 | 8/2013 | Katona |
| 8,524,578 B1 | 9/2013 | Raring |
| 8,575,728 B1 | 11/2013 | Raring |
| 8,597,967 B1 | 12/2013 | Krames |
| 8,674,395 B2 | 3/2014 | Shum |
| 8,686,431 B2 | 4/2014 | Batres |
| 8,686,458 B2 | 4/2014 | Krames |
| 8,749,030 B2 | 6/2014 | Raring |
| 8,786,053 B2 | 7/2014 | D Evelyn |
| 8,791,499 B1 | 7/2014 | Sharma |
| 8,802,471 B1 | 8/2014 | Cich |
| 8,911,518 B1 | 12/2014 | Chakraborty |
| 8,912,025 B2 | 12/2014 | Felker |
| 8,946,865 B2 | 2/2015 | D Evelyn |
| 2001/0009134 A1 | 7/2001 | Kim |
| 2001/0043042 A1 | 11/2001 | Murazaki |
| 2001/0055208 A1 | 12/2001 | Kimura |
| 2002/0027933 A1 | 3/2002 | Tanabe |
| 2002/0028564 A1 | 3/2002 | Motoki |
| 2002/0050488 A1 | 5/2002 | Nikitin |
| 2002/0070416 A1 | 6/2002 | Morse |
| 2002/0079506 A1* | 6/2002 | Komoto ............... H01L 33/507 257/99 |
| 2002/0085603 A1 | 7/2002 | Okumura |
| 2002/0096994 A1 | 7/2002 | Iwafuchi |
| 2002/0127824 A1 | 9/2002 | Shelton |
| 2002/0155691 A1 | 10/2002 | Lee |
| 2002/0182768 A1 | 12/2002 | Morse |
| 2002/0190260 A1 | 12/2002 | Shen |
| 2003/0000453 A1 | 1/2003 | Unno |
| 2003/0001238 A1 | 1/2003 | Ban |
| 2003/0012243 A1 | 1/2003 | Okumura |
| 2003/0012246 A1 | 1/2003 | Klimek |
| 2003/0020087 A1 | 1/2003 | Goto |
| 2003/0045042 A1 | 3/2003 | Biwa |
| 2003/0047076 A1 | 3/2003 | Liu |
| 2003/0080345 A1 | 5/2003 | Motoki |
| 2003/0138732 A1 | 7/2003 | Nagase |
| 2003/0140846 A1 | 7/2003 | Biwa |
| 2003/0164507 A1 | 9/2003 | Edmond |
| 2003/0178617 A1 | 9/2003 | Appenzeller |
| 2003/0213964 A1 | 11/2003 | Flynn |
| 2003/0216011 A1 | 11/2003 | Nakamura |
| 2004/0025787 A1 | 2/2004 | Selbrede |
| 2004/0031437 A1 | 2/2004 | Sarayama |
| 2004/0051107 A1 | 3/2004 | Nagahama |
| 2004/0060518 A1 | 4/2004 | Nakamura |
| 2004/0070004 A1 | 4/2004 | Eliashevich |
| 2004/0080256 A1 | 4/2004 | Hampden-Smith |
| 2004/0080938 A1 | 4/2004 | Holman |
| 2004/0089919 A1 | 5/2004 | Motoki |
| 2004/0104391 A1 | 6/2004 | Maeda |
| 2004/0116033 A1 | 6/2004 | Ouderkirk |
| 2004/0124435 A1 | 7/2004 | D Evelyn |
| 2004/0151222 A1 | 8/2004 | Sekine |
| 2004/0161222 A1 | 8/2004 | Niida |
| 2004/0164308 A1 | 8/2004 | Asatsuma |
| 2004/0196877 A1 | 10/2004 | Kawakami |
| 2004/0207998 A1 | 10/2004 | Suehiro |
| 2004/0245543 A1 | 12/2004 | Yoo |
| 2004/0251471 A1 | 12/2004 | Dwilinski |
| 2005/0001227 A1 | 1/2005 | Niki |
| 2005/0012446 A1 | 1/2005 | Jermann |
| 2005/0025205 A1 | 2/2005 | Ryowa |
| 2005/0030760 A1 | 2/2005 | Capello |
| 2005/0040384 A1 | 2/2005 | Tanaka |
| 2005/0045894 A1 | 3/2005 | Okuyama |
| 2005/0072986 A1 | 4/2005 | Sasaoka |
| 2005/0087753 A1 | 4/2005 | D Evelyn |
| 2005/0095861 A1 | 5/2005 | Ueno |
| 2005/0121679 A1 | 6/2005 | Nagahama |
| 2005/0139960 A1 | 6/2005 | Shibata |
| 2005/0140270 A1 | 6/2005 | Henson |
| 2005/0167680 A1 | 8/2005 | Shei |
| 2005/0168564 A1 | 8/2005 | Kawaguchi |
| 2005/0199899 A1 | 9/2005 | Lin |
| 2005/0214992 A1 | 9/2005 | Chakraborty |
| 2005/0224826 A1 | 10/2005 | Keuper |
| 2005/0224830 A1 | 10/2005 | Blonder |
| 2005/0229855 A1 | 10/2005 | Raaijmakers |
| 2005/0230701 A1 | 10/2005 | Huang |
| 2005/0232327 A1 | 10/2005 | Nomura |
| 2005/0263791 A1 | 12/2005 | Yanagihara |
| 2006/0017061 A1 | 1/2006 | Sakamoto |
| 2006/0037529 A1 | 2/2006 | D Evelyn |
| 2006/0038542 A1 | 2/2006 | Park |
| 2006/0060131 A1 | 3/2006 | Atanackovic |
| 2006/0060872 A1 | 3/2006 | Edmond |
| 2006/0077795 A1 | 4/2006 | Kitahara |
| 2006/0078022 A1 | 4/2006 | Kozaki |
| 2006/0079082 A1 | 4/2006 | Bruhns |
| 2006/0086319 A1 | 4/2006 | Kasai |
| 2006/0097278 A1 | 5/2006 | Goto |
| 2006/0108162 A1 | 5/2006 | Tabata |
| 2006/0118799 A1 | 6/2006 | D Evelyn |
| 2006/0144334 A1 | 7/2006 | Yim |
| 2006/0163589 A1 | 7/2006 | Fan |
| 2006/0166390 A1 | 7/2006 | Letertre |
| 2006/0169993 A1 | 8/2006 | Fan |
| 2006/0186418 A1 | 8/2006 | Edmond |
| 2006/0189098 A1 | 8/2006 | Edmond |
| 2006/0193359 A1 | 8/2006 | Kuramoto |
| 2006/0204865 A1 | 9/2006 | Erchak |
| 2006/0205199 A1 | 9/2006 | Baker |
| 2006/0214287 A1 | 9/2006 | Ogihara |
| 2006/0216416 A1 | 9/2006 | Sumakeris |
| 2006/0240585 A1 | 10/2006 | Epler |
| 2006/0255343 A1 | 11/2006 | Ogihara |
| 2006/0256482 A1 | 11/2006 | Araki |
| 2006/0272572 A1 | 12/2006 | Uematsu |
| 2006/0273339 A1 | 12/2006 | Steigerwald |
| 2006/0286695 A1 | 12/2006 | Yanashima |
| 2006/0288928 A1 | 12/2006 | Eom |
| 2007/0012944 A1 | 1/2007 | Bader |
| 2007/0045200 A1 | 3/2007 | Moon |
| 2007/0054476 A1 | 3/2007 | Nakahata |
| 2007/0062440 A1 | 3/2007 | Sato |
| 2007/0072324 A1 | 3/2007 | Krames |
| 2007/0093073 A1 | 4/2007 | Farrell, Jr. |
| 2007/0096239 A1 | 5/2007 | Cao |
| 2007/0105351 A1 | 5/2007 | Motoki |
| 2007/0110112 A1 | 5/2007 | Sugiura |
| 2007/0114561 A1 | 5/2007 | Comanzo |
| 2007/0114569 A1 | 5/2007 | Wu |
| 2007/0121690 A1 | 5/2007 | Fujii |
| 2007/0131967 A1 | 6/2007 | Kawaguchi |
| 2007/0202624 A1 | 8/2007 | Yoon |
| 2007/0217462 A1 | 9/2007 | Yamasaki |

(56) References Cited

U.S. PATENT DOCUMENTS

| | | |
|---|---|---|
| 2007/0231978 A1 | 10/2007 | Kanamoto |
| 2007/0264733 A1 | 11/2007 | Choi |
| 2007/0280320 A1 | 12/2007 | Feezell |
| 2007/0290224 A1 | 12/2007 | Ogawa |
| 2008/0001174 A1 | 1/2008 | Shibata |
| 2008/0023691 A1 | 1/2008 | Jang |
| 2008/0023708 A1 | 1/2008 | Akita et al. |
| 2008/0030976 A1 | 2/2008 | Murazaki |
| 2008/0054290 A1 | 3/2008 | Shieh |
| 2008/0073660 A1 | 3/2008 | Ohno |
| 2008/0081015 A1 | 4/2008 | Sarayama |
| 2008/0083929 A1 | 4/2008 | Fan |
| 2008/0087919 A1 | 4/2008 | Tysoe |
| 2008/0092812 A1 | 4/2008 | McDiarmid |
| 2008/0095492 A1 | 4/2008 | Son |
| 2008/0096470 A1 | 4/2008 | Hou |
| 2008/0099777 A1 | 5/2008 | Erchak |
| 2008/0106212 A1 | 5/2008 | Yen |
| 2008/0108162 A1 | 5/2008 | Dwilinski |
| 2008/0116786 A1 | 5/2008 | Wang |
| 2008/0121906 A1 | 5/2008 | Yakushiji |
| 2008/0121913 A1 | 5/2008 | McKenzie |
| 2008/0124817 A1 | 5/2008 | Bour |
| 2008/0128752 A1 | 6/2008 | Wu |
| 2008/0142781 A1 | 6/2008 | Lee |
| 2008/0151543 A1 | 6/2008 | Wang |
| 2008/0164489 A1 | 7/2008 | Schmidt |
| 2008/0164578 A1 | 7/2008 | Tanikella |
| 2008/0173735 A1 | 7/2008 | Mitrovic |
| 2008/0173882 A1 | 7/2008 | Parikh et al. |
| 2008/0173884 A1 | 7/2008 | Chitnis |
| 2008/0179607 A1 | 7/2008 | Denbaars |
| 2008/0179610 A1 | 7/2008 | Okamoto |
| 2008/0191192 A1 | 8/2008 | Feezell |
| 2008/0191223 A1 | 8/2008 | Nakamura |
| 2008/0194054 A1 | 8/2008 | Lin |
| 2008/0210958 A1 | 9/2008 | Senda |
| 2008/0211389 A1 | 9/2008 | Oshio |
| 2008/0211416 A1 | 9/2008 | Negley |
| 2008/0217745 A1 | 9/2008 | Miyanaga |
| 2008/0218759 A1 | 9/2008 | Colvin |
| 2008/0230765 A1 | 9/2008 | Yoon |
| 2008/0232416 A1 | 9/2008 | Okamoto |
| 2008/0237569 A1 | 10/2008 | Nago |
| 2008/0257256 A1 | 10/2008 | Melnik |
| 2008/0258165 A1 | 10/2008 | Zimmerman |
| 2008/0261381 A1 | 10/2008 | Akiyama |
| 2008/0272463 A1 | 11/2008 | Butcher |
| 2008/0282978 A1 | 11/2008 | Butcher |
| 2008/0283851 A1 | 11/2008 | Akita |
| 2008/0284346 A1 | 11/2008 | Lee |
| 2008/0285609 A1 | 11/2008 | Ohta |
| 2008/0291961 A1 | 11/2008 | Kamikawa |
| 2008/0298409 A1 | 12/2008 | Yamashita |
| 2008/0303033 A1 | 12/2008 | Brandes |
| 2008/0315179 A1 | 12/2008 | Kim |
| 2009/0008573 A1 | 1/2009 | Conner |
| 2009/0028204 A1 | 1/2009 | Hiroyama |
| 2009/0032828 A1 | 2/2009 | Romano |
| 2009/0045439 A1 | 2/2009 | Hoshi |
| 2009/0058532 A1 | 3/2009 | Kikkawa |
| 2009/0065798 A1 | 3/2009 | Masui |
| 2009/0071394 A1 | 3/2009 | Nakahata |
| 2009/0072252 A1 | 3/2009 | Son |
| 2009/0078944 A1 | 3/2009 | Kubota |
| 2009/0078955 A1 | 3/2009 | Fan |
| 2009/0081857 A1 | 3/2009 | Hanser |
| 2009/0086475 A1 | 4/2009 | Caruso |
| 2009/0095973 A1 | 4/2009 | Tanaka |
| 2009/0140279 A1 | 6/2009 | Zimmerman |
| 2009/0141765 A1 | 6/2009 | Kohda |
| 2009/0146170 A1 | 6/2009 | Zhong |
| 2009/0155989 A1 | 6/2009 | Uematsu |
| 2009/0159869 A1 | 6/2009 | Ponce |
| 2009/0162963 A1 | 6/2009 | Tansu |
| 2009/0173958 A1 | 7/2009 | Chakraborty |
| 2009/0191658 A1 | 7/2009 | Kim |
| 2009/0194796 A1 | 8/2009 | Hashimoto |
| 2009/0206354 A1 | 8/2009 | Kitano |
| 2009/0212277 A1 | 8/2009 | Akita |
| 2009/0221106 A1 | 9/2009 | Zimmerman |
| 2009/0227056 A1 | 9/2009 | Kyono |
| 2009/0229519 A1 | 9/2009 | Saitoh |
| 2009/0250686 A1 | 10/2009 | Sato |
| 2009/0252191 A1 | 10/2009 | Kubota |
| 2009/0267098 A1 | 10/2009 | Choi |
| 2009/0267100 A1 | 10/2009 | Miyake |
| 2009/0273005 A1 | 11/2009 | Lin |
| 2009/0301387 A1 | 12/2009 | D Evelyn |
| 2009/0301388 A1 | 12/2009 | D Evelyn |
| 2009/0309110 A1 | 12/2009 | Raring |
| 2009/0309127 A1 | 12/2009 | Raring |
| 2009/0315057 A1 | 12/2009 | Konishi |
| 2009/0315480 A1 | 12/2009 | Yan |
| 2009/0315965 A1 | 12/2009 | Yamagata |
| 2009/0320744 A1 | 12/2009 | D Evelyn |
| 2009/0321745 A1 | 12/2009 | Kinoshita |
| 2009/0321778 A1 | 12/2009 | Chen |
| 2010/0001300 A1 | 1/2010 | Raring |
| 2010/0003492 A1 | 1/2010 | D Evelyn |
| 2010/0006873 A1 | 1/2010 | Raring |
| 2010/0006876 A1 | 1/2010 | Moteki |
| 2010/0025656 A1 | 2/2010 | Raring |
| 2010/0031875 A1 | 2/2010 | D Evelyn |
| 2010/0032644 A1 | 2/2010 | Akita |
| 2010/0032691 A1 | 2/2010 | Kim |
| 2010/0055819 A1 | 3/2010 | Ohba |
| 2010/0067241 A1 | 3/2010 | Lapatovich |
| 2010/0096615 A1 | 4/2010 | Okamoto |
| 2010/0108985 A1 | 5/2010 | Chung |
| 2010/0109030 A1 | 5/2010 | Krames |
| 2010/0117101 A1 | 5/2010 | Kim |
| 2010/0117106 A1 | 5/2010 | Trottier |
| 2010/0117118 A1 | 5/2010 | Dabiran |
| 2010/0133656 A1 | 6/2010 | Hager, IV |
| 2010/0140634 A1 | 6/2010 | Van De Ven |
| 2010/0140745 A1 | 6/2010 | Khan |
| 2010/0148145 A1 | 6/2010 | Ishibashi |
| 2010/0149814 A1 | 6/2010 | Zhai |
| 2010/0151194 A1 | 6/2010 | D Evelyn |
| 2010/0155746 A1 | 6/2010 | Ibbetson |
| 2010/0163887 A1 | 7/2010 | Kim |
| 2010/0187540 A1 | 7/2010 | Ishibashi |
| 2010/0195687 A1 | 8/2010 | Okamoto |
| 2010/0200837 A1 | 8/2010 | Zimmerman |
| 2010/0220262 A1 | 9/2010 | Demille |
| 2010/0240158 A1 | 9/2010 | Ter-Hovhannissian |
| 2010/0276663 A1 | 11/2010 | Enya |
| 2010/0290208 A1 | 11/2010 | Pickard |
| 2010/0295054 A1 | 11/2010 | Okamoto |
| 2010/0295088 A1 | 11/2010 | D Evelyn |
| 2010/0302464 A1 | 12/2010 | Raring |
| 2010/0309943 A1 | 12/2010 | Chakraborty |
| 2010/0316075 A1 | 12/2010 | Raring |
| 2010/0320462 A1 | 12/2010 | Koukitu |
| 2010/0327291 A1 | 12/2010 | Preble |
| 2011/0017298 A1 | 1/2011 | Lee |
| 2011/0031508 A1 | 2/2011 | Hamaguchi |
| 2011/0037049 A1 | 2/2011 | Tachibana |
| 2011/0056429 A1 | 3/2011 | Raring |
| 2011/0057167 A1 | 3/2011 | Ueno |
| 2011/0057205 A1 | 3/2011 | Mueller |
| 2011/0062415 A1 | 3/2011 | Ohta |
| 2011/0064100 A1 | 3/2011 | Raring |
| 2011/0064101 A1 | 3/2011 | Raring |
| 2011/0064102 A1 | 3/2011 | Raring |
| 2011/0064103 A1 | 3/2011 | Ohta |
| 2011/0075694 A1 | 3/2011 | Yoshizumi |
| 2011/0100291 A1 | 5/2011 | D Evelyn |
| 2011/0101400 A1 | 5/2011 | Chu |
| 2011/0101414 A1 | 5/2011 | Thompson |
| 2011/0103418 A1 | 5/2011 | Hardy |
| 2011/0108081 A1 | 5/2011 | Werthen |
| 2011/0115084 A1 | 5/2011 | Ueshima |

(56) References Cited

U.S. PATENT DOCUMENTS

| | | |
|---|---|---|
| 2011/0124139 A1 | 5/2011 | Chang |
| 2011/0136281 A1 | 6/2011 | Sheen |
| 2011/0175200 A1 | 7/2011 | Yoshida |
| 2011/0177631 A1 | 7/2011 | Gardner |
| 2011/0180781 A1 | 7/2011 | Raring |
| 2011/0182056 A1 | 7/2011 | Trottier |
| 2011/0186860 A1 | 8/2011 | Enya |
| 2011/0186874 A1 | 8/2011 | Shum |
| 2011/0186887 A1 | 8/2011 | Trottier |
| 2011/0188530 A1 | 8/2011 | Lell |
| 2011/0204324 A1 | 8/2011 | Kim |
| 2011/0204378 A1 | 8/2011 | Su |
| 2011/0216795 A1 | 9/2011 | Hsu |
| 2011/0220912 A1 | 9/2011 | D Evelyn |
| 2011/0220934 A1 | 9/2011 | Gotoda |
| 2011/0247556 A1 | 10/2011 | Raring |
| 2011/0256693 A1 | 10/2011 | D Evelyn |
| 2011/0260189 A1 | 10/2011 | Kim |
| 2011/0262773 A1 | 10/2011 | Poblenz |
| 2011/0266552 A1 | 11/2011 | Tu |
| 2011/0279054 A1 | 11/2011 | Katona |
| 2011/0281422 A1 | 11/2011 | Wang |
| 2011/0315999 A1 | 12/2011 | Sharma |
| 2011/0317397 A1 | 12/2011 | Trottier |
| 2012/0000415 A1 | 1/2012 | D Evelyn |
| 2012/0007102 A1 | 1/2012 | Feezell |
| 2012/0043552 A1 | 2/2012 | David |
| 2012/0073494 A1 | 3/2012 | D Evelyn |
| 2012/0091465 A1 | 4/2012 | Krames |
| 2012/0104359 A1 | 5/2012 | Felker |
| 2012/0104412 A1 | 5/2012 | Zhong |
| 2012/0118223 A1 | 5/2012 | D Evelyn |
| 2012/0135553 A1 | 5/2012 | Felker |
| 2012/0137966 A1 | 6/2012 | D Evelyn |
| 2012/0178215 A1 | 7/2012 | D Evelyn |
| 2012/0181560 A1 | 7/2012 | Hiramatsu |
| 2012/0187412 A1 | 7/2012 | D Evelyn |
| 2012/0199841 A1 | 8/2012 | Batres |
| 2012/0199952 A1 | 8/2012 | D Evelyn |
| 2012/0235201 A1 | 9/2012 | Shum |
| 2012/0288974 A1 | 11/2012 | Sharma |
| 2013/0016750 A1 | 1/2013 | Raring |
| 2013/0022064 A1 | 1/2013 | Raring |
| 2013/0022758 A1 | 1/2013 | Trottier |
| 2013/0026483 A1 | 1/2013 | Sharma |
| 2013/0044782 A1 | 2/2013 | Raring |
| 2013/0056776 A1 | 3/2013 | Su |
| 2013/0064261 A1 | 3/2013 | Sharma |
| 2013/0112987 A1 | 5/2013 | Fu |
| 2013/0126902 A1 | 5/2013 | Isozaki |
| 2013/0234108 A1 | 9/2013 | David |
| 2014/0027789 A1 | 1/2014 | Katona |
| 2014/0050244 A1 | 2/2014 | Ohno |
| 2014/0103356 A1 | 4/2014 | Krames |
| 2014/0145235 A1 | 5/2014 | Shum |
| 2014/0175492 A1 | 6/2014 | Steranka |
| 2014/0312373 A1 | 10/2014 | Donofrio |
| 2014/0346524 A1 | 11/2014 | Batres |
| 2014/0346546 A1 | 11/2014 | D Evelyn |
| 2015/0014695 A1 | 1/2015 | Cich |
| 2015/0155459 A1 | 6/2015 | Ishihara |

FOREIGN PATENT DOCUMENTS

| | | |
|---|---|---|
| CN | 103178181 A | 6/2013 |
| EP | 961328 A3 | 12/1999 |
| EP | 2381490 | 10/2011 |
| JP | H02028541 | 1/1990 |
| JP | 09036430 | 2/1997 |
| JP | H0982587 A | 3/1997 |
| JP | H09199756 | 7/1997 |
| JP | H11340507 | 12/1999 |
| JP | H11340576 | 12/1999 |
| JP | 2000294883 | 10/2000 |
| JP | 2001160627 | 6/2001 |
| JP | 2001177146 | 6/2001 |
| JP | 2002185085 | 6/2002 |
| JP | 2003031844 | 1/2003 |
| JP | 2005217421 | 8/2005 |
| JP | 2006173621 | 6/2006 |
| JP | 2007067418 | 3/2007 |
| JP | 2007507115 | 3/2007 |
| JP | 2007110090 | 4/2007 |
| JP | 2007173467 | 7/2007 |
| JP | 2008042158 A | 2/2008 |
| JP | 2008084973 | 4/2008 |
| JP | 2008172040 | 7/2008 |
| JP | 2008258503 | 10/2008 |
| JP | 2008311640 | 12/2008 |
| JP | 2009021824 | 1/2009 |
| JP | 2009130097 A | 6/2009 |
| JP | 2010034487 | 2/2010 |
| JP | 2010517274 | 5/2010 |
| JP | 06334215 | 10/2015 |
| WO | 2006062880 | 6/2006 |
| WO | 2007/143197 A2 | 12/2007 |
| WO | 2008091846 | 7/2008 |
| WO | 2009001039 | 12/2008 |
| WO | 2010138923 | 12/2010 |
| WO | 2011035265 A1 | 3/2011 |
| WO | 2013171286 | 11/2013 |

OTHER PUBLICATIONS

Aguilar, 'Ohmic n-contacts to Gallium Nitride Light Emitting Diodes', National Nanotechnologhy Infrastructure Network, 2007pp. 56-57.

Aoki et al., 'InGaAs/InGaAsP MQW Electroabsorption Modulator Integrated With a DFB Laser Fabricated by Band-Gap Energy Control Selective Area MOCVD', IEEE Journal of Quantum Electronics, vol. 29, 1993, pp. 2088-2096.

Asano et al., '100-mW Kink-Free Blue-Violet Laser Diodes With Low Aspect Ratio', IEEE Journal of Quantum Electronics, vol. 39, No. 1, 2003, pp. 135-140.

Baker et al., 'Characterization of Planar Semipolar Gallium Nitride Films on Spinel Substrates', Japanese Journal of Applied Physics, vol. 44, No. 29, 2005, pp. L920-L922.

Benke et al., 'Uncertainty in Health Risks from Artificial Lighting due to Disruption of Circadian Rythm and Melatonin Secretion: A Review', Human and Ecological Risk Assessment: An International Journal, vol. 19, No. 4, 2013, pp. 916-929.

Bernardini et al., 'Spontaneous Polarization and Piezoelectric Constants of III-V Nitrides', Physical Review B, vol. 56, No. 16, 1997, pp. R10-024-R10-027.

Caneau et al., 'Studies on Selective OMPVE of (Ga,In)/(As,P)', Journal of Crystal Growth, vol. 124, 1992, pp. 243-248.

Cartwright, 'Quantum Electronics: III Nitrides Bandgap Calculator', University of Buffalo, Jan. 5, 2015, p. 1.

Chen et al., 'Growth and Optical Properties of Highly Uniform and Periodic InGaN Nanostructures', Advanced Materials, vol. 19, 2007, pp. 1707-1710.

Chhajed et al., 'Junction temperature in light-emitting diodes assessed by different methods', Future Chips Constellation, 2005, p. 1-9.

Cich et al., 'Bulk GaN based violet light-emitting diodes with high efficiency at very high current density', Applied Physics Letters, 101, Nov. 29, 2012, pp. 223509-1-223509-3.

Communication from the Chinese Patent Office re 201080052148.X dated Mar. 11, 2014, (4 pages).

Communication from the German Patent Office re 11 2010 003 697.7 dated Apr. 11, 2013, (6 pages).

Communication from the Japanese Patent Office re 2012-529905 dated Apr. 19, 2013, (4 pages).

Communication from the Japanese Patent Office re 2012-529969 dated Dec. 5, 2014 (2 pages).

Communication from the Japanese Patent Office re 2012-529969 dated Jul. 4, 2014 (8 pages).

Communication from the Japanese Patent Office re 2012-529969, dated Oct. 15, 2013, (6 pages).

(56) References Cited

OTHER PUBLICATIONS

Communication from the Japanese Patent Office re 2012-5520086 dated Nov. 28, 2014 (6 pages).
Communication from the Japanese Patent Office re 2013-515583 dated Sep. 12, 2014 (4 pages).
Communication from the Japanese Patent Office re 2013515583 dated Janury 16, 2014, (4 pages).
Communication from the Korean Patent Office re 10-2012-7009980 dated Apr. 15, 2013, (6 pages).
D'Evelyn, et al., "Bulk GaN Crystal Growth by the High-Pressure Ammonothermal Method", Journal of Crystal Growth, Elsevier, Amsterdam, NL, vol. 300, No. 1, pp. 11-16, 2007.
Enya, '531nm Green Lasing of InGaN Based Laser Diodes on Semi-Polar {20-21} Free-Standing GaN Substrates', Applied Physics Express, Jul. 17, 2009, vol. 2, pp. 082101.
European Search Report dated Jun. 30, 2017 in Application No. EP 17 16 5385, 7 pages.
Founta et al., Anisotropic Morphology of Nonpolar a-Plane GaN Quantum Dots and Quantum Wells, Journal of Applied Physics, vol. 102, vol. 7, 2007, pp. 074304-1-074304-6.
Fujii et al., Increase in the Extraction Efficiency of GaN-Based Light-Emitting Diodes Via Surface Roughening, 2Applied Physics Letters, vol. 84, No. 6, 2004, pp. 855-857.
Funato et al., 'Monolithic Polychromatic Light-Emitting Diodes Based on InGaN Microfacet Quantum Wells Toward Tailor-Made Solid-State Lighting', Applied Physics Express, vol. 1, 2008, pp. 011106-1-011106-3.
Funato et al., 'Blue, Green, and Amber InGaN/GaN Light-Emitting Diodes on Semipolar (1122) GaN Bulk Substrates', Japanese Journal of Applied Physics, vol. 45, No. 26, 2006, pp. L659-L662.
Gardner et al., 'Blue-Emitting InGaN-GaN Double-Heterostructure Light-Emitting Diodes Reaching Maximum Quantum Efficiency Above 200 a/cm2', Applied Physics Letters. vol. 91, 2007, pp. 243506-1-243506-3.
Hanifin et al., 'Photoreception for Circadian, Neuroendocrine, and Neurobehavioral Regulation', Journal of Physiological Anthropology, vol. 26, 2007, pp. 87-94.
Haskell et al., 'Defect Reduction in (1100) m-plane gallium nitride via lateral epitaxial overgrowth by hydride vapor phase epitaxy', Applied Physics Letters 86, 111917 (2005), pp. 1-3.
Hiramatsu et al., Selective Area Growth and Epitaxial Lateral Overgrowth of GaN by Metalorganic Vapor Phase Epitaxy and Hydride Vapor Phase Epitaxy. Materials Science and Engineering B, vol. 59, May 6, 1999. pp. 104-111.
http://www.philipslumileds.com/products/luxeon-flash, 'Luxeon Flash', Philips Lumileds, Aug. 8, 2013, pp. 1-2; Retrieved on Sep. 21, 2013.
International Preliminary Report & Written Opinion of PCT Application No. PCT/US2011/037792, dated Dec. 6, 2012, 8 pages total.
International Search Report & Written Opinion of PCT Application No. PCT/US2013/029453, dated Jul. 25, 2013, 11 pages total.
International Search Report of PCT Application No. PCT/US2011/023622, dated Apr. 1, 2011, 2 pages total.
International Search Report of PCT Application No. PCT/US2011/041106, dated Jan. 5, 2012, 4 pages total.
Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.
Kendall et al., 'Energy Savings Potential of Solid State Lighting in General Lighting Applications', Report for the Department of Energy, 2001, pp. 1-35.
Khan, 'Cleaved Cavity Optically Pumped InGaN-GaN Laser Grown on Spinel Substrates,' Applied Physics Letters, vol. 69, No. 16, 1996, pp. 2417-2420.
Kim et al., 'High Brightness Light Emitting Diodes Using Dislocation-Free Indium Gallium Nitride/Gallium Nitride Multiquantum-Well Nanorod Arrays', Nano Letters, vol. 4, No. 6, 2004, pp. 1059-1062.
Kuramoto et al., 'Novel Ridge-Type InGaN Multiple-Quantum-Well Laser Diodes Fabricated by Selective Area Re-Growth on n-GaN Substrates', Japanese Journal of Applied Physics, vol. 40, 2001, pp. L925-L927.
Lin et al., 'Influence of Separate Confinement Heterostructure Layer on Carrier Distribution in InGaAsP Laser Diodes With Nonidentical Multiple Quantum Wells,' Japanese Journal of Applied Physics, vol. 43, No. 10, 2004, pp. 7032-7035.
Lu et al., 'Etch-Pits of GaN Films with Different Etching Methods', Journal of the Korean Physical Society, vol. 45, Dec. 2004, p. S673-S675.
Mastro et al., 'Hydride vapor phase epitaxy-grown AlGaN/GaN high electron mobility transistors', Solid-State Electronics, vol. 47, Issue 6, Jun. 2003, pp. 1075-1079.
Masui et al., 'Electrical Characteristics of Nonpolar InGaN-Based Light-Emitting Diodes Evaluated at Low Temperature', Japanese Journal of Applied Physics, vol. 46, No. 11, 2007, pp. 7309-7310.
Morkoc, 'Handbook of Nitride Semiconductors and Devices', vol. 1, 2008, p. 704.
Motoki et al., 'Dislocation reduction in GaN crystal by advanced-Deep', Journal of Crystal Growth, vol. 305, Apr. 1, 2007, pp. 377-383.
Nakamura et al., 'InGaN/Gan/AlGaN-Based Laser Diodes With Modulation-Doped Strained-Layer Superlattices Grown on an Epitaxially Laterally Overgrown GaN Substrate', Applied Physics Letters, vol. 72, No. 2, 1998, pp. 211-213.
Nam et al., 'Lateral Epitaxial Overgrowth of GaN Films on SiO2 Areas Via Metalorganic Vapor Phase Epitaxy', Journal of Electronic Materials, vol. 27, No. 4, 1998, pp. 233-237.
Okamoto et al., 'Continuous-Wave Operation of m-Plane InGaN Multiple Quantum Well Laser Diodes', Japanese Journal of Applied Physics, vol. 46, No. 9, 2007, pp. L187-L189.
Okamoto et al., 'High-Efficiency Continuous-Wave Operation of Blue-Green Laser Diodes Based on Nonpolar mPlane Gallium Nitride,' The Japan Society of Applied Physics, Applied Physics, Express 1, 2008, pp. 072201-1-072201-3.
Okamoto et al., 'Pure Blue Laser Diodes Based on Nonpolar m-Plane Gallium Nitride With InGaN Waveguiding Layers', Japanese Journal of Applied Physics, vol. 46, No. 35, 2007, pp. L820-L822.
Okubo, 'Nichia Develops Blue-Green Semiconductor Laser With 488 nm Wavelength', http://techon.nikkeibp.co.jp/english/ NEWS-EN/20080122/146009, 2008, 2 pgs.
Park, 'Crystal Orientation Effects on Electronic Properties of Wurtzite InGaN/GaN Quantum Wells,', Journal of Applied Physics, vol. 91, No. 12, 2002, pp. 9903-9908.
PCT Communication Including Partial Search and Examination Report for PCT/US2011/041106, dated Oct. 4, 2011, 4 pages total.
Purvis, 'Changing the Crystal Face of Gallium Nitride', The Advance Semiconductor Magazine, vol. 18, No. 8, 2005, pp. 1-3.
Rea et al., 'White Lighting', Color Research and Application, vol. 38, No. 2, Sep. 3, 2011, pp. 82-92.
Rickert et al., 'n-GaN Surface Treatments for Metal Contacts Studied Via X-ray Photoemission Spectroscopy', Applied Physics Letters, vol. 80, No. 2, Jan. 14, 2002, p. 204-206.
Romanov et al., 'Strain-Induced Polarization in Wurtzite III-Nitride Semipolar Layers,' Journal of Applied Plysics, vol. 100, 2006, pp. 023522-1 through 023522-10.
Sato et al., 'High Power and High Efficiency Green Light Emitting Diode on Free-Standing Semipolar (1122) Bulk GaN Substrate', Physica Status Solidi (RRL), vol. 1, No. 4, 2007, pp. 162-164.
Sato et al., 'High Power and High Efficiency Semipolar InGaN Light Emitting Diodes', Journal of Light and Visible Environment, vol. 32, No. 2, Dec. 13, 2007, pp. 57-60.
Sato et al., 'High Power and High Efficiency Semipolar InGaN Light Emitting Diodes', Journal of Light and Visible Environment, vol. 32, No. 2, Feb. 12, 2008, pp. 107-110.
Sato et al., "Optical properties of yellow light-emitting diodes grown on semipolar (1122) bulk GaN substrate", Applied Physics Letters, vol. 92, No. 22, 2008, pp. 221110-221110-3.
Schmidt et al., 'Demonstration of Nonpolar m-Plane InGaN/GaN Laser Diodes', Japanese Journal of Applied Physics, vol. 46, No. 9, 2007, pp. L190-L191.
Schmidt et al., 'High Power and High External Efficiency m-Plane InGaN Light Emitting Diodes', Japanese Journal of Applied Physics, vol. 46, No. 7, 2007, pp. L126-L128.

(56) References Cited

OTHER PUBLICATIONS

Schoedl, 'Facet Degradation of GaN Heterostructure Laser Diodes,' Journal of Applied Physics, vol. 97, issue 12, 2006, pp. 123102-1-123102-8.

Selvanathan et al., Investigation of Surface Treatment Schemes on n-type GaN and Al 0.20Ga0.80N, Journal of Vacuum Science and Technology B, vol. 23, No. 6, May 10, 2005, p. 2538-2544.

Semendy et al., 'Observation and Study of Dislocation Etch Pits in Molecular Beam Epitaxy Grown Gallium Nitride with the use of Phosphoric Acid and Molten Potassium Hydroxide', Army Research Laboratory, Jun. 2007, 18 pages.

Shchekin et al., 'High Performance Thin-film Flip-Chip InGaN-GaN Light-Emitting Diodes', Applied Physics Letters, vol. 89, 2006, pp. 071109-1-071109-3.

Shen et al., 'Auger Recombination in Letters InGaN Measured by Photoluminescence', Applied Physics Letters, vol. 91, 2007, pp. 141101-1-141101-3.

Sizov et al., '500-nm Optical Gain Anisotropy of Semipolar (1122) InGaN Quantum Wells', Applied Physics Express, vol. 2, 2009, pp. 071001-1-071001-3.

Tomiya et al., 'Dislocation Related Issues in the Degradation of GaN-Based Laser Diodes', IEEE Journal of Selected Topics in Quantum Electronics, vol. 10, No. 6, 2004, pp. 1277-1287.

Tyagi et al., 'High Brightness Violet InGaN/GaN Light Emitting Diodes on Semipolar (1011) Bulk GaN Substrates', Japanese Journal of Applied Physics, vol. 46, No. 7, 2007, pp. L129-L131.

Uchida et al., 'Recent Progress in High-Power Blue-Violet Lasers', IEEE Journal of Selected Topics in Quantum Electronics, vol. 9, No. 5, 2003, pp. 1252-1259.

Waltereit et al., 'Nitride Semiconductors Free of Electrostatic Fields for Efficient White Light-Emitting Diodes', Letters to Nature: International Weekly Journal of Science, vol. 406, 2000, pp. 865-868.

Weaver et al., 'Optical Properties of Selected Elements', Handbook of Chemistry and Physics, vol. 94, 2013-2014, pp. 12-126-12-140.

Wierer et al., 'High-Power AlGaInN Flip-Chip Light-Emitting Diodes', Applied Physics Letters, vol. 78, No. 22, 2001, pp. 3379-3381.

Yamaguchi, 'Anisotropic Optical Matrix Elements in Strained GaN-Quantum Wells With Various Substrate Orientations', Physica Status Solidi (PSS), vol. 5, No. 6, 2008, pp. 2329-2332.

Yoshizumi et al., 'Continuous-Wave Operation of 520nm Green InGaN-Based Laser Diodes on Semi-Polar {2021} GaN Substrates', Applied Physics Express, vol. 2, 2009, pp. 092101-1-092101-3.

Yu et al., 'Multiple Wavelength Emission From Semipolar InGaN/GaN Quantum Wells Selectively Grown by MOCVD', Optical Society of America, 2007, pp. 1-2.

Zhong et al., 'Demonstration of High Power Blue-Green Light Emitting Diode on Semipolar (1122) Bulk GaN Substrate,' Electronics Letters, vol. 43, No. 15, 2007, pp. 825-826.

Zhong et al., 'High Power and High Efficiency Blue Light Emitting Diode on Freestanding Semipolar (1011) Bulk GaN Substrate', Applied Physics Letter, vol. 90, No. 23, 2007, pp. 233504-1-233504-3.

Kwang-Choong Kim et al., Improved electroluminescence on nonpolar m-plane InGaN/GaN quantum wells LEDs, physica status solidi (RRL), Apr. 17. 2007, vol. 1, No. 3, pp. 125-127.

Atsuo Michiue, et al., Recent development of nitride LEDs and LDs, Proceedings of SPIE, Jan. 26, 2009, vol. 7216, pp. 72161Z-1-72161Z-6.

* cited by examiner

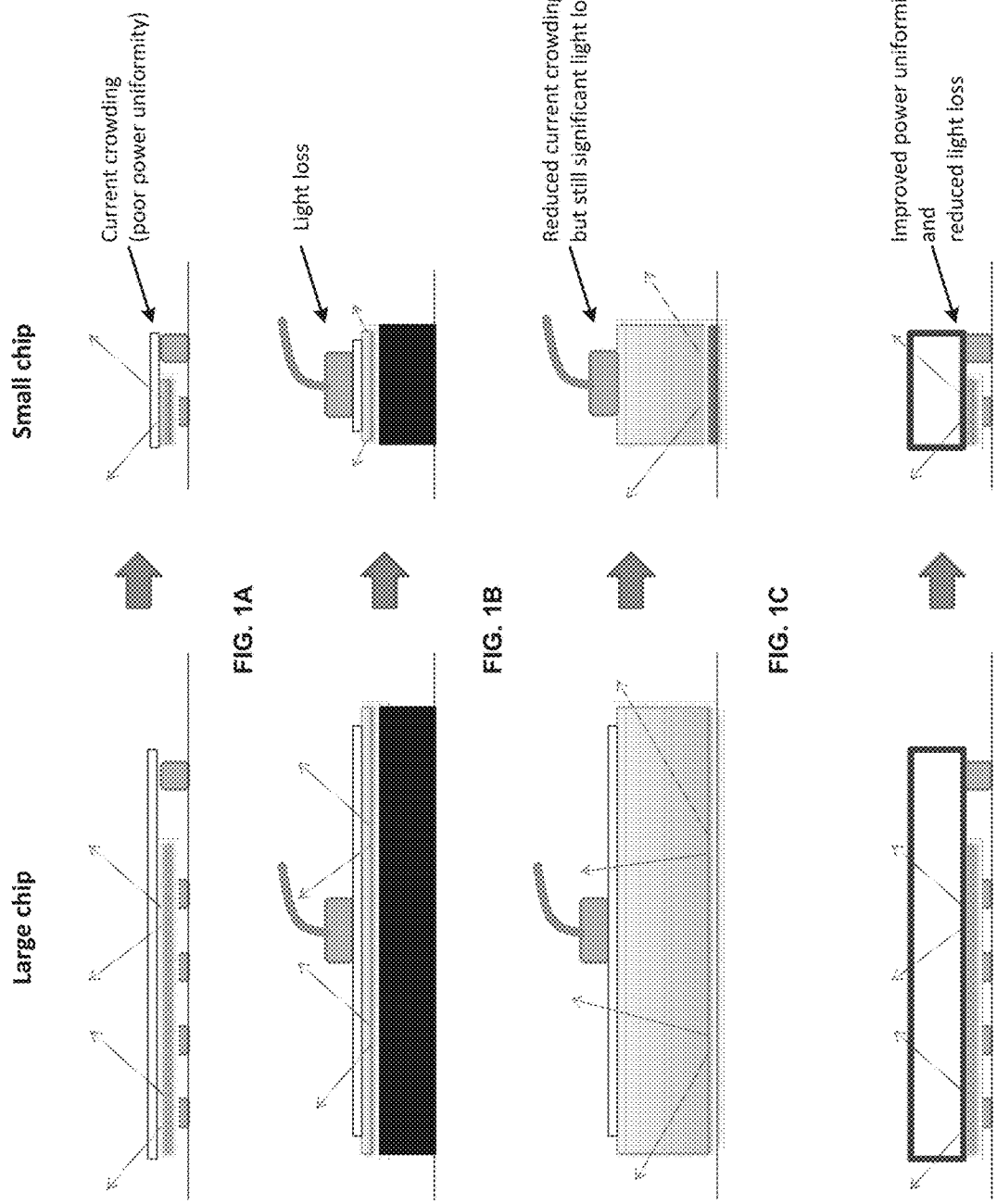

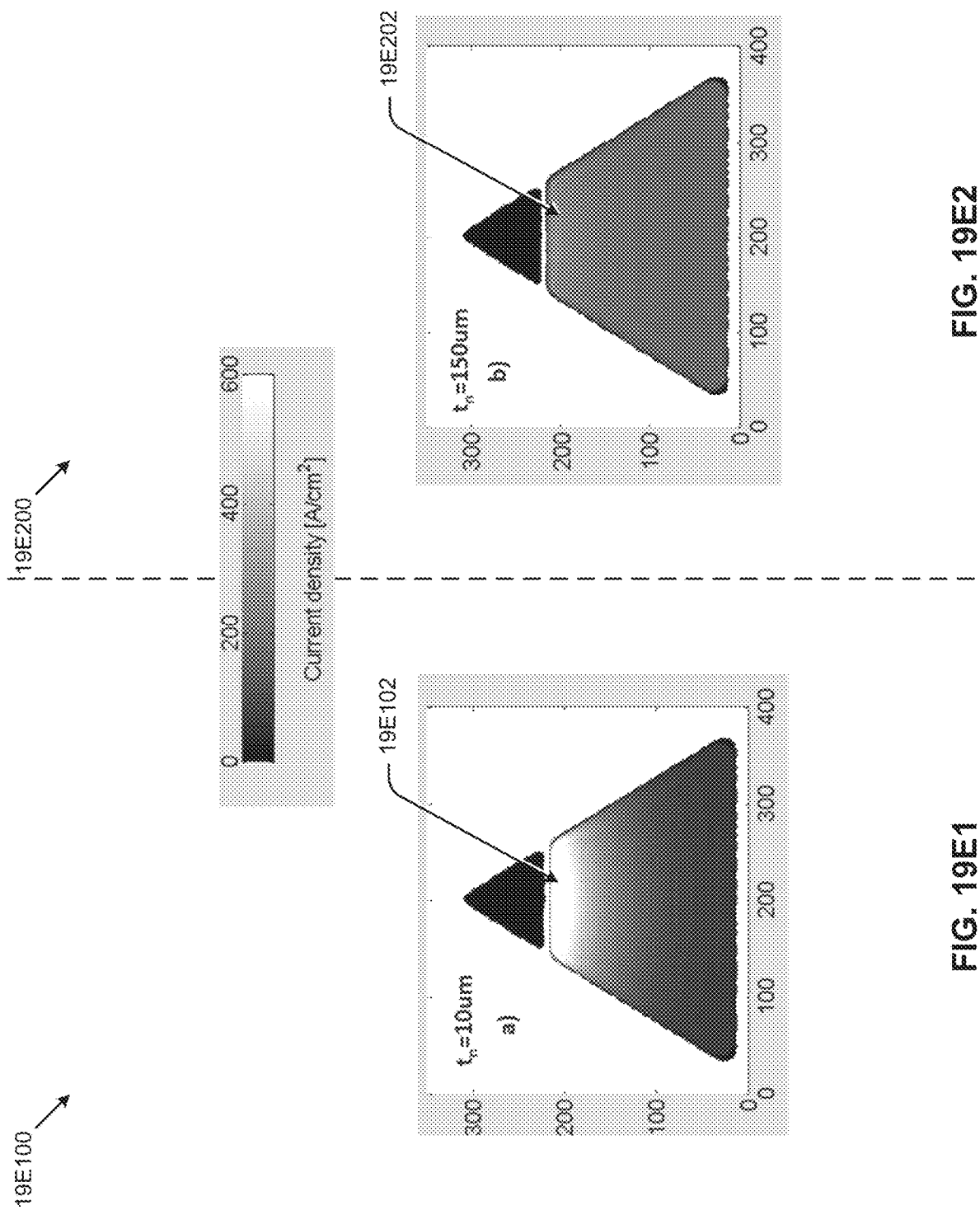
FIG. 19E1
FIG. 19E2

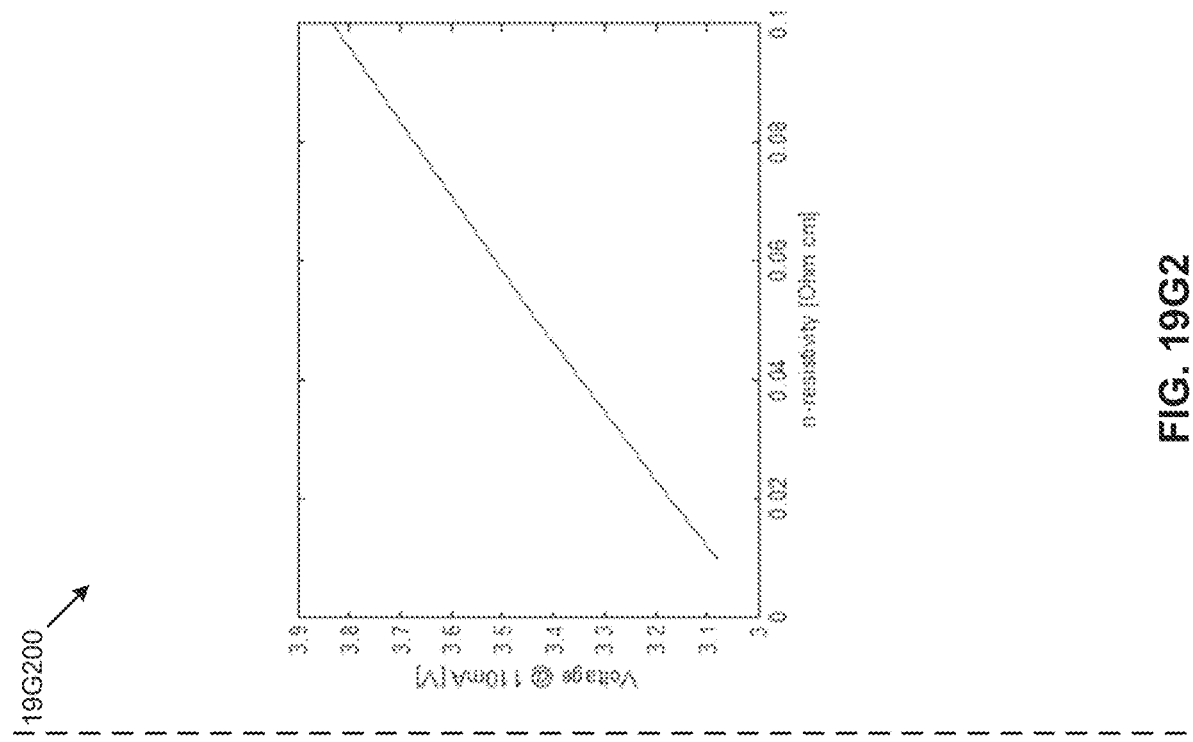
FIG. 19G2
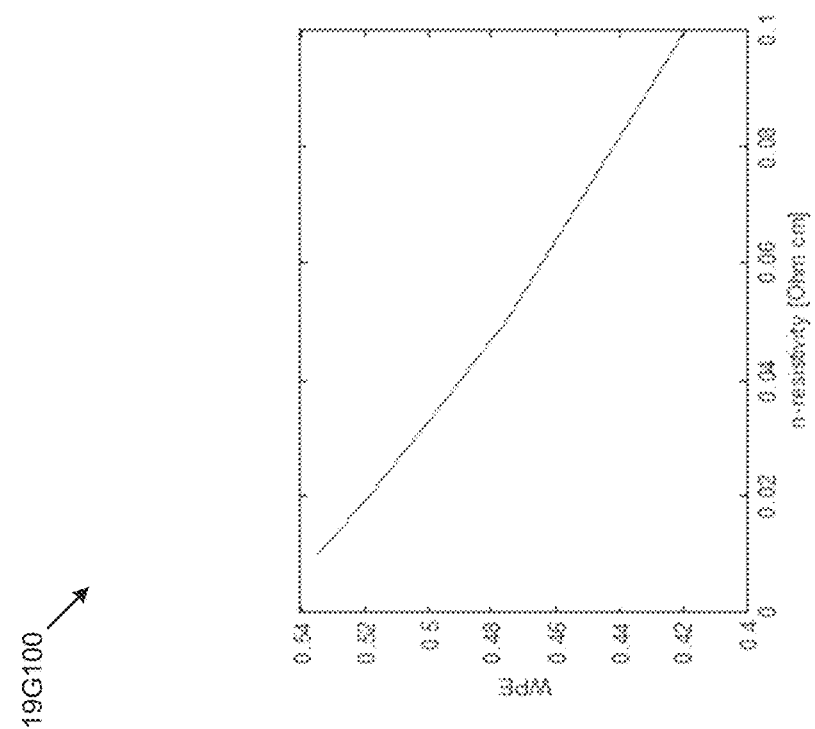
FIG. 19G1

19H100
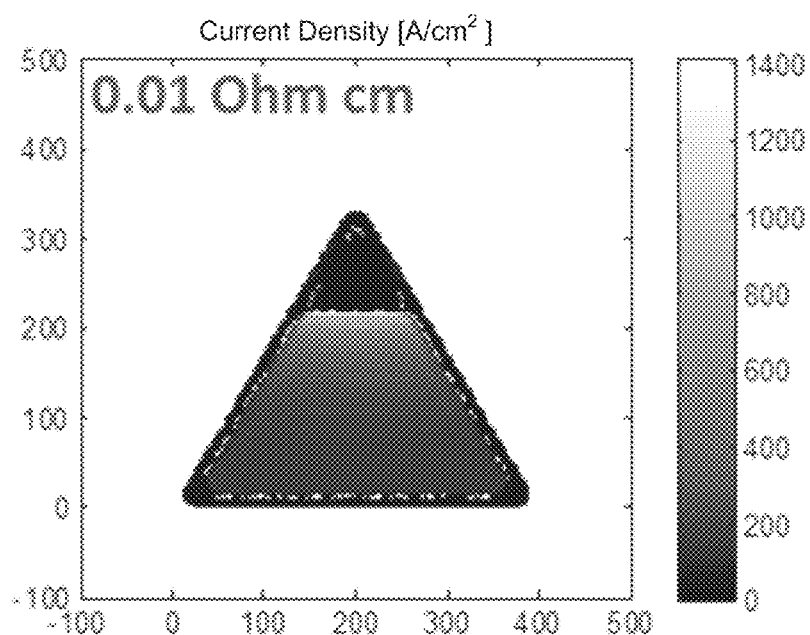
FIG. 19H1
19H200
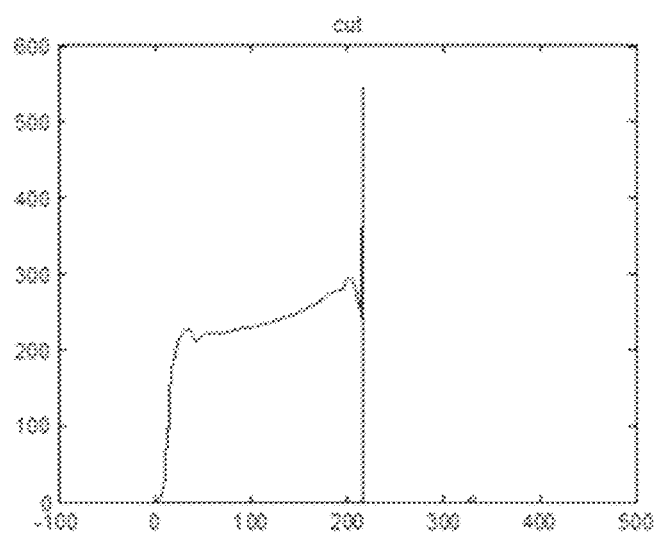
FIG. 19H2

191100
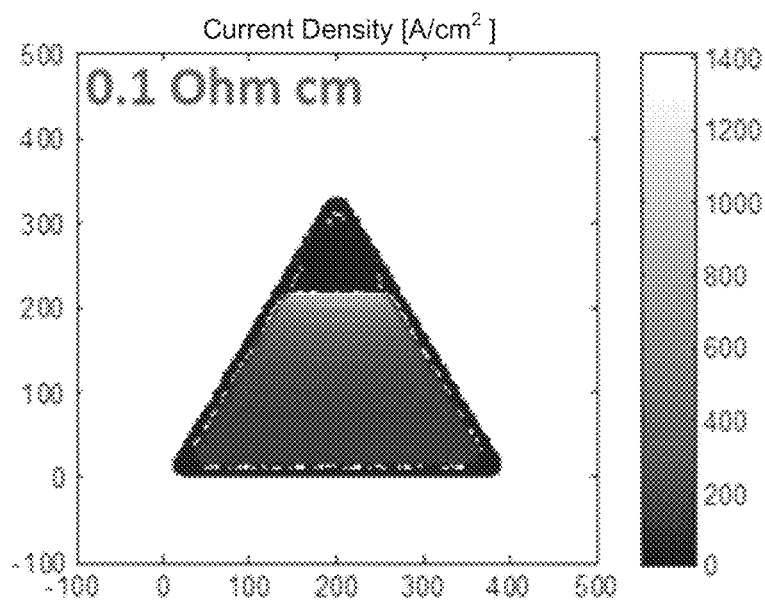
FIG. 19I1
191200
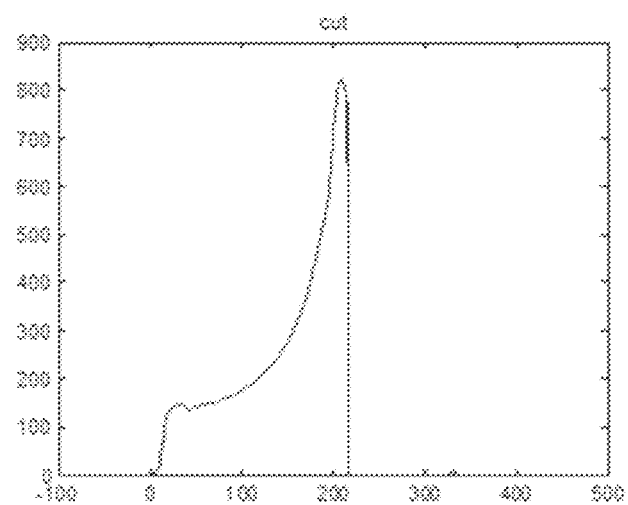
FIG. 19I2

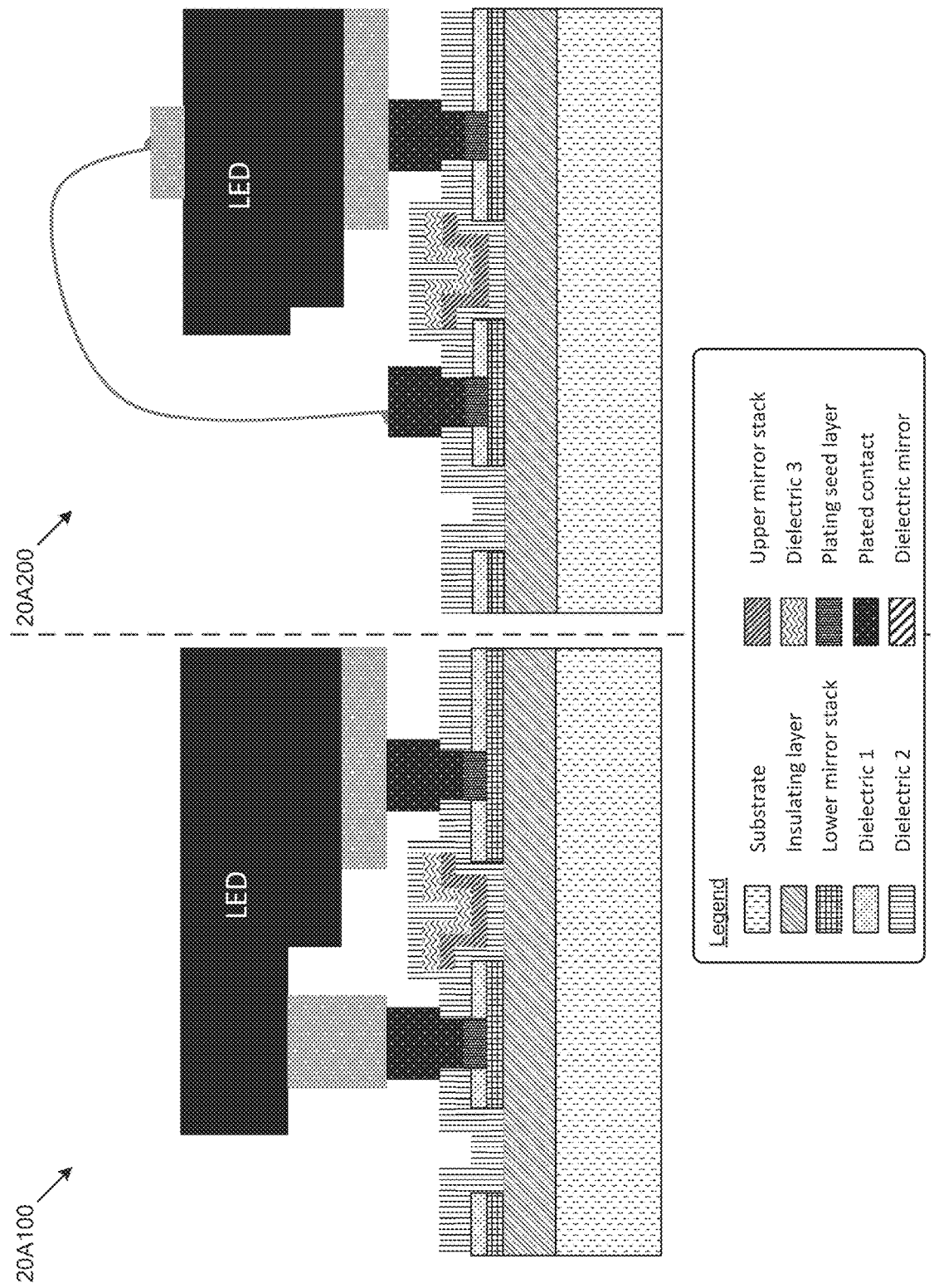
FIG. 20A1    FIG. 20A2

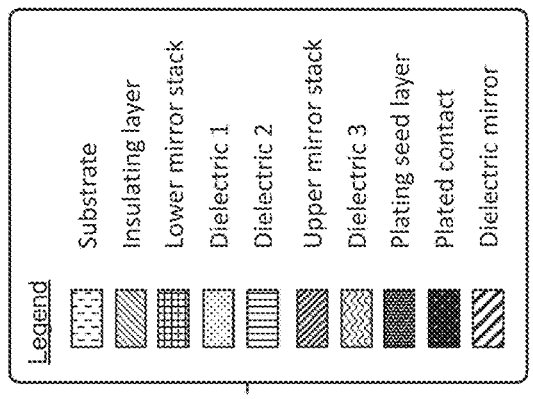
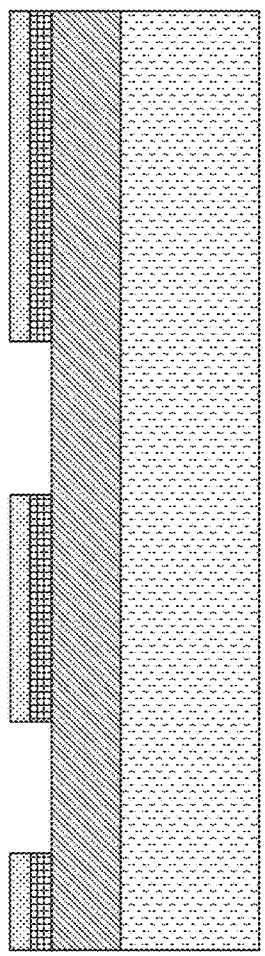
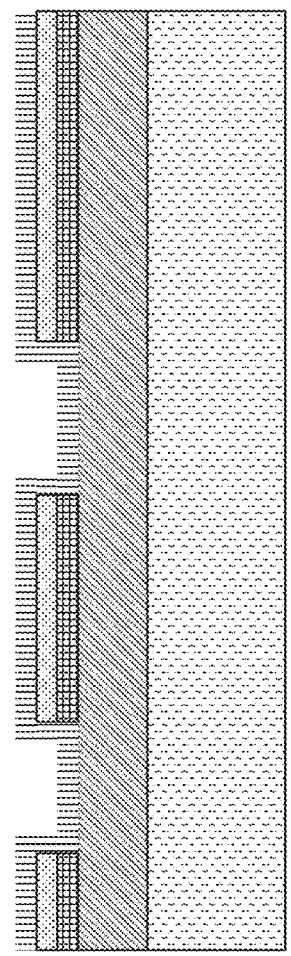

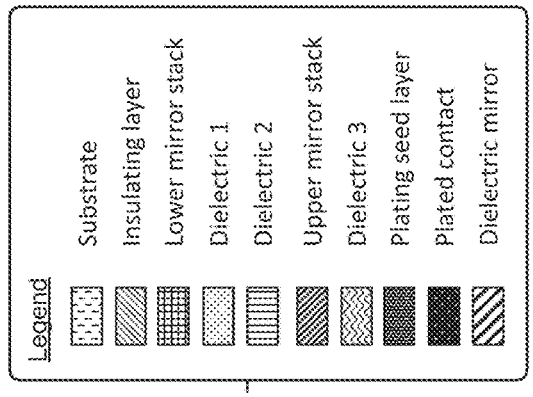
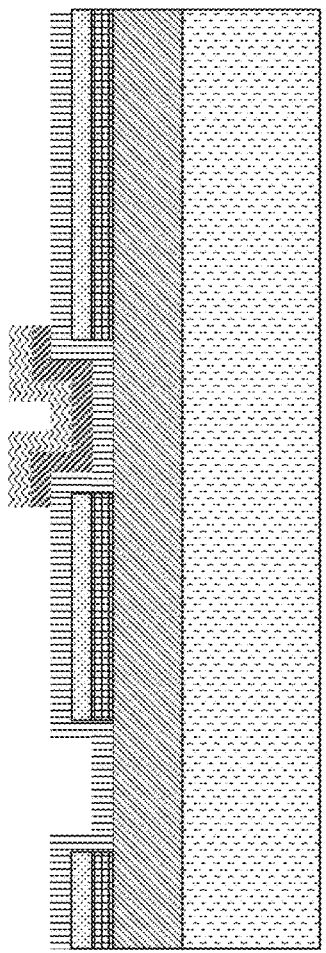
FIG. 20D
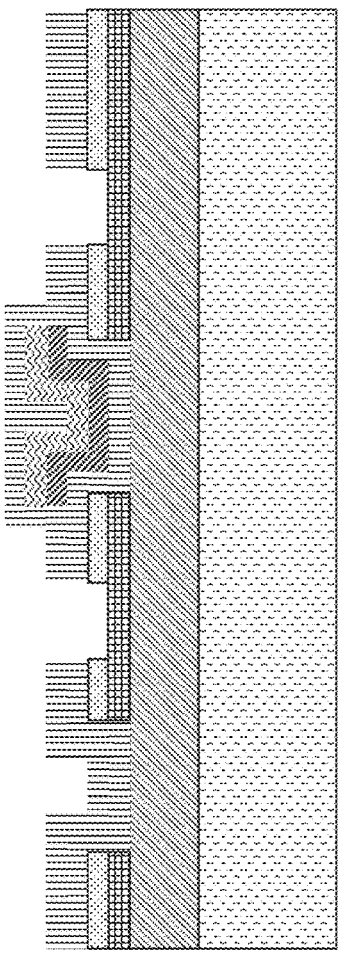
FIG. 20E

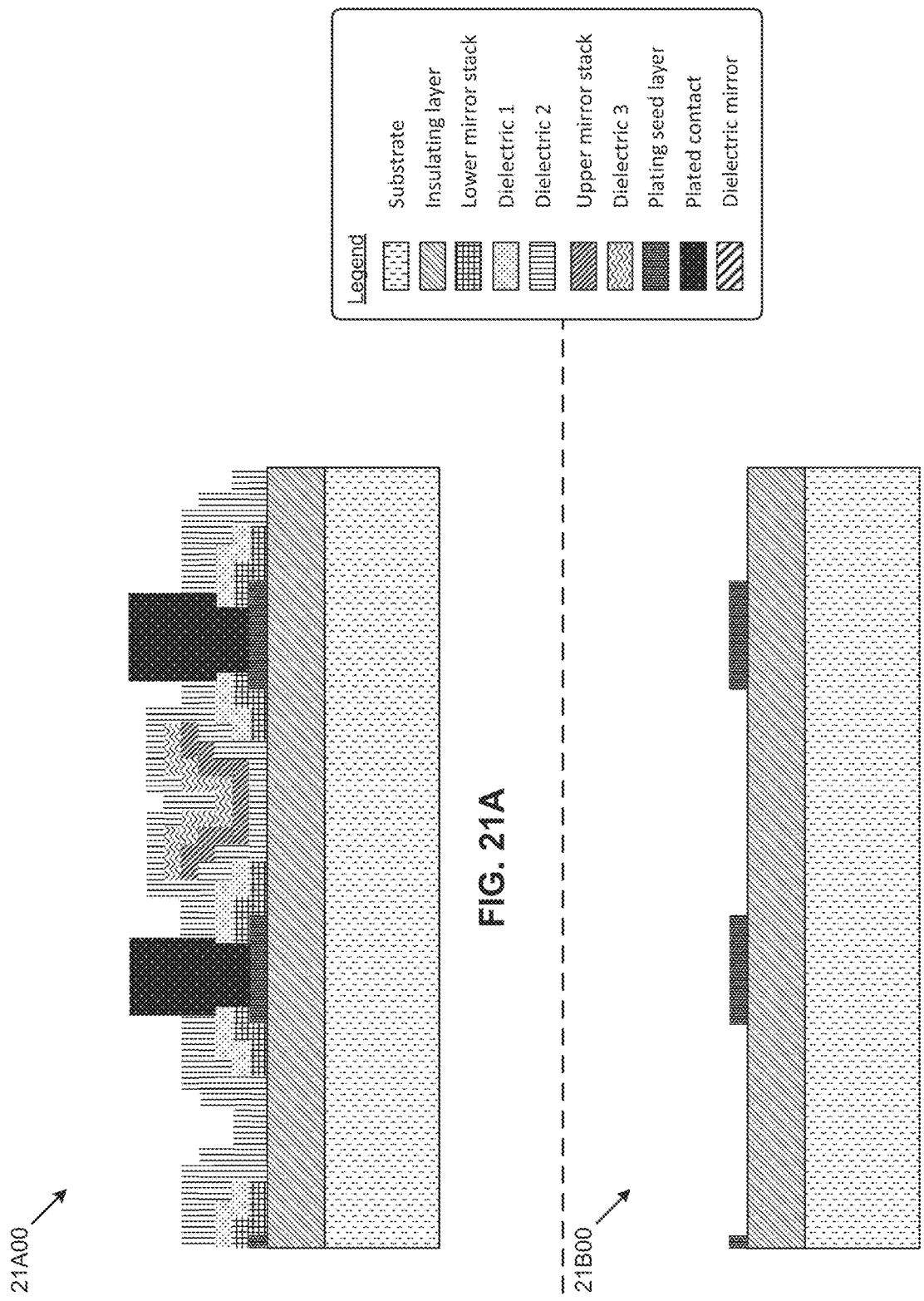

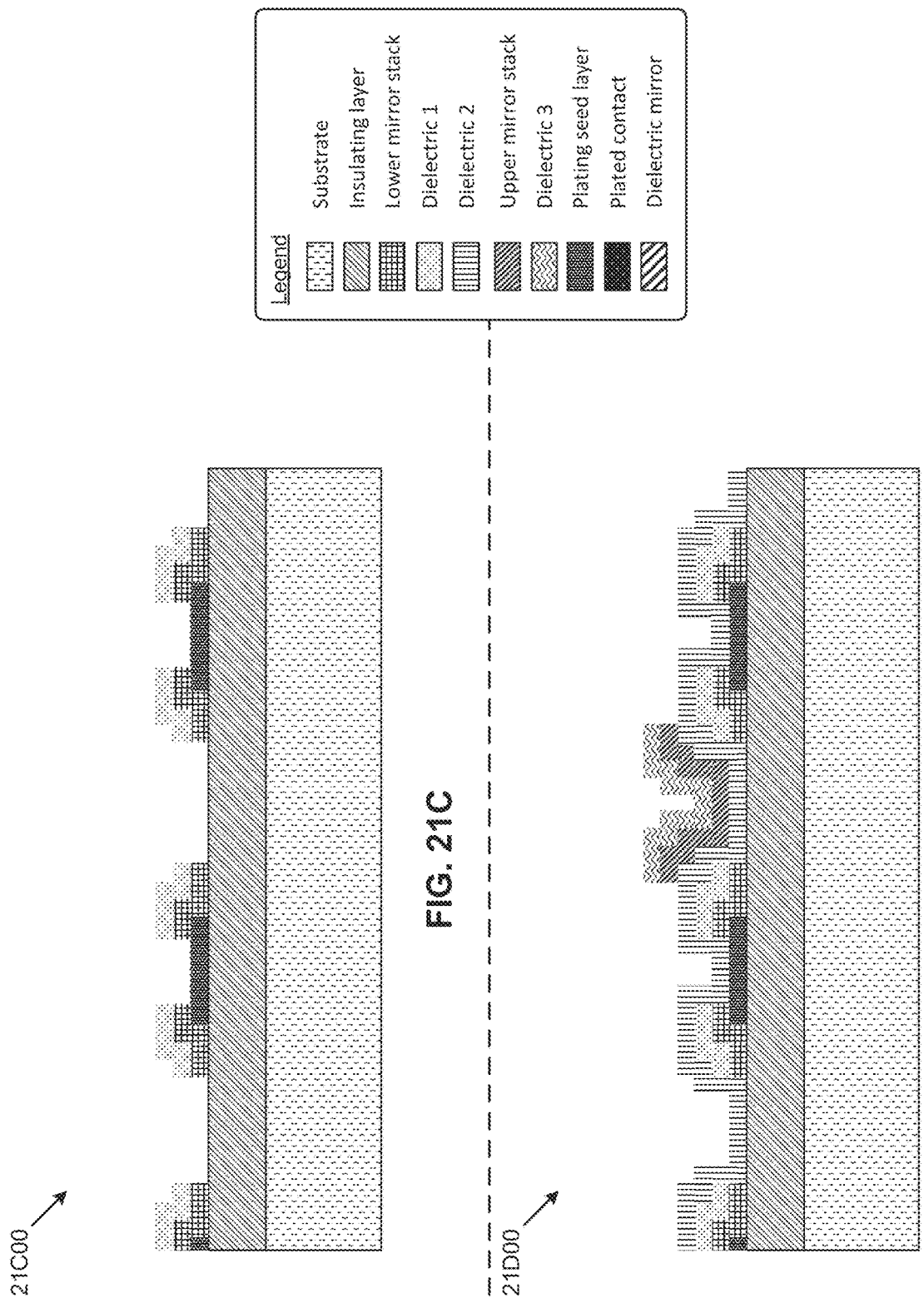

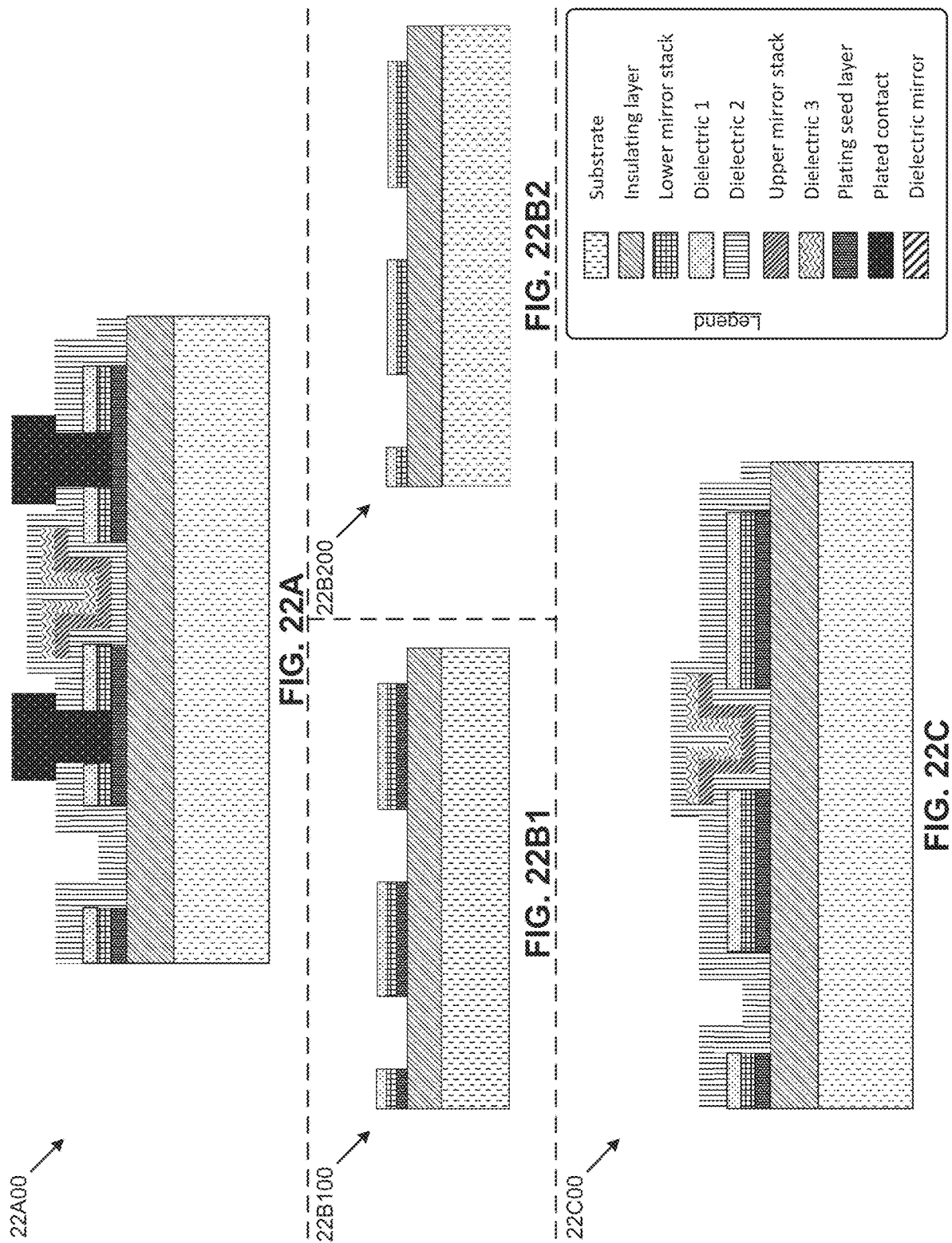

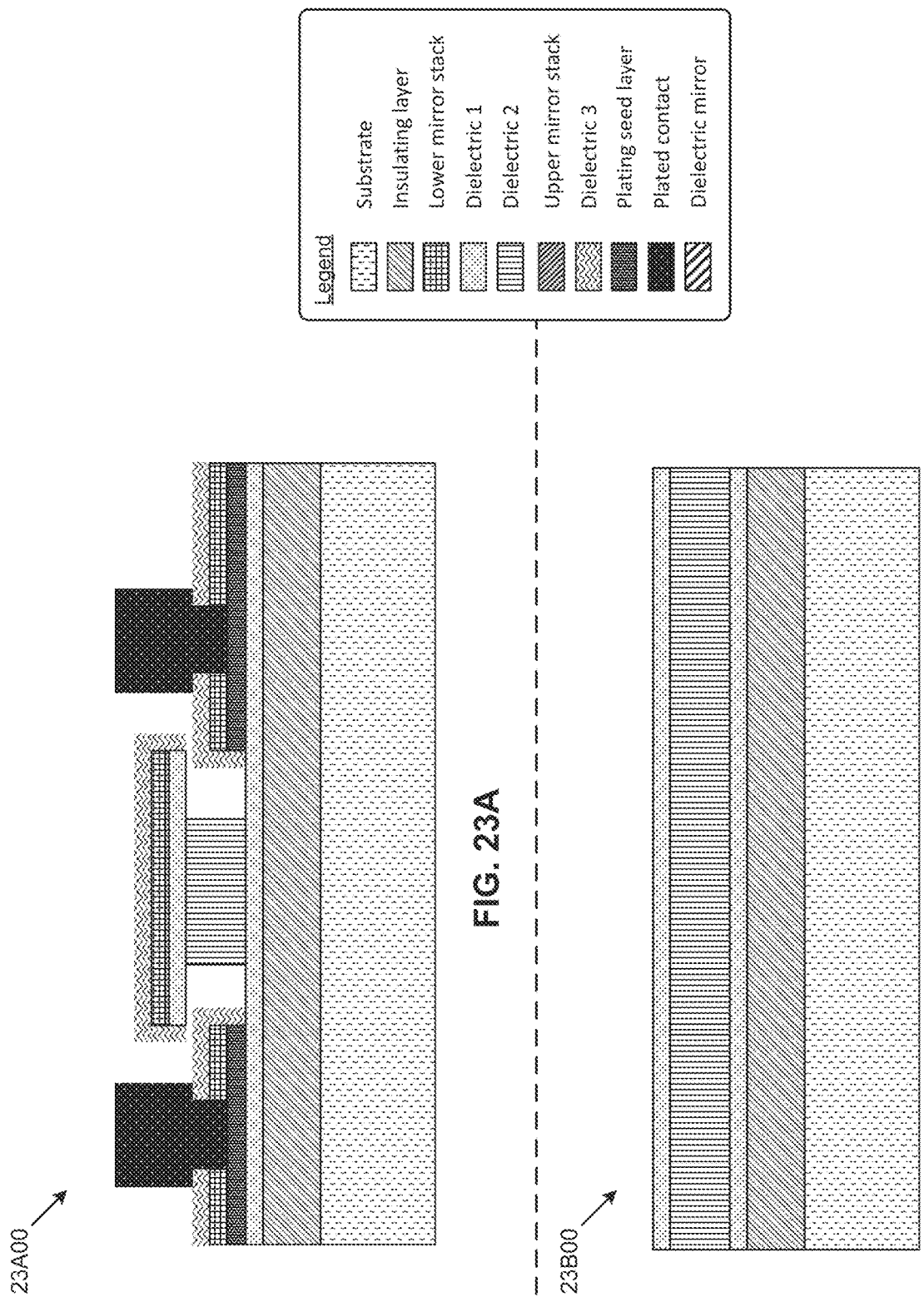

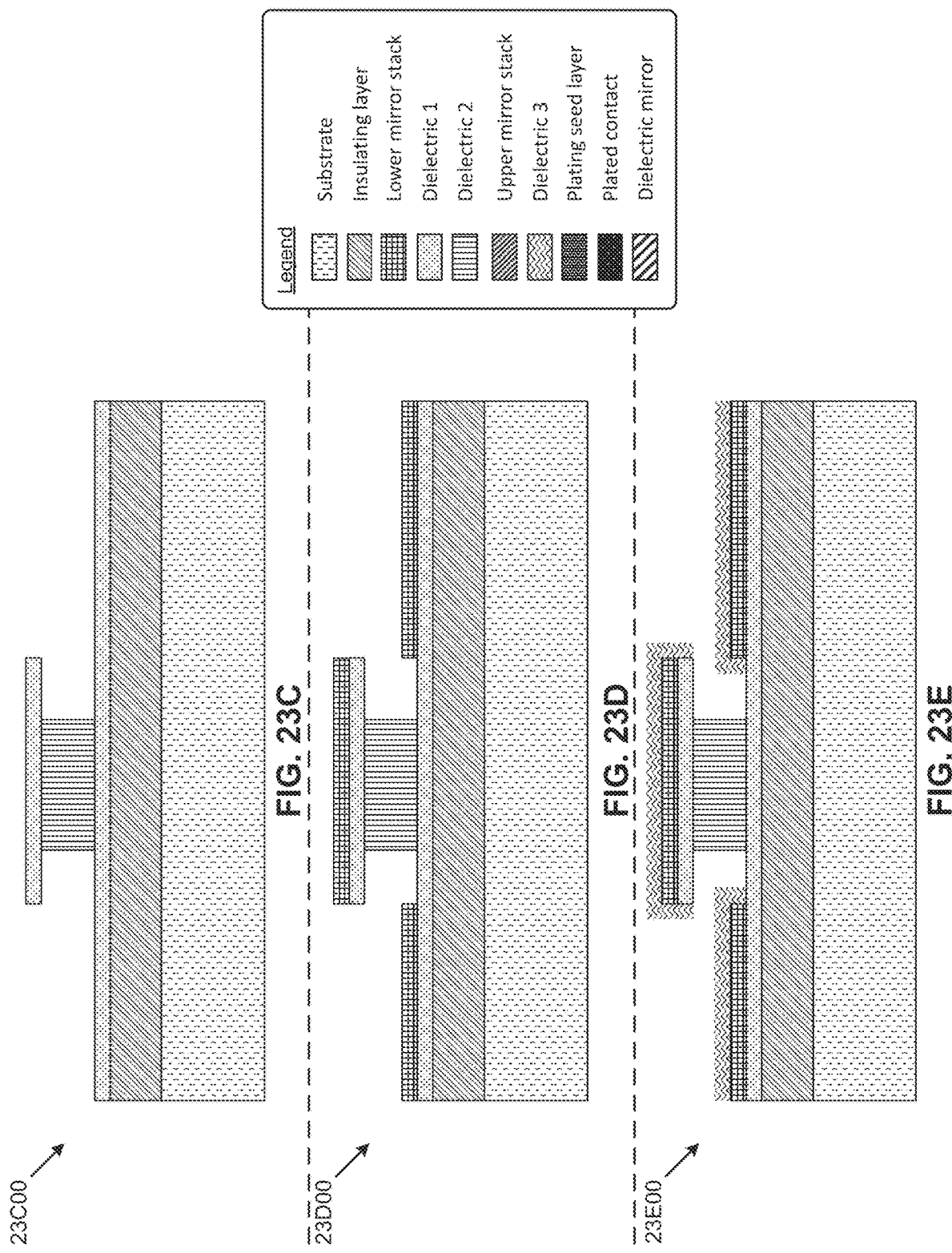

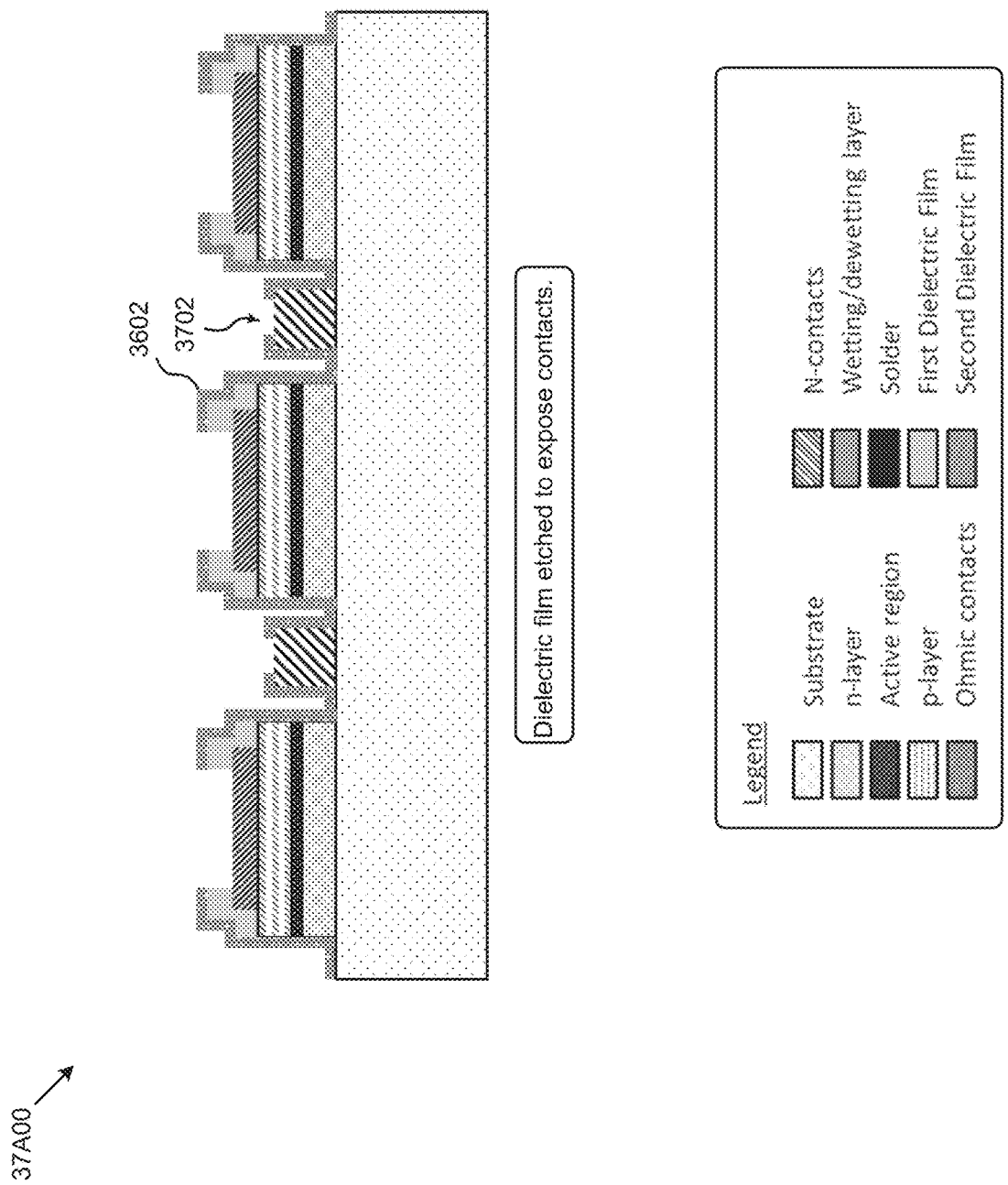

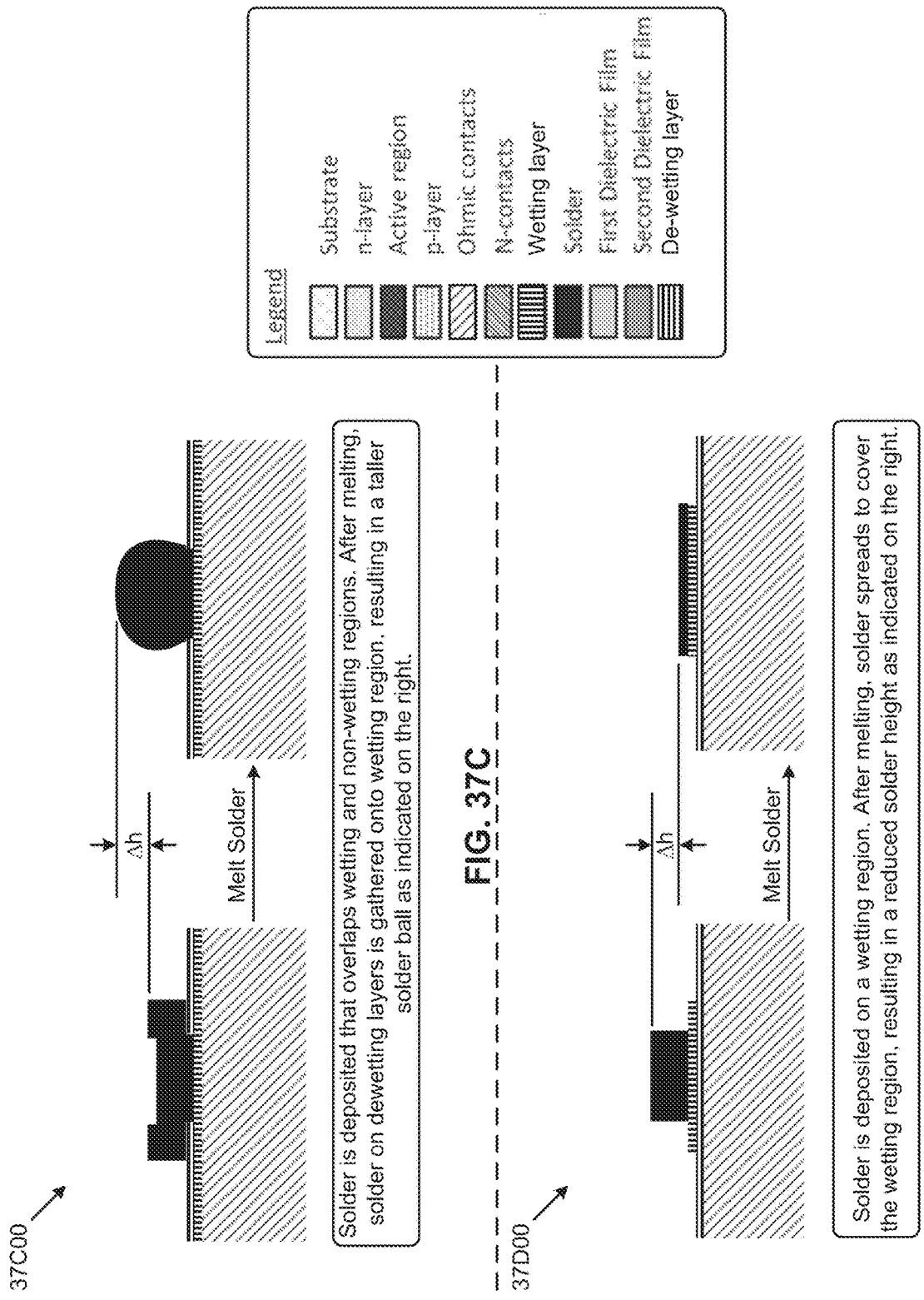

Die design with double corner n-contact.

Rhombus die design with single corner n-contact.

Square or rectangular die with various n- and p-contact patterns. The area can split between n and p contacts many ways (with different shapes of pads and including ring, bus-bar, and/or interdigitated contacts) with the goal of limiting die series resistance while maximizing the area of the p-contact.

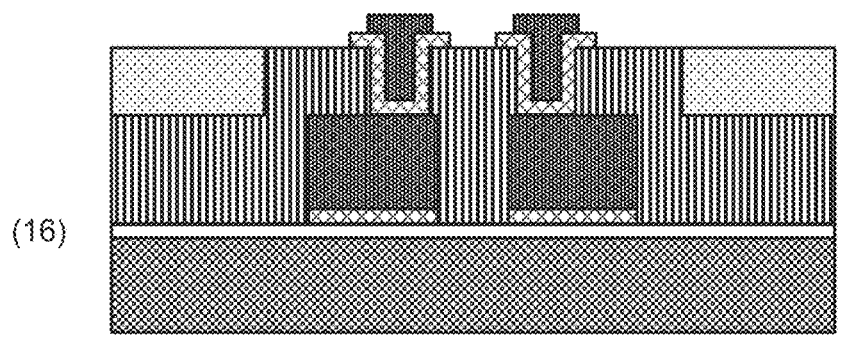
(16)
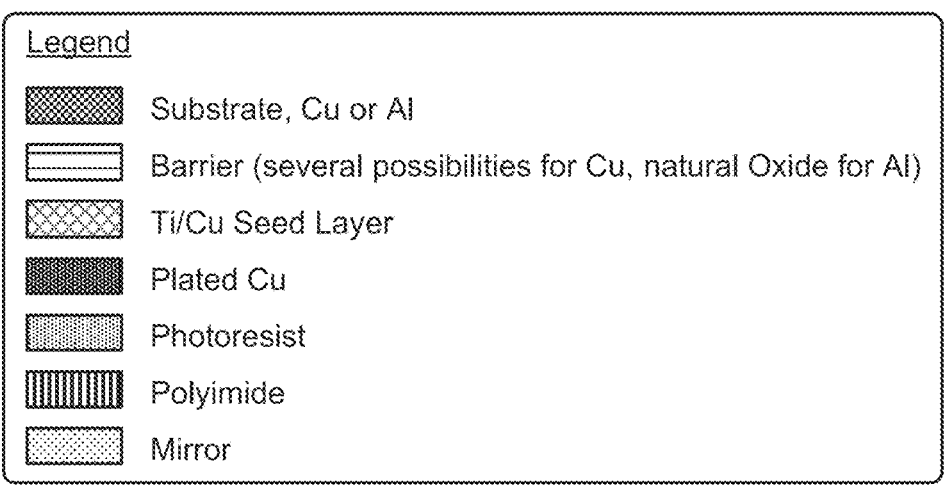
FIG. 50

5100
(1) 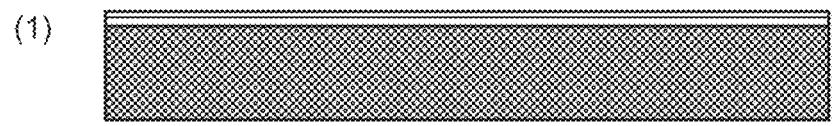
(2) 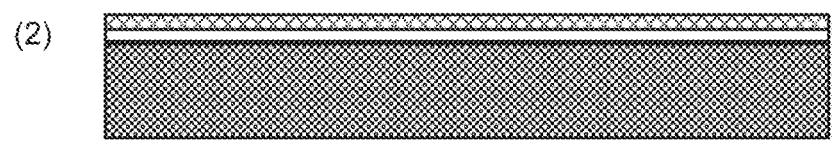
(3) 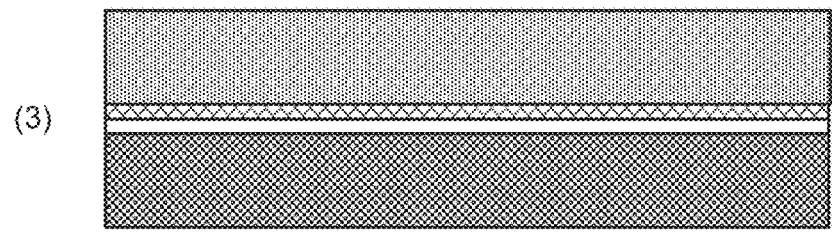
(4) 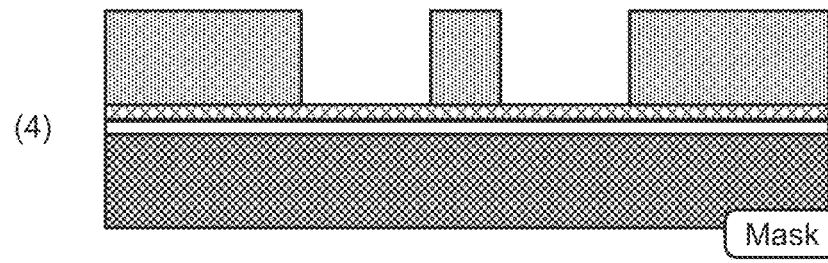
Mask 1
Legend
- Substrate, Cu or Al
- Barrier (several possibilities for Cu, natural Oxide for Al)
- Ti/Cu Seed Layer
- Plated Cu
- Photoresist
- Polyimide
- Mirror
FIG. 51

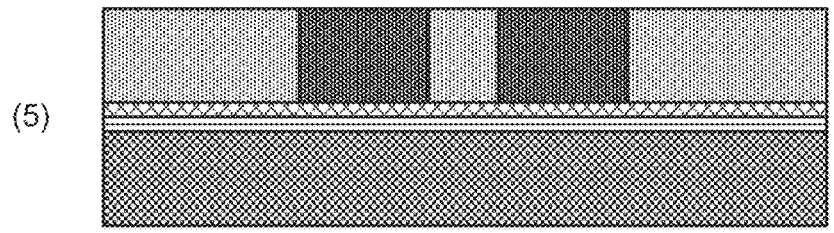
(5)
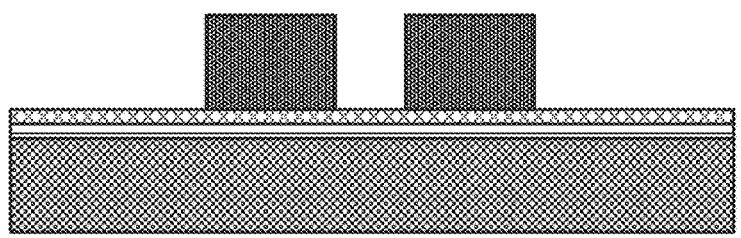
(6)
5210   5220
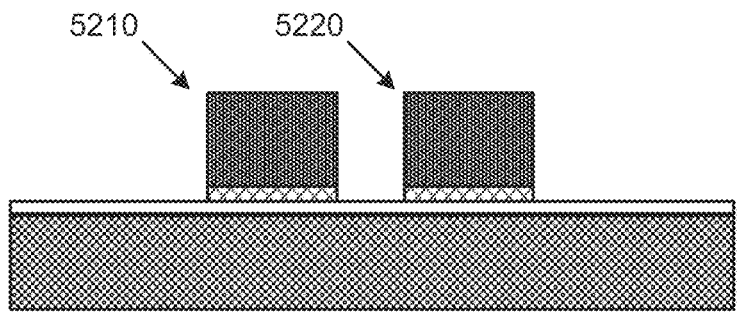
(7)
| Legend | |
|---|---|
| | Substrate, Cu or Al |
| | Barrier (several possibilities for Cu, natural Oxide for Al) |
| | Ti/Cu Seed Layer |
| | Plated Cu |
| | Photoresist |
| | Polyimide |
| | Mirror |
FIG. 52

5400
(11)
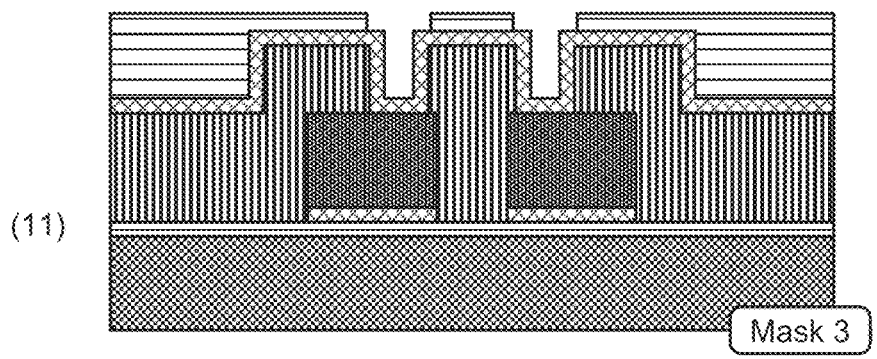
Mask 3
(12)
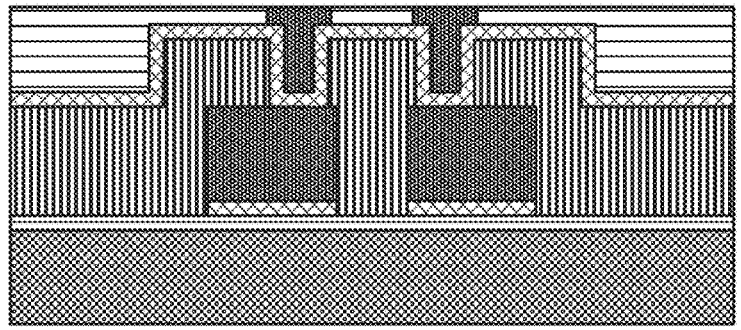
Legend
- Substrate, Cu or Al
- Barrier (several possibilities for Cu, natural Oxide for Al)
- Ti/Cu Seed Layer
- Plated Cu
- Photoresist
- Polyimide
- Mirror
FIG. 54

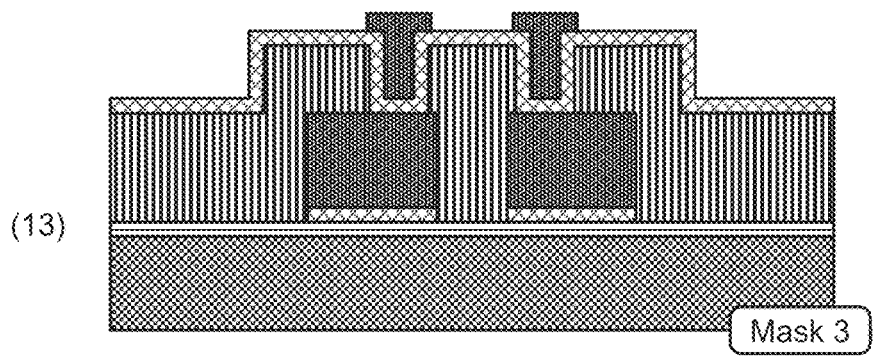
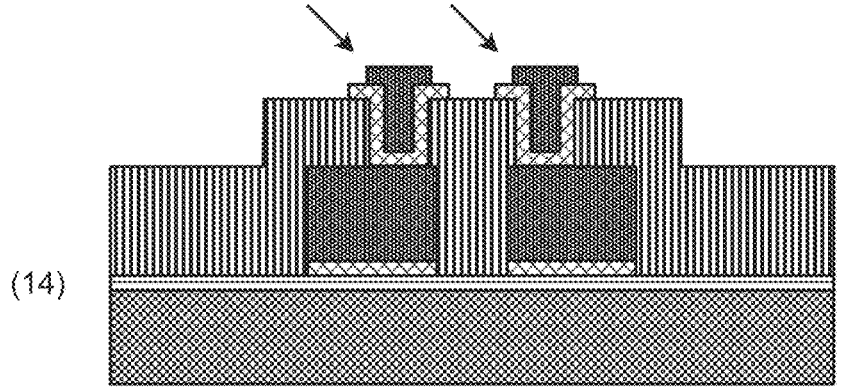
FIG. 55

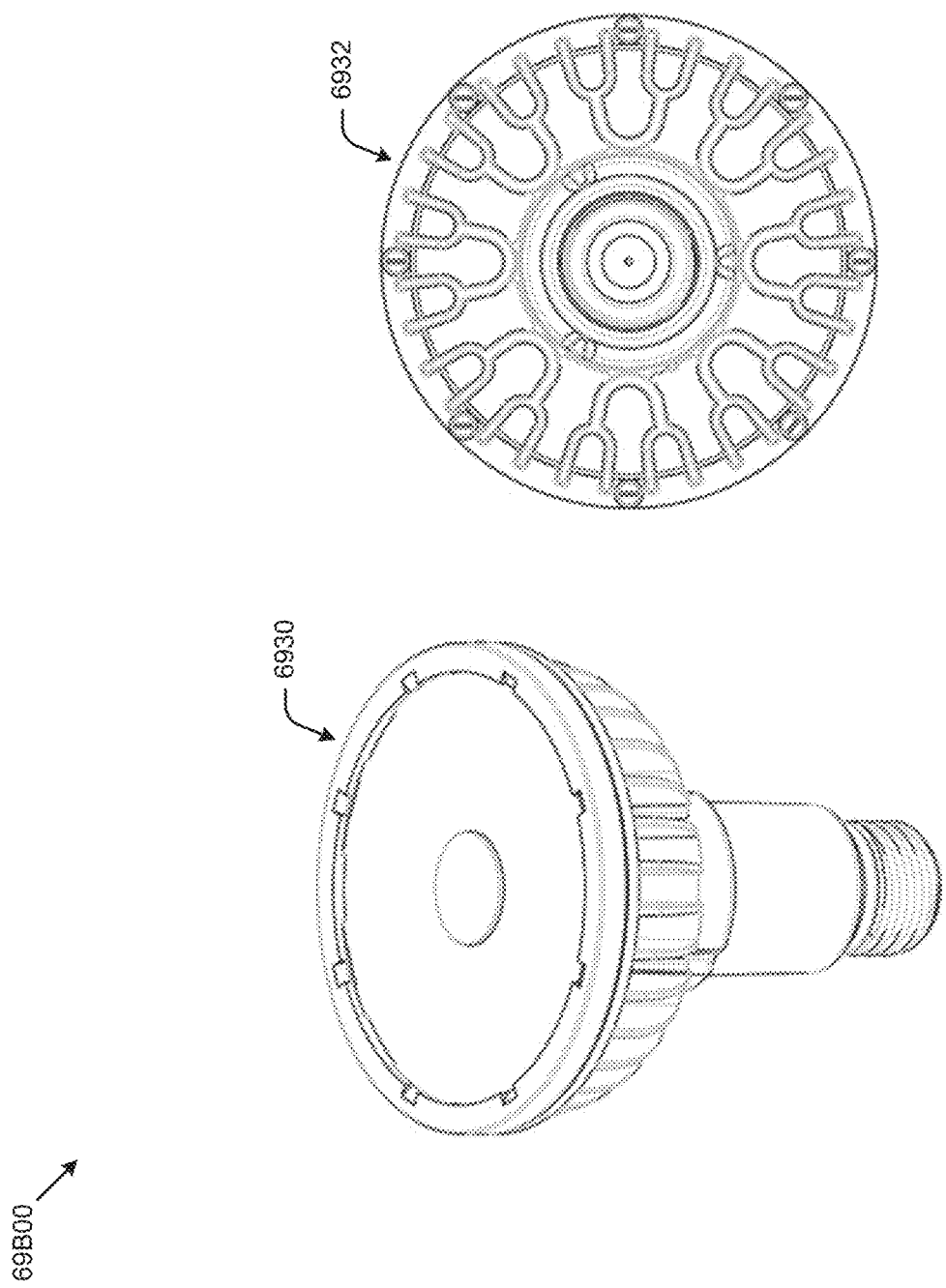

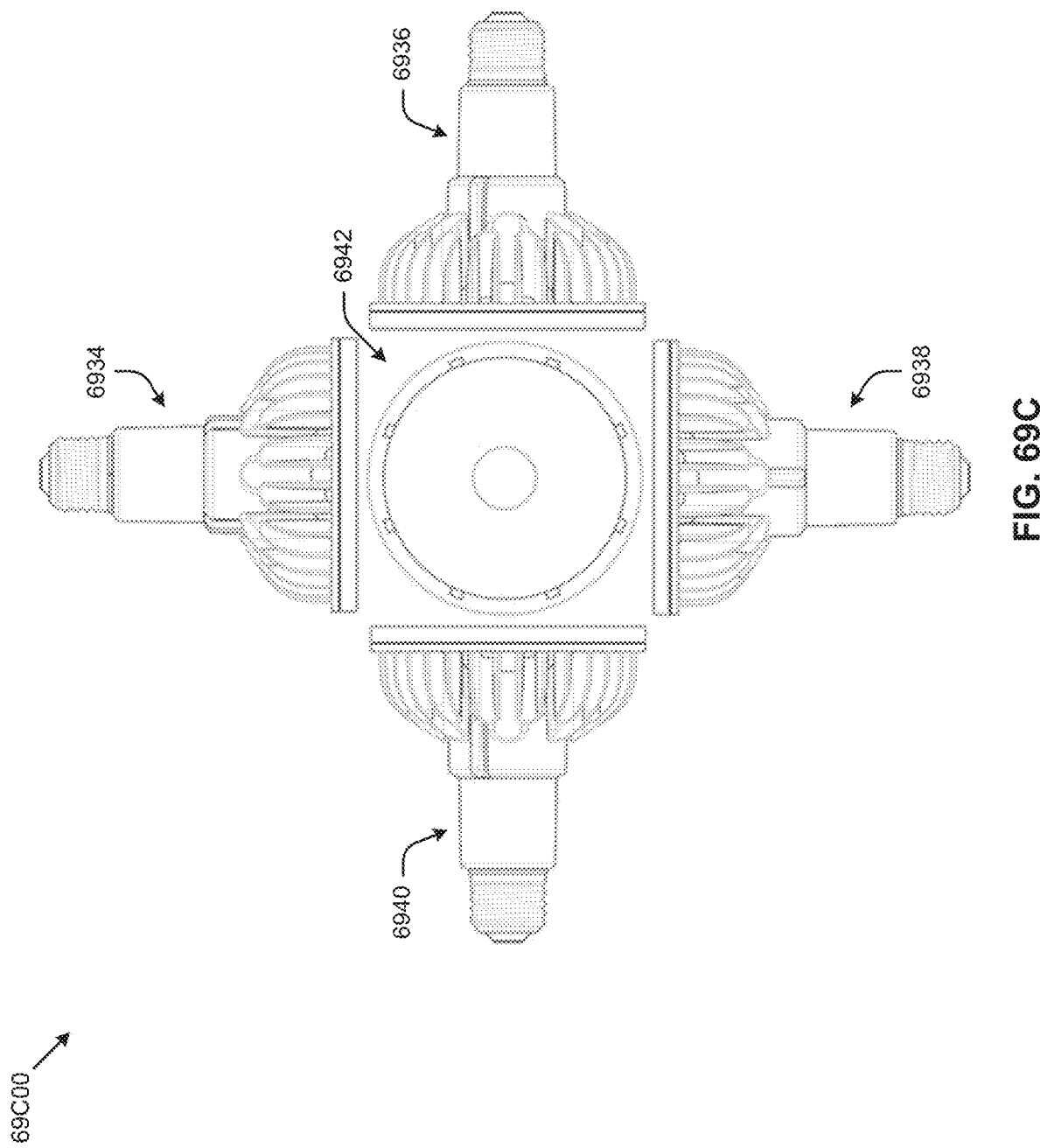

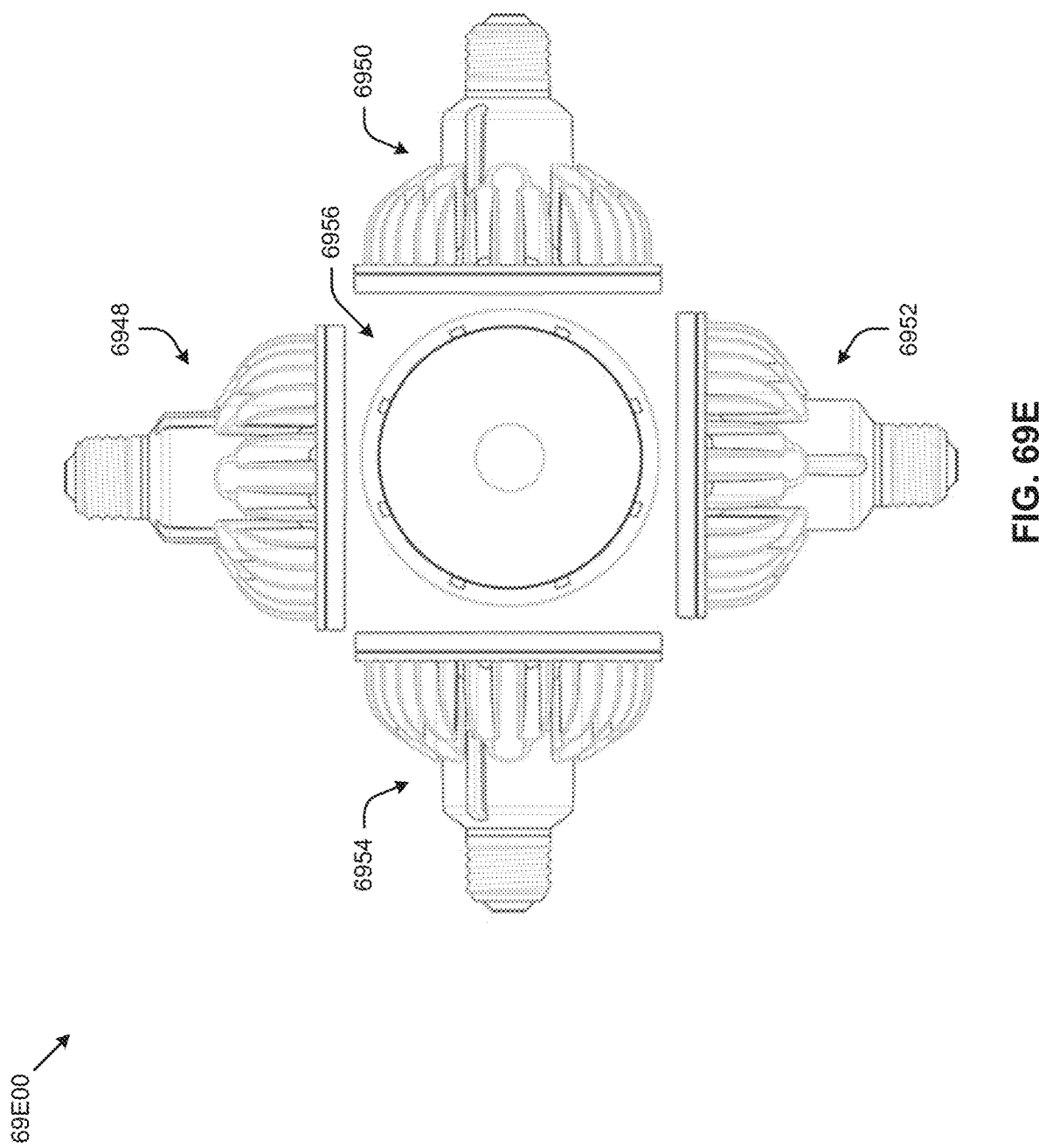

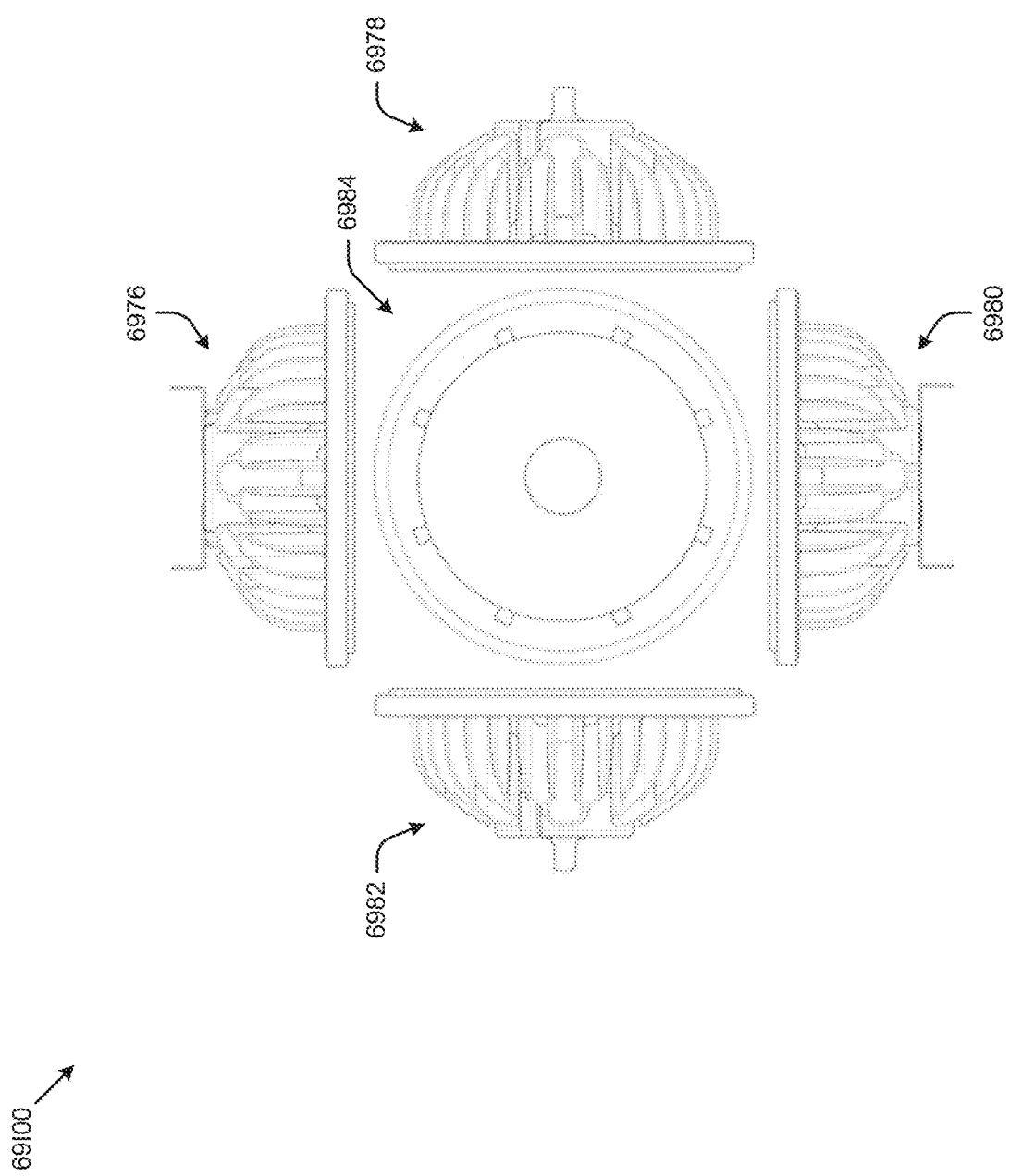

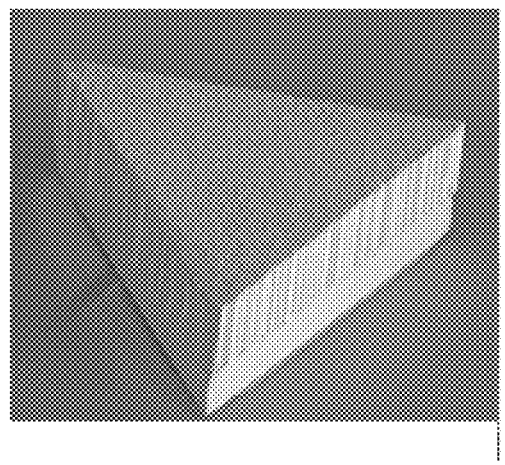
FIG. 70A1
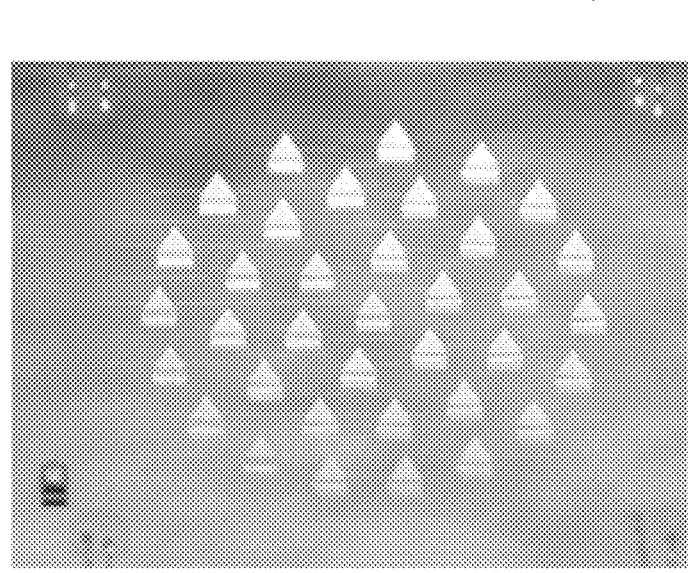
FIG. 70A2
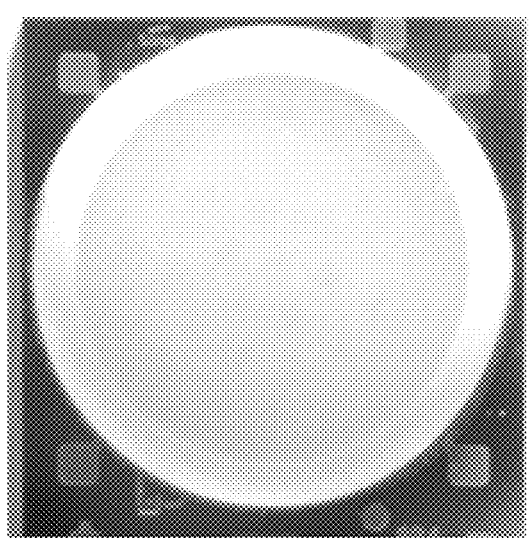
FIG. 70A3

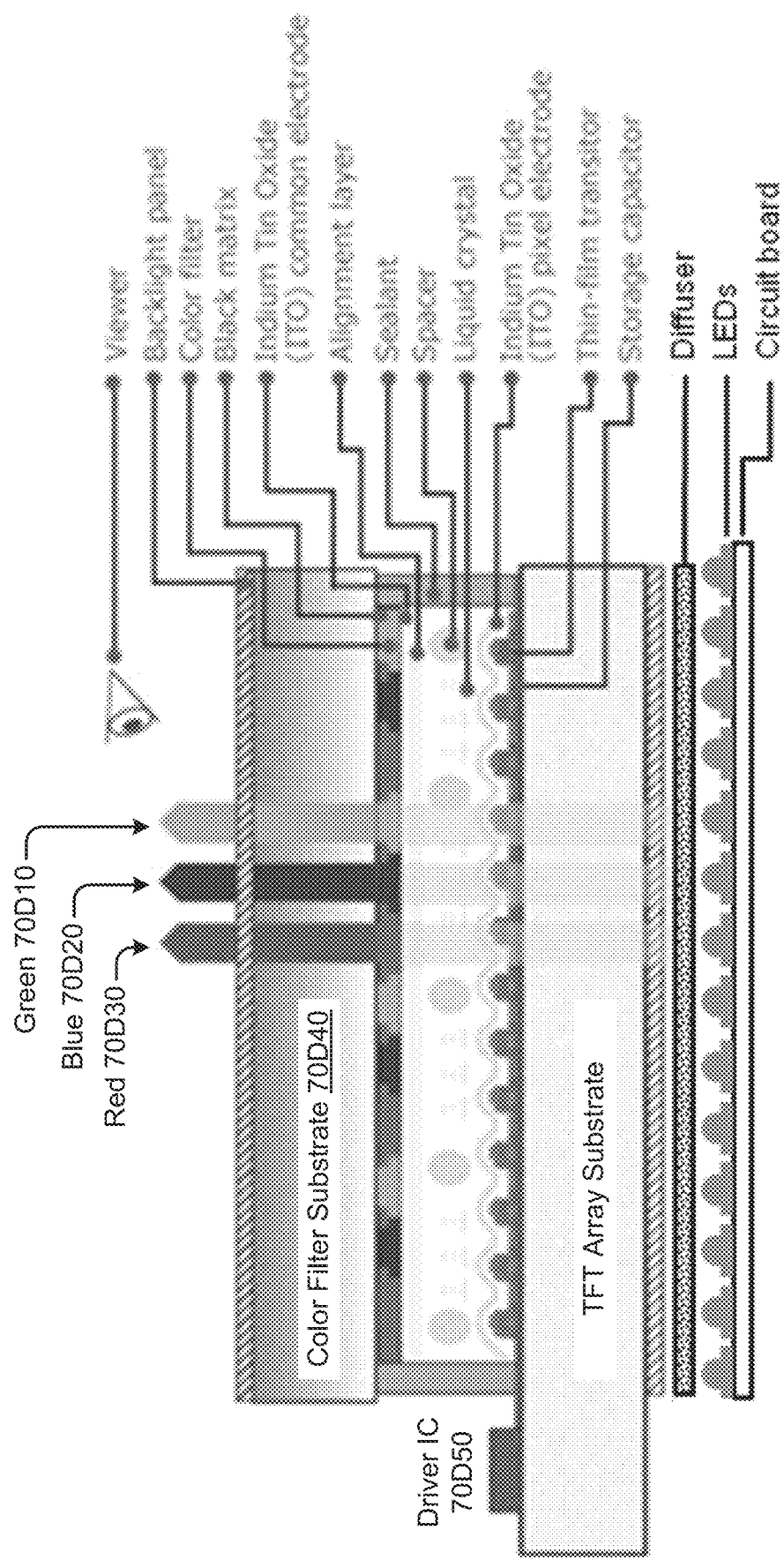
FIG. 70D1

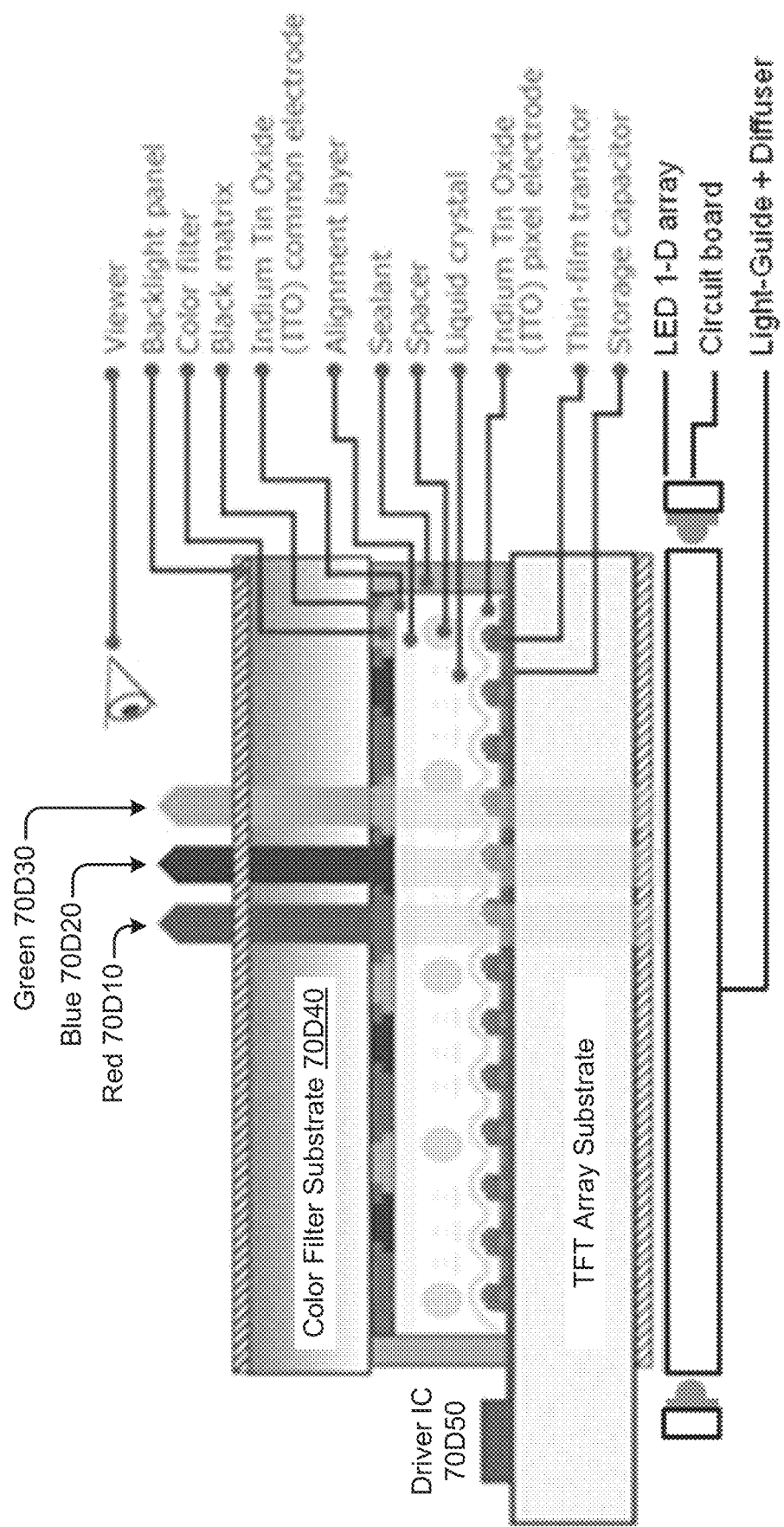
FIG. 70D2

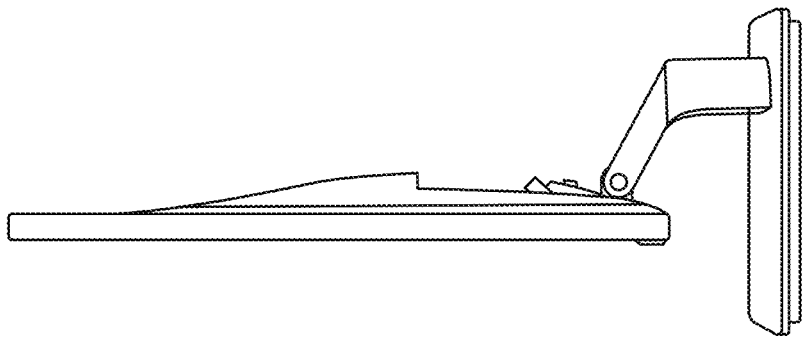
FIG. 70E2
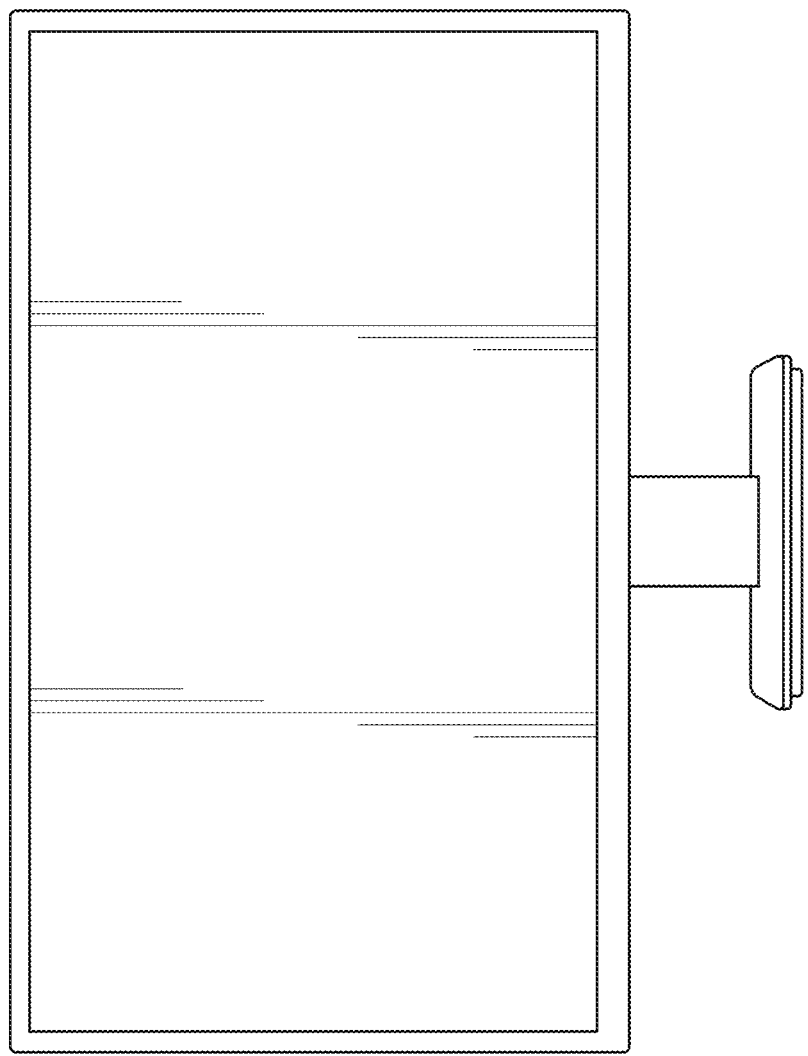
FIG. 70E1

HIGH-PERFORMANCE LED FABRICATION

This application is a continuation of U.S. application Ser. No. 15/785,950, filed Oct. 17, 2017, issued as U.S. Pat. No. 10,115,865, which is a continuation of U.S. application Ser. No. 15/418,268 filed on Jan. 27, 2017, issued as U.S. Pat. No. 9,831,388, which is continuation of U.S. application Ser. No. 14/615,315 filed on Feb. 5, 2015, issued at U.S. Pat. No. 9,583,678, which is continuation-in-part of U.S. application Ser. No. 14/040,379 filed on Sep. 27, 2013, issued as U.S. Pat. No. 9,293,644, which is a continuation-in-part of U.S. application Ser. No. 13/931,359 filed on Jun. 28, 2013, issued as U.S. Pat. No. 8,686,458, which claims the benefit under 35 U.S.C. § 119(e) of U.S. Provisional Application No. 61/778,002, filed on Mar. 12, 2013, and U.S. application Ser. No. 13/931,359 is a continuation of U.S. application Ser. No. 12/936,238 filed on Jul. 29, 2011, issued as U.S. Pat. No. 8,502,465, which claims priority to PCT International Application No. PCT/US2010/49531 filed on Sep. 20, 2010, and which claims priority to U.S. Provisional Application No. 61/243,988, filed on Sep. 18, 2009; and this application claims the benefit under 35 U.S.C. § 119(e) of U.S. Application No. 61/936,000 filed on Feb. 5, 2014; and this application claims the benefit under 35 U.S.C. § 119(e) of U.S. Application No. 61/989,693 filed on May 17, 2014; and this application claims the benefit under 35 U.S.C. § 119(e) of U.S. Application No. 62/093,855 filed on Dec. 18, 2014, each of which is incorporated by reference in its entirety.

FIELD

The disclosure relates to the field of LED-based lighting systems and more particularly to techniques for fabricating high-performance light-emitting diodes.

BACKGROUND

LEDs have been used for illumination products for decades, yet the performance of such LEDs has stalled, until now. Disclosed herein is a high-performance LED that exhibits exceptionally good efficiency while delivering extremely high reliability. Various legacy techniques have been attempted in an effort to improve efficiency, and reliability, yet such legacy techniques have failed to approach the efficiency and reliability of the structures disclosed herein. In addition to detailed descriptions of the structures that exhibit high efficiency and reliability, details are provided to teach various techniques for making high-performance light-emitting diodes using gallium- and nitrogen-containing materials.

The aforementioned legacy techniques do not reach desired performance levels for light-emitting diodes, therefore, there is a need for improvements.

SUMMARY

Accordingly, high-performance light-emitting diodes techniques for fabricating high-performance light-emitting diodes are disclosed.

Embodiments provided by the present disclosure address the challenges that emerge when creating high performance light-emitting LEDs. Some embodiments address reducing optical losses while addressing electrical distribution issues and thermal management issues in a single high-performance design. For example, this disclosure teaches techniques to minimize optical losses at the die and package level (e.g., packages for producing white light) while providing high-current electrical power distribution and without introducing extra optical losses and while providing thermal paths to efficiently remove heat from the different parts of the system. Some of the embodiments apply flip-chip die technologies to form multi-level highly reflective packages that are configured to distribute the locations of heat source points so as to facilitate heat management.

Conventional GaN-based LEDs are fabricated by epitaxial growth of device layers on foreign substrates, such as sapphire, Silicon Carbide (SiC), or Silicon (Si). In the case of sapphire, a lateral injection geometry is mandated due to the electrically insulating properties of sapphire. The lateral geometry may be top-emitting, through semi-transparent ohmic contact metallization, or bottom-emitting (i.e., "Flip-Chip, or FC geometry). Otherwise, the sapphire substrate may be removed and a thin-film approach employed, wherein the epitaxial device layers are transferred onto a carrier substrate or package element. For Si, for high light extraction efficiency, the Si substrate may be removed, mandating a thin-film approach. For SiC, either a lateral or thin-film approach is feasible.

For a fixed light output level, the main lever for reducing cost is by decreasing the LED semiconductor area required for the lighting product. Reducing the total LED chip area effectively increases semiconductor manufacturing plant output, while reducing the size of optics and other components used in final product assembly. Reducing chip size increases current density, but high external quantum efficiency may be maintained at high current density using epitaxial techniques of the present disclosure described below. Chip design also plays a role. Chip size reduction for lateral chips (either top or substrate emitting) is problematic as fabrication tolerances can reduce active area utilization as chip size is reduced. In the case of thin-film LEDs, power density uniformity is also a challenge.

This effect is illustrated in the embodiments of FIG. 1A through FIG. 1C and is contrasted in FIG. 2. FIG. 1A illustrates chip size reduction for thin-film lateral injection (e.g., thin-film-flip-chip shown) based LEDs. FIG. 1B illustrates vertical thin-film based LEDs, and FIG. 1C illustrates vertical injection bulk-substrate based LEDs. Lateral-injection devices (whether top or bottom contacted) require area for making both anode and cathode connections on the same side of the device. This fundamentally reduces active area utilization (portions of the die footprint are required for the cathode) and puts a practical limit on die size. In addition, for thin-film versions, severe current crowding occurs at high current densities, making it difficult to obtain high light output from small chips with good efficiency and reliability. What is needed is a technique or techniques to both improve power uniformity at the same time as reducing light loss. A flip-chip architecture exhibiting improved power uniformity and reduced light loss is depicted in FIG. 2 and techniques for how to make and use such a flip-chip LED is discussed herein.

For devices grown on insulating substrates (such as sapphire) or thinned-down devices with only a few μm of GaN, an additional problem is current crowding. Even if the GaN layer is highly doped, electrons will not spread efficiently at high current density across the lateral dimension of the die. This results in an uneven lateral current profile 1600 such as on FIG. 16A, with more electrons injected directly under the n-contact and fewer electrons father away from the contact. This is undesirable for several reasons; first, regions of higher current density will suffer more droop; second, light is emitted preferentially under the n-contact which may negatively impact light extraction; third, current crowding may negatively impact device reliability.

This disclosure provides a light emitting diode that include a bulk gallium and nitrogen containing substrate with a surface region. One or more active regions are formed overlying the surface region, with a current density of greater than about 175 Amps/cm$^2$ characterizing the one or more active regions. The device has an external quantum efficiency (EQE) of 40% (or 50%, 60%, 70%, 80%, 90%) and greater.

In an alternative embodiment, the disclosure provides an alternative type light emitting diode device, but which also includes a bulk gallium and nitrogen containing substrate and one or more active regions formed overlying the surface region. The device also has a current density of greater than about 200 A/cm$^2$ characterizing the active regions, and an emission characterized by a wavelength of 385 nm to 480 nm. In a specific embodiment, the device has desired red, green, blue, or other emitting phosphor materials operably coupled to the primary device emission to provide a white light source.

In another embodiment, the disclosure provides a light emitting diode device with a bulk gallium and nitrogen containing substrate having a non-polar orientation. The device also has active regions formed overlying the surface region and a current density of greater than about 500 A/cm$^2$ characterizing the active regions. The device has an emission characterized by a wavelength of 385 nm to 415 nm and one or more RGB or other color phosphor materials operably coupled to the emission to provide a white light source. In a further specific embodiment, the device has a current density of greater than about 500 A/cm$^2$ characterizing the active regions and an emission characterized by a wavelength of 385 nm to 415 nm.

In further embodiments, the disclosure provides a method of operating a light emitting diode device of the type described above. The method subjects the optical device to an electrical current such that a junction region of the active regions provides a current density of greater than about 200 Amps/cm$^2$ and outputs electromagnetic radiation having wavelengths between 385 nm to 480 nm. The device preferably includes a package enclosing at least the bulk gallium and nitrogen containing substrate and active regions. Preferably, the package is characterized by a thermal resistance of 15 or 10 or 5 or 1 degrees per Watt and less.

In certain embodiments, a light emitting diode provided by the present disclosure has an external quantum efficiency of at least 40%, at least 50%, and/or at least 60%, at a forward current density of at least 175 A/cm$^2$, at least 200 A/cm$^2$, at least 300 A/cm$^2$, at least 400 A/cm$^2$, at least 500 A/cm$^2$, at least 600 A/cm$^2$, at least 700 A/cm$^2$, at least 800 A/cm$^2$, at least 900 A/cm$^2$, and/or at least 1,000 A/cm$^2$ In certain embodiments, a light emitting diode exhibits any or all of the above external quantum efficiencies and forward current densities when operating at emission wavelengths from 405 nm to 430 nm, from 385 nm to 415 nm, from 385 nm to 480 nm, from 390 nm to 430 nm, or others. These values may apply for all or most of the recited wavelength ranges.

In another embodiment the light emitting diode device has a current density of greater than about 175 Amps/cm$^2$ characterizing the one or more active regions. Additionally, the device has an internal quantum efficiency (IQE) of at least 50%; and a lifetime of at least about 5000 hours operable at the current density.

In another embodiment, the bulk gallium and nitrogen containing substrate is n-doped. Further, the thickness of the LED can be optimized as follows:

1. The LED is formed to be thick enough (e.g., as shown in the example of FIG. 16B) to enable efficient lateral current spreading (e.g., see profile 1625) through the substrate and enable a uniform current density in the active region, across the device (e.g., across the lateral dimension of the device); and
2. The LED is sufficiently thin that vertical resistance does not negatively impact its performance.

Still further, the disclosure provides a method for manufacturing a light emitting diode device. The method includes providing a bulk gallium and nitrogen containing substrate having a surface region and forming first epitaxial material over the surface region. The device also includes one or more active regions formed overlying the epitaxial material preferably configured for a current density of greater than about 175 Amps/cm$^2$. The method can also include forming second epitaxial material overlying the active regions and forming contact regions.

The present disclosure provides an LED optical device with an active area utilization characterizing the active area, which is greater than 50%. In other embodiments, the utilization is >80%, >90%, or >95%. Also the disclosure enables a device with a ratio characterizing the emitting outer surface area to active region area of greater than 1, and in other embodiments, the ratio is >5, >10, or >100.

Still further, the present disclosure provides an apparatus, e.g., light bulb or fixture. The apparatus has one or more LEDs having a cumulative die surface area of less than about 1 mm$^2$ and configured to emit at least 300 lumens. In a specific embodiment, the LEDs consists of a single LED fabricated from a gallium and nitrogen containing material having a semipolar, polar, or non-polar orientation. If more than one LED is provided they are preferably configured in an array.

Typically, the LED has an active junction area of a size with an active junction area of less than about 1 mm$^2$, is less than about 0.75 mm$^2$, is less than about 0.5 mm$^2$, is less than about 0.3 mm$^2$. In a specific embodiment, the apparatus emits at least 300 lumens, at least 500 lumens, or at least 700 lumens. In a specific embodiment, the emission is substantially white light or in ranges of 390-415 nm, 415-440 nm, 440-470 nm, and others. In other embodiments, the LED is characterized by an input power per active junction area of greater than 2 watts/mm$^2$, of greater than 3 watts/mm$^2$, of greater than 5 watts/mm$^2$, of greater than 10 watts/mm$^2$, of greater than 15 watts/mm$^2$, of greater than 20 watts/mm$^2$, or others. Depending upon the embodiment, the LED is characterized by a lumens per active junction area of greater than 300 lm/mm$^2$, for a warm white emission with a CCT of less than about 5000K and CRI of greater than about 75. Alternatively, the LED is characterized by a lumens per active junction area of greater than 400 lm/mm$^2$ for a warm white emission with a CCT of greater than about 5000K and CRI of greater than about 75. Alternatively, the LEDs is characterized by a lumens per active junction area of greater than 600 lm/mm$^{2'}$ for a warm white emission with a CCT of greater than about 5,000K and CRI of greater than about 75. Alternatively, the LEDs is characterized by a lumens per active junction area of greater than 800 lm/mm$^2$, for a warm white emission with a CCT of greater than about 5000K and CRI of greater than about 75.

The LEDs described herein can have a current density of greater than about 175 Amps/cm$^2$ characterizing the active regions and an external quantum efficiency characterized by a roll off of less than about 5% in absolute efficiency, as measured from a maximum value compared to the value at a predetermined increased operating current density, and an emission characterized by a wavelength of 390 nm to 480 nm.

The present LED is operable at a junction temperature greater than 100° C., greater than 150° C., and/or greater than 200° C., and even higher. In some embodiments, the present device is operable in un-cooled state and under continuous wave operation. The present LED device also has a current density that may range from about 175 A/cm$^2$ to about 1 kA/cm$^2$ or more. In one or more embodiments, the current density is also about 400 A/cm$^2$ to 800 A/cm$^2$.

The device and method herein provide for higher yields over conventional techniques in fabricating LEDs. In other embodiments, the present method and resulting structure are easier to form using conventional techniques and gallium and nitrogen containing substrate materials having polar, non-polar or semipolar surface orientations. The present disclosure provides a resulting device and method for high current density LED devices having smaller feature sizes and substantially no "Droop." In an exemplary embodiment, the device provides a resulting white light fixture that uses substantially reduced LED semiconductor area, as compared to conventional devices. In an exemplary embodiment, the present LED active region designs are configured for reducing droop, enabling chip architectures that operate efficiently at high current densities.

In a first aspect, light emitting flip-chip on mirror apparatus are provided comprising an electrically-conductive n-doped bulk GaN-containing substrate; an epitaxially-grown n-type layer overlying the substrate; an epitaxially-grown active region overlying the epitaxially-grown n-type layer; an epitaxially-grown p-type layer overlying the epitaxially-grown active region; an p-contact overlying at least a portion of the p-type layer; an opening through the epitaxially-grown p-type layer and active region that exposes n-type material; an n-contact formed in the opening to provide an electrically-conductive path to the substrate; a submount comprising, at least a first conductive lower mirror region and a second conductive lower mirror region to provide separate electrical connection to the n-contact and p-contact; an insulating layer; a third mirror region overlying a gap between the first conductive lower mirror region and the second conductive lower mirror to provide a higher reflectivity than the submount; a first metal containing composition in direct contact with at least a portion of the first lower mirror region and in electrical contact with the p-contact, and a second metal containing composition in direct contact with at least a portion of the second lower mirror region and in electrical contact with the n-contact.

In a second aspect, lighting systems are provided comprising a base member configurable to provide an electrical connection to a power source; at least one light emitting diode die, electrically connected to the power source comprising: an electrically-conductive n-doped bulk GaN-containing substrate that is greater than or equal to 20 microns thick; an epitaxially-grown n-type layer overlying the substrate; an epitaxially-grown active region overlying the epitaxially-grown n-type layer; an epitaxially-grown p-type layer overlying the epitaxially-grown active region; an p-contact overlying at least a portion of the p-type layer; an opening through the epitaxially-grown p-type layer and active region that exposes n-type material; an n-contact formed in the opening to provide an electrically-conductive path to the substrate; a submount comprising, at least a first conductive lower mirror region and a second conductive lower mirror region to provide separate electrical connection to the n-contact and p-contact; an insulating layer; a third mirror region overlying a gap between the first conductive lower mirror region and the second conductive lower mirror to provide a higher reflectivity than the submount; a first metal containing composition in direct contact with at least a portion of the first lower mirror region and in electrical contact with the p-contact, and a second metal containing composition in direct contact with at least a portion of the second lower mirror region and in electrical contact with the n-contact.

A further understanding of the nature and advantages of the present disclosure may be realized by reference to the specification and attached drawings.

BRIEF DESCRIPTION OF THE DRAWINGS

Those skilled in the art will understand that the drawings, described herein, are for illustration purposes only. The drawings are not intended to limit the scope of the present disclosure.

FIG. 1A, FIG. 1B, and FIG. 1C present illustrations of several chip architectures.

FIG. 2 illustrates active area utilization (ratio of active area to device footprint) as a function of chip width for lateral chip designs compared with other designs, assuming lithography tolerances of 5 μm, a die-attach tolerance of 25 μm, and a bump diameter of 75 μm.

FIG. 19E1 depicts current crowding in various regions of an LED die as predicted by simulations.

FIG. 19E2 depicts current crowding in various regions of an LED die as predicted by simulations.

FIG. 19G1 and FIG. 19G2 show the forward voltage (Vf) and wall plug efficiency (WPE) respectively as a function of resistivity of the n-type GaN substrate.

FIG. 19H1 and FIG. 19H2 show the two-dimensional current density map and cross section of the current density when the resistivity of the n-GaN substrate is 1E-2 Ohm cm with a thick n-GaN substrate (~150 μm).

FIG. 19I1 and FIG. 19I2 show the two-dimensional current density map and cross section of the current density when the resistivity of the n-GaN substrate is 1E-1 Ohm cm with a thick n-GaN substrate (~150 μm).

FIG. 20A1 is a side view of a LED subassembly 1A100 with flip-chip style contacts to a high-performance light-emitting diode, according to some embodiments.

FIG. 20A2 is a side view of a LED subassembly 1A200 with a wire-bond contact to a high-performance light-emitting diode, according to some embodiments.

FIG. 20B shows electrically isolated mirror segments covered by a transparent dielectric layer to protect the mirror from chemical attack and permit maximum reflectance from the mirror, according to some embodiments.

FIG. 20C shows a transparent dielectric layer to encapsulate the mirror segments and electrically isolate the mirror segments for forming a submount used in fabricating a high-performance light-emitting diode, according to some embodiments.

FIG. 20D shows a patterned upper mirror segment with a protective dielectric coating to reflect light that would otherwise pass between lower mirror segments as used in fabrication of a high-performance light-emitting diode, according to some embodiments.

FIG. 20E shows another transparent dielectric layer to encapsulate the upper mirror segments and etched holes for electrical contacts to the lower mirror segments as used in a submount for a high-performance light-emitting diode, according to some embodiments.

FIG. 21A shows a submount subassembly having a seed layer patterned before depositing the metal mirror stack and exposed for plating by etching to form a submount, according to some embodiments.

FIG. 21B shows a patterned plating seed layer used to facilitate contact formation with a plating process as used to form a submount for a high-performance light-emitting diode, according to some embodiments.

FIG. 21C shows a patterned mirror and protective dielectric segments covering the seed layer to prevent light from being absorbed in the seed layer, according to some embodiments.

FIG. 21D shows a patterned upper mirror segment with protective dielectric coating to reflect light that would otherwise pass between lower mirror segments. It also illustrates a transparent dielectric layer to encapsulate the lower mirror segments and isolate them from the upper mirror segments, according to some embodiments.

FIG. 22A depicts a submount subassembly having a plating seed layer and a metal mirror stack deposited and patterned in contemporaneous steps and the final plated pad, according to some embodiments.

FIG. 22B1 shows patterned segments consisting of a plating seed layer, a metal mirror stack, and a transparent protective dielectric coating, according to some embodiments.

FIG. 22B2 shows patterned segments consisting of a metal mirror stack, and a transparent protective dielectric coating, according to some embodiments.

FIG. 22C shows a patterned upper mirror segment with protective dielectric coating to reflect light that would otherwise pass between lower mirror segments, according to some embodiments.

FIG. 23A shows a submount wherein the metal mirror is made discontinuous by a deposition over a self-aligned dielectric pillar, according to some embodiments.

FIG. 23B shows layers of the dielectric pillar prior to etching, according to some embodiments.

FIG. 23C shows an etched dielectric pillar with the middle layer undercut by the etching process to create a break in the subsequent metal mirror stack, according to some embodiments.

FIG. 23D shows a metal mirror stack that is deposited using a directional process so the sidewall of the dielectric pillar is not coated, according to some embodiments.

FIG. 23E shows a transparent dielectric film encapsulating the metal mirror stack to protect it against chemical attack, according to some embodiments.

FIG. 37A shows areas of a dielectric film that are etched to expose n-contacts and p-contacts, according to some embodiments.

FIG. 37C and FIG. 37D depict solder deposition and melting, according to some embodiments.

FIG. 50 depicts a subassembly comprising a highly thermally conductive, electrically isolated mirror submount with buried routing traces for use as a submount for a high-performance light-emitting diode, according to some embodiments.

FIG. 51 depicts a series of steps of a fabrication process for forming a thermally conductive and highly reflective submount having buried routing traces for use in assembling a high-performance light-emitting diode, according to some embodiments.

FIG. 52 depicts a series of steps of a fabrication process for forming a thermally conductive and highly reflective submount having buried routing traces for use in assembling a high-performance light-emitting diode, according to some embodiments.

FIG. 54 depicts a series of steps of a fabrication process for forming a thermally conductive and highly reflective submount having buried routing traces for use in assembling a high-performance light-emitting diode, according to some embodiments.

FIG. 55 depicts a series of steps of a fabrication process for forming a thermally conductive and highly reflective submount having buried routing traces for use in assembling a high-performance light-emitting diode, according to some embodiments.

FIG. 69A through FIG. 69I depict lamp system embodiments, according to some embodiments.

FIG. 70A1 through FIG. 70I depict light emitting diodes as applied toward lighting applications, according to some embodiments.

DETAILED DESCRIPTION

Figure 3:
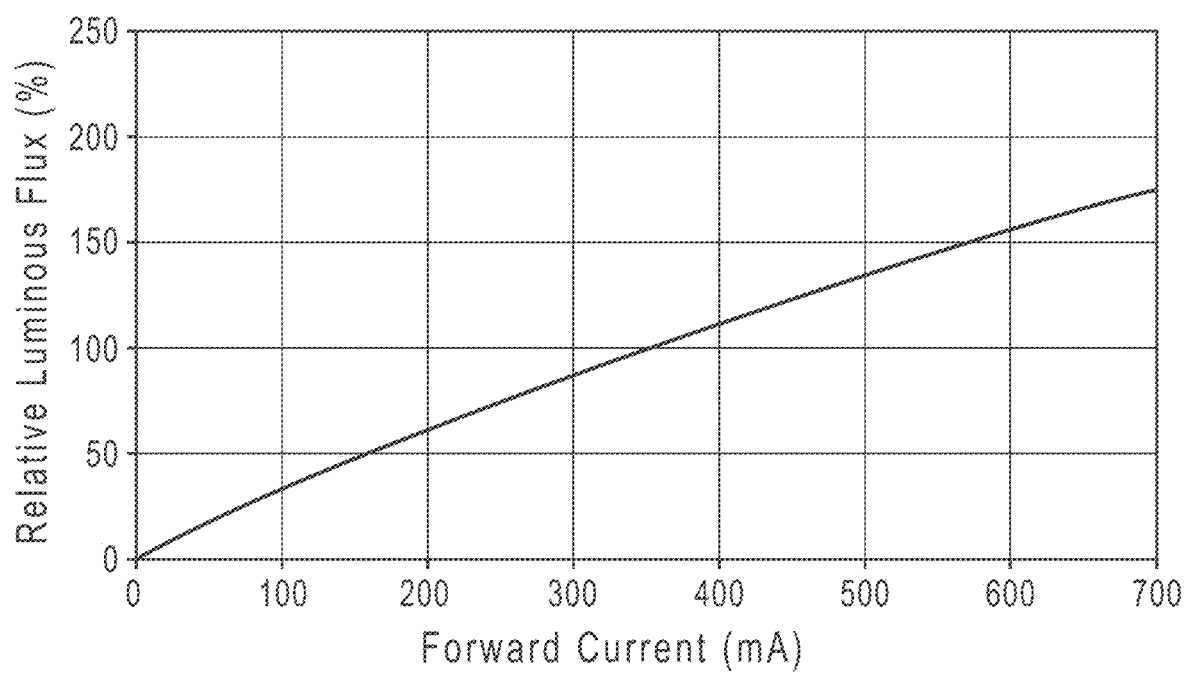
FIG. 3 shows a sample plot of relative luminous flux as a function of injection current for a conventional LED, a Cree XP-E white LED with junction temperature of 25° C.

The term "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

The term "or" is intended to mean an inclusive "or" rather than an exclusive "or". That is, unless specified otherwise, or is clear from the context, "X employs A or B" is intended to mean any of the natural inclusive permutations. That is, if X employs A, X employs B, or X employs both A and B, then "X employs A or B" is satisfied under any of the foregoing instances. In addition, the articles "a" and "an" as used in this application and the appended claims should generally be construed to mean "one or more" unless specified otherwise or is clear from the context to be directed to a singular form.

The term "logic" means any combination of software or hardware that is used to implement all or part of the disclosure.

The term "non-transitory computer readable medium" refers to any medium that participates in providing instructions to a logic processor.

A "module" includes any mix of any portions of computer memory and any extent of circuitry including circuitry embodied as a processor.

The compositions of matter referred to in the present disclosure comprise various compositions of matter. The compositions of wavelength-converting materials referred to in the present disclosure comprise various wavelength-converting materials.

Wavelength conversion materials can be crystalline (single or poly), ceramic or semiconductor particle phosphors, ceramic or semiconductor plate phosphors, organic or inorganic downconverters, upconverters (anti-stokes), nanoparticles and other materials which provide wavelength conversion. Major classes of downconverter phosphors used in solid-state lighting include garnets doped at least with $Ce^{3+}$; nitridosilicates, oxynitridosilicates or oxynitridoaluminosilicates doped at least with $Ce^{3+}$; chalcogenides doped at least with $Ce^{3+}$; silicates or fluorosilicates doped at least with $Eu^{2+}$; nitridosilicates, oxynitridosilicates, oxynitridoaluminosilicates or sialons doped at least with $Eu^{2+}$; carbidonitridosilicates or carbidooxynitridosilicates doped at least with $Eu^{2+}$; aluminates doped at least with $Eu^{2+}$; phosphates or apatites doped at least with $Eu^{2+}$; chalcogenides doped at least with $Eu^{2+}$; and oxides, oxyfluorides or complex fluorides doped at least with $Mn^{4+}$. Some specific examples are listed below:

$(Ba,Sr,Ca,Mg)_5(PO_4)_3(Cl,F,Br,OH):Eu^{2+}, Mn^{2+}$ $(Ca,Sr,Ba)_3MgSi_2O_8:Eu^{2+}, Mn^{2+}$ $(Ba,Sr,Ca)MgAl_{10}O_{17}:Eu^{2+}, Mn^{2+}$ $(Na,K,Rb,Cs)_2[(Si,Ge,Ti,Zr,Hf,Sn)F_6]:Mn^{4+}$ $(Mg,Ca,Zr,Ba,Zn)[(Si,Ge,Ti,Zr,Hf,Sn)F_6]:Mn^{4+}$ $(Mg,Ca,Sr,Ba,Zn)_2SiO_4:Eu^{2+}$ $(Sr,Ca,Ba)(Al,Ga)_2S_4:Eu^{2+}$ $(Ca,Sr)S:Eu^{2+},Ce^{3+}$ $(Y,Gd,Tb,La,Sm,Pr,Lu)_3(Sc,Al,Ga)_5O_{12}:Ce^{3+}$

The group:

$$Ca_{1-x}Al_{x-xy}Si_{1-x+xy}N_{2-x-xy}C_{xy}:A \quad (1);$$

$$Ca_{1-x-z}Na_zM(III)_{x-xy-z}Si_{1-x+xy+z}N_{2-x-xy}C_{xy}:A \quad (2);$$

$$M(II)_{1-x-z}M(I)_zM(III)_{x-xy-z}Si_{1-x+xy+z}N_{2-x-xy}C_{xy}:A \quad (3);$$

$$M(II)_{1-x-z}M(I)_zM(III)_{x-xy-z}Si_{1-x+xy+z}N_{2-x-xy-2w/3}C_{xy}O_{w-v/2}H_v:A \quad (4);$$

and $$M(II)_{1-x-z}M(I)_zM(III)_{x-xy-z}Si_{1-x+xy+z}N_{2-x-xy-2w/3-v/3}C_{xy}O_wH_v:A \quad (4a),$$

where $0<x<1$, $0<y<1$, $0\leq z<1$, $0\leq v<1$, $0<w<1$, $x+z<1$, $x>xy+z$, and $0<x-xy-z<1$, M(II) is at least one divalent cation, M(I) is at least one monovalent cation, M(III) is at least one trivalent cation, H is at least one monovalent anion, and A is a luminescence activator doped in the crystal structure.

$Ce_x(Mg,Ca,Sr,Ba)_y(Sc,Y,La,Gd,Lu)_{1-x-y}Al(Si_{6-z+y}Al_{z-y})(N_{10-z}O_z)$ (where $x,y<1$, $y\geq 0$ and $z\sim 1$)

$(Mg,Ca,Sr,Ba)(Y,Sc,Gd,Tb,La,Lu)_2S_4:Ce^{3+}$ $(Ba,Sr,Ca)_xSi_yN_z:Eu2+$ (where $2x+4y=3z$)

$(Y,Sc,Lu,Gd)_{2-n}Ca_nSi_4N_{6+n}C_{1-n}:Ce^{3+}$, (where $0\leq n\leq 0.5$)

$(Lu,Ca,Li,Mg,Y)$ alpha-SiAlON doped with $Eu^{2+}$ and/or $Ce^{3+}$ $(Ca,Sr,Ba)SiO_2N_2:Eu^{2+},Ce^{3+}$ $(Sr,Ca)AlSiN_3:Eu^{2+}$ $CaAlSi(ON)_3:Eu^{2+}$ $(Y,La,Lu)Si_3N_5:Ce^{3+}$ and $(La,Y,Lu)_3Si_6N_{11}:Ce^{3+}$.

For purposes of the application, it is understood that when a phosphor has two or more dopant ions (i.e. those ions following the colon in the above phosphors), this is to mean that the phosphor has at least one (but not necessarily all) of those dopant ions within the material. That is, as understood by those skilled in the art, this type of notation means that the phosphor can include any or all of those specified ions as dopants in the formulation. Further, it is to be understood that nanoparticles, quantum dots, semiconductor particles, and other types of materials can be used as wavelength converting materials. The list above is representative and should not be taken to include all the materials that may be utilized within embodiments described herein.

This disclosure relates generally to lighting techniques, and in particular to techniques for high current density LED devices fabricated on bulk gallium and nitrogen containing polar, semipolar or nonpolar materials. The disclosure can be applied to lighting systems and to lighting applications such as white lighting, multi-colored lighting, flat panel display lighting, other optoelectronic devices, and similar illumination products.

The disclosure herein relates to making and using a light emitting diode device emitting at a wavelength of 390 nm to 470 nm or at a wavelength of 405 nm to 430 nm. Some of the disclosed embodiments address the desirability of uniform current density across the active region, and some of the device embodiments comprise a bulk gallium and nitrogen containing substrate with a growth to form an active region. Exemplary devices are characterized by having a geometric relationship (e.g., aspect ratio) between a lateral dimension of the device and a vertical dimension of the device such that the geometric aspect ratio forms a volumetric LED that delivers a substantially flat current density across the device (e.g., as measured across a lateral dimension of the active region). Moreover, exemplary devices are characterized by having a current density in the active region of greater than about 175 Amps/cm$^2$.

The herein-disclosed breakthroughs in the field of GaN-based optoelectronics have demonstrated the great potential of devices fabricated on bulk polar, nonpolar and semipolar GaN substrates. For any surface orientation, the bulk native substrate provides for simplified device geometry that may be scaled down to provide lower costs (in dollars per lumen) compared to approaches based on foreign substrates like sapphire SiC, or Si. Furthermore, the reduced dislocation densities provided by bulk GaN offer assurance of high reliability at high current densities, which is not guaranteed by foreign substrate approaches.

An LED may be fabricated on a bulk gallium nitride substrate. The gallium nitride substrate may be sliced from a boule that was grown by hydride vapor phase epitaxy or ammonothermally, or via a flux method, or other methods. In one specific embodiment, the gallium nitride substrate is fabricated by a combination of hydride vapor phase epitaxy and ammonothermal growth, as disclosed in U.S. Patent Application No. 61/078,704, filed on Jul. 7, 2008, which is incorporated by reference in its entirety. The boule may be grown in the c-direction, the m-direction, the a-direction, or in a semi-polar direction on a single-crystal seed crystal. Semipolar planes may be designated by (hkil) Miller indices, where i=−(h+k), l is nonzero and at least one of h and k are nonzero. The gallium nitride substrate may be cut, lapped, polished, and chemical-mechanically polished. The gallium nitride substrate orientation may be within ±5 degrees, ±2 degrees, ±1 degree, or ±0.5 degrees of the {0001} c plane, the {1 −1 0 0} m plane, the {1 1 −2 0} a plane, the {1 1 −2 2} plane, the {2 0 −2 ±1} plane, the {1 −1 0 ±1} plane, the {1 0 −1 ±1} plane, the {1 −1 0 −±2} plane, or the {1 −1 0 ±3} plane. The gallium nitride substrate may have a dislocation density in the plane of the large-area surface that is less than 10$^6$ cm$^{-2}$, less than 10$^5$ cm$^{-2}$, less than 10$^4$ cm$^{-2}$, or less than 10$^3$ cm$^{-2}$.

An LED is fabricated on the gallium nitride substrate according to methods that are known in the art, for example, following the methods disclosed in U.S. Pat. No. 7,053,413, and U.S. Application Publication No. 2013/0075770 each of which is incorporated by reference in its entirety. At least one Al$_x$In$_y$Ga$_{1-x-y}$N layer, where 0≤x≤1, 0≤y≤1, and 0≤x+y≤1, is deposited on the substrate, for example, following the methods disclosed by U.S. Pat. Nos. 7,338,828 and 7,220,324, which are hereby incorporated by reference in their entirety. The at least one Al$_x$In$_y$Ga$_{1-x-y}$N layer may be deposited by metal-organic chemical vapor deposition, by molecular beam epitaxy, by hydride vapor phase epitaxy, or by a combination thereof. In one embodiment, the Al$_x$In$_y$Ga$_{1-x-y}$N layer comprises an active layer that preferentially emits light when an electrical current is passed through it. In one specific embodiment, the active layer comprises a single quantum well, with a thickness between about 0.5 nm and about 40 nm. In a specific embodiment, the active layer comprises a single quantum well with a thickness between about 1 nm and about 5 nm. In other embodiments, the active layer comprises a single quantum well with a thickness between about 5 nm and about 10 nm, between about 10 nm and about 15 nm, between about 15 nm and about 20 nm, between about 20 nm and about 25 nm, between about 25 nm and about 30 nm, between about 30 nm and about 35 nm, or between about 35 nm and about 40 nm. In another set of embodiments, the active layer comprises a multiple quantum well. In still another embodiment, the active region comprises a double heterostructure, with a thickness between about 40 nm and about 500 nm. In some embodiment, the active layer comprises an In$_y$Ga$_{1-y}$N layer, where 0≤y≤1.

Reference is now made in detail to certain embodiments. The disclosed embodiments are not intended to be limiting of the claims and there can be other variations, modifications, and alternatives.

FIG. 1A depicts lateral injection of current in a thin-film flip-chip architecture. FIG. 1B depicts a vertical injection in a thin-film device. FIG. 1C depicts a vertical-injection bulk-substrate based LED. FIG. 2 depicts a flip-chip bulk-substrate based LED.

Deficiencies inherent in thin substrate flip-chip designs, and deficiencies (e.g., light loss) that are inherent in vertical architectures are overcome by the herein-disclosed thick substrate flip-chip architectures. For example, the device of FIG. 1A suffers from current crowding due to the limited ability to spread current at high current densities. The devices of FIG. 1B and FIG. 1C suffer from top contact occlusion and associated light loss.

The device of FIG. 2 depicts a device of the present invention, wherein the thick substrate flip-chip architecture supports a high power density capability, enabling a high light output from a very small chip with high efficiency and reliability.

FIG. 3 shows a sample plot of relative luminous flux as a function of injection current for a conventional GaN-based LED, a Cree XP-E white LED with junction temperature of 25° C. The plot shows that the relative luminous flux at 350 mA (approximately 30 A/cm$^2$ to 50 A/cm$^2$) is 100% while at 700 mA the relative luminous flux is only approximately 170%. This shows that for a conventional LED a roll-off in efficiency for the LED of approximately 15% occurs over the operating range from approximately 30 A/cm$^2$ to 50 A/cm$^2$ to 60 A/cm$^2$ to 100 A/cm$^2$. In addition, the peak efficiency for this diode occurs at an even lower operating current density, indicating that the roll-off in efficiency from the peak value is even greater than 15% were the diode to be operated at 700 mA.

Due to the roll-off phenomenon, conventional GaN-based light emitting diodes are typically operated at lower current densities than provided by the present method and devices, ranging from 10 A/cm² to 100 A/cm². This operating current density restriction has placed practical limits on the total flux that is possible from a single conventional light emitting diode. Common approaches to increase the flux from an LED package include increasing the active area of the LED (thereby allowing the LED to have a higher operating current while maintaining a suitably low current density), and packaging several LED die into an array of LEDs, whereby the total current is divided amongst the LEDs in the package. While these approaches have the effect of generating more total flux per LED package while maintaining a suitably low current density, they are inherently more costly due to the requirement of increased total LED die area. One or more embodiment propose a method and device for lighting based on one or more small-chip high brightness LEDs offering high efficiency operating at current densities in excess of conventional LEDs, while maintaining a long operating lifetime.

There is a large body of work that establishes conventional knowledge of the limitations of operating LEDs at high current density with efficient operation. This body of work includes the similarity in operating current density for high brightness LEDs that have been commercialized by the largest LED manufacturers, and a large body of work referencing the "LED Droop" phenomena. Examples of commercial LEDs include Cree's XP-E, XR-E, and MC-E packages and Lumileds K2 and Rebel packages, with one such example shown in FIG. 1A through FIG. 1C. Similar high brightness LEDs are available from companies such as Osram, Nichia, Avago, Bridgelux, etc. that all operate in a current density range much lower than proposed in this disclosure either through limiting the total current, increasing the die size beyond 1 mm², or packaging multiple LED chips to effectively increase the LED junction area. Examples of literature referencing and showing the LED "droop" phenomena are described by Shen et al. in Applied Physics Letters, 91, 141101 (2007), and Michiue et. al. in the Proceedings of the SPIE Vol. 7216, 72161Z-1 (2009) by way of example. In addition, Gardner et al. in Applied Physics Letters, 91, 243506 (2007) explicitly state in reference to this phenomena and attempts to overcome it that typical current densities of interest for LEDs are 20-400 A/cm² with their double heterostructure LED grown on a sapphire substrate showing a peak efficiency at approximately 200 A/cm² and then rolling off above that operating point. In addition to the limits in maintaining device efficiency while operating at high current density, it has been shown that as the current density is increased in light emitting devices, the lifetime of the devices degrade below acceptable levels with this degradation being correlated with dislocations in the material. Tomiya et. al. demonstrated in IEEE J. of Quantum Elec., Vol. 10, No. 6 (2004) that light emitting devices fabricated on reduced dislocation density material allowed for higher current operation without the decrease in lifetime that was observed for devices fabricated on high dislocation material. In their studies, dislocation reduction was achieved by means of lateral epitaxial overgrowth on material grown heteroepitaxially. To date, conventional methods related to light emitting diodes related to alleviating or minimizing the droop phenomena have not addressed growth and device design of light emitting diodes grown and fabricated on bulk substrates. A further explanation of conventional LED devices and their quantum efficiencies are described in more detail below.

Figure 4A:
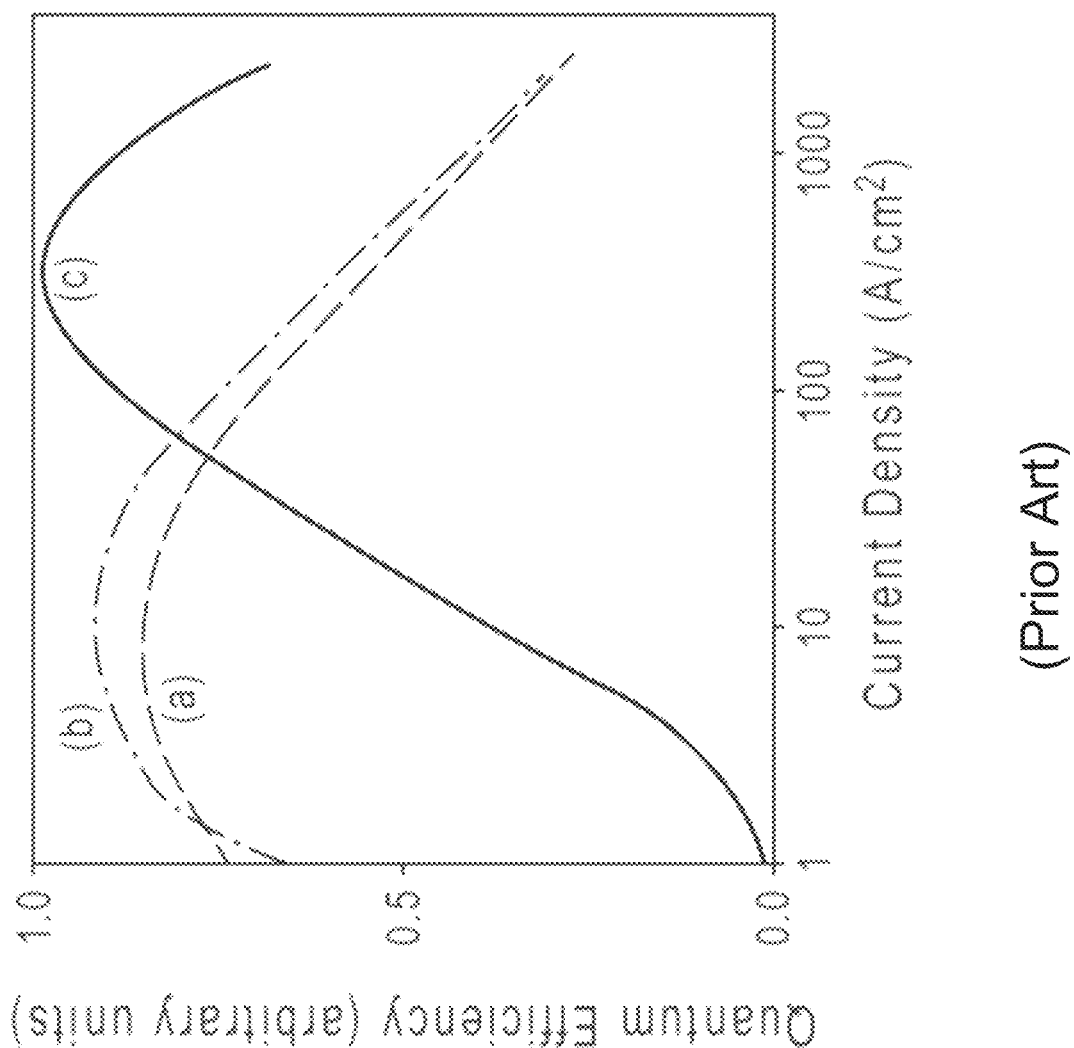
FIG. 4A shows an external quantum efficiency as a function of current density for (a) a multiple quantum well LED with two 2.5 nanometer wells, (b) a multiple quantum well LED with six 2.5 nanometer quantum wells, and (c) a double heterostructure LED with a 13 nanometer active region. Each of the LEDs exhibited emission at ~430 nm.

FIG. 4A is taken from N. F. Gardner et al., "Blue-emitting InGaN-GaN double-heterostructure light-emitting diodes reaching maximum quantum efficiency above 200 A/cm²", Applied Physics Letters 91, 243506 (2007), and shows two types of variations in the external quantum efficiency as a function of current density that are known in the prior art. The behavior shown in lines (a) and (b) of FIG. 4A are representative of that of conventional LEDs. With one or more relatively thin quantum wells, for example, less than about 4 nanometers thick, the external quantum efficiency peaks at a current density of about 10 amperes per square centimeter or less and drops relatively sharply at higher current densities. The external quantum efficiency at higher current densities can be increased by increasing the thickness of the active layer, for example, to approximately 13 nanometers, as shown in by line (c) in FIG. 4A. However, in this case the external quantum efficiency is very low at current densities below about 30 amperes per square centimeter (A/cm²) and also at current densities above about 300 A/cm², with a relatively sharp maximum in between. Ideal would be an LED with an external quantum efficiency that was approximately constant from current densities of about 20 A/mo' to current densities above about 200 A/cm², above about 300 A/cm², above about 400 A/cm², above about 500 A/cm², or above about 1000 A/cm².

Figure 4B:
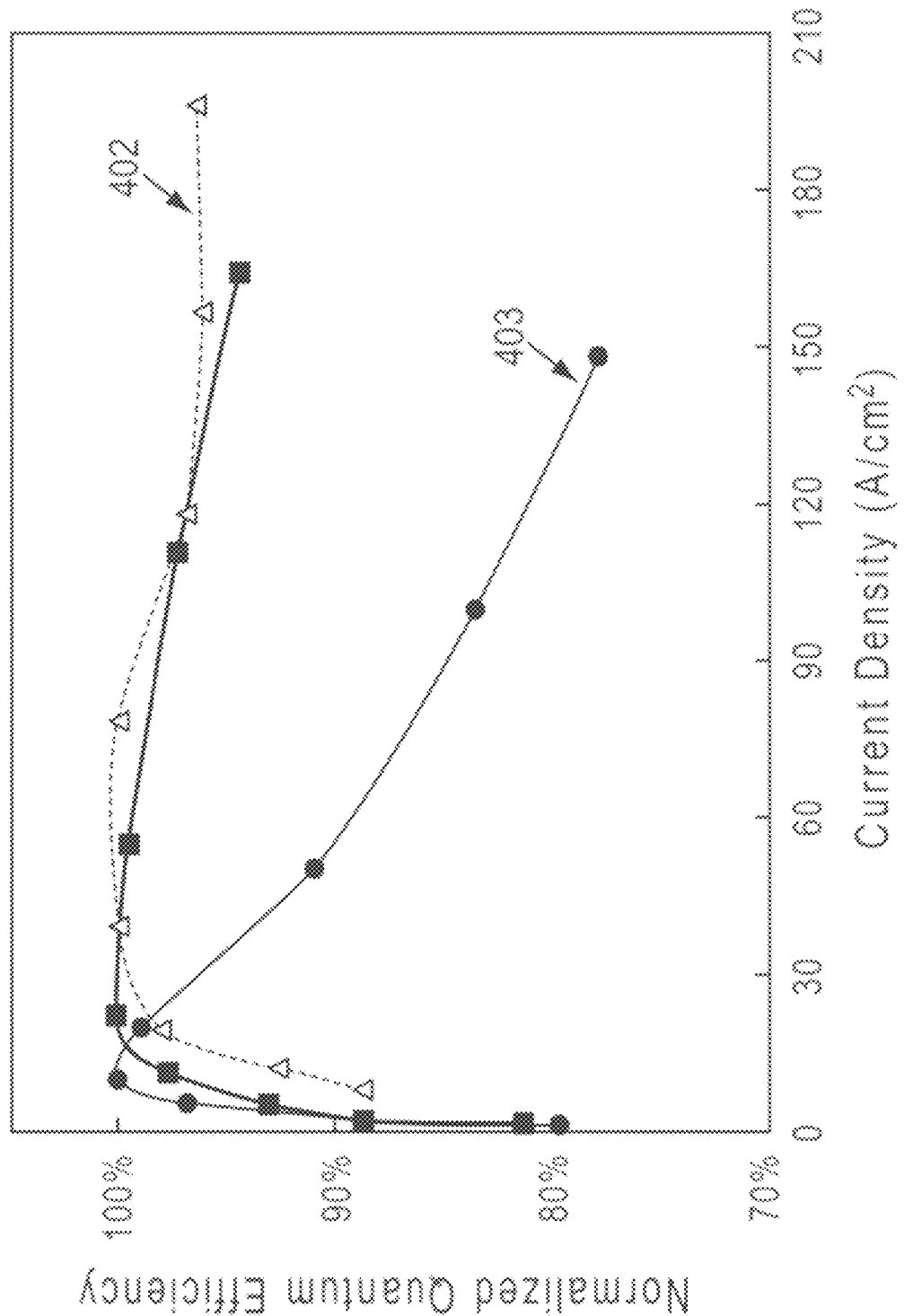
FIG. 4B illustrates quantum efficiency plotted against current density for LED devices according to an embodiment of the present disclosure and compared to prior art devices.

FIG. 4B illustrates quantum efficiency plotted against current density for LED devices according to an embodiment of the present disclosure. As shown, the present devices are substantially free from current droop and is within a tolerance of about 10 percent, which is significant. Further details of the present device can be found throughout the present specification and more particularly below. Line 403 represents the normalized quantum efficiency (%) with current density (A/cm²) characteristic of prior art devices, and lines 402 represent the normalized quantum efficiency (%) with current density (A/cm²) for non-polar and polar LEDs provided by the present disclosure.

Figure 5A:
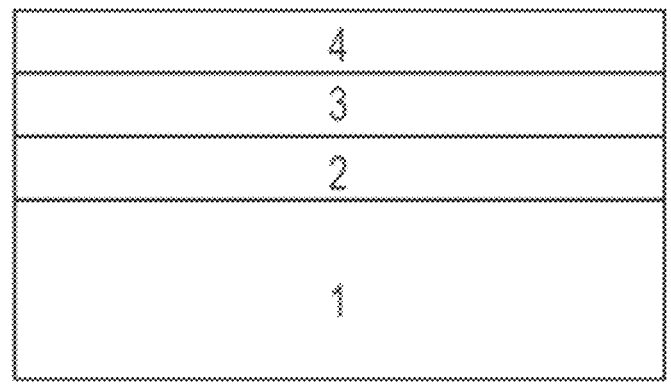
FIG. 5A is a diagram of a high current density epitaxially grown LED structure according to an embodiment.

FIG. 5A is a diagram of a high current density epitaxially grown LED structure according to an embodiment of the present disclosure. In one or more embodiments, the LED structure includes at least:

1. A bulk GaN substrate, including a polar, semipolar or non-polar surface orientation and further comprising details provided below:
    Any orientation, e.g., polar, non-polar, semi-polar, c-plane
    (Al,Ga,In)N based material
    Threading dislocation (TD) density $<10^8$ cm$^{-2}$
    Stacking fault (SF) density $<10^4$ cm$^{-1}$
    Doping $>10^{17}$ cm$^{-3}$
2. An n-Type (Al)(In)GaN epitaxial layer(s) having a thickness ranging from about 1 nm to about 10 μm and a dopant concentration ranging from about $1\times10^{16}$ cm$^{-3}$ to about $5\times10^{20}$ cm$^{-3}$ and further comprising details provided below:
    Thickness <2 μm, <1 μm, <0.5 μm, <0.2 μm
    (Al,Ga,In)N based material
    Growth T<1200° C., <1000° C.
    Un-intentionally doped (UID) or doped
3. A plurality of doped and/or undoped (Al)(In)GaN active region layers and further comprising details provided below:
    At least one (Al,Ga,In)N based layer
    Quantum Well (QW) structure with one or more wells
    QWs are >20 Å, >50 Å, >80 Å in thickness
    QW and n- and p-layer growth temperature identical, or similar
    Emission wavelength <575 nm, <500 nm, <450 nm, <410 nm 4. A p-Type (Al)(In)GaN epitaxial layer(s) having a thickness ranging from about 10 nm to about 500 nm and a dopant concentration ranging from about $1\times10^{16}$ $cm^{-3}$ to about $1\times10^{21}$ $cm^{-3}$ and further comprising details provided below:
At least one Mg doped layer
Thickness <0.3 µm, <0.1
(Al,Ga,In)N based
Growth T<1,100° C., <1,000° C., <900° C.
At least one layer acts as an electron blocking layer
At least one layer acts as a contact layer.

These structures are indicated in FIG. 5A as elements 1, 2, 3, and 4, respectively.

In a specific embodiment and referring to FIG. 5A, the bulk GaN substrate is sliced from a gallium nitride boule, lapped, polished, and chemically mechanically polished according to methods that are known in the art. In some embodiments, the gallium nitride boule is grown epitaxially on a seed crystal. In some embodiments, the gallium nitride boule is grown ammonothermally. In other embodiments, the gallium nitride boule is grown by hydride vapor phase epitaxy (HVPE) of flux methods. Alternatively, combinations of these techniques can also exist.

In another specific embodiment, the bulk GaN substrate is prepared from a boule that was grown by a flux method. Examples of suitable flux methods are described in U.S. Pat. No. 7,063,741 and in U.S. Application Publication No. 2006/0037529, each of which is incorporated by reference in its entirety. In yet another specific embodiment, the bulk GaN substrate is prepared from a boule that was grown by hydride vapor phase epitaxy (HVPE). Further details of the next steps including growth sequences are explained throughout the present specification and more particularly below.

In a specific embodiment, the epitaxial growth sequence includes deposition of at least (1) n-type epitaxial material; (2) active region; (3) electron blocking region; and (4) p-type epitaxial material.

In certain embodiments, epitaxial layers are deposited on the substrate by metalorganic chemical vapor deposition (MOCVD) at atmospheric pressure. The ratio of the flow rate of the group V precursor (ammonia) to that of the group III precursor (trimethyl gallium, trimethyl indium, trimethyl aluminum) during growth is between about 3,000 and about 12,000. In certain embodiments, a contact layer of n-type (silicon-doped) GaN is deposited on the substrate, with a thickness of less than 5 microns and a doping level of about $2\times10^{18}$ $cm^{-3}$.

In certain embodiments, an undoped InGaN/GaN multiple quantum well (MQW) is deposited as the active layer. The MQW active region has two to twenty periods, comprising alternating layers of 2 nm to 12 nm of InGaN and 1 nm to 20 nm of GaN as the barrier layers. Next, a 5 nm to 30 nm undoped AlGaN electron blocking layer is deposited on top of the active region. In other embodiments, the multiple quantum wells can be configured slightly differently. The substrate and resulting epitaxial surface orientation may be polar, nonpolar or semipolar. In one or more other embodiments, the bulk wafer can be in an off-axis configuration, which causes formation of one or more smooth films. In certain embodiments, the overlying epitaxial film and structures are characterized by a morphology that is smooth and relatively free-from pyramidal hillocks. Further details of the off-axis configuration and surface morphology can be found throughout the present specification and more particularly below. As an example, however, details of the off cut embodiment is described in "Method and Surface Morphology of Non-Polar Gallium Nitride Containing Substrates," James Raring et al., U.S. application Ser. No. 12/497,289 filed on Jul. 2, 2009, which is incorporated by reference in its entirety.

As an example, the present method can use the following sequence of steps in forming one or more of the epitaxial growth regions using an MOCVD tool operable at atmospheric pressure, or low pressure, in some embodiments.
1. Start;
2. Provide a crystalline substrate member comprising a backside region and a surface region, which has been offcut or miscut or off-axis;
3. Load substrate member into an MOCVD chamber;
4. Place substrate member on susceptor, which is provided in the chamber, to expose the offcut or miscut or off axis surface region of the substrate member;
5. Input one or more III- and/or V-containing species into the reactor in a controlled sequence;
6. Cease flow of precursor gases to stop crystalline growth;
7. Perform other steps and repetition of the above, as desired; and
8. Stop.

The above sequence of steps provides methods according to an embodiment of the present disclosure. As shown, the method uses a combination of steps including a way of forming a film of crystalline material using MOCVD. In some embodiments, the present disclosure includes atmospheric pressure (e.g., 700 Torr to 800 Torr) growth for formation of high quality gallium nitride containing crystalline films that are smooth and substantially free from hillocks, pyramidal hillocks, and other imperfections that lead to degradation of the electrical or optical performance of the device, including droop. In some embodiments, a multiflow technique is provided.

Figure 5B:
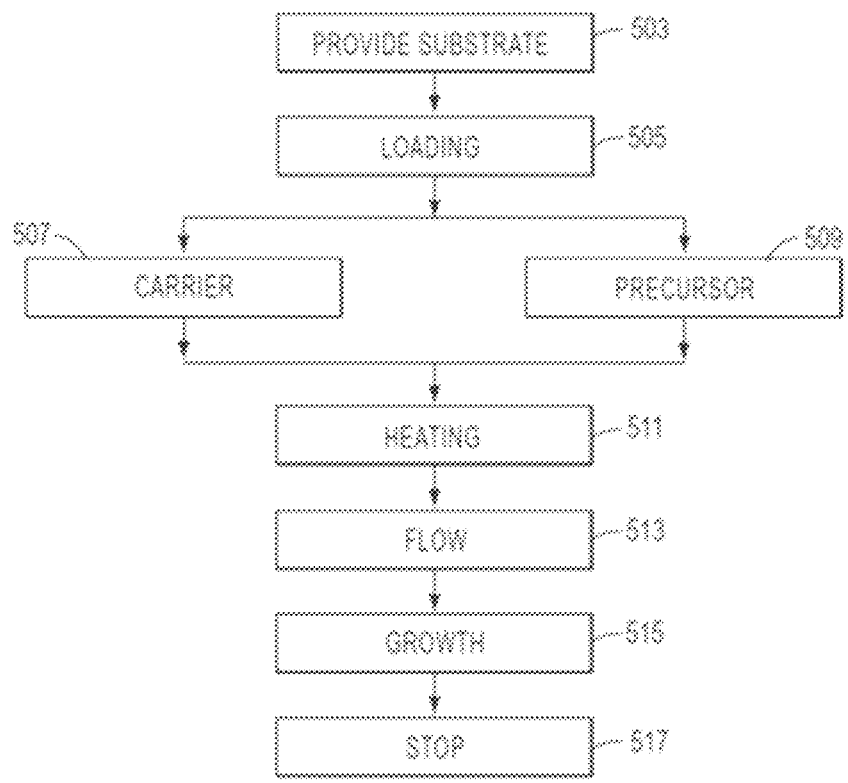
FIG. 5B is a flow diagram of an epitaxial deposition process according to one or more some embodiments.

FIG. 5B is one example of a flow diagram for a method for fabricating an improved GaN film according to an embodiment of the present disclosure. The disclosure provides (step 503) a crystalline substrate member having a backside region and a surface region. The crystalline substrate member can include a gallium nitride wafer, or the like. In an exemplary embodiment, the substrate is bulk nonpolar (10-10) GaN substrate.

As shown, the method includes placing or loading (step 505) the substrate member into an MOCVD chamber. In a specific embodiment, the method supplies one or more carrier gases, step 507, and one or more nitrogen bearing precursor gases, step 509, which are described in more detail below. In one or more embodiments, the crystalline substrate member is provided on a susceptor from the backside to expose the surface region of the substrate member. The susceptor is preferably heated using resistive elements or other suitable techniques. In a specific embodiment, the susceptor is heated (step 511) to a growth temperature ranging from about 700 to about 1,200 Degrees Celsius, but can be others.

In a specific embodiment, the present method includes subjecting the surface region of the crystalline substrate to a first flow in a first direction substantially parallel to the surface region. In a specific embodiment, the method forms a first boundary layer within a vicinity of the surface region. In a specific embodiment, the first boundary layer is believed to have a thickness ranging from about 1 millimeters to about 1 centimeters, but can be others. Further details of the present method can be found below.

Depending upon the embodiment, a flow is preferably derived from one or more precursor gases including at least an ammonia containing species, a Group III species (step 513), and a first carrier gas, and possibly other entities. Ammonia is a Group V precursor according to a specific embodiment. Other Group V precursors include $N_2$. In a specific embodiment, the first carrier gas can include hydrogen gas, nitrogen gas, argon gas, or other inert species, including combinations. In a specific embodiment, the Group III precursors include TMGa, TEGa, TMIn, TMAl, dopants (e.g., $Cp_2Mg$, disilane, silane, diethelyl zinc, iron, manganese, or cobalt containing precursors), and other species. As an example, a combination of miscut/offcut/ substrate surface configurations, precursors, and carrier gases are provided below:

Polar (0001) GaN substrate surface configured −0.35 degrees and greater (and less than −1.2 degrees) in magnitude toward m-plane (1010);

Carrier Gas: Any mixture of $N_2$ and $H_2$, but preferably all Hz;

Group V Precursor: $NH_3$; Group III Precursor: TMGa and/or TEGa and/or TMIn and/or TEIn and/or TMAl; and Optional Dopant Precursor: Disilane, silane, $Cp_2Mg$, oxygen-containing molecules, etc.

Non-polar or semi-polar GaN substrate with no offcut or miscut;

Carrier Gas: all $N_2$; Group V Precursor: $NH_3$; Group III Precursor: TMGa and/or TEGa and/or TMIn and/or TEIn and/or TMAl; and Optional Dopant Precursor: Disilane, silane, $Cp_2Mg$, oxygen-containing molecules, etc.

Depending upon the embodiment, the method also continues (step 515) with epitaxial crystalline material growth, which is substantially smooth and substantially free of hillocks or other imperfections. In a specific embodiment, the method also can cease flow of precursor gases to stop growth and/or perform other steps. In a specific embodiment, the method stops at step 517. In an exemplary embodiment, the present method causes formation of a gallium nitride containing crystalline material that has a surface region that is substantially free of hillocks and other defects, which lead to poorer crystal quality and can be detrimental to device performance. In a specific embodiment, at least 90% of the surface area of the crystalline material is free from pyramidal hillock structures.

The above sequence of steps provides methods according to certain embodiments of the present disclosure. As shown, the method uses a combination of steps including a way of forming a film of crystalline material using MOCVD. In some embodiments, the present disclosure includes a flow technique provided at atmospheric pressure for formation of high quality gallium nitride containing crystalline films, which have surface regions substantially smooth and free from hillocks and other defects or imperfections. The above sequence of steps provides a method according to an embodiment of the present disclosure. In a specific embodiment, the resulting crystalline material is substantially free from hillocks for improved device performance.

In one or more embodiments, a p-type GaN contact layer is deposited, with a thickness of about 200 nm and a hole concentration greater than about $5\times10^{17}$ cm$^{-3}$. An ohmic contact layer is deposited onto the p-type contact layer as the p-type contact and may be annealed to provide desired characteristics. Ohmic contact layers include Ag-based single or multi-layer contacts, indium-tin-oxide (ITO) based contacts, Pd-based contacts, Pt-based contacts, Ni-based contacts, Au based contacts, and others. LED mesas, with a size of about 250×250 µm$^2$, are formed by photolithography and dry etching using a chlorine-based inductively-coupled plasma (ICP) technique. As an example, Ag/Ni/Ag is e-beam evaporated onto the exposed p-GaN layer to form the p-type contact. Pt/Ag; Ag may be e-beam evaporated onto a portion of the p-type contact layer to form a p-contact pad. Al; or Ti containing contacts may be deposited by ebeam to form an n-contact. The wafer can then be diced into discrete LED dies using techniques such as by laser scribing and breaking, diamond scribing and breaking, sawing, water-jet cutting, laser ablation, or others. Electrical connections can be formed by conventional die-attach and wire bonding steps.

Figure 6:
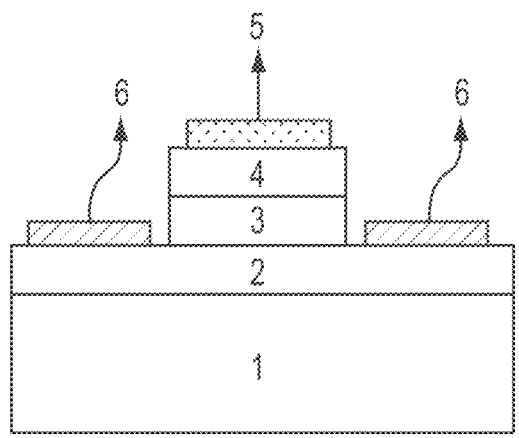
FIG. 6 is a diagram illustrating a high current density LED structure with electrical connections according to an embodiment.

FIG. 6 is a diagram illustrating a high current density LED structure with electrical connections according to an embodiment of the present disclosure. As shown, the LED structure is characterized as a top-emitting lateral conducting high current density LED according to a specific embodiment. Preferably, the LED structure includes at least:

1. A bulk GaN substrate, including polar, semipolar or non-polar surface orientation;
2. An n-Type (Al)(In)GaN epitaxial layer(s) having a thickness ranging from about 1 nm to about 10 µm and a dopant concentration ranging from about $1\times10^{16}$ cm$^{-3}$ to about $5\times10^{20}$ cm$^{-3}$;
3. A plurality of doped and/or undoped (Al)(In)GaN Active Region layers;
4. A p-Type (Al)(In)GaN epitaxial layer(s) having a thickness ranging from about 10 nm to about 500 nm and a dopant concentration ranging from about $1\times10^{16}$ cm$^{-3}$ to about $1\times10^{21}$ cm$^{-3}$;
5. A semi-transparent p-type contact made of a suitable material such as indium tin oxide, zinc oxide and having a thickness ranging from about 5 nm to about 500 nm; and
6. An n-type contact made of a suitable material such as Ti/Al/Ni/Au or combinations of these metals, Ti/Al/Ti/Au or combinations of these metals having a thickness ranging from about 100 nm to about 7 µm.

The structures are identified in FIG. 6 as elements 1, 2, 3, 4, 5, and 6, respectively.

Figure 7:
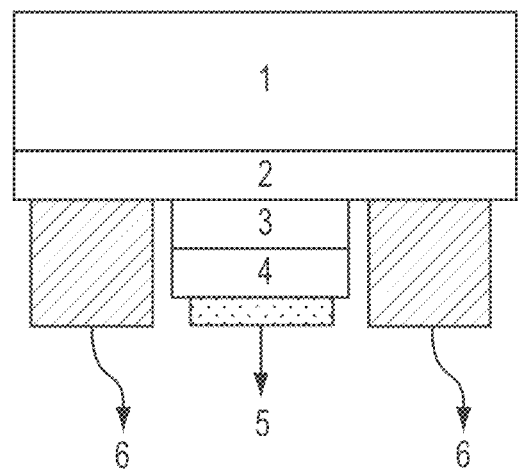
FIG. 7 is a diagram of a bottom-emitting lateral conducting high current density LED device according to an embodiment.

FIG. 7 is a diagram of a substrate-emitting lateral conducting (i.e., "flip-chip") high current density LED device according to an embodiment of the present disclosure. In this embodiment, the LED device includes at least:

1. A bulk GaN substrate;
2. An n-Type (Al)(In)GaN epitaxial layer(s);
3. A plurality of doped and/or undoped (Al)(In)GaN Active Region layers;
4. A p-Type (Al)(In)GaN epitaxial layer(s);
5. A reflective p-type contact; and
6. An n-type contact.

The structures are identified in FIG. 7 as elements 1, 2, 3, 4, 5, and 6, respectively.

Figure 8:
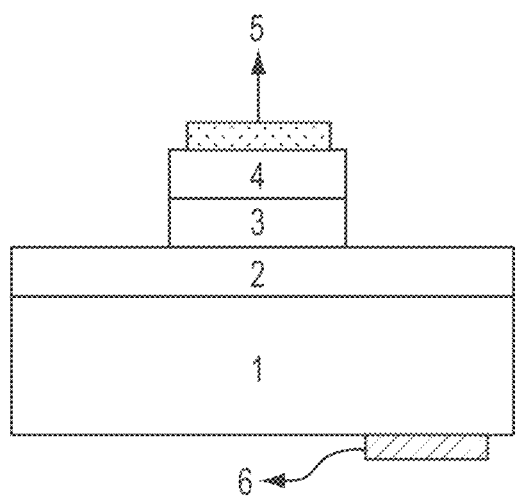
FIG. 8 is a diagram of a bottom-emitting vertically conducting high current density LED according to a specific embodiment of the present disclosure.

FIG. 8 is a diagram of a substrate-emitting vertically conducting high current density LED according to a specific embodiment of the present disclosure. The LED device includes at least:

1. A bulk GaN substrate;
2. An n-Type (Al)(In)GaN epitaxial layer(s);
3. A plurality of doped and/or undoped (Al)(In)GaN Active Region layers;
4. A p-Type (Al)(In)GaN epitaxial layer(s);
5. A reflective p-type contact; and
6. An n-type contact.

The structures are identified in FIG. 8 as elements 1, 2, 3, 4, 5, and 6, respectively.

Figure 9:
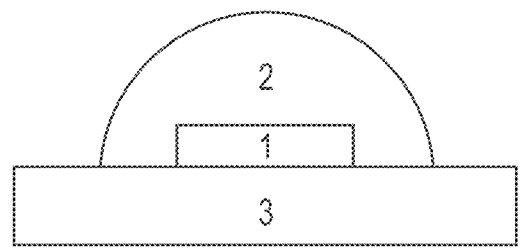
FIG. 9 is an example of a packaged white LED containing a high current density LED device according to an embodiment.

FIG. 9 is an example of a packaged white light LED containing a high current density LED device according to an embodiment of the present disclosure. In a specific embodiment, the packaged LED device includes at least:
1. A high current density LED device;
2. An encapsulant or lens material that may or may not contain a combination of red, green, blue, orange, yellow emitting, and/or other color down-conversion materials in a configuration such that white light is produced when the down-conversion materials are contained in the encapsulant or lens; and
3. An LED package that provides electrical connection to the LED and a path for thermal dissipation from the subject disclosure to the surrounding environment.

The structures are identified in FIG. 9 as elements 1, 2, and 3, respectively.

Other examples of packaged LED devices can be found in U.S. Application Publication No. 2011/0186887, which is incorporated by reference in its entirety. In other embodiments, the packaged device includes an array configuration such as described in U.S. Application Publication No. 2011/0186874, which is incorporated by reference in its entirety. The present LED devices can be configured in an array formed on a submount member.

The junction temperature of the LED under operating conditions is greater than about 100 degrees Celsius, and often greater than about 150 degrees Celsius, or even above about 200 degrees Celsius. In some embodiments, the LED is able to operate in continuous wave (CW) mode without active cooling, and in some cases without passive cooling.

In other embodiments, the present disclosure provides a resulting device and method using bulk gallium and nitrogen containing material for improved reliability. That is, growth on the bulk GaN substrates increases reliability at the high current densities. In contrast, conventional LEDs grown on foreign substrates are imperfect and include multiple defects. It is believed that such defects caused by the heteroepitaxial growth limit the device lifetime and therefore prohibit operation at high current densities. The LEDs according to one or more embodiments should not suffer from the same defects. In certain embodiments, the lifetime windows are >500 hours CW, >1,000 hours CW, >2,000 hours CW, >5,000 hours CW, or others.

In a specific embodiment, the present disclosure can also include LED based lighting fixtures and replacement lamps. As an example, goals of these lighting fixtures are to produce an acceptable level of light (total lumens), of a desirable appearance (color temperature and CRI), with a high efficacy (lm/W), at a low cost. While these characteristics are all desirable, there are typically design tradeoffs that must be considered that result in some, but not all, of the requirements being met. The present disclosure proposes LED based fixtures and lamps that are based on light emitting diodes grown on bulk III-Nitride substrates such as a bulk gallium nitride substrate. These LEDs exhibit surprisingly superior performance characteristics compared with conventional LEDs that are grown heteroepitaxially on foreign substrates such as sapphire, silicon carbide, silicon, zinc oxide, and the like. The characteristics that these bulk III-nitride based LEDs exhibit enable very different lamp/fixture designs that are currently were believed not to be possible with conventional LEDs.

Conventional light sources, incandescent, halogen, fluorescent, HID, and the like have well-defined standard characteristics. This standardization allows for a high degree of knowledge on the operating characteristics that are required from LED based lamps when designing light sources that are made to be replacements for the incumbent technology. While there is a vast array of lighting products on the market, there are a large number of standard lamps or fixtures that have been the subject of intense research for LED based replacement solutions. Some examples of these lamp/fixtures, while not exhaustive, include A-lamps, fluorescent tubes, compact CFLs, metallic reflectors of various sizes (MR), parabolic reflectors of various sizes (PAR), reflector bulbs (R), single and double ended quartz halogens, candelabra's, globe bulbs, high bays, troffers, and cobraheads. A given lamp will have characteristic luminous outputs that are dictated by the input power to the lamp. For example, a 20 W MR-16 fixture will typically emit approximately 300 lm, a 30 W MR-16, 450 lm, and a 50 W MR-16 will emit 700 lm. To appropriately replace these fixtures with an LED solution, the lamp must conform to the geometrical sizing for MR16 lamps, and reach minimum levels of luminous flux.

Despite these specified guidelines, there are relatively few true replacement lamps that are designed with LEDs that reach the luminous flux desired and have either a comparable or higher luminous efficacy, motivating the end user to switch from the incumbent technology. Those products that do meet these requirements are prohibitively expensive which has led to extremely slow adoption. A large portion of this cost is dictated by the number of LEDs required for LED based lamps to reach the luminous flux and luminous efficacy of current technology. This has occurred despite the high luminous efficacy that is typically reported for LEDs, which is much lower in an SSL lamp than specified as a discrete device.

Figure 10A:
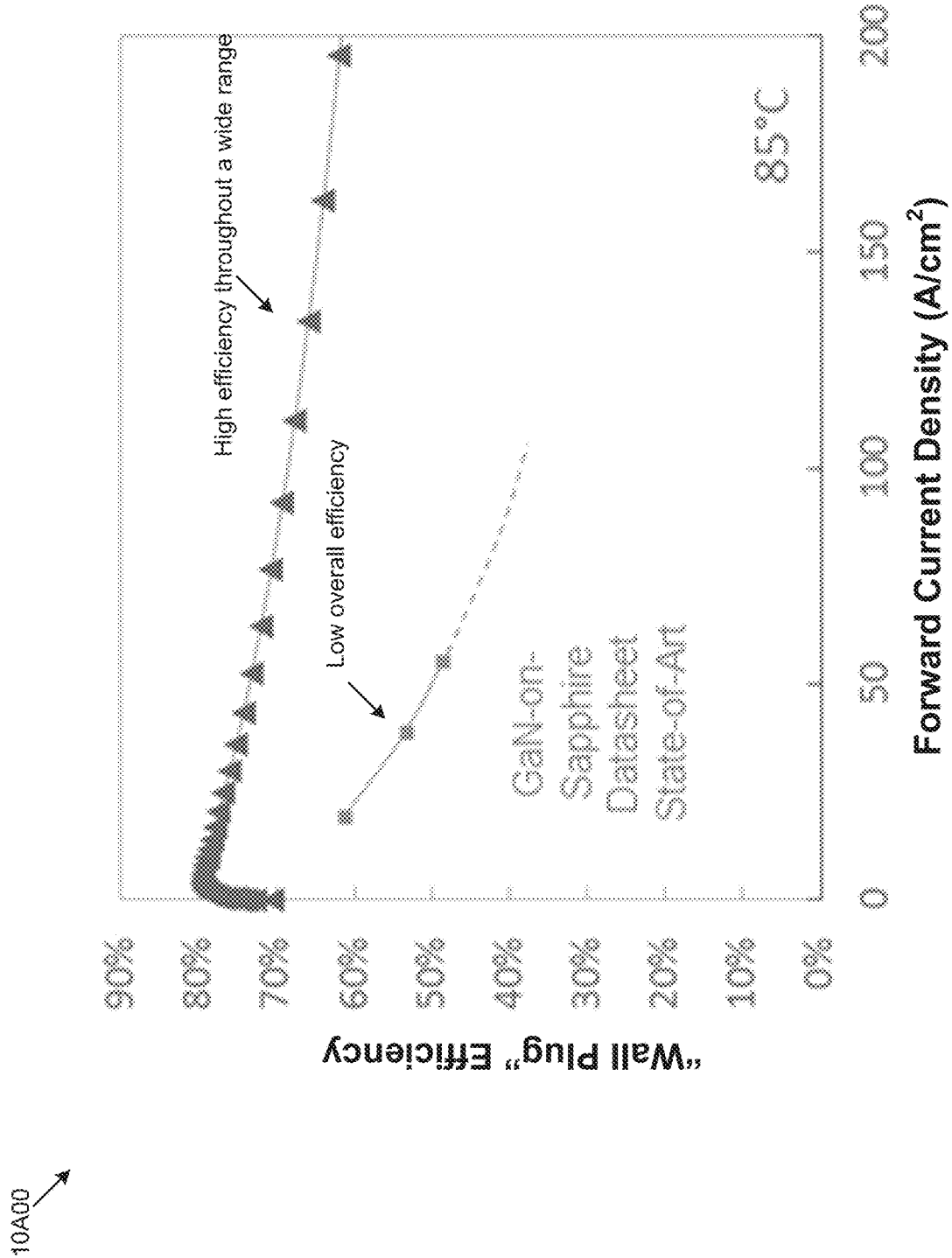
FIG. 10A shows the LED power conversion, or "wall-plug", efficiency of LEDs based on the present invention, compared to standard LEDs, as a function of forward current density.

FIG. 10A shows the LED power conversion, or "wall-plug", efficiency of LEDs based on the present invention, compared to standard LEDs, as a function of forward current density. For the present invention, the LEDs are violet-emitting with peak wavelength of approximately 410 nm, tested at a temperature of 85° C. The efficiency remains very high out to 200 A/cm$^2$ and more. In contrast, the conventional LEDs have a lower overall efficiency and much lower efficiency as current density is increased. The conventional LED data come from a data sheet for GaN-on-sapphire LEDs emitting in the blue (440-460 nm) regime.

Figure 10B:
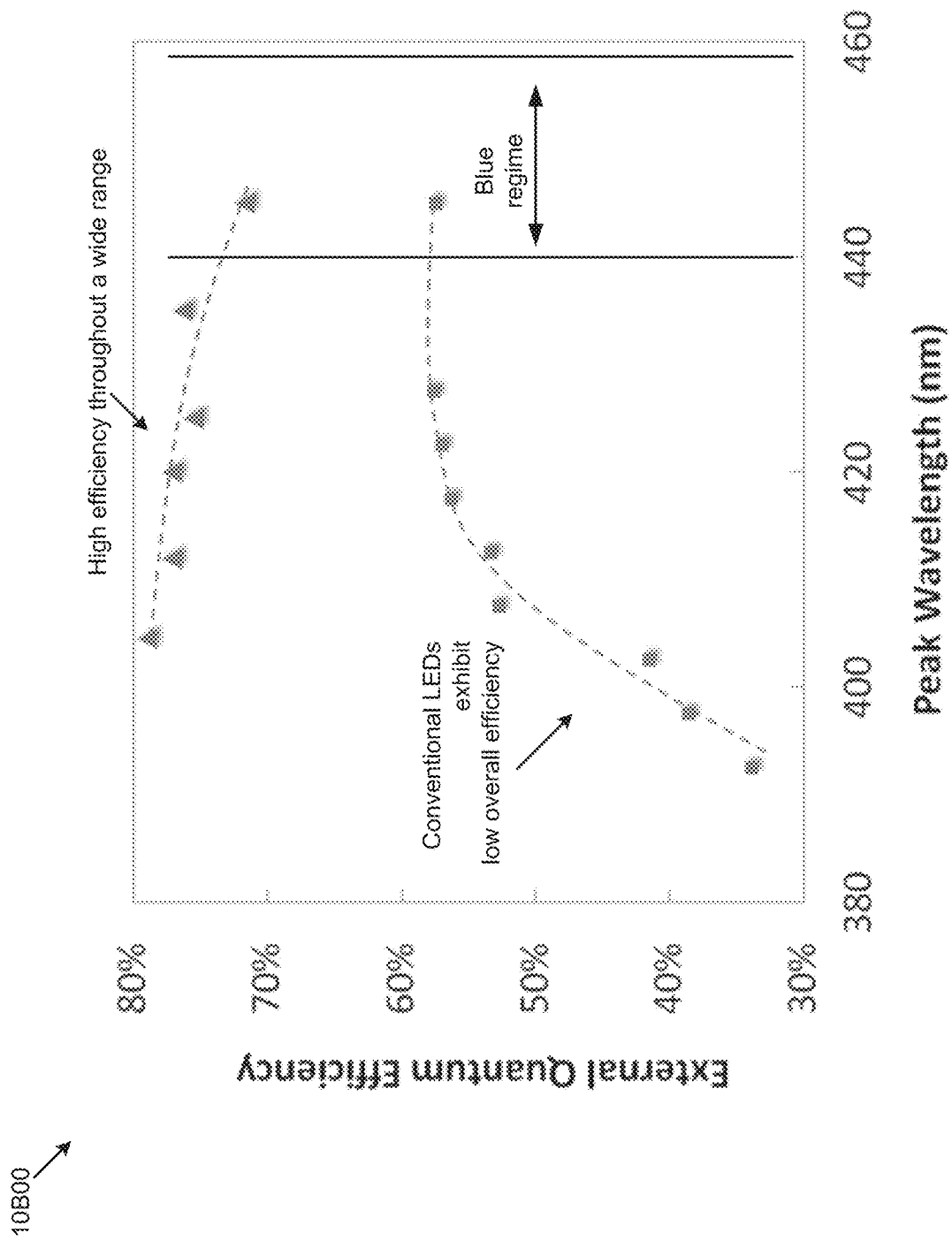
FIG. 10B shows the LED external quantum efficiency of LEDs based on the present invention, compared to standard LEDs, as a function of peak emission wavelength.

FIG. 10B shows the LED external quantum efficiency of LEDs based on the present invention, compared to standard LEDs, as a function of peak emission wavelength. For the present invention, the LED efficiency is high in the blue emission regime, and even higher as emission wavelength is decreased toward 400 nm. In contrast, the conventional LEDs have a lower overall efficiency and much lower efficiency as emission wavelength is reduced below about 425 nm. The conventional LED data come from a data sheet for GaN-on-sapphire LEDs. The reduced efficiency for the conventional LEDs is attributable to the poorer crystal quality of LEDs grown on foreign substrates, compared to those grown on bulk GaN substrates as taught in the present disclosure.

Figure 11:
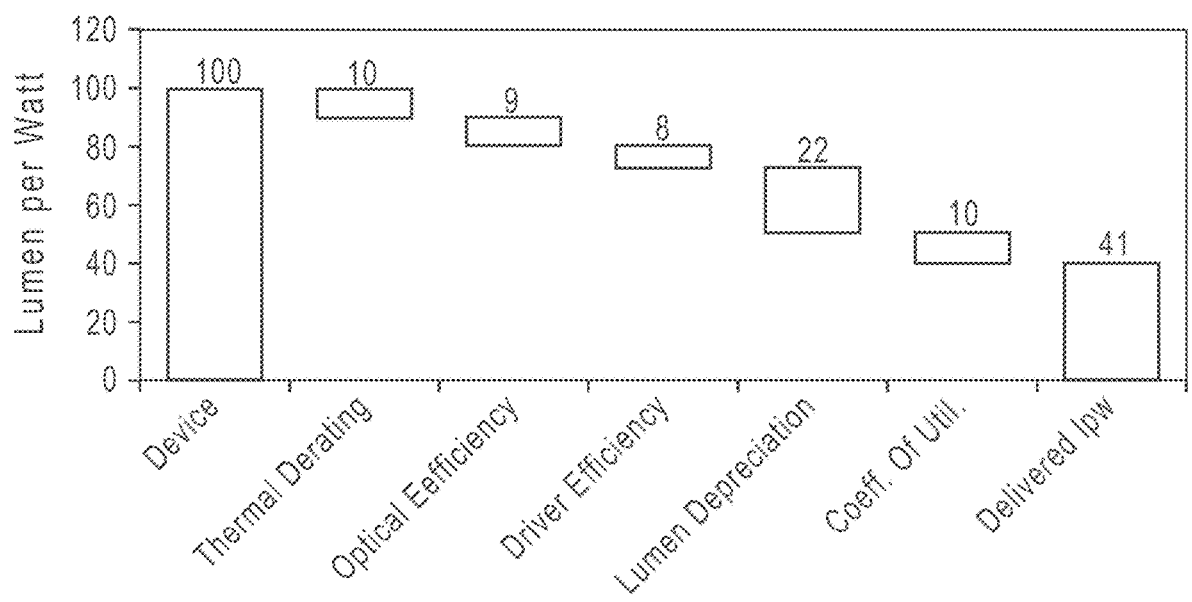
FIG. 11 shows a typical derating that is performed for LEDs that are inserted into an SSL lamp.

FIG. 11 shows a LED de-rating that SSL users assume when using LEDs in a SSL application. See Challenges for LEDs in Commercial Lighting, LEDs 2009, San Diego, Calif., October 2009. The LEDs typically have to be de-rated from their specified performance to account for increased temperature during operation, optical loss, electrical conversion losses, and lumen depreciation over time. Reduced efficacy and total flux as a function of temperature is extremely problematic because heating results both from the minimal heat sink volume in typical lamp fixtures, and additional heating that occurs as the end user increases the input current in an attempt to increase the output flux. As shown in FIG. 11, after account for a derating due to thermal effects, optical efficiency, driver efficiency, lumen depreciation, and coefficient of utility, a LED having a rating of 100 lumen/Watt can be derated to a delivered output of only 41 lumen/Watt.

Typical LEDs that are grown heteroepitaxially are unable to maintain high flux while decreasing the active area size because of current and thermal "droop". As the current density is increased in an LED, the relative efficiency has been shown to decrease. This effect can result in a decrease in relative radiative efficiency from 100% at about 10 A/cm$^2$ to 50% at about 100 A/cm$^2$.

LED radiative efficiency has also been shown to decrease as a function of the temperature of the junction of the LED. As the LED junction area decreases, the thermal resistance of the LED to package bond increases because the area for thermal flow is decreased. In addition to this, the current density increase that is associated with the decreasing area results in lower radiative efficiency as described above and thus more power that is required to be dissipated as heat. Further details of performance characteristics of conventional LED devices as compared to the present techniques are provided below. As shown, the present techniques and device lead to higher lumens per square area.

In one embodiment, the bulk gallium and nitrogen containing substrate is n-doped, and has an electrical resistivity smaller than 0.5 Ohm-cm, and in certain embodiments, less than 0.4 Ohm-cm, less than 0.3 Ohm-cm, less than 0.2 Ohm-cm, less than 0.1 Ohm-cm, and in certain embodiments, less than 0.05 Ohm-cm. In an exemplary embodiment, the electrical resistivity is less than 0.05 Ohm-cm. Further, the aspect ratio of the LED (i.e., the ratio of its characteristic height to its characteristic lateral dimension) is at least 0.05. This enables efficient current spreading through the substrate and enables a uniform current density in the active region, across the device. This is exemplified in the cross-sections presented herein, where it is shown that the electrons injected from the top n-contact spread efficiently and have a uniform profile when they reach the active region.

Figure 12:
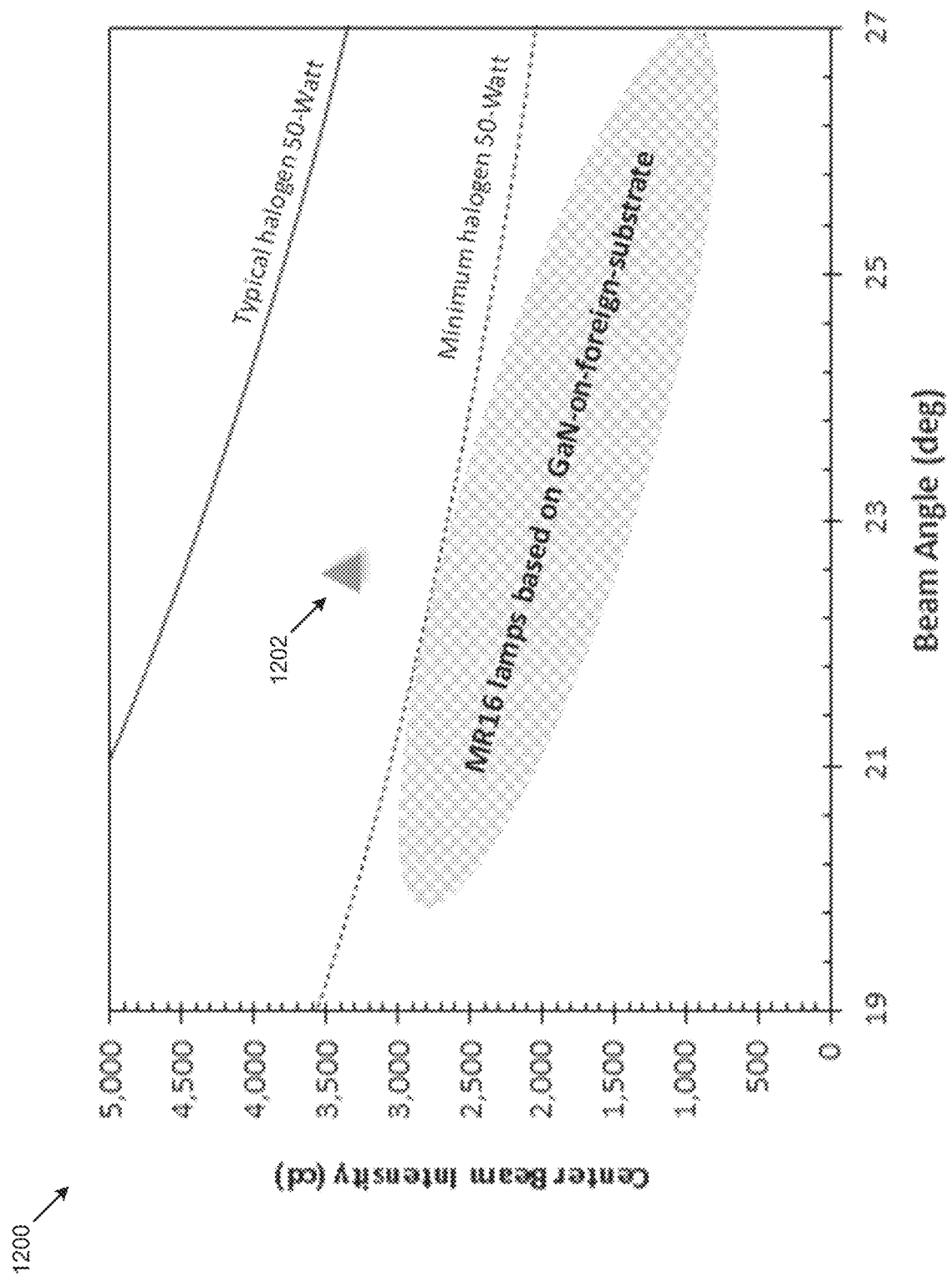
FIG. 12 shows LED MR16 lamp center beam candle power (CBCP), in candela, for a bulk-GaN based LEDs compared to that achievable using conventional LEDs.

FIG. 12 depicts a chart 1200 showing LED MR16 lamp center beam candle power (CBCP), in candela, for a bulk-GaN based LEDs compared to that achievable using conventional LEDs. The dashed and solid line show the minimum and typical performance for 50-Watt halogen MR16 lamps, respectively. Using the techniques of the present disclosure, LED MR16 performance 1202 surpasses that of the minimum requirement for 50-Watt halogen MR16s. In contrast, conventional LEDs with limited power density capability do not achieve the brightness necessary to reach the 50-Watt minimum halogen performance level.

Figure 13:
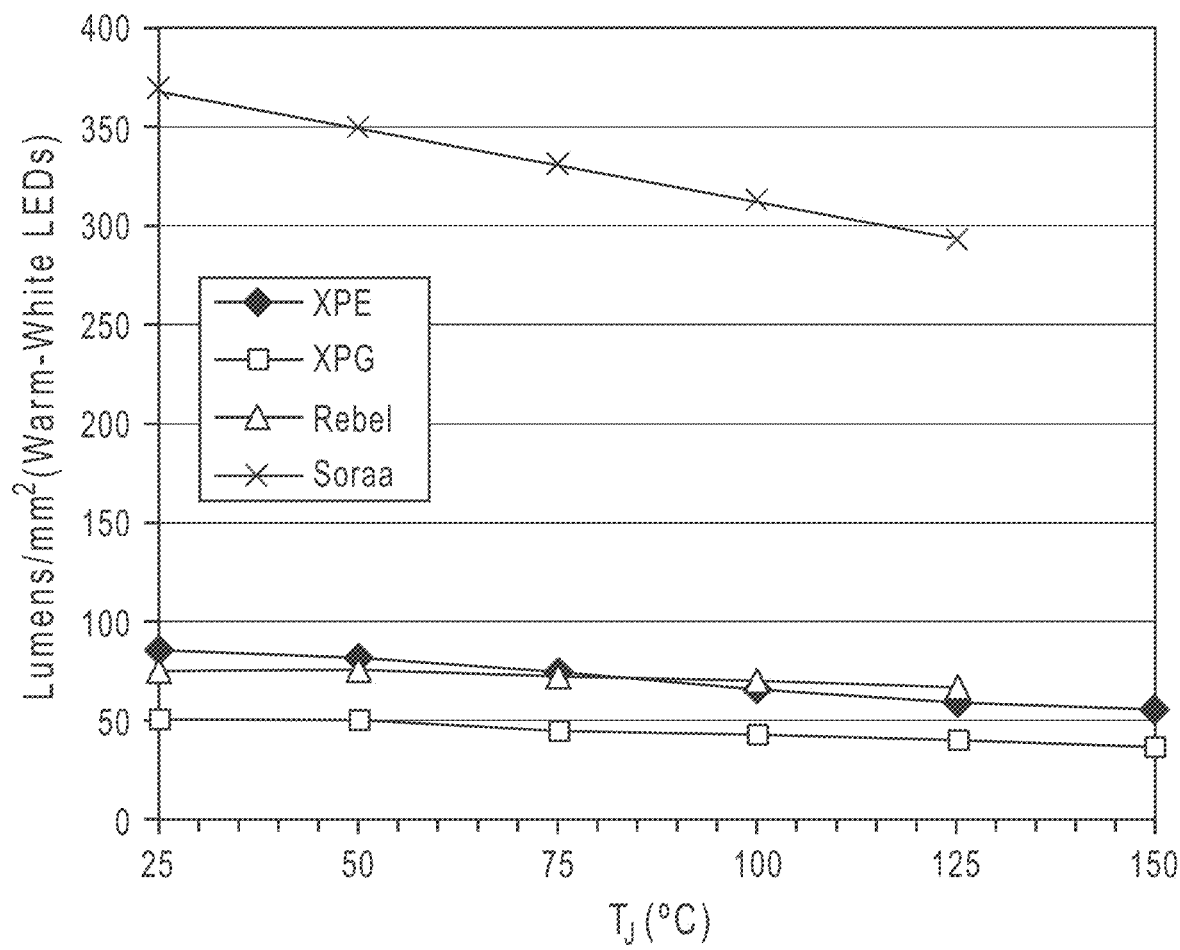
FIG. 13 is a summary of lumen/mm$^2$ for conventional LEDs compared to certain embodiments of the present disclosure at 350 mA drive current.

FIG. 13 is a summary of lumen/mm$^2$ for conventional LEDs compared to certain embodiments of the present disclosure at 350 mA drive current.

Figure 14:
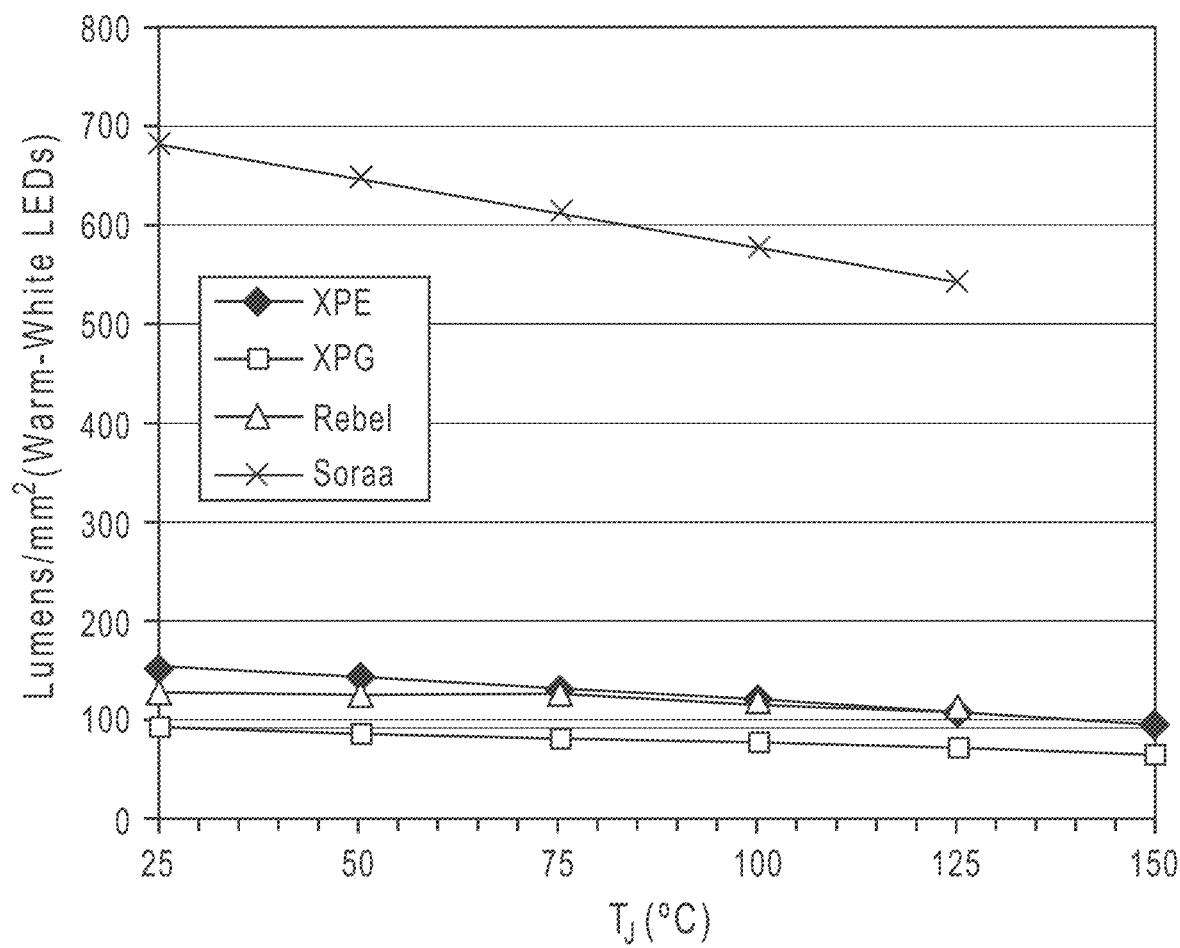
FIG. 14 is a summary of lumen/mm$^2$ for conventional LEDs compared to certain embodiments of the present disclosure at 700 mA drive current.

FIG. 14 is a summary of lumen/mm$^2$ for conventional LEDs compared to certain embodiments of the present disclosure at 700 mA drive current.

Figure 15:
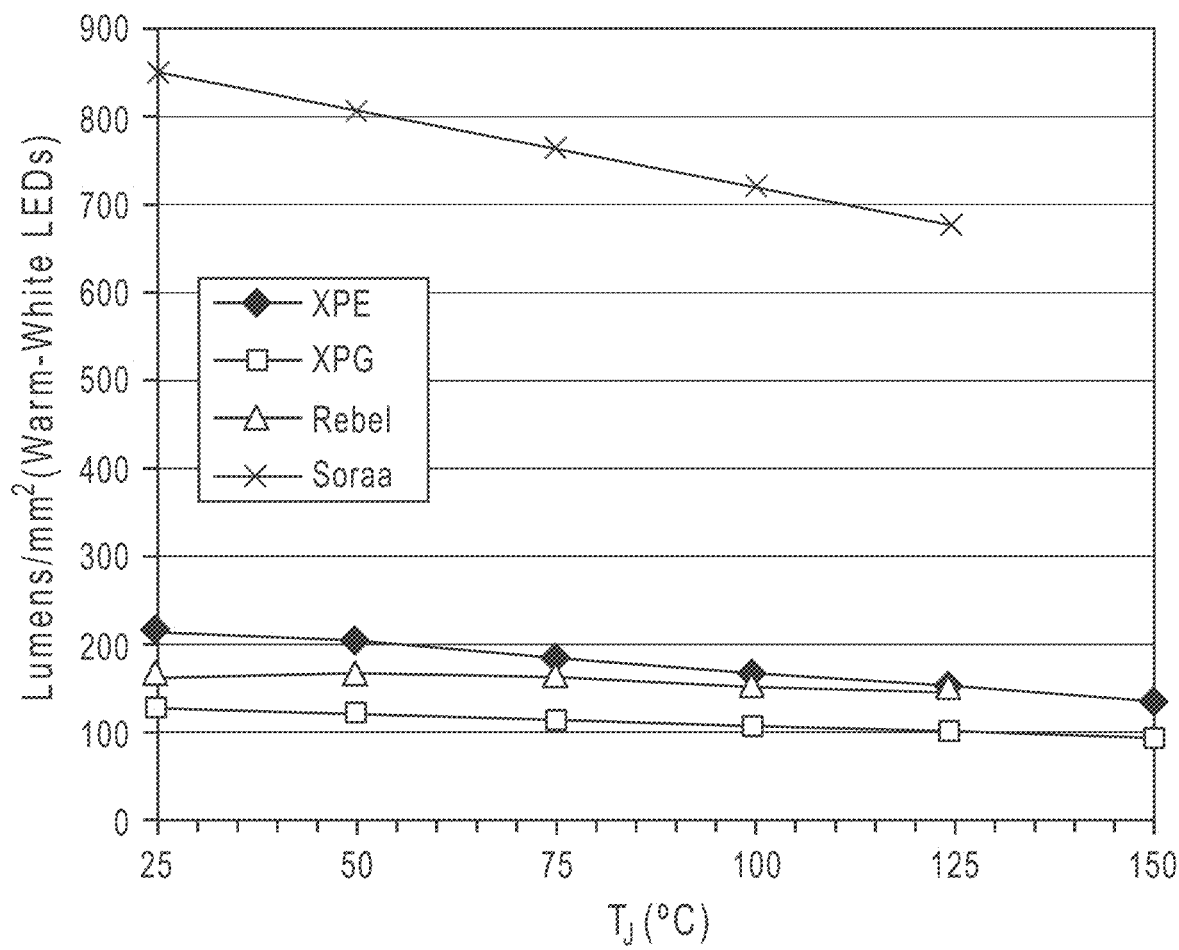
FIG. 15 is a summary of lumen/mm$^2$ for conventional LEDs compared to certain embodiments of the present disclosure at 1,000 mA drive current.

FIG. 15 is a summary of lumen/mm$^2$ for conventional LEDs compared to certain embodiments of the present disclosure at 1,000 mA drive current.

Figure 16A:
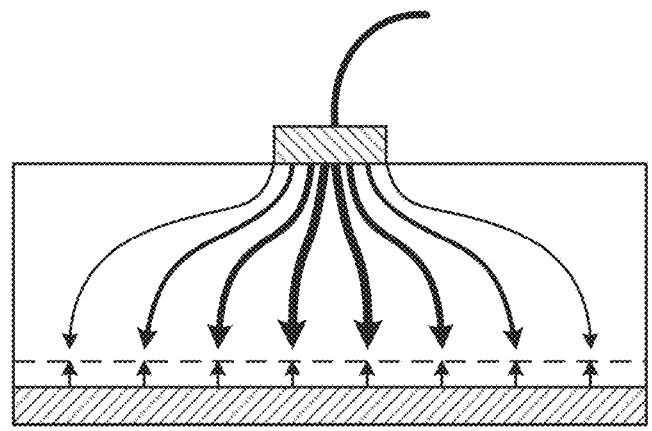
FIG. 16A is a cross-section of a thin-film LED with arrows of varying thicknesses showing the flow of electrons and holes.

FIG. 16A is a cross-section of a thin-film LED with arrows of varying thicknesses showing the flow of electrons and holes.

Figure 16B:
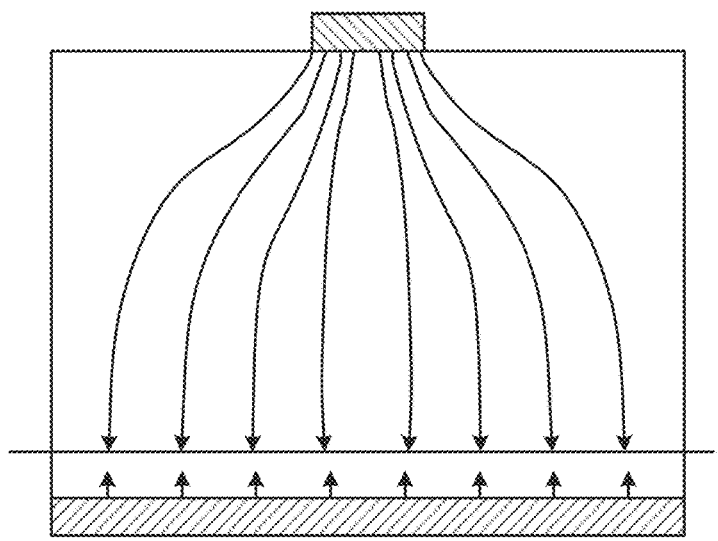
FIG. 16B is a cross-section of a thick LED with a doped substrate, with arrows showing the flow of electrons and holes, according to an embodiment.

FIG. 16B is a cross-section of a thick LED with a doped substrate, with arrows showing the flow of electrons and holes, according to an embodiment.

Figure 17A:
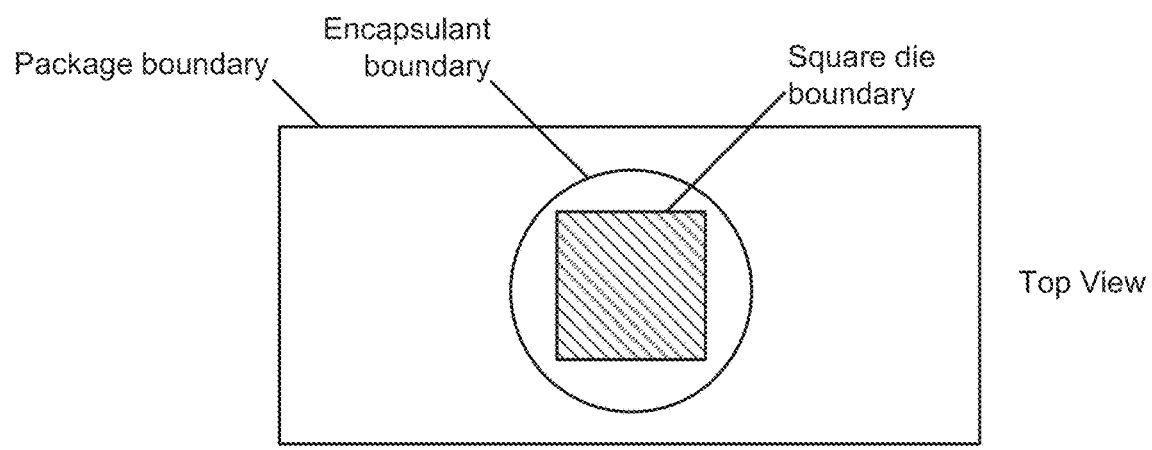
FIGS. 17A and 17B depict top views of LEDs, according to some embodiments.
Figure 17B:
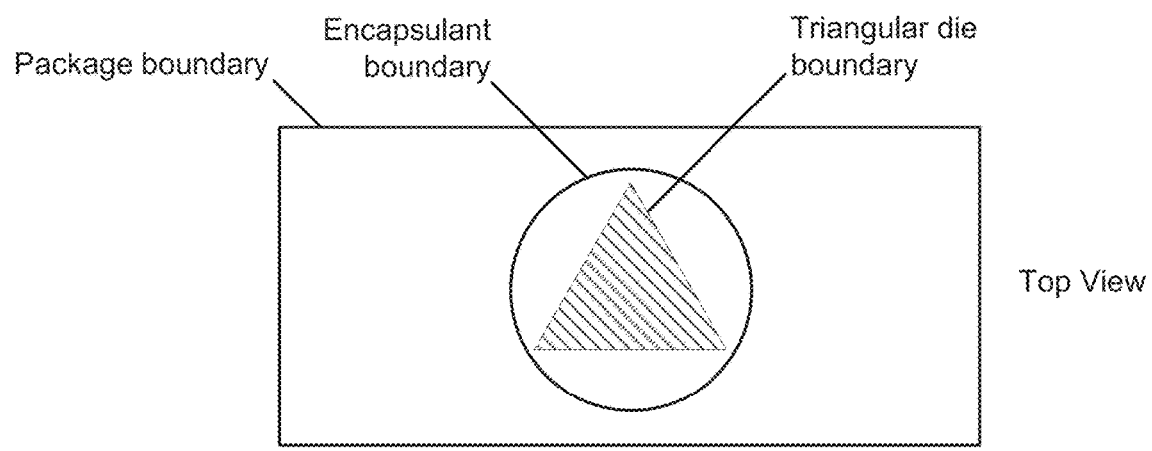

FIGS. 17A and 17B is a top view 1700 of an LED. As shown, the top view is substantially rectangular, however, other top view shapes are possible (e.g., triangles, squares, multi-sided polygonal shapes, irregular polygonal shapes, etc.). For example, a top view 1750 can be substantially in the shape of an equilateral triangle. In cases where the shape is not a regular polygon, a characteristic lateral dimension of the die may be defined as the longest distance across the shape.

Figure 18:
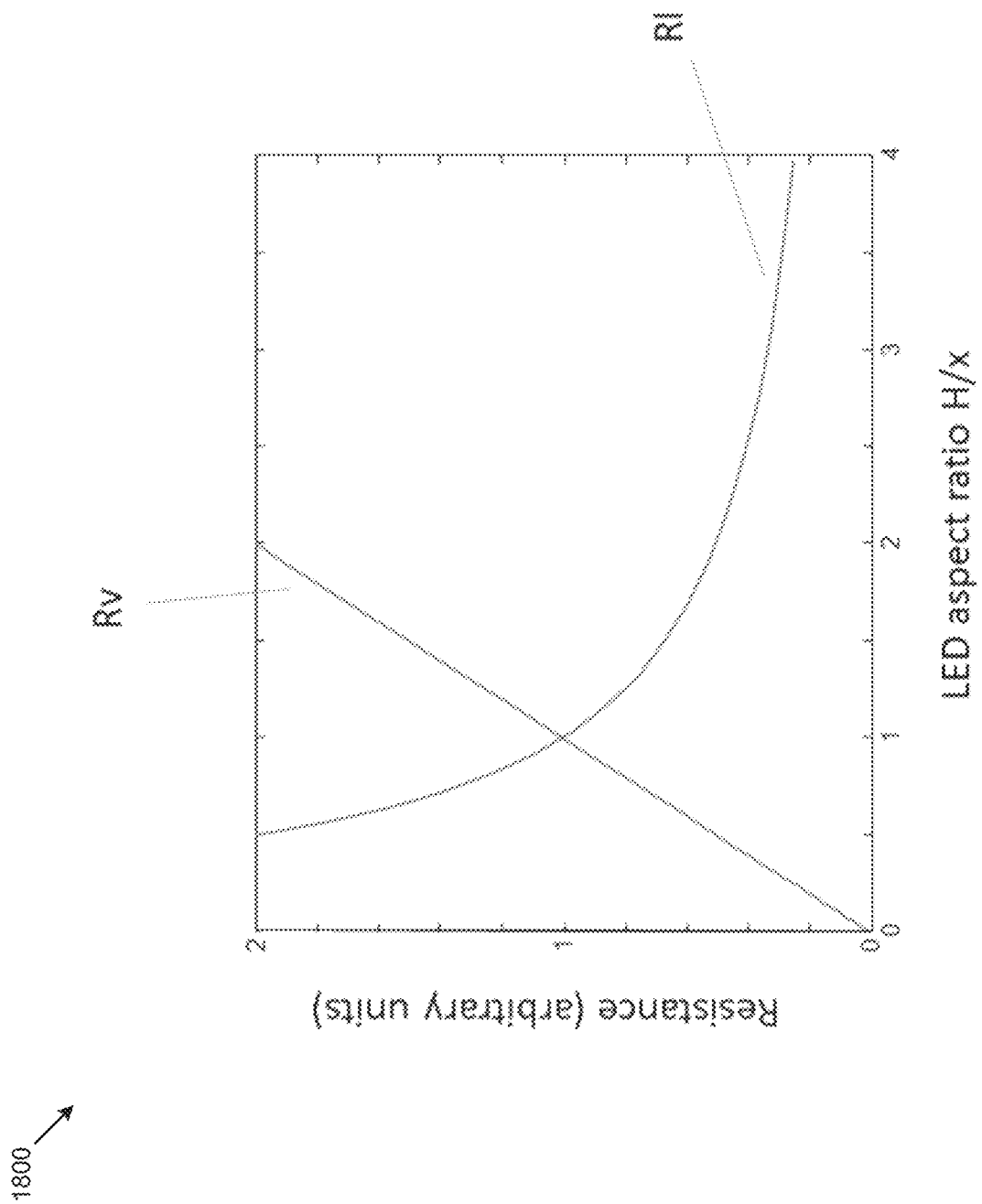
FIG. 18 is a plot of the lateral and vertical resistance in an LED as a function of its aspect ratio.

As shown in plot 1800 of FIG. 18, there is a tradeoff between thinning down an LED device (which makes current crowding problematic) and making the device very thick (which increases resistance). For a conducting element of resistivity r, area A and length L the resistance is R=r×L/A. Therefore, for an LED of lateral dimension x and height H, where the bulk substrate has resistivity r, two characteristic resistances can be defined: the vertical resistance Rv=r×H/x$^2$, and the lateral resistance Rl=r×x/(x×H). Rv describes vertical resistance: a tall LED has more vertical resistance. Rl describes lateral resistance: a thin chip has more lateral resistance, and hence more current crowding. FIG. 18 depicts this tradeoff between Rv and Rl. A possible choice to mitigate this tradeoff is to require Rv=Rl, in which case x=H, e.g., the aspect ratio of the LED should be close to unity. Rl and Rv are approximate measures of the actual resistance of the device, and therefore the actual optimal aspect ratio may vary slightly from unity. FIG. 18 illustrates the tradeoff between lateral and vertical resistances and provides a rationale for an optimization objective function. Further, the precise value of the aspect ratio may be chosen to take into account other considerations besides electrical properties—such as optical effects.

In certain embodiments, the aspect ratio of the LED is at least 0.05 and less than 10 in order to mitigate the tradeoff between lateral and vertical resistance. In other embodiments, the aspect ratio of the LED is larger than 0.2 and less than 2. An experimental demonstration of such an embodiment is shown in FIG. 19A.

In certain embodiments, the aspect ratio of the longest lateral dimension to thickness of the light emitting diode is from 0.05 to 10, from 0.1 to 8, from 0.2 to 5, from 0.2 to 2, and in certain embodiments from 0.2 to 1.

Figure 19A:
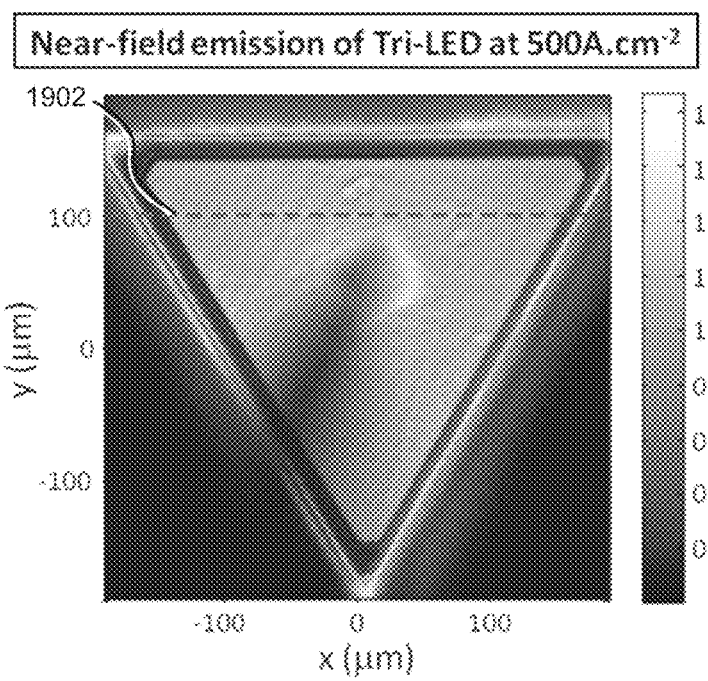
FIG. 19A is a microscope image of a lit-up LED according to an embodiment.

FIG. 19A shows a top-view microscope image 19A00 of a lit-up triangle-shaped LED on a bulk GaN substrate, under injection at a high current density of 500 A/cm$^{-2}$. The lateral dimension of the die is 380 µm and its height is 160 µm, hence an aspect ratio of 0.4. FIG. 19A depicts a plot line 1902 and showing that the light-up from the LED is uniform across the entire active region (see FIG. 19B).

Figure 19B:
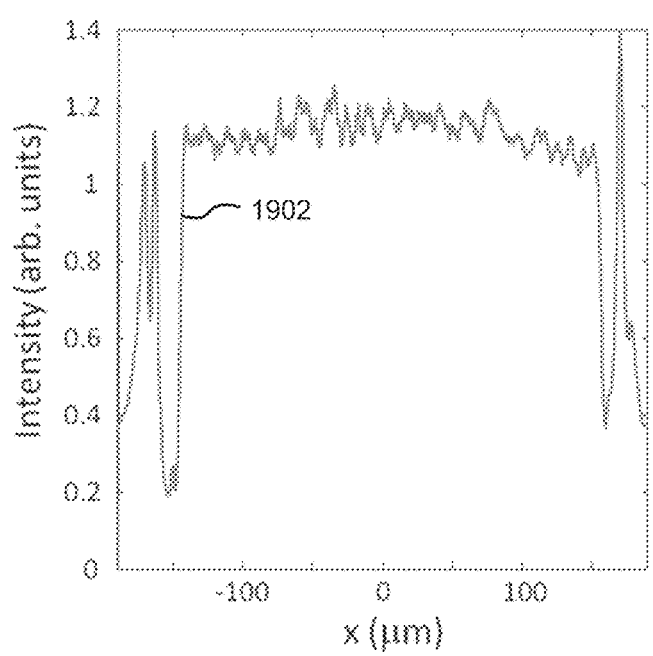
FIG. 19B is a cross-section of an LED and shows the light intensity profile across an LED according to an embodiment.

FIG. 19B depicts a cross-section 19B00 of FIG. 19A along the dashed line 1902 and further shows a plotted result 19B00 that across the LED, the intensity along dashed line 1902 over a wide range of current density is nearly uniform (e.g., as shown by plot line 1902) and shows no sign of current crowding, even at high current density (e.g., as shown). This result can be contrasted to commercial LEDs with a thin GaN layer, which shows pronounced current crowding at high current densities (see 403). Such characteristics facilitate the formation of the embodiments listed below.

Embodiment 1

A light emitting diode comprising a bulk gallium and nitrogen containing substrate having a surface region; and an active region formed overlying the surface region; where, the light emitting diode is configured to operate at a current density of the active region from 175 Amps/cm² to 2,000 Amps/cm²; and with an external quantum efficiency (EQE) of at least 50%.

Embodiment 2

The light emitting diode of embodiment 1, where the current density across the active region is substantially uniform at a current density from 175 Amps/cm² to 2,000 Amps/cm².

Embodiment 3

The light emitting diode of embodiment 1, where the emission intensity across the active region is within ±20% at a current density from 175 Amps/cm² to 2,000 Amps/cm².

Embodiment 4

The light emitting diode of embodiment 1, where the emission intensity across the active region is within ±10% at a current density at a current density from 175 Amps/cm² to 2,000 Amps/cm².

Embodiment 5

The light emitting diode of embodiment 1, where the active region is characterized by a characteristic lateral dimension of at least 100 μm.

Embodiment 6

The light emitting diode of embodiment 2, where the light emitting diode is characterized by a vertical dimension and a characteristic lateral dimension, where a ratio of the vertical dimension to the characteristic lateral dimension is from 0.05 to 10.

Embodiment 7

The light emitting diode of embodiment 2, where the ratio is from 0.1 to 5.

Embodiment 8

The light emitting diode of embodiment 2, where the ratio is from 0.2 to 2.

Embodiment 9

The light emitting diode of embodiment 1, where the light emitting diode is characterized by an aspect ratio defined by the ration of the vertical dimension and a characteristic lateral dimension of the surface region, where the aspect ratio is selected to provide a substantially uniform current density across the characteristic lateral dimension of the surface region.

Embodiment 10

The light emitting diode of embodiment 1, where the light emitting diode is configured to emit at wavelengths from 405 nm to 30 nm.

Embodiment 11

The light emitting diode of embodiment 1, where active region is characterized by a thickness from 0.5 nm to 40 nm.

Embodiment 12

The light emitting diode of embodiment 1, where the active region is characterized by a thickness is from 40 nm to 500 nm.

Embodiment 13

The light emitting diode of embodiment 1, where the bulk gallium and nitrogen containing substrate is n-doped and is characterized by a resistivity less than 0.5 Ohm-cm.

Embodiment 14

The light emitting diode of embodiment 1, where the bulk gallium and nitrogen containing substrate is p-doped and is characterized by a resistivity less than 0.05 Ohm-cm.

Embodiment 15

The light emitting diode of embodiment 1, further comprising a junction area from about 0.0002 mm² to about 1 mm².

Embodiment 16

The light emitting diode of embodiment 1, where the active region is characterized by a junction temperature greater than about 100 degrees Celsius.

Embodiment 17

The light emitting diode of embodiment 1, where the bulk gallium and nitrogen containing substrate is characterized by a resistivity less than about 0.050 Ohm-cm.

Embodiment 18

The light emitting diode of embodiment 1, where the current density is from 400 Amps/cm² to 800 Amps/cm², at emission wavelengths from 405 nm to 430 nm.

Embodiment 19

The light emitting diode of embodiment 1, where the current density is from 200 Amps/cm² to 1,000 Amps/cm², at emission wavelengths from 405 nm to 430 nm.

Embodiment 20

The light emitting diode of embodiment 1, where the current density is from 500 Amps/cm² to 1,000 Amps/cm², at emission wavelengths from 405 nm to 430 nm.

Embodiment 21

The light emitting diode of embodiment 1, where the current density is from 1,000 Amps/cm² to 2,000 Amps/cm², at emission wavelengths from 405 nm to 430 nm.

Embodiment 22

The light emitting diode of embodiment 1, where the light emitting diode is characterized by a lumens per active junction area of greater than 300 lm/mm², for a warm white emission with a correlated color temperature (CCT) of less than about 5,000K, and a color rendering index (CRI) greater than 75.

Embodiment 23

A light emitting diode comprising a bulk gallium and nitrogen containing substrate having a surface region bounded by a polygonal area formed of at least a longest lateral side and a shortest lateral side; and an active region formed by epitaxial growth upon the surface region; the light-emitting diode having a thickness where the aspect ratio of the thickness to the longest lateral side is from about 0.05 to about 10; and where the active region is configured to operate at a current density of greater than about 175 Amps/cm².

Embodiment 24

The light emitting diode of embodiment 23, where a variation of current density as measured across the longest lateral side is less than about 20%.

Embodiment 25

The light emitting diode of embodiment 23, where the aspect ratio of the thickness to the longest lateral side is from about 0.2 to about 2.

Embodiment 26

The light emitting diode of embodiment 23, where light output from the active region is configured to be uniform across the active region within about ±20% at a current density higher than about 100 A/cm$^{-2}$.

Embodiment 27

A lighting fixture comprising the light emitting diode of embodiment 1.

Embodiment 28

A lighting fixture comprising the light emitting diode of embodiment 23.

Embodiment 29

A lamp comprising the light emitting diode of embodiment 1.

Embodiment 30

The lamp of embodiment 29, where the lamp is a replacement lamp.

Embodiment 31

The lamp of embodiment 29, where the lamp conforms to a form factor selected from an A-lamp, a fluorescent tube, a compact fluorescent lamp (CFL), a metallic reflector (MR) lamp, an MR16 lamp, a parabolic reflector (PAR) lamp, a reflector bulb (R), a single end quartz halogen lamp, a double end quartz halogen lamp, a candelabra, a globe bulb, a high bay lamp, a troffer lamp, and a cobra head lamp.

Embodiment 32

A lamp comprising the light emitting diode of embodiment 23.

Embodiment 33

The lamp of embodiment 32, where the lamp is a replacement lamp.

Embodiment 34

The lamp of embodiment 32, where the lamp conforms to a form factor selected from an A-lamp, a fluorescent tube, a compact fluorescent lamp (CFL), a metallic reflector (MR) lamp, an MR16 lamp, a parabolic reflector (PAR) lamp, a reflector bulb (R), a single end quartz halogen lamp, a double end quartz halogen lamp, a candelabra, a globe bulb, a high bay lamp, a troffer lamp, and a cobra head lamp.

Figure 19C:
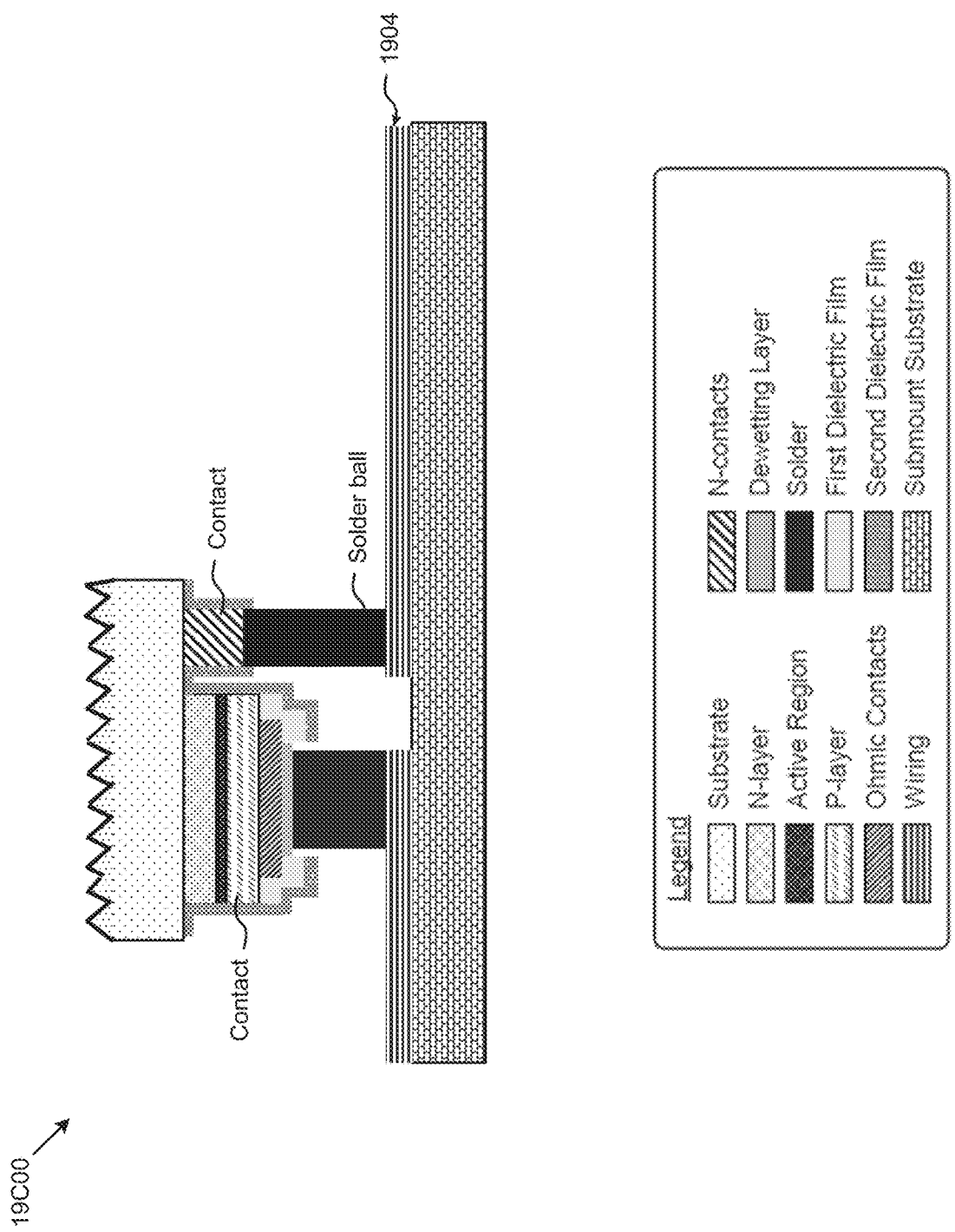
FIG. 19C is a side view of a flip-chip LED device.

FIG. 19C is a side view 19C00 of a flip-chip LED device. Current crowding characteristics of such a flip-chip LED device are shown and discussed in the following figures. Referring to the structures of the shown LED device, current has a tendency to crowd at the edge of the contacts. This tendency is particularly observable for LED devices where the p-GaN resistivity is much higher than the n-GaN. Current crowding causes non-uniform local current densities, which in turn reduces the effective internal quantum efficiency of the device. Current crowding also results in non-uniform localized heating. Non-uniform heating (e.g., hot-spots) in thin film devices is correlated to failures in the thin film devices.

Devices such as the LED device shown in FIG. 19C are formed using thick, highly conductive bulk GaN substrates. The thick, highly-conductive substrate layer improves current spreading, and many performance and reliability characteristics are greatly improved as compared with thin film devices.

Figure 19D:
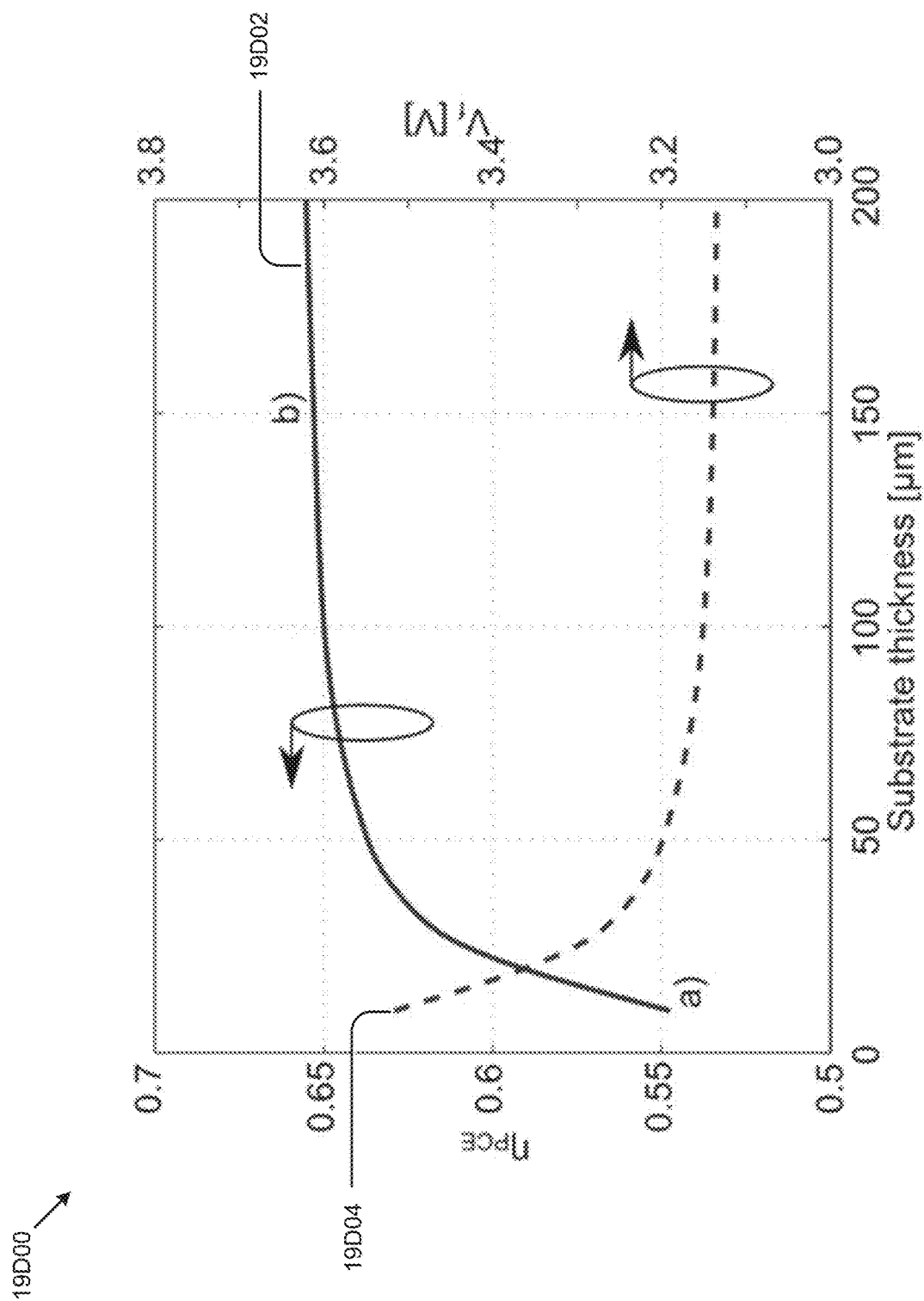
FIG. 19D plots simulation results for comparison.

FIG. 19D plots simulation results 19D00 for comparison. Specifically, the effect of the thickness of the substrate is plotted for the forward voltage (Vf) (see 19D02 on right side of FIG. 19D), and is also plotted for the wall-plug efficiency (see 19D04 on left side of FIG. 19D). As we will show through the following simulations, in order to maximize wall plug efficiency, it is desirable to have low resistivity (lower than 0.05 Ohm cm) and thick (thicker than 50 μm) substrates.

FIG. 19E1 depicts current crowding in various regions of an LED die as predicted by simulations. The shown LED die has a triangular outline and a 10 μm thick n-GaN conductive substrate, and the simulation results predict current crowding near the contacts of the device (see region 19E102). This particular simulation was made to illustrate operating conditions (~160 A/cm², 85° C.). This can be compared with the device with a 150 μm thick n-GaN conductive substrate of FIG. 19E2, which does not exhibit current crowding near the contacts of the device.

FIG. 19E2 depicts near absence of current crowding in various regions of an LED die as predicted by simulations. The shown LED die has a triangular outline and a 150 μm thick n-GaN conductive substrate, and the simulation results predict very moderate current crowding (see region 19E202). This particular simulation was made to illustrate operating conditions (~160 A/cm², 85° C.).

Figure 19F:
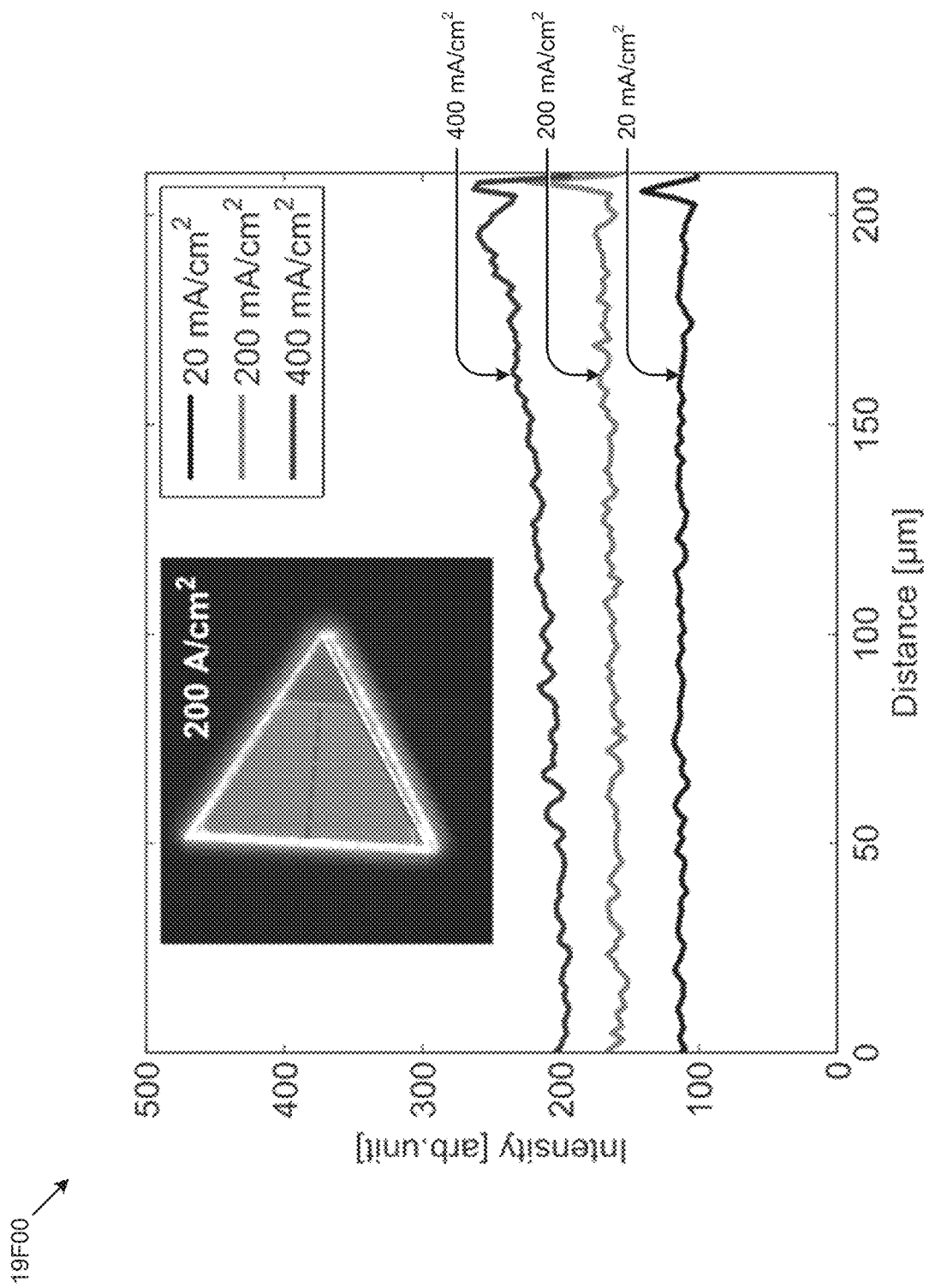
FIG. 19F depicts a plot showing measured performance of a device with a thick conductive GaN substrate.

The aforementioned simulation results of FIG. 19E2 are confirmed experimentally, as shown in FIG. 19F.

FIG. 19F depicts a plot 19F00 showing performance of a device with a thick conductive GaN substrate. As shown, current crowding effects are not observed when running intensity versus distance experiments. Specifically, and as shown, a device with a thick (e.g., ~150 μm) and highly-conductive (e.g., ~0.01 Ohm cm) GaN substrate exhibits almost no current crowding effects, even at high current densities of 400 A/cm$^2$. In addition to the thickness of the n-GaN substrate, the low resistivity of the GaN substrate decreases current crowding and hence increases reliability, even after long-term continuous high power operation. Several characteristics related to GaN substrate are plotted in following figures.

FIG. 19G1 and FIG. 19G2 show the wall plug efficiency (WPE) trend 19G100, and the forward voltage (Vf) trend 19G200, respectively, as a function of the resistivity of the n-type GaN substrate. In this particular case, the substrate thickness is assumed to be thick (~150 µm).

FIG. 19H1 and FIG. 19H2 shows a two-dimensional current density map 19H100 and a cross section of the current density 19H200 for a n-GaN substrate resistivity of 1E-2 Ohm cm and when the n-GaN substrate is thick (e.g., ~150 µm).

FIG. 19G1 and FIG. 19G2 show a two-dimensional current density map 19I100 and a cross section 19I200 of the current density for a n-GaN substrate resistivity of 1E-1 Ohm cm and when the n-GaN substrate is thick (e.g., ~150 µm). This case shows a lot of current crowding.

It is clear that the wall plug efficiency is higher and the forward voltage lower for a device with a low resistivity. Desirable of ~0.05 Ohm cm or lower are usually obtained with substrate carrier concentration of 1e17 cm$^3$ or higher, assuming standard reported mobilities of ~10-500 cm$^2$/Vs, and substrate thickness of 50 µm or thicker.

A flip-chip LED has its metal contacts to both the anode and cathode on one side of the device. The LED is mounted on a submount by flipping it upside down and solder-attaching it to the submount. The functions of the submount include:
  to provide an electrically conductive current path to and from the LED, and
  to serve as a reflector to direct light outwards and prevent absorption in the bulk of the submount, and
  to provide a thermally conductive path for the extraction of heat from the system.

Light is emitted from an LED in all directions, and the efficiency of a packaged LED device, scales with the reflectivity of the submount mirror. The encapsulated, or sealed, nature of the interconnect traces in this disclosure is important. Exposed reflective conductive traces made from a material such as silver are prone to metal migration, which poses a reliability risk. Metal migration can bridge the gap between electrodes of a flip-chip device, causing a short circuit. Exposed traces are also prone to oxidation, which reduces their reflectivity. The submount structures as disclosed herein comprise:
  a substrate,
  a layer of electrically insulating material,
  a stack of metals forming a mirror,
  a protective dielectric layer over the mirror,
  a second dielectric to isolate the mirror segments,
  an upper mirror stack,
  a protective dielectric to reflect light that falls between segments of the main lower mirror, and
  another layer of dielectric to encapsulate the upper mirror segments.

The lower mirror stack is divided into segments so the current path to the anode is electrically isolated from the path to the cathode, and to form 'streets' where the substrate can be easily singulated into chips. Via holes through the dielectric layers provide access to the submount metal for the LED anode and cathode contacts. A metal seed layer for a plating process may be deposited in the via openings on the exposed mirror. A plating process would be used to fill the via openings with an appropriate metal stack, facilitating attach processes to connect LEDs and other elements, such as interposers, to the submount.

The method used to fabricate the submount can affect the reflectivity of the mirror and therefore govern its effectiveness. The choice of metal at the top of the mirror stack plays a large role in determining the optical performance of the submount. The choice of reflector material also influences subsequent process steps, as certain metals are prone to attack by a respective set of chemicals.

FIG. 20A1 is a side view of a LED subassembly 20A100 with flip-chip style contacts to a high-performance light-emitting diode.

FIG. 20A2 is a side view of a LED subassembly 20A200 with a wire-bond contact to a high-performance light-emitting diode.

As shown the LED is attached by aligning the anode and cathode LED contacts with the submount electrodes and using a die attach method (e.g., eutectic alloy reflow, solder-attach, gold-gold attach, etc.) to make electrical connections.

FIG. 20B shows electrically isolated mirror segments covered by a transparent dielectric layer to protect the mirror from chemical attack and permit maximum reflectance from the mirror for a high-performance light-emitting diode.

The method for making the submount consists of the following steps:
  Formation of an insulating layer on the substrate. This layer provides electrical isolation between the LED anode and cathode current paths, and also between the LED and the backside of the substrate, which is typically held at ground potential. This layer can be thermally grown, or can be chemically grown using a method such as chemical vapor deposition (CVD), or can be deposited using a physical vapor deposition (PVD) process such as sputtering. Minimum thickness of the layer is determined by the electrical breakdown characteristics of the film, while the maximum thickness is determined by the thermal conductivity of the film. Plasma-enhanced chemical vapor deposition (PECVD) could be used to deposit the insulator, but PECVD films have lower breakdown voltages than thermally grown films, so a much thicker film would be needed to yield an equivalent breakdown characteristic. In cases for which the substrate is electrically insulating itself, this insulating layer is optional.
  Deposition of the mirror metal stack and protective dielectric coating. The mirror stack can consist of multiple metal layers. The bottom layer typically is used as an adhesion layer to prevent delamination of the stack from the dielectric beneath it. Middle layer(s) are typically barriers that prevent diffusion of the reflective upper metal during subsequent thermal treatment. The upper layer is chosen for its reflective properties. The mirror stack can be deposited using either a sputter process or an e-beam evaporation process. A protective dielectric layer is deposited on top of the mirror stack. This layer, which can also be sputtered or evaporated, serves to protect the mirror from chemicals used in subsequent processing. It also provides a protective barrier against elements and compounds in the atmosphere that can degrade the mirror over its lifetime, such as oxygen, water or sulfur.
  Patterning of the mirror stack and protective dielectric layer. The mirror and dielectric can be patterned using a lift-off resist process. They also can be patterned by wet and/or dry etching, which is often followed by spinning and patterning after metal and dielectric deposition. In both cases, the upper dielectric protects the reflective metal layer during processing against chemicals such as resist stripper.

FIG. 20C shows a transparent dielectric layer to encapsulate the mirror segments and electrically isolate the mirror segments for forming a submount used in fabricating a high-performance light-emitting diode.

A method for construction of such a mirror includes:

Blanket deposition of a second dielectric layer above the mirror. This layer can be deposited by sputtering, or by PECVD. It is important that the method used creates a conformal coating that encapsulates the lower dielectric and mirror layers. This layer provides electrical isolation between the lower mirror and upper mirror segments, which are deposited next.

Deposition of the upper mirror segments and protective dielectric coating. These segments serve as reflective elements in the gaps between the lower mirror segments serving as paths to the LED anode and cathode. The same deposition and patterning methods used for the lower mirror and protective dielectric coating apply to the upper mirror and protective dielectric. The materials used in the upper mirror and its protective dielectric film need not be identical to those used for the lower mirror and its protective dielectric film.

Deposition of top layer dielectric coating. This layer encapsulates the upper mirror segments. Identical concerns and processing methods used in earlier-disclosed methods also apply here.

Etching of via holes to lower mirror. These vias are holes in the dielectrics that enable electrical contacts between the LED terminals and the conductive paths in the submount. The vias can be formed with dry and/or wet etch processes.

FIG. 20D shows a patterned upper mirror segment with a protective dielectric coating to reflect light that would otherwise pass between lower mirror segments as used in fabrication of a high-performance light-emitting diode.

Deposition of an optional plating seed metal in the via openings. The seed layer may be sputtered or evaporated. A lift-off process can be used to confine the seed layer within the via openings, or alternately, the seed layer can be deposited as a blanket film. A blanket seed layer uses a subsequent mask application and patterning to define the areas to be plated.

FIG. 20E shows another transparent dielectric layer to encapsulate the upper mirror segments and etched holes for electrical contacts to the lower mirror segments as used in a submount for a high-performance light-emitting diode.

The via openings are filled with a metallization stack designed to be compatible with the finish on the LEDs and with other objects that may be attached to the submount, such as interposers. For example, a finish may be applied (e.g., by deposition of electroless nickel, and/or electroless palladium, and/or immersion gold) according to known-in-the-art practices for compatibility with many die attach solder materials such as gold-tin alloy. Alternatively, a die attach material can be evaporated or plated, such as for copper or gold stud bonding.

If a blanket seed layer was deposited and masked to define the plating regions, the mask and seed layer are removed from the areas that were not plated using wet or dry etching.

As an example, the following steps may be used:

The substrate is a silicon wafer with 3 μm of thermally grown silicon dioxide. This thickness of oxide is sufficient to withstand a voltage of 600 VAC, the high voltage requirement for commercial 12V LED lamps in North America and Europe.

The lower reflective metal stack is comprised of a 250 Å Ti adhesion layer, a 200 Å Ni barrier layer, and 3000 Å of Ag. This thickness of silver has a high reflectivity over the visible portion of the spectrum and is thick enough that the resistance of the metal is small relative to that of a LED. The protective layer over the mirror stack is 300 Å of $Al_2O_3$.

The Ti/Ni/Ag mirror and $Al_2O_3$ coating are patterned using a lift-off resist process. The wafer is coated with a bi-layer resist stack of an underlying lift-off resist (LOR) and an upper positive photoresist. The resist is patterned, with the LOR layer undercut relative to the upper positive resist, the mirror is deposited, followed by the $Al_2O_3$, and then a solvent is used to remove the resist and unwanted metal/dielectric. A sputter process is used for the Ti/Ni/Ag mirror deposition. A non-reactive sputter process is used to deposit the $Al_2O_3$. The $O_2$ used in a reactive $Al_2O_3$ deposition process can react with the Ag mirror surface and degrade its reflectivity. Whether sputtered or deposited using e-beam evaporation, the deposition of the metals and $Al_2O_3$ must be directional to prevent a continuous film from forming up the sidewall of the photoresist. The film must be discontinuous to facilitate a clean lift-off process.

A blanket layer of 6000 Å $SiO_2$ is deposited. This oxide layer forms a conformal film over the underlying layers. PECVD or a non-directional sputter process may be used to achieve the necessary conformity.

The gaps between the mirror segments that provide electrical isolation between the LED cathode and anode are covered with reflectors. These upper reflective segments are formed using an identical Ti/Ni/Ag metal stack as the lower mirror segments. The Ag thickness in this case could be as thin as 1500 Å as this layer does not conduct current (1500 Å is enough for reflectivity purposes). As before, a 300 Å layer of $Al_2O_3$ covers the Ti/Ni/Ag stack. The upper segments are formed using a lift-off process identical to that used for the lower mirror.

Another blanket layer of 6000 Å $SiO_2$ is deposited to encapsulate the upper mirror segments. Again, PECVD or a non-directional sputter process is used to produce a conformal oxide layer.

The wafer is coated with photoresist that is patterned to create openings for via holes over the lower mirror segments providing current paths to the LED anode and cathode. If no plating seed layer is needed, a single layer of positive photoresist is used. If a seed layer will be deposited later after vias are etched in the oxides, then a bi-layer stack of LOR and positive photoresist is used. After the resist is patterned with a standard UV exposure and develop, the $SiO_2$ is removed from the via holes using a reactive ion etch (RIE) process. A suitable etch chemistry is 45 $CHF_3$:5 $O_2$. The thin layer of $Al_2O_3$ may be removed by etching it at room temperature in 5:1 buffered oxide etchant (5 parts 40% $NH_4F$:1 part 49% HF by volume) for 20 seconds.

After the vias have been formed through the dielectrics, the optional plating seed layer can be deposited using e-beam evaporation. This layer can be 300 Å of Ni. The resist mask is removed using a resist stripper.

The wafer is immersed in an electroless nickel plating bath to produce a nickel layer about 3 microns thick.

This layer extends over the perimeter of the via opening and acts to seal the underlying silver layer.

The wafer is rinsed and placed in an electroless palladium bath to produce a palladium layer about 0.2 microns thick.

The wafer is rinsed and placed in an immersion gold bath to produce a gold finish of about 0.05 microns.

FIG. 21A shows a submount subassembly 21A00 having a seed layer patterned before depositing the metal mirror stack and exposed for plating by etching to form a submount.

The plating seed layer is deposited first and patterned. Patterning may be done with wet or dry etching, or a lift-off process may be used. The seed layer in this structure now has to conduct current laterally, so it needs to be thicker than the seed layer from FIG. 20D. As an example, 3000 Å of Ni can be sputtered directionally and patterned with a lift-off process.

FIG. 21B shows a patterned plating seed layer used to facilitate contact formation with a plating process as used to form a submount for a high-performance light-emitting diode.

The bottom mirror stack and protective dielectric are deposited after the plating seed layer has been patterned. Patterning of the bottom mirror stack and protective dielectric now includes gaps to expose the underlying seed layer. The gaps over the seed layer are created during the same step as the gaps to electrically isolate the anode and cathode current paths and the gaps to create singulation streets on the wafer. As before, this may be done using wet or dry etching or a lift-off process. The earlier example of sputtered Ti/Ni/Ag and non-reactive sputtered $Al_2O_3$ patterned by a lift-off process can be used here as well.

FIG. 21C shows a patterned mirror and protective dielectric segments covering the seed layer to prevent light from being absorbed in the seed layer.

FIG. 21D shows a patterned upper mirror segment with protective dielectric coating to reflect light that would otherwise pass between lower mirror segments. It also illustrates a transparent dielectric layer to encapsulate the lower mirror segments and isolate them from the upper mirror segments.

The etch process to open via holes to the seed layer only needs to remove the upper dielectric material because the lower protective dielectric has already been opened over the seed layer. This can be advantageous when employing a protective dielectric material that is difficult to etch through. Following the earlier example from FIG. 20A through FIG. 20D, a dry etch using $CHF_3$ and $O_2$ gases can be used to etch through an upper layer of $SiO_2$.

FIG. 22A depicts a submount subassembly having a plating seed layer and a metal mirror stack deposited and patterned in contemporaneous steps.

The submount subassembly 22A00 depicts a variant of the submount structure with the plating seed metal extending to the edge of the lower mirror segments. This approach uses one less photolithography step than the structure shown in FIG. 21A, as the seed metal, mirror stack and protective dielectric are all patterned at once.

FIG. 22B1 shows patterned segments consisting of a plating seed layer, a metal mirror stack, and a transparent protective dielectric coating. The dielectric coating facilitates formation of plated contacts, enhances light reflection, and prevents chemical attacks of the mirror.

The plating seed layer, lower mirror stack and protective dielectric are deposited sequentially and patterned together. Patterning may be accomplished with a lift-off process, or via wet or dry etching. With the seed layer beneath the mirror, the mirror stack can be thinned to facilitate easier step coverage by the upper dielectric without compromising conductivity. As an example, the sputtered Ag can be reduced to 1500 Å from 3000 Å. The seed layer can be 1500 Å of sputtered Ni. Alternately, the seed layer can be incorporated into the mirror stack. For example, Ni can act both as a plating seed layer and a barrier layer in a mirror stack. In this case, the thin 200 Å Ni barrier can be increased to 1500 Å for improved current conduction.

FIG. 22B2 shows patterned segments formed without a plating seed layer. The patterned segments may be defined by a lithography, deposition, and lift-off sequence. Alternately, the patterned segments may be deposited, then lithographically defined and etched to define the segments. The apparatus comprises a metal mirror stack, and a transparent protective dielectric coating. The dielectric coating facilitates formation of plated contacts, enhances light reflection, and prevents chemical attacks of the mirror.

FIG. 22C shows a patterned upper mirror segment with protective dielectric coating to reflect light that would otherwise pass between lower mirror segments.

The via etch to expose the plating seed layer removes the upper dielectric, the protective dielectric over the mirror stack, and either some of, or the entire, mirror stack. The etch stops on the seed layer. As before, the $SiO_2$ can be removed with a 45 $CHF_3$:5 $O_2$ dry etch. The $Al_2O_3$ can be removed with 5:1 buffered oxide etchant. The 1500 Å Ag can be etched at room temperature in a mixture of 1 $NH_4OH$:1 $H_2O_2$:20 $H_2O$ for 75 seconds ($NH_4OH$ is 29% $NH_3$ in $H_2O$ by volume; $H_2O_2$ is 30% $H_2O_{22}$ in $H_2O$). If the seed layer is 1500 Å Ni beneath the mirror stack, the 200 Å Ni in the mirror stack can be removed in 30 seconds at room temperature by a solution of 20% $HNO_3$ in $H_2O$. The 250 Å Ti in the mirror stack can be removed in 15 seconds at room temperature by a solution of 1 HF:10 $H_2O$ (HF is 49% HF in $H_2O$ by volume). The HF solution does not etch the underlying Ni seed metal, so the Ni serves as an etch stop for the via formation. If a thick Ni barrier in the mirror stack also serves as a seed layer, the via etch is complete after the Ag is removed.

In an alternative configuration, the mirror stack can be used as the plating seed for the plated pad. For example, the Ni stack can be plated from Ag using a Pd activator to promote the initiation of plating. This approach is simpler to fabricate and provides a thicker metal buffer under the plated pad to manage the stress of the thicker Ni pad during thermal cycling.

FIG. 23A shows a submount 23A00 where the metal mirror is made discontinuous by a deposition over a self-aligned dielectric pillar.

FIG. 23A illustrates another variation of a submount. This structure employs an undercut pillar or mesa to electrically isolate the LED anode and cathode current paths. The advantage of this structure is the simple method to separate the mirror segments, which eliminates a photolithography step. This structure lacks singulation streets on the wafer where metal is absent, but pillars (e.g., see FIG. 23A) can be used on either side of a singulation cut to confine any damage to the thin films that may arise from the singulation process. The pillar height is small compared to the metal stacks used for die attach, so the LED electrodes can contact the lower mirror segments without issue. Alternately, the mirror segments sitting on top of the pillars can serve as the conductive paths between LED terminals, but the additional thickness of the pillar dielectric can result in worse heat conduction from the LED.

FIG. 23B shows layers of the dielectric pillar prior to etching.

The dielectric pillar formation begins with a trio of blanket depositions. The pillar layers can be deposited with e-beam, PECVD or sputtering. There must exist a selective etch process to preferentially remove the middle dielectric over the first and third layers. Conventional lithography can be used to pattern a resist mask that defines pillar locations on the wafer.

FIG. 23C shows an etched dielectric pillar with the middle layer undercut by the etching process to create a break in the subsequent metal mirror stack.

The pillar is formed by etching the top dielectric layer, then selectively etching the middle dielectric, stopping on the lower dielectric layer. For example, a pillar of 1500 Å $Si_3N_4$/8000 Å $SiO_2$/1500 Å $Si_3N_4$ can be created by dry etching the top $Si_3N_4$ layer in a mixture of 9 $CF_4$:1 $O_2$, then wet etching the $SiO_2$ in 5:1 buffered oxide etchant. The wet etch is isotropic and selective, naturally creating an undercut in the $SiO_2$ as it etches vertically. PECVD $SiO_2$ can be removed by 5:1 buffered oxide etchant at a rate eight times or greater relative to that of PECVD $Si_3N_4$. Etching 8,000 Å $SiO_2$ for 2 minutes and 20 seconds at room temperature in 5:1 buffered oxide etchant creates an undercut of approximately 0.5 µm.

FIG. 23D shows a metal mirror stack that is deposited using a directional process so the sidewall of the dielectric pillar is not coated.

The mirror stack is added to the structure with a directional blanket deposition. The metal layers can be deposited with e-beam or sputter deposition, but the deposition tool must be configured so the metal flux to the wafer is directional. The directional nature of the deposition ensures the mirror does not form a contiguous layer up the pillar sidewall.

A protective optically transparent dielectric layer is deposited to encapsulate the mirror segments. This deposition must not be directional, as the dielectric must enclose the sidewalls of the mirror segments, protecting them against chemical attack during subsequent processing and long-term exposure to elements in the atmosphere such as sulfur. A PECVD process or a non-directional sputter process can be used to deposit this layer, shown as dielectric 3 in FIG. 23E.

FIG. 23E shows a transparent dielectric film encapsulating the metal mirror stack to protect it against chemical attack. Processing proceeds as outlined in the previous examples: via openings are etched in the protective dielectric layer and an optional plating seed layer can be deposited on the exposed mirror elements. Techniques for these steps have been discussed in the previous examples, and they also apply to the aforementioned pillar structures.

Figure 24:
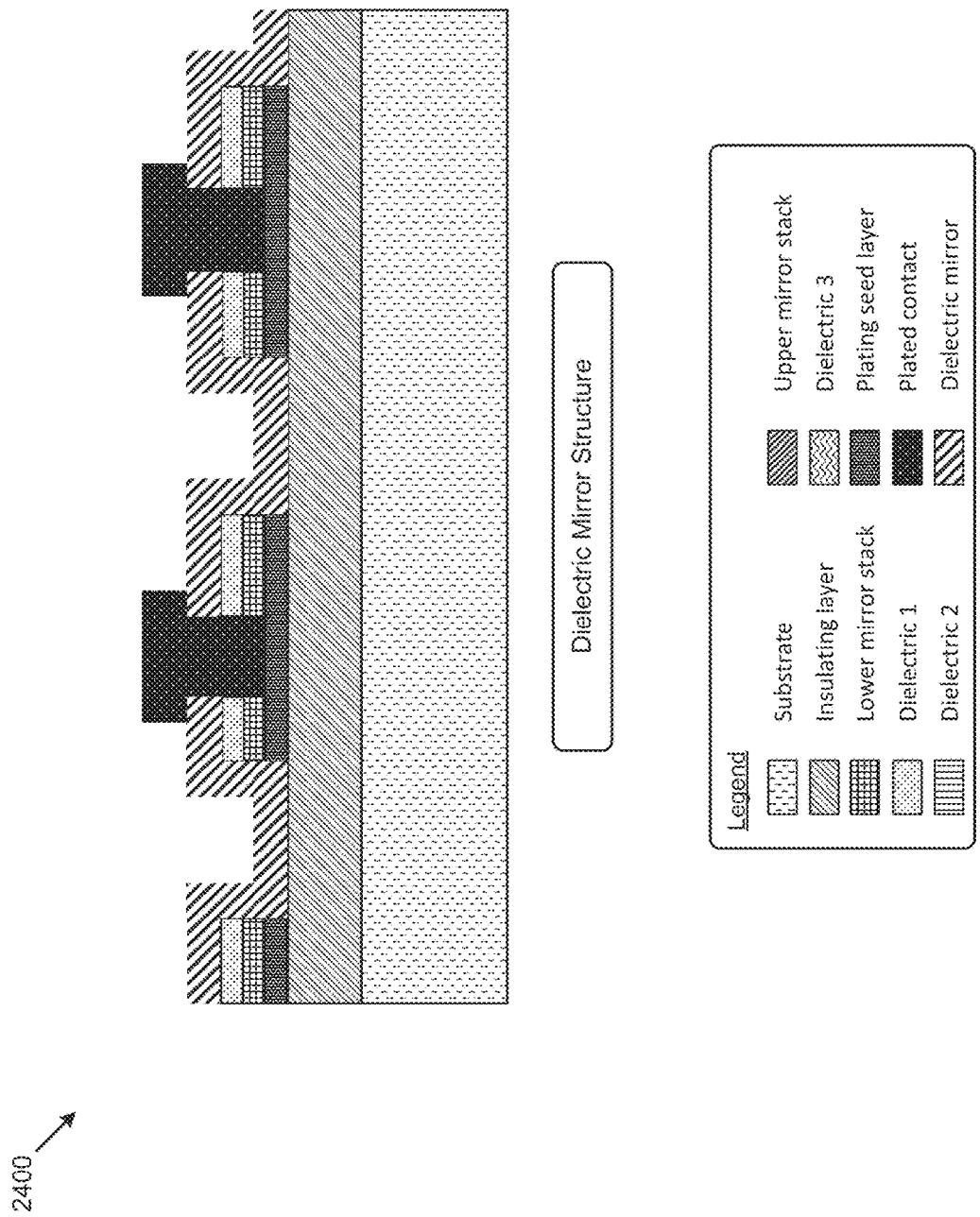
FIG. 24 shows a submount where the seed layer and metal mirror stack are deposited and patterned in contemporaneous steps and over which is deposited dielectric mirror segments, according to some embodiments.

FIG. 24 shows a submount 2400 where the seed layer and metal mirror stack are deposited and patterned in contemporaneous steps and over which is deposited dielectric mirror segments.

This structure is a variant of the structure illustrated by FIG. 22A, where the function of the upper mirror segments is now performed by a dielectric mirror.

Figure 25:
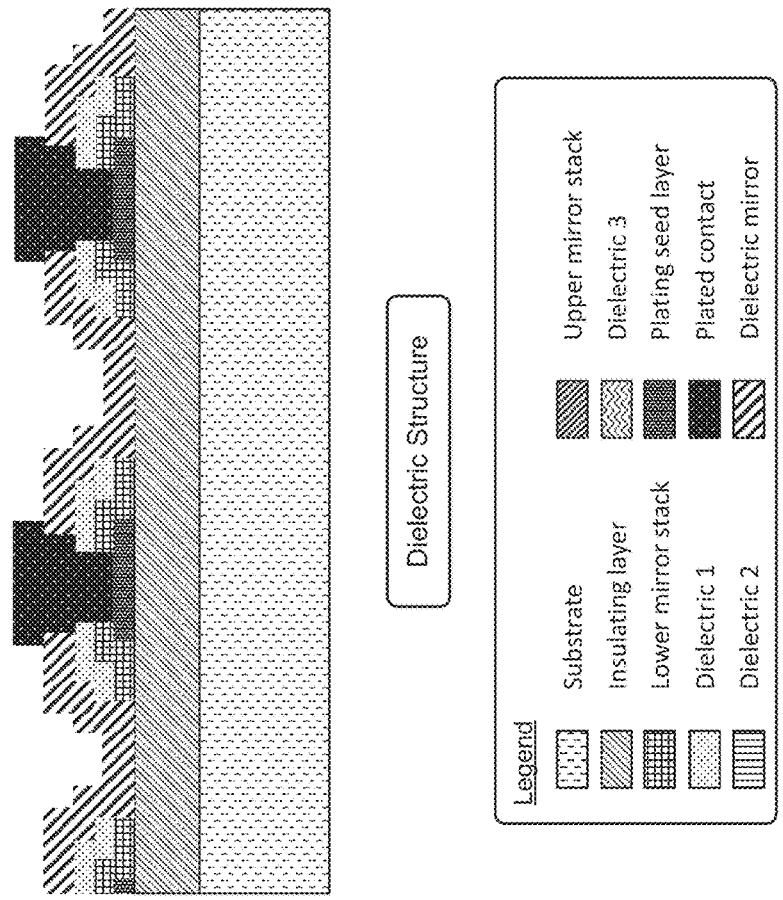
FIG. 25 shows a submount where the plating seed layer is patterned before depositing the metal mirror stack and over which is deposited a dielectric mirror for fabricating a high-performance light-emitting diode, according to some embodiments.

FIG. 25 shows a submount 2500 where the plating seed layer is patterned before depositing the metal mirror stack and over which is deposited a dielectric mirror for fabricating a high-performance light-emitting diode.

This structure includes a dielectric mirror, where the function of the upper mirror segments (e.g., see FIG. 21D) is performed by the dielectric mirror.

Figure 26:
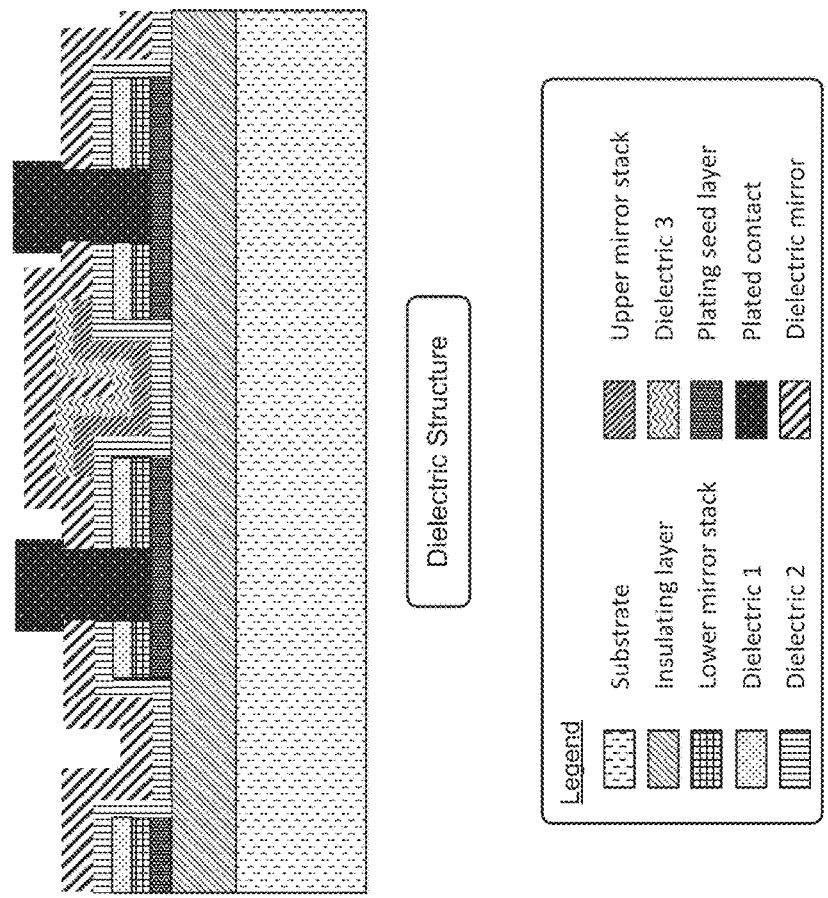
FIG. 26 shows a submount where the seed layer and metal mirror stack are deposited and patterned in contemporaneous steps, according to some embodiments.

FIG. 26 shows a submount 2600 where the seed layer and metal mirror stack are deposited and patterned in contemporaneous steps.

The shown submount is formed by a seed layer and metal mirror stack being deposited and patterned in contemporaneous steps, and where a transparent dielectric layer separates segments of the mirror from an upper metal mirror which conceals gaps between lower mirror segments and over which is deposited a dielectric mirror. The materials used in the upper mirror and its protective dielectric coating may differ from those used in the lower mirror.

Figure 27:
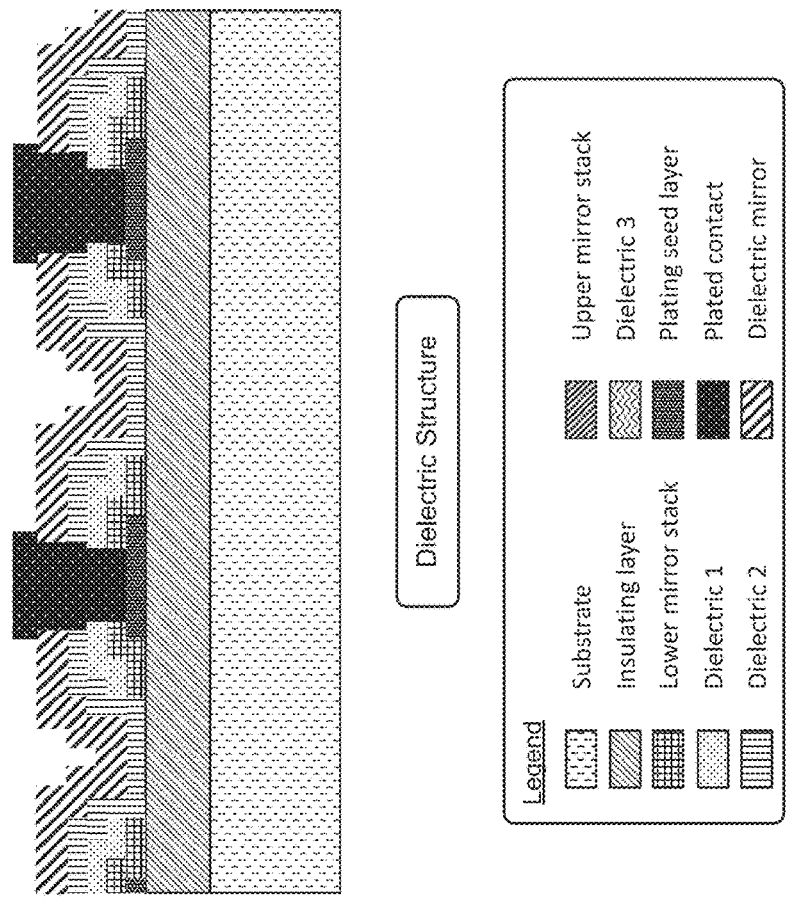
FIG. 27 shows a submount where the plating seed layer is patterned before depositing the metal mirror stack and over which is deposited both a transparent dielectric layer and a dielectric mirror, according to some embodiments.

FIG. 27 shows a submount 2700 where the plating seed layer is patterned before depositing the metal mirror stack and over which is deposited both a transparent dielectric layer and a dielectric mirror.

This structure is a variant of the structure illustrated by FIG. 26, where the upper mirror segments are now omitted (e.g., to simplify fabrication).

Figure 28:
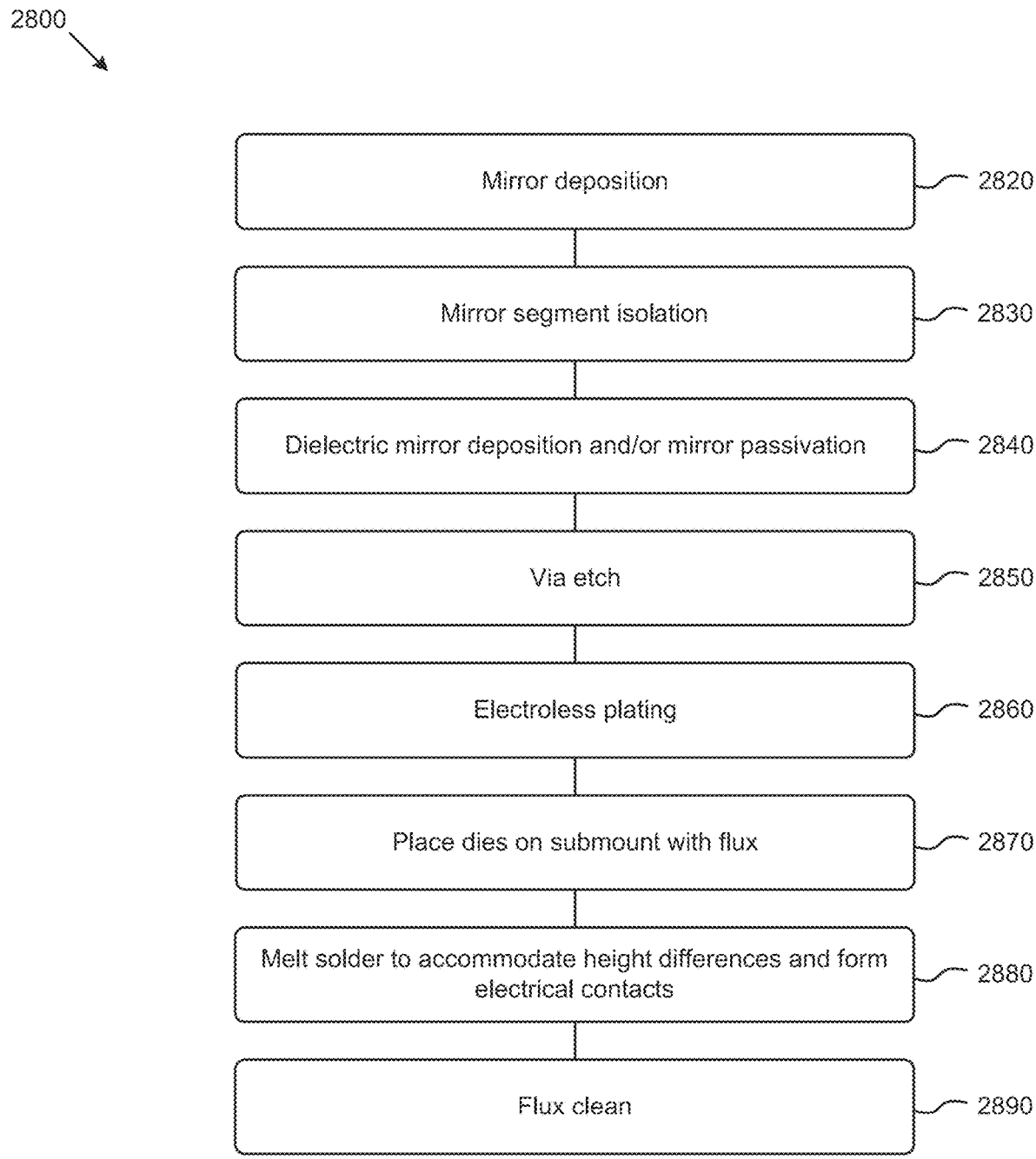
FIG. 28 is a flow chart of a process flow for assembly of a submount as used in fabricating a high-performance light-emitting diode, according to some embodiments.

FIG. 28 is a flow chart of a process flow 2800 for assembly of a submount as used in fabricating a high-performance light-emitting diode.

The flow commences upon mirror deposition (see step 2820), followed by mirror segment isolation (see step 2830). A second layer of mirror (e.g., to form a dielectric mirror) can be added (see step 2840), and passivated as needed. Via can be etched (see step 2850) and plated (see step 2860). The assembly can receive LED die, for example, using flux (see step 2870) and the die can be soldered to form electrical connections. As is discussed herein there may be a height difference between anode and cathode of an LED die, which height difference can be accommodated by any technique, including the herein-disclosed techniques for establishing wetting/de-wetting regions in juxtaposition to the solder, then melting the solder to accommodate height differences and form electrical contacts (see step 2880). A next step cleans away residual flux (see step 2890).

Figure 29A:
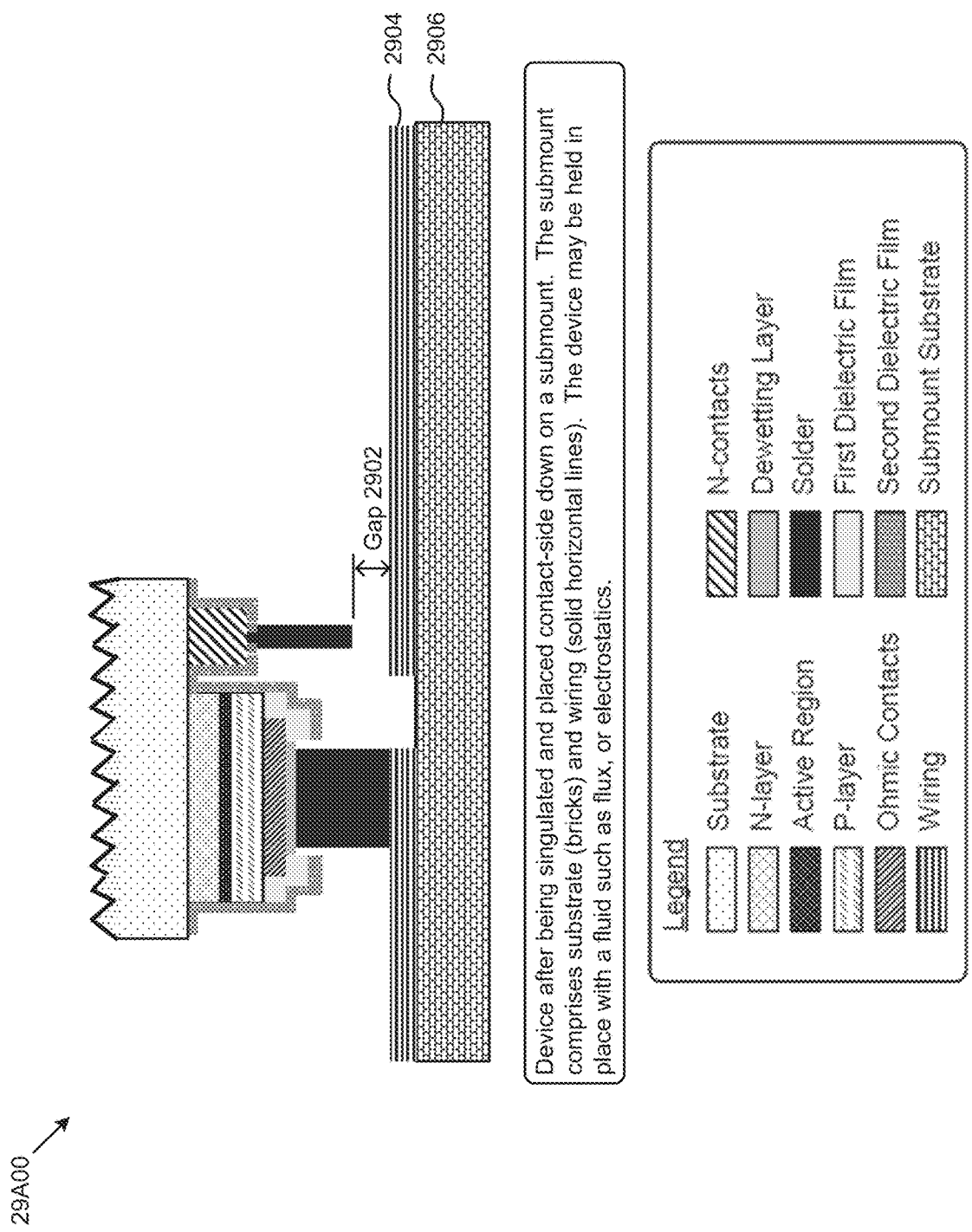
FIG. 29A depicts an epitaxially-formed LED atop a highly-reflective submount to fabricate a high-performance light-emitting diode, according to some embodiments.

FIG. 29A depicts an epitaxially-formed LED atop a highly-reflective submount to fabricate a high-performance light-emitting diode.

LED devices are singulated and placed contact-side down on submount. As shown, the submount consists of submount substrate 2906 (brick pattern) and layers of wiring 2904 (solid horizontal lines). Elements of the assembly are held in place temporarily with a fluid such as solder flux or electrostatics until the solder reflow is performed to permanently attach the die to the submount. In such configuration, there is a natural gap between the top of the anode and cathode in the LED given by the etch depth to reach the n-contact and the stacking of the metal layers. This gap needs to be compensated to accomplish a reliable contact for the cathode (see such techniques as are disclosed herein).

Figure 29B:
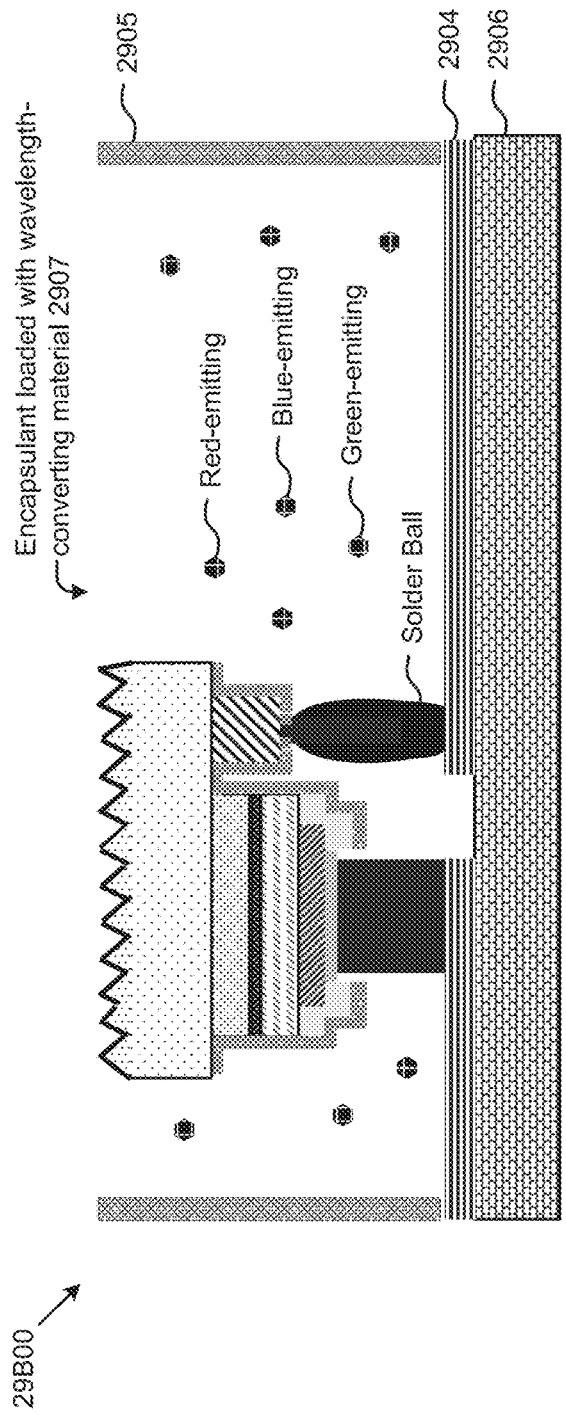
FIG. 29B depicts an epitaxially-formed LED atop a highly-reflective submount to fabricate a high-performance light-emitting diode, according to some embodiments.

FIG. 29B depicts an epitaxially-formed LED atop a highly-reflective submount to fabricate a high-performance light-emitting diode.

As shown, the die is encapsulated. The encapsulant can be loaded with wavelength-converting materials (e.g., red-emitting phosphor, blue-emitting phosphor, green-emitting phosphor, etc.). In some cases the encapsulant is also loaded with thermally-conductive materials, which may be index matched. Related techniques are disclosed in U.S. application Ser. No. 14/022,587, filed on Sep. 10, 2013, and U.S. application Ser. No. 14/097,481, filed on Dec. 5, 2013, each of which is incorporated by reference in its entirety.

Figure 30:
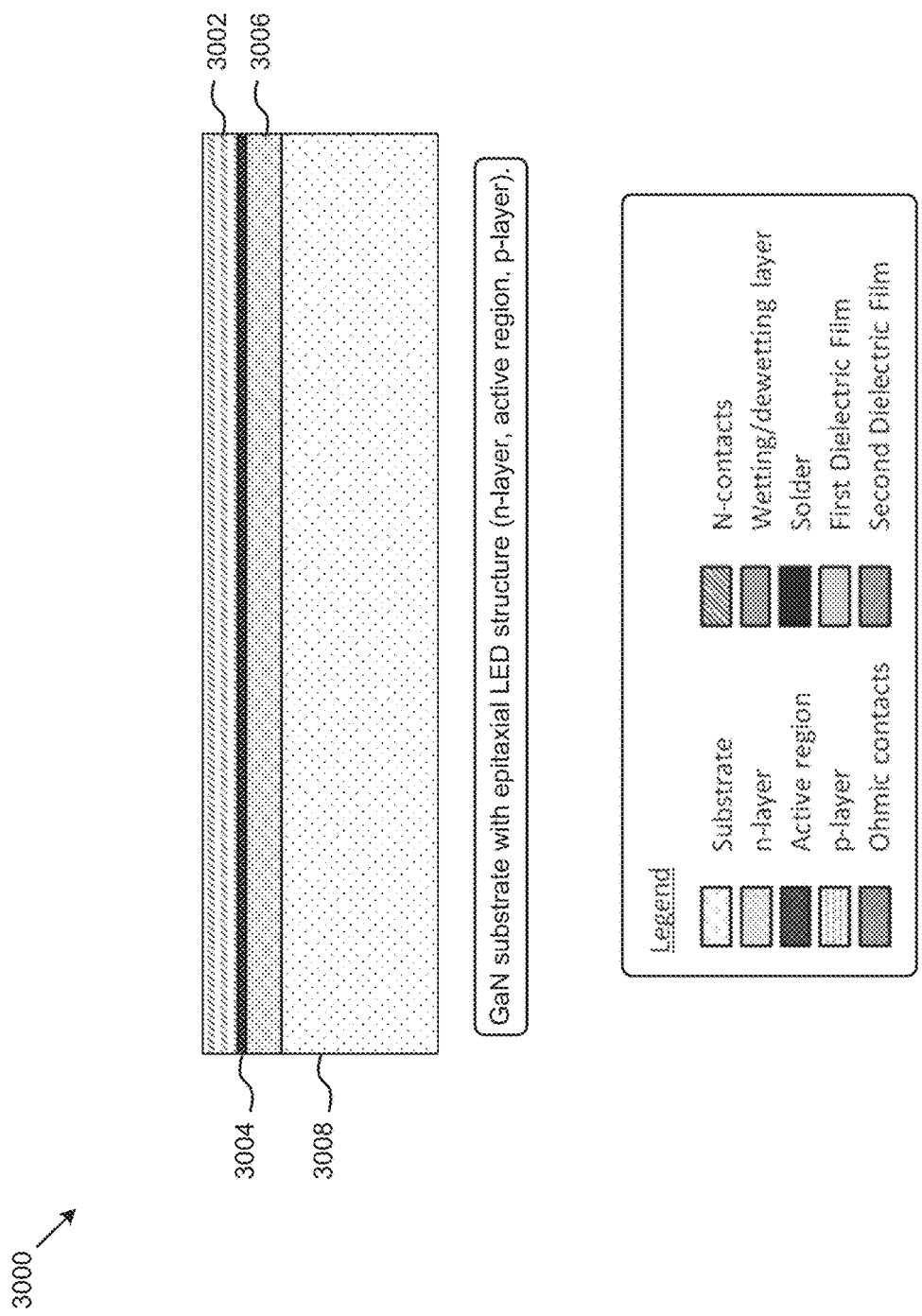
FIG. 30 depicts an epitaxially-formed LED structure prior to forming ohmic contacts to fabricate a high-performance light-emitting diode, according to some embodiments.

FIG. 30 depicts an epitaxially-formed LED structure 3300 prior to forming ohmic contacts to fabricate a high-performance light-emitting diode.

The figure depicts a GaN substrate 3008 doped n-type with an epitaxial structure consisting of an n-type layer 3006, an active region 3004, and a surface p-type layer 3002.

Figure 31:
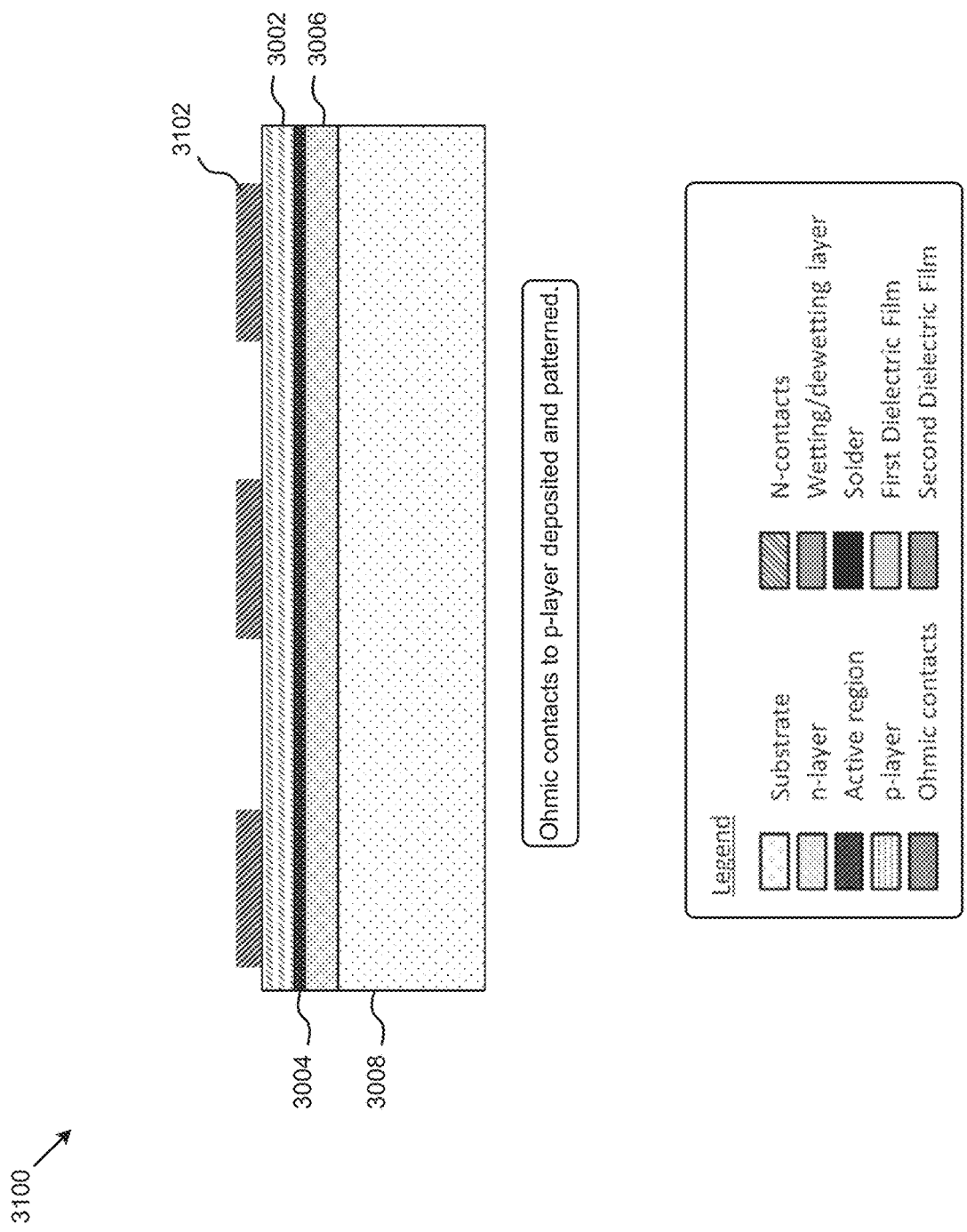
FIG. 31 depicts ohmic contacts deposited atop an epitaxially-formed LED structure as used in fabricating a high-performance light-emitting diode, according to some embodiments.

FIG. 31 depicts ohmic contacts deposited atop an epitaxially-formed LED structure 1200 as used in fabricating a high-performance light-emitting diode.

The p-contacts 3102 can be formed by a liftoff process, consisting of forming a pattern with photoresist, cleaning the wafer, depositing the p-contact metal, then dissolving the resist and excess metal. Alternately, the wafer may be cleaned and the metal deposited, then patterned and wet etched to define the contact area. The metal deposition may begin with a thin platinum layer, followed by silver for high reflectivity, and a stack of other metals to prevent interdiffusion and provide environmental and mechanical protection of the silver layer. In an example, the stack on top of the silver may consist of titanium, platinum, gold, and platinum.

Figure 32:
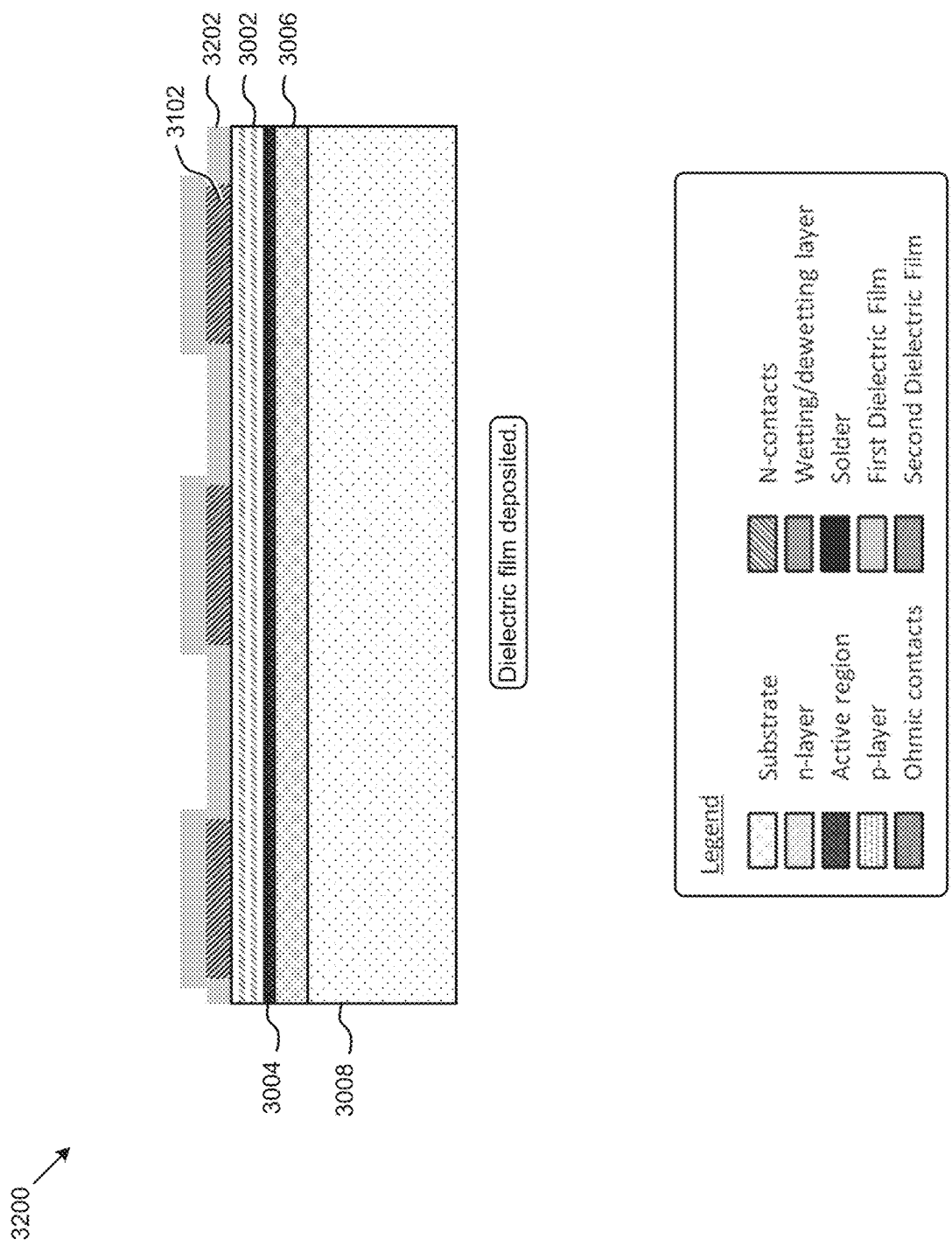
FIG. 32 depicts an LED structure having a dielectric film as used in fabricating a high-performance light-emitting diode, according to some embodiments.

FIG. 32 depicts an LED structure 3200 having a dielectric film as used in fabricating a high-performance light-emitting diode.

Dielectric coating 3202 is deposited over the whole surface of the wafer and the p-contact, whether the p-contact is formed from one or two deposition steps. The dielectric coating may consist of silicon nitride, silicon oxide, aluminum oxide, hafnium oxide, or any other insulator with low optical absorption. The deposition method may be plasma-enhanced chemical vapor deposition, chemical vapor deposition, sputtering, atomic layer deposition, or any other technique that provides good adhesion of dielectric to the underlying metal and semiconductor and good step coverage and thickness to fully encapsulate the ohmic contact.

Figure 33:
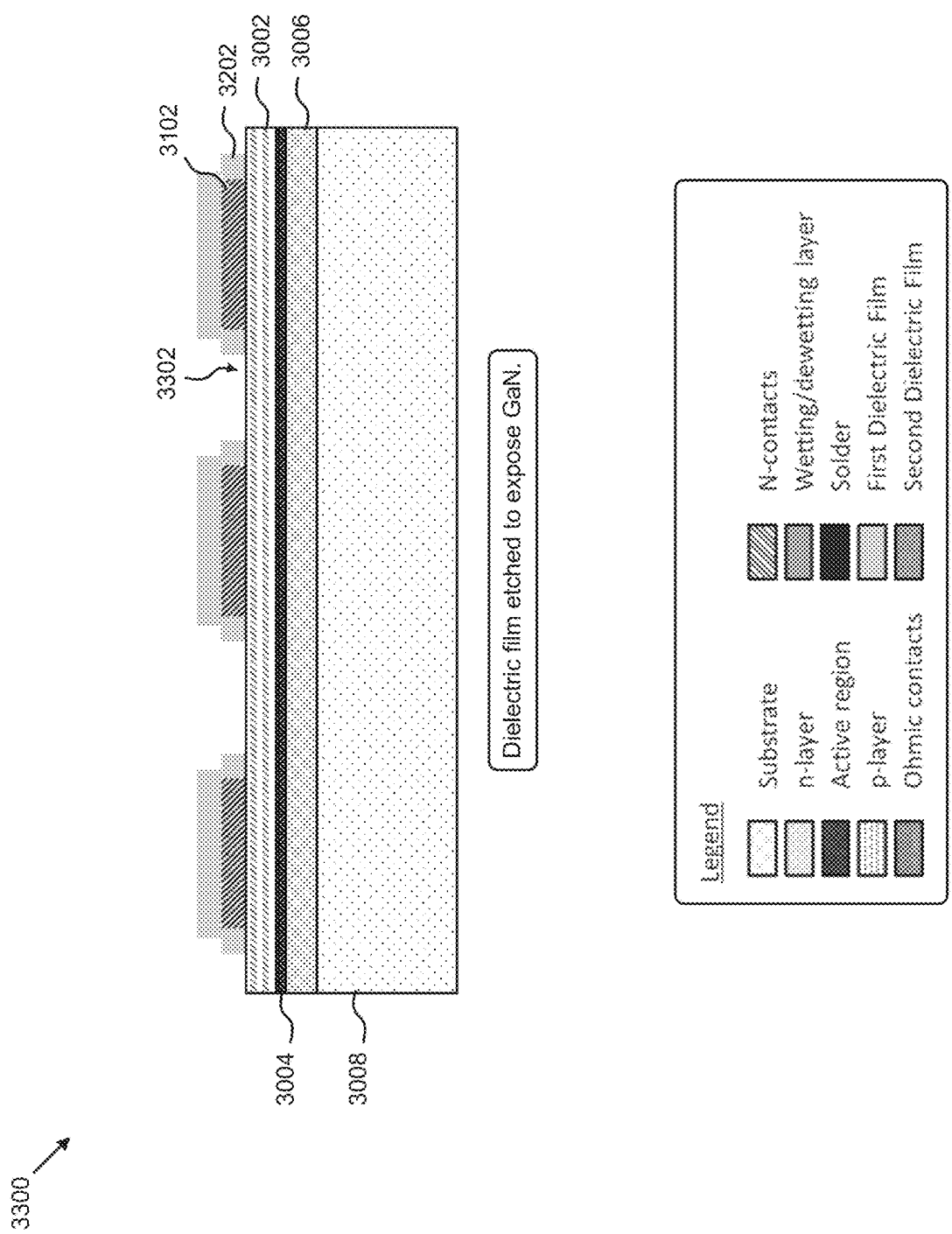
FIG. 33 depicts an LED structure after etching through the dielectric film to expose GaN as used in fabricating a high-performance light-emitting diode, according to some embodiments.

FIG. 33 depicts an LED structure 3300 after etching through the dielectric film to expose GaN as used in fabricating a high-performance light-emitting diode.

As shown, the etching through the dielectric film results in exposed GaN 3302.

Figure 34:
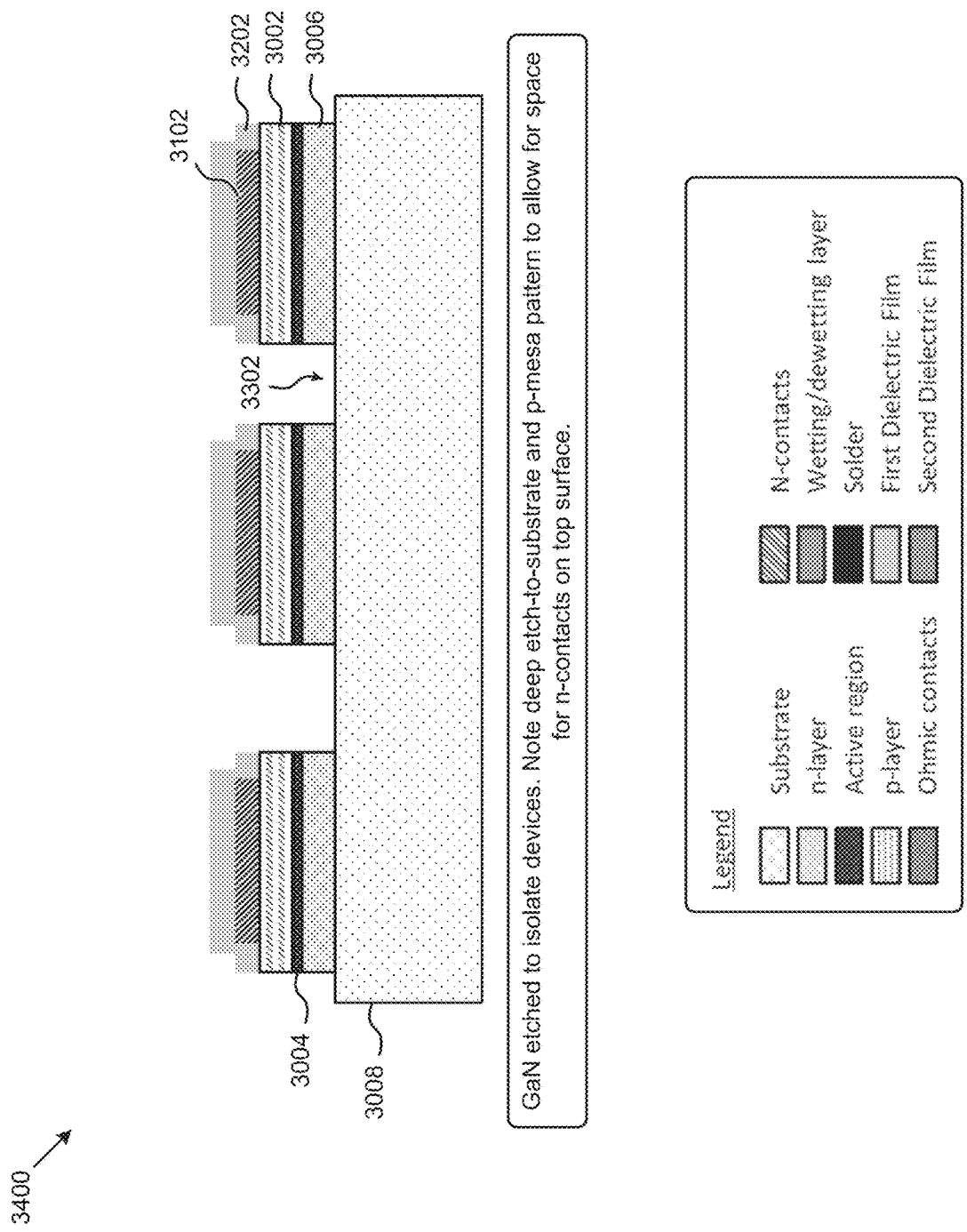
FIG. 34 depicts isolated LED devices, according to some embodiments.

FIG. 34 depicts isolated LED devices 3400.

The depth of the isolation etch is sufficient to reach the n-type material. In an example, this etch extends through the epistructure and into the n-type substrate.

Figure 35:
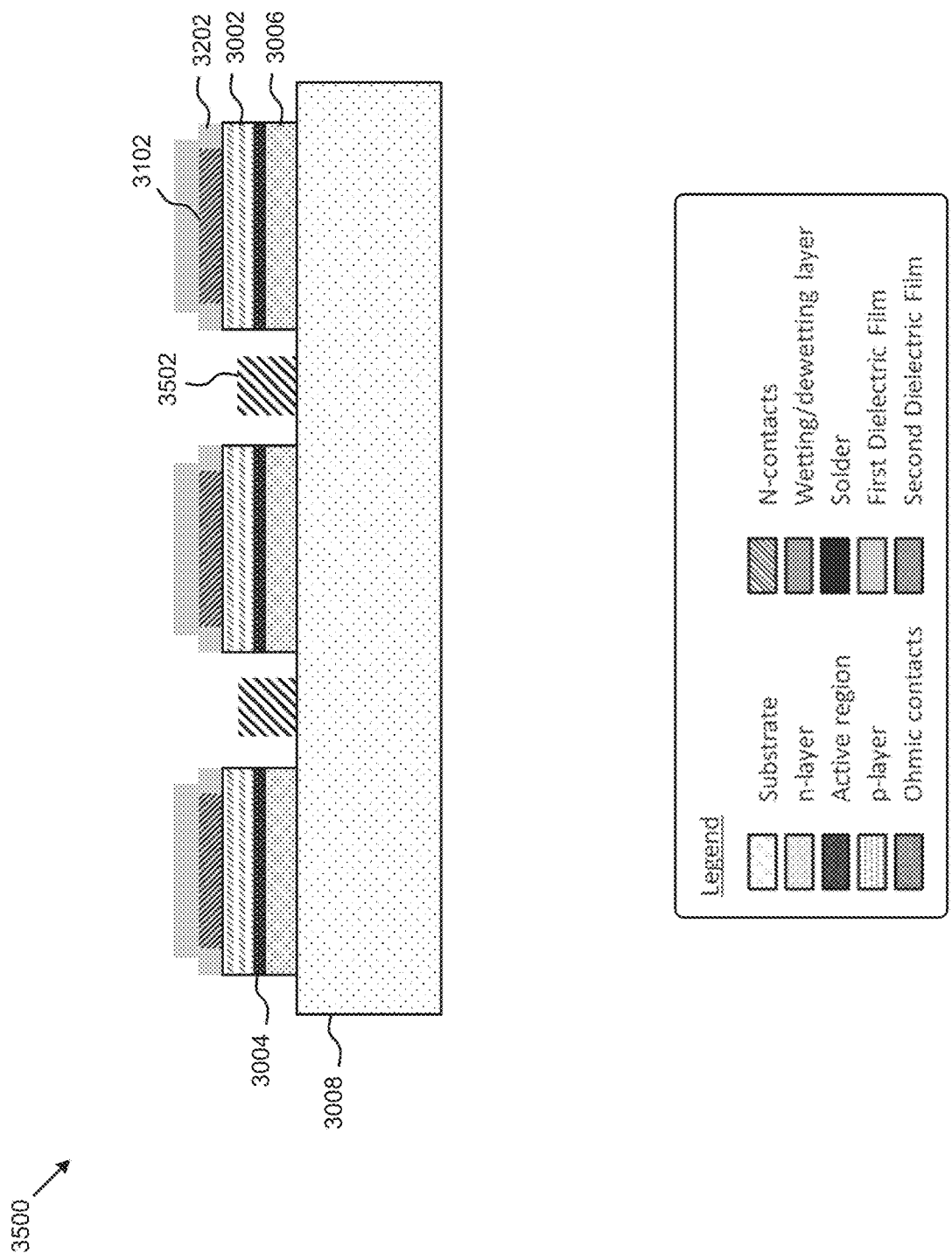
FIG. 35 depicts n-contacts deposited on the gallium face of a high-performance light-emitting diode, according to some embodiments.

FIG. 35 depicts n-contacts deposited on a high-performance light-emitting diode.

Similar to the p-contact process, the n-contact 3600 is formed through either a liftoff or a deposition-and-etch process. The first metal against the n-type material is chosen to form a highly reflective and low-resistance contact to n-type GaN. For example, the contact metal may be aluminum or silver. Subsequent metals are evaporated to protect the reflective layer during the remainder of the process and to prevent interdiffusion between the reflective metal and the solder alloys during assembly. For example, the aluminum may be followed by 200 nm of nickel and 100 nm of platinum. Before the deposition begins, a sequence of plasma and wet cleans is used to improve ohmic contact properties.

Figure 36:
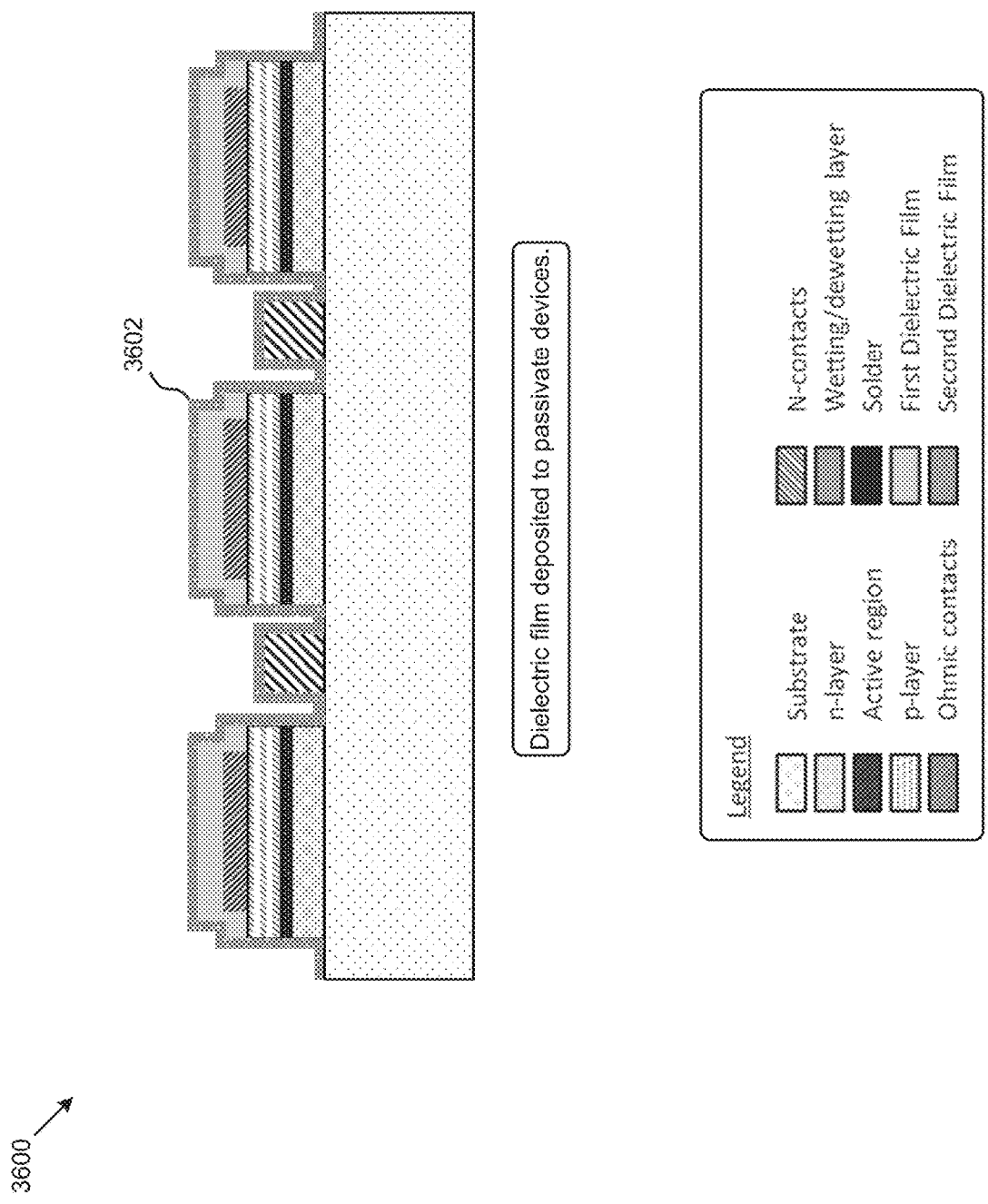
FIG. 36 shows a passivating dielectric film deposit deposited over the wafer, according to some embodiments.

FIG. 36 shows a passivating dielectric film deposited over the wafer.

Dielectric coating 3602 is deposited over the whole surface of the wafer, contacts, and previous dielectric film. The dielectric coating may consist of silicon nitride, silicon oxide, aluminum oxide, hafnium oxide, or any other insulator with low optical absorption. The deposition method may be plasma-enhanced chemical vapor deposition, chemical vapor deposition, sputtering, atomic layer deposition, or any other technique that provides good adhesion of dielectric to the underlying metal and semiconductor and good step coverage and thickness to fully encapsulate the ohmic contact, as well as providing passivation to the etched LED p-n junction sidewall.

FIG. 37A is a side view 37A00 shows areas of a dielectric film that are etched to create a via to expose p-contacts and n-contacts. The figures shows an etch area 3702.

Figure 37B:
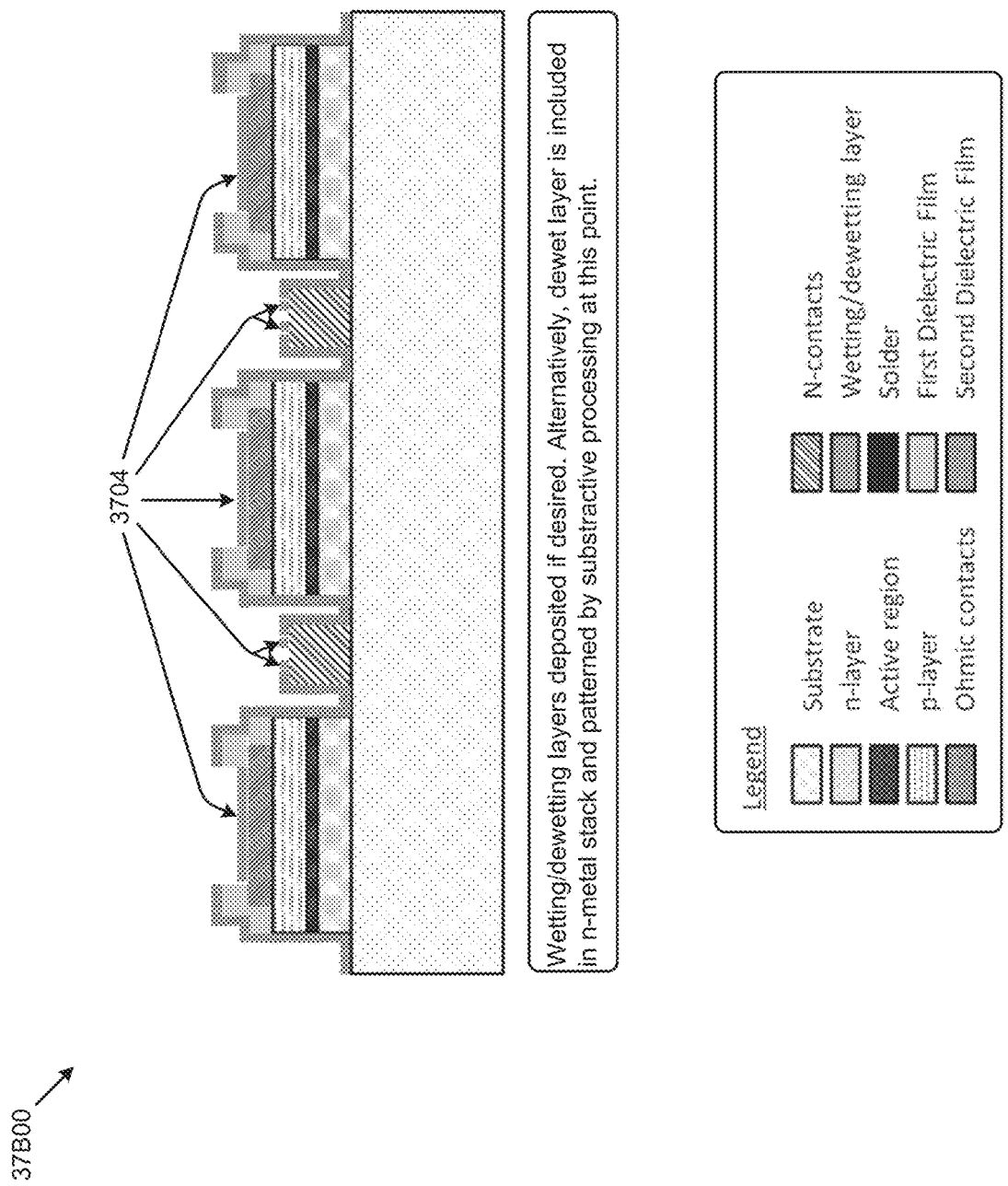
FIG. 37B is a side view showing dewetting layer atop the n-contact of a high-performance light-emitting diode, according to some embodiments.

FIG. 37B is a side view showing a dewetting layer atop the n-contact of a high-performance light-emitting diode.

The purpose of the dewetting layer is to define regions of the surface where the solder will attach (wetting regions) and regions where the solder will not attach (dewetting regions). During the die attach process, the solder melts and the surface tension forces act to pull the solder off of the dewetting regions and accumulate it in the wetting regions.

FIG. 37C and FIG. 37D depict solder deposition and melting.

In the case of the solder overlapping dewetting and wetting regions as in FIG. 37C, the portions of the solder on the dewet regions will flow off onto the wetting regions, increasing the thickness of the metal in that area. In this way the difference in heights between different portions of the die may be accommodated to attach to a submount with coplanar contacts. In addition, height differences between the submount attach pads may be tolerated while still forming electrical contacts between the metallization on the die and submount.

The surface of the wetting region may consist of platinum, nickel, palladium, silver, gold, or any other material that has a low contact angle for molten solder. It can be deposited by evaporation, sputtering, or another process and defined by a liftoff or an etchback process. It can be deposited separately on a field of non-wetting material, or it can be deposited as part of an underlying structure and exposed during subsequent processing. For example, the wetting layer can be platinum deposited at the time of the n-contact.

The surface of the dewetting region may consist of silicon nitride, silicon oxide, titanium, tungsten, or other alloys or dielectrics that have a large contact angle with molten solder. It can be deposited by evaporation, sputtering, or another process and defined by a liftoff or an etchback process.

In the case of wetting layers, the wetting material has a higher surface energy than molten solder so that the solder will flow across the surface to reduce the total surface energy. An example is a Ni/Au stack, for instance 100 nm Ni and 20 nm Au, which will act as a wetting layer for AuSn eutectic solders. In the case of dewetting layers, the interface between the layer and the solder has a higher surface energy than the combination of exposed dewetting layer area and the molten solder surface, so that the solder spontaneously flows off of the dewetting layer. An example is Ti—W alloy with 90% W. Another example is titanium or chrome with surface oxide and AuSn eutectic solder.

In the case of a solder pad smaller than the wetting layer as in FIG. 37D, the solder will spread to cover the wetting region and reduce in thickness. Either method can be used to compensate for height differences. However, from the fabrication perspective, it may be more convenient to use techniques as in FIG. 37C as it uses thinner (and larger) areas of solder to start, which in some situations is more amenable to thin-film deposition techniques.

Figure 38:
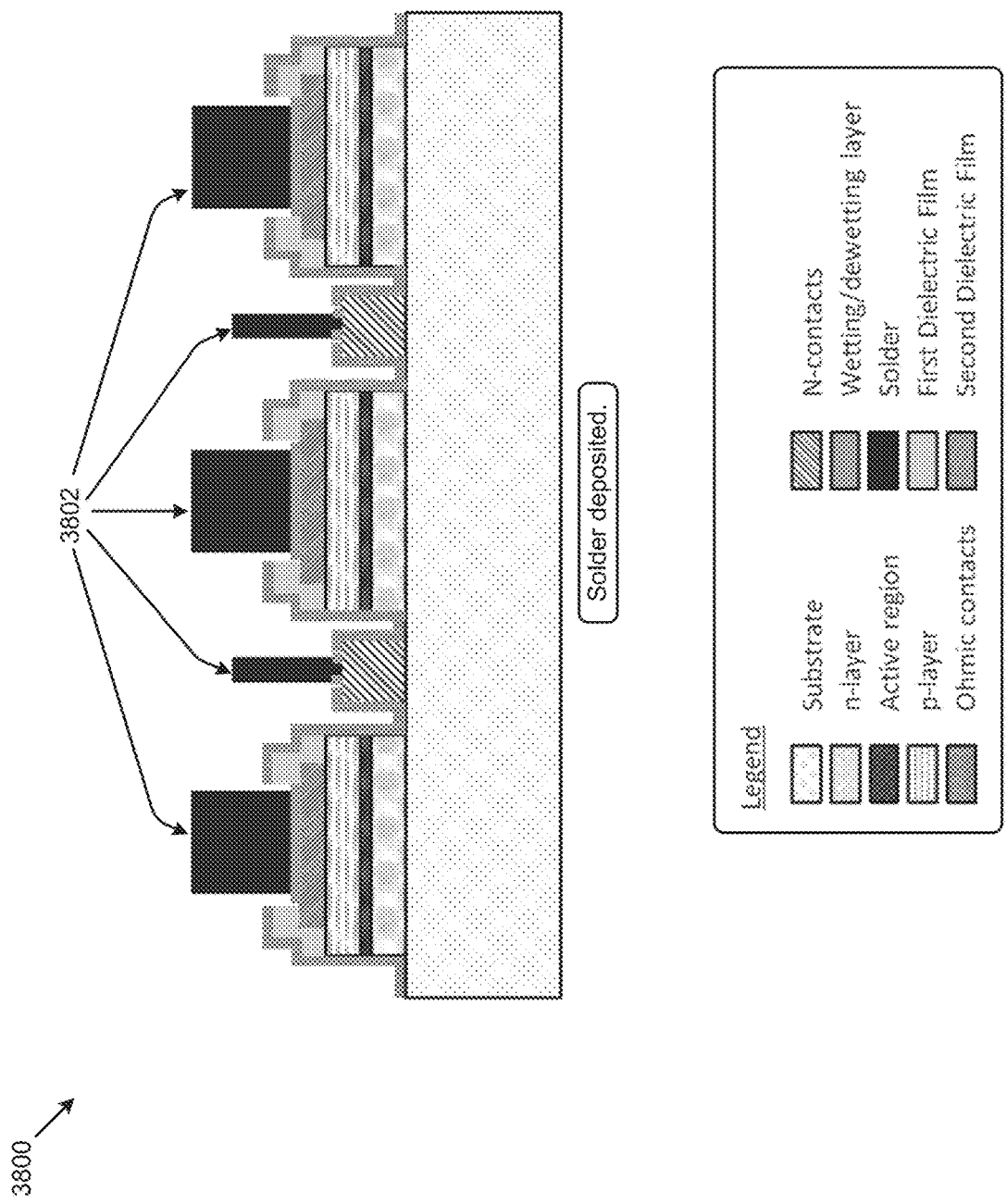
FIG. 38 shows solder deposits deposited on contacts of a high-performance light-emitting diode, according to some embodiments.

FIG. 38 shows solder deposits 3802 disposed on contacts of a high-performance light-emitting diode. A sequence of cleaning steps is performed and then followed by solder deposition. The solder may be compositions around 78/22 Au/Sn, or 60/40 Pb/Sn, or indium, or others. The solder overlaps regions of differing wettability in order to produce the ball-up effect on melting and will therefore make up for differences in die and/or submount height.

Figure 39:
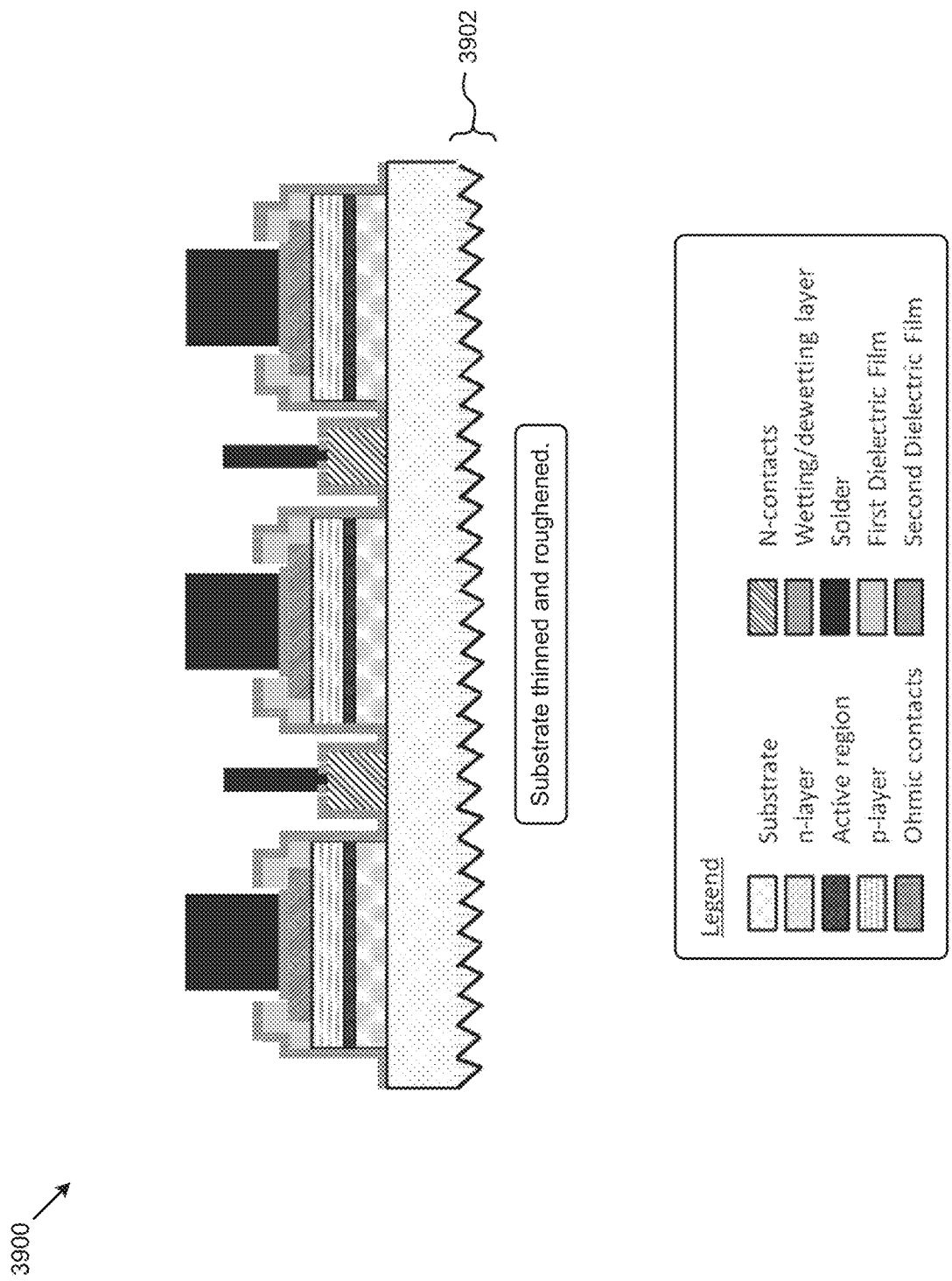
FIG. 39 shows results of substrate thinning to form a high-performance light-emitting diode, according to some embodiments.

FIG. 39 shows results of substrate thinning 3900 to form a high-performance light-emitting diode. The final thickness and surface finish 3902 of the device can be controlled by lapping, polishing, and roughening processes to maximize the light extraction from the device. The device is separated from the substrate into individual die by laser or mechanical scribing followed by mechanical break, sawing, through-wafer etching, or others, in order to form a die shape with good light extraction. The die shape may be square, rectangular, rhombohedral, triangular, or other. The die separation process may contribute to improved light extraction by producing die sidewalls that incorporate a roughness component. Roughening can be accomplished using any know techniques, including any of the techniques disclosed on commonly-owned U.S. application Ser. No. 13/781,633, filed on Feb. 28, 2013, which is incorporated by reference in its entirety.

Figure 40A:
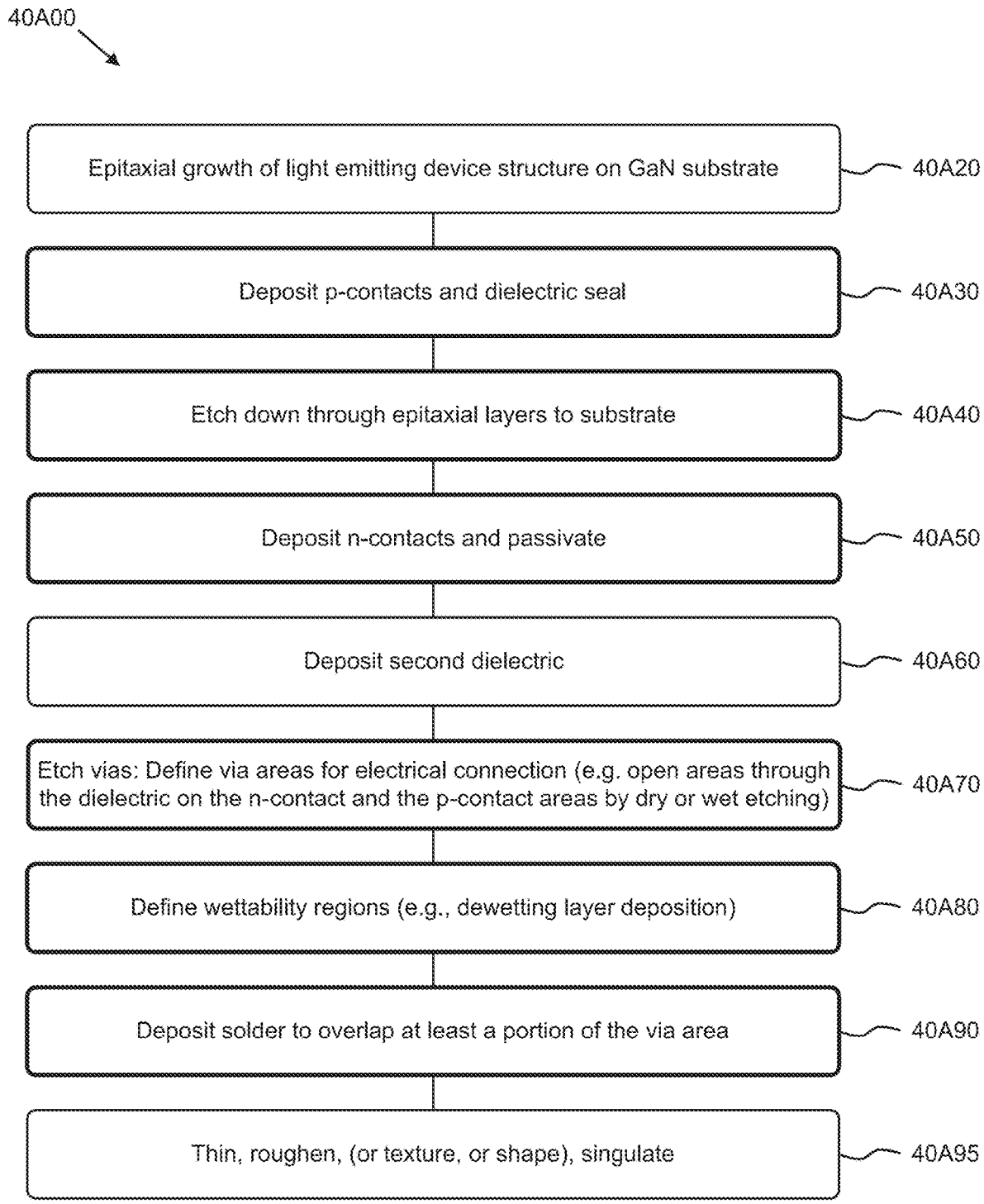
FIG. 40A is a flow chart of a process flow for assembling a high-performance light-emitting diode, according to some embodiments.

FIG. 40A is a flow chart of a process flow 40A00 for assembling a high-performance light-emitting diode.

The process flow 40A00 includes a series of steps for the assembly. Certain of the steps are highlighted for further discussion as presented herein. Some of the steps are presented purely for ease of disclosing the process flow. Strictly as one example of a process flow for assembling a high-performance light-emitting diode:

After epitaxial growth (step 40A20), p-contacts must be deposited and defined (see step 40A30). These contacts may be defined by performing lithography and a subsequent directional deposition of a metal stack. The principal metal contacting the p-type layer is highly reflective, such as silver, so as to minimize optical loss due to absorption of light generated in the die. A layer of certain elements, such as platinum, palladium or nickel, or others, may be incorporated as a thin, non-contiguous deposition at the interface or within the silver film to aid in forming a low-resistance contact. Additional conductive layers on top of the p-contact (e.g., using materials such as any of or combinations of titanium, nickel, platinum, and gold) may be deposited in the same deposition or subsequent depositions to provide chemical and environmental protection of the main reflective layer, and to facilitate subsequent processing and solder-attach steps. In addition, a dielectric layer may be deposited, for example by PECVD, to provide a first protective seal of the contact. After the p-contacts have been deposited, a lithography step is used to protect areas of the wafer from etching. The protective resist layer covers the p-contacts. An etching step isolates individual die by etching through the p-type layer, the active layer, and the epitaxial n-type layer down to the substrate (see step 40A40).

Following the isolation etch processing, the resist is stripped and areas for n-contact formation are defined with another lithography step (see step 40A50). The surface may be cleaned with wet and plasma methods, and metal deposited, for example by evaporation. The first metal to contact the substrate is highly reflective, such as aluminum or silver. Subsequent layers such as nickel and platinum are added to provide compatibility with solder alloys. After the metal deposition, the entire surface of the wafer is covered with dielectric such as $SiO_2$ or SiN (see step 40A60). The processing of step 40A60 serves to passivate the etched sidewalls and may further serve to provide a dewetting surface used in step 40A80.

Following the passivation deposition the wafer is lithographically patterned to define via areas for electrical connection. One or more areas is opened through the dielectric on the n-contact and the p-contact areas by dry or wet etching (see step 40A70).

After the via opening, the dewetting/wetting areas are defined (see step 40A80). To define dewetting areas, a film can be deposited with has high interfacial energy with the molten solder alloy chosen in the next step. Conversely, a wetting area is defined by providing a material with low interfacial area to the molten solder alloy chosen in the next step. For example, if the solder alloy is gold-tin eutectic (abbreviated as AuSn here), surfaces such as silicon nitride, silicon oxide, titanium oxide, titanium with native oxide, tungsten-10% titanium alloys, and other materials, exhibit a high interfacial energy with molten AuSn. These materials are dewetting surfaces and can be deposited by techniques such as sputtering, evaporation, or CVD, and patterned by liftoff or etching. Also for AuSn solder, materials such as nickel or titanium without surface oxides, platinum, gold, and others, provide low interfacial energy with molten AuSn. These materials are wetting surfaces and can be deposited by techniques such as sputtering, evaporation, or CVD, and patterned by liftoff or etching. Note that in some instances a defined wetting/dewetting area may be provided without a separate step. For example, the top layer of the n-contact might be platinum, and the passivating dielectric SiN, and the solder AuSn. Then the via is etched and an larger AuSn layer deposited that overlaps the via area and some of the silicon nitride passivation layer. In this instance, the silicon nitride acts as the dewetting layer and the exposed platinum n-contact surface as the wetting layer.

After defining the different wetting or non-wetting regions for solder, a solder alloy is applied. The solder alloy overlaps at least a portion of the via area. The via area is at least partly wet by the solder alloy. A portion of the solder may also fall outside of the via area. The portion of the solder outside of the via area may be on a wettable or non-wettable material. Depending on the solder alloy of choice, the deposition method may vary. The solder alloy is selected so as to remain in a solid state over the range of temperatures the assembly may be subjected to during assembly and operation. For instance, the solder alloy may be alloys with a composition around the gold-tin eutectic with about 20 weight percent tin, which melts in the range of 280° C. to 320° C. In this case, the alloy may be deposited by thermal evaporation and liftoff Alternately, the alloy of choice may be deposited by sputtering, melt jetting, or other techniques. Before deposition a variety of cleaning methods such as plasma or wet cleans may be employed to improve solder adhesion during the rest of the process. In addition, thin adhesion layers may be deposited before the solder layer to improve adhesion. For example, 5 nm of nickel and 5 nm of gold may be deposited under AuSn. These adhesion layers are soluble in the molten alloy and thin enough so as to not significantly affect the melting temperature or kinetics, so that the dewetting behavior is not degraded significantly (see step 40A90).

Following the solder deposition, the wafer undergoes grinding, lapping and/or polishing. The final wafer thickness is chosen to be compatible with further wafer handling. For example, the final wafer thickness can be determined based on design and manufacturing metrics such as high-yield singulation (e.g., laser scribe singulation), and/or such as minimizing light absorption in the substrate, and/or such as providing good electrical, thermal, and mechanical performance, and/or such as maximizing light extraction from the device (see step 40A95).

One problem in producing a flip-chip device with multiple electrical contacts and attaching it to a submount is the method of accommodating variations in the height of the contacts on the device and/or the submount. This is illustrated in FIG. 29A. In this case the gap 2902 is caused by the fact that the n-metal and solder thickness does not match the thickness of the etch and the metals on the p-contact. Even if thicknesses were matched, tolerances of the thicknesses and etch depth would result in gaps varying from device to device. This height difference between the n-contact and the p-contact is accommodated using the combination of solder and dewetting/wetting regions as deposited in steps 40A80 and 40A90. When the solder melts, its geometry can adjust to minimize the total Gibbs free energy. This is accomplished by the surface tension of the liquid alloy causing the shape of the liquid alloy to change to reduce the total area of high surface/interface energy and increasing the area of low surface energy while maintaining the total volume (mass). For example, take a 100 micron diameter disc of 80% gold-20% tin (AuSn) solder that is 2 microns thick, sitting on silicon nitride. The silicon nitride has a 50 micron diameter hole exposing a platinum surface. When the AuSn melts, the total energy is reduced if the diameter of the disc decreases to reduce the area of high interfacial energy AuSn-silicon nitride interface. In order to achieve this, the total surface area of liquid AuSn increases slightly, which costs interfacial energy. The diameter continues to shrink until the total energy is minimized. In practice, for this combination of materials and dimensions, the interfacial energies are such that the AuSn disk will shrink to the diameter of the platinum surface and be approximately 8 microns tall. Therefore, a height difference of up 6 microns between contacts can be accommodated and electrical contact formed. If there is excess AuSn, when it reaches the opposing electrical contact it will begin to spread, for example across an electroless nickel/immersion gold surface.

The situation of a small solder region on a larger wettable region will result in the solder spreading to cover the wettable region until the total surface energy is minimized. This will reduce the height of the solder region and can also provide some accommodation of the height difference between electrical contacts. However the relative height change is limited to the original solder height with this wetting/spreading approach.

The final shape of the solder after melting is determined by a combination of the starting solder shape, the wetting area shape, the dewetting area shape, and the relevant surface and interfacial energies. The starting shape includes all contiguous volumes of solder. For example, the solder may flow up or down a step to form the final shape as long as there is no physical break in the solder layer. This ability to control the final solder shape independently of the starting shape adds process and design flexibility. For example, solder may dewet from a particular area (e.g., as per a particular design), increasing the gap between electrical conductors and providing larger breakdown voltage after assembly. This can also control which areas of the electrical contact are made first and help to reduce trapped voids at solder interfaces.

The combination of dewetting and wetting surfaces with solder placement provides electrical connections between die contacts and submount contacts. In some cases, the contacts on the die and submount are each not precisely coplanar. This non-coplanarity can be due to process design and variability (e.g., choice of mesa etch depths and metal thickness on the die, and non-uniformity in submount contact deposition). The wetting and dewetting areas with solder deposited can be arranged on the submount, or the wetting and dewetting areas with solder deposited can be arranged on the die. In some situations, it may be advantageous to perform all or portions of step 40A80 and step 40A90 on the submount rather than performing those steps on the die. For instance, in some cases, more space is available for depositing solder and achieving larger solder volumes and larger, lower resistance electrical contacts if the solder dewetting scheme is applied to the substrate. In other instances, (e.g., depending on the solder deposition techniques used) it may be more felicitous to perform the deposition on the die because the fraction of die covered with solder is much higher—leading to reduced waste of the deposited solder material. In certain cases where the gap between electrical contacts to be connected is very large, it may be felicitous to use a combination of solder deposited on both the die and solder deposited on submount.

Figure 40B:
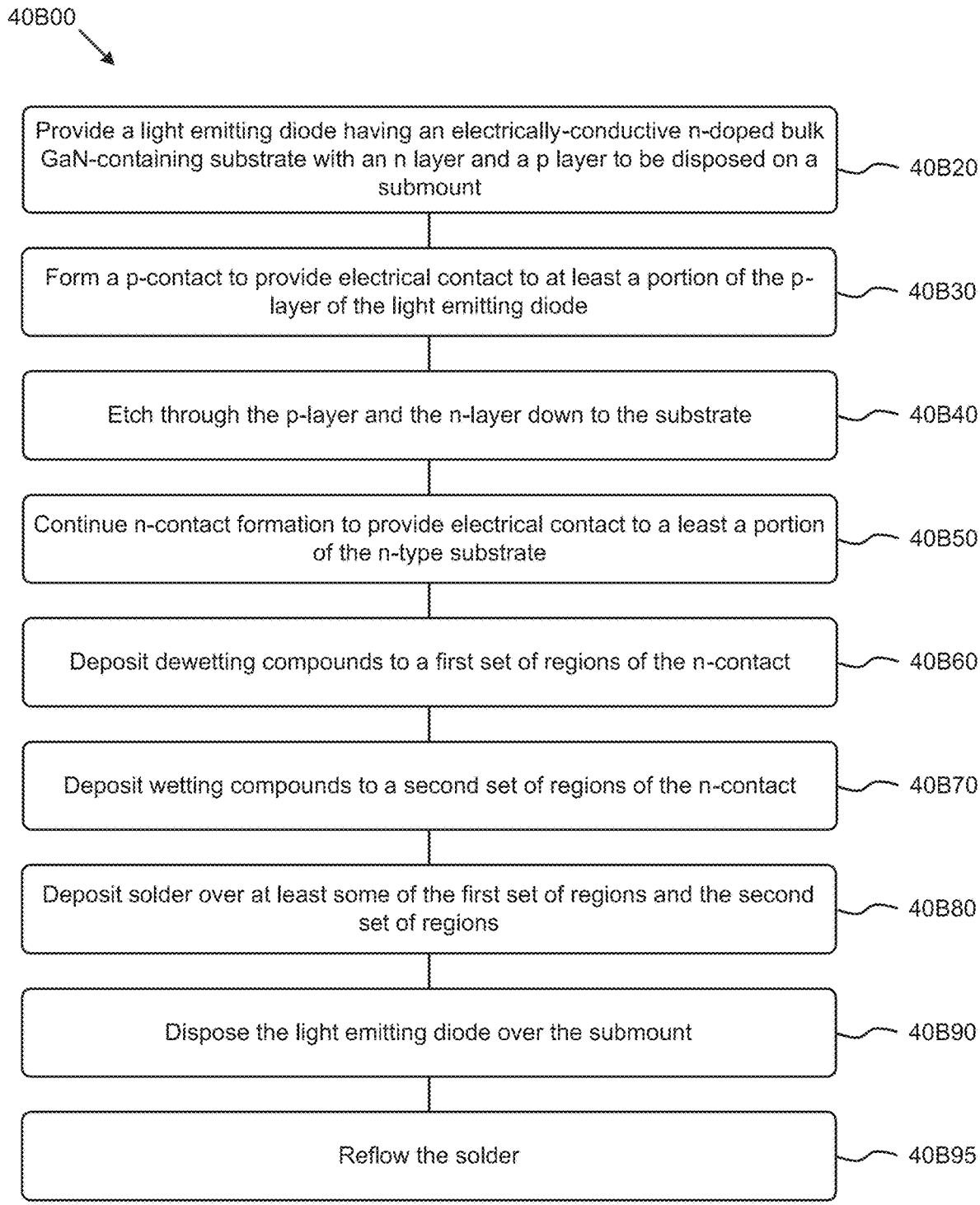
FIG. 40B is a flow chart of a process flow for assembling a high-performance light-emitting diode, according to some embodiments.

FIG. 40B is a flow chart of a process flow 40B00 for assembling a high-performance light-emitting diode. This flow is further described as pertaining to the embodiments below.

Embodiment 1

A method of forming a light emitting diode having an electrically-conductive n-doped bulk GaN-containing substrate with an n layer and a p layer to be disposed on a submount (step 40B20), the method comprising: performing p-contact formation to provide electrical contact to at least a portion of the p-layer of the light emitting diode (step 40B30); etching through the p-layer and the n-layer down to the substrate (step 40B40); performing n-contact formation to provide electrical contact to a least a portion of the n-type substrate (step 40B50); performing dielectric passivation; depositing dewetting compounds on a first set of regions of the n-contact (step 40B60); depositing wetting compounds on a second set of regions of the n-contact (step 40B70); depositing solder over at least some of the first set of regions and the second set of regions (step 40B80); disposing the light emitting diode over the submount (step 40B90); and reflowing the solder (step 40B95).

Embodiment 2

The method of claim 1 wherein the etching is performed using photolithography and an etchant.

Embodiment 3

The method of embodiment 1, wherein the n-contact formation comprises depositing multiple layers of metals.

Embodiment 4

The method of embodiment 3, wherein the multiple layers of metals includes at least one layer of at least one element selected from the list consisting of silver, gold, platinum, palladium, titanium, tungsten and nickel.

Embodiment 5

The method of embodiment 1, wherein the dielectric passivation includes at least some deposition of at least one material selected from the list consisting of a $SiO_2$-containing material, a SiN-containing material, a hafnium oxide-containing material, an aluminum oxide-containing material, a niobium oxide-containing material, a tantalum oxide-containing material, a titanium oxide-containing material, a magnesium oxide-containing material, and a zirconium oxide-containing material.

Embodiment 6

The method of embodiment 1, wherein the dewetting compounds includes at least some deposition of at least one material selected from the list consisting of, a silicon-nitride-containing material, silicon-oxide-containing material, a titanium-oxide-containing material, a tungsten-containing material.

Embodiment 7

The method of embodiment 6, wherein the dewetting compounds are deposited using at least one of, sputtering, evaporation, CVD.

Embodiment 8

The method of embodiment 7, wherein the dewetting compounds are patterned by a liftoff process or by an etching process.

Embodiment 9

The method of embodiment 1, wherein the wetting compounds include at least some deposition of at least one material selected from the list consisting of nickel, gold, platinum, silver, copper, palladium, and cobalt.

Embodiment 10

The method of embodiment 1, wherein the solder includes at least one solder material selected from the list consisting of gold, tin, a gold-tin eutectic.

Embodiment 11

The method of embodiment 10, wherein the solder is a gold-tin eutectic of about 20% weight tin.

Embodiment 12

The method of embodiment 10, further comprising a plasma cleaning step.

Embodiment 13

The method of embodiment 1, further comprising depositing a layer of an adhesion material before depositing the solder.

Embodiment 14

The method of embodiment 13, wherein the adhesion material is soluble in the solder material when the solder material is in a molten state.

Figure 41:
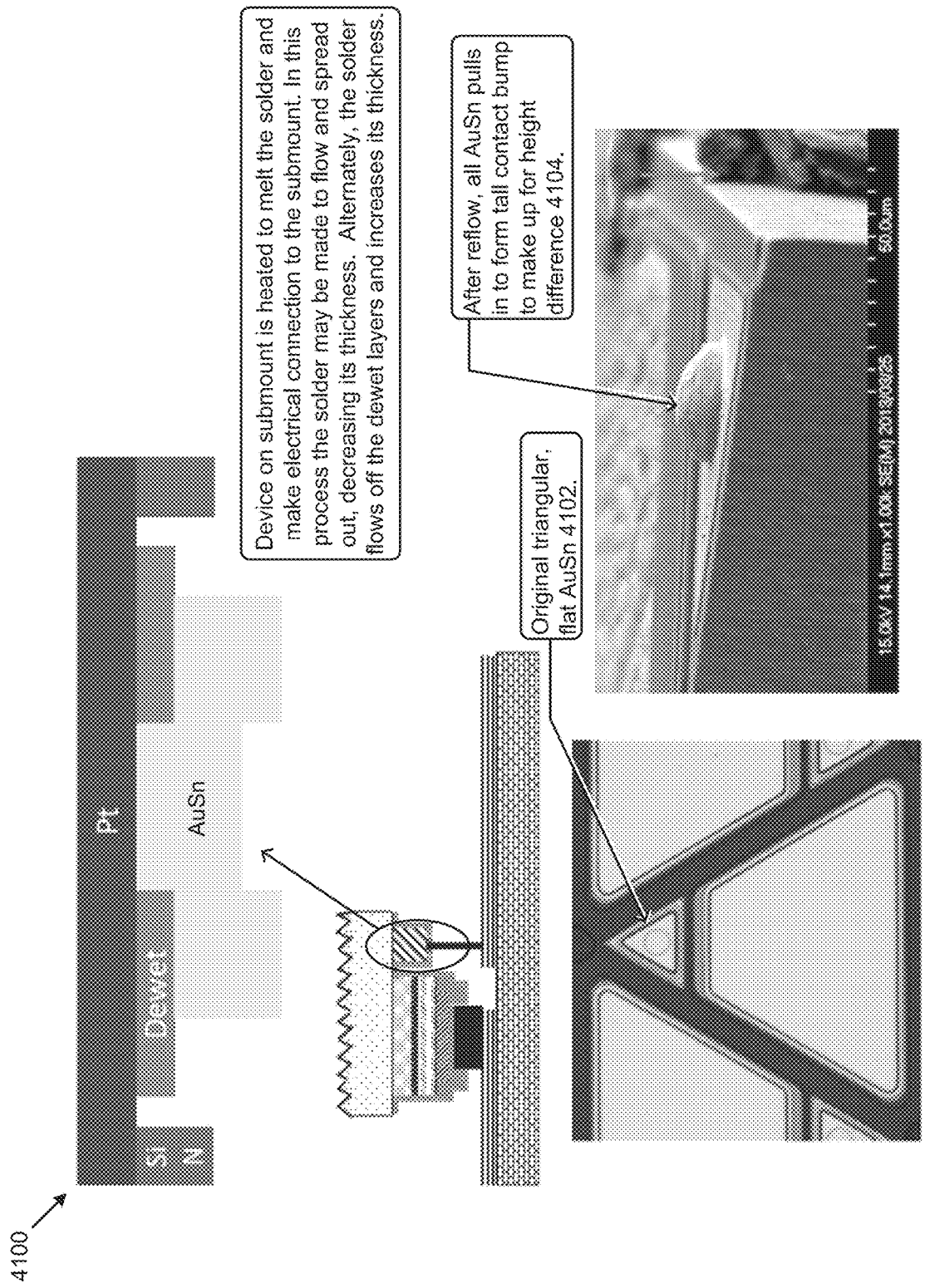
FIG. 41 depicts the results of a solder reflow process as used in assembling a high-performance light-emitting diode, according to some embodiments.

FIG. 41 depicts a solder reflow process 4100 used for assembling a high-performance light-emitting diode.

The solder reflow process begins by physically placing the die onto the submount with wiring to provide electrical connections of one or more die. This submount may incorporate mirrors, dielectrics, and other structures to minimize light absorption. They may be held in place temporarily using flux, cold welding, electrostatics, or other methods. The die are heated to melt the solder. The combination of solder shape and thickness of the dewet/wetting layer shapes, and etch and metal thicknesses combine together to accommodate die surface height variations and submount surface height variations.

Figure 42:
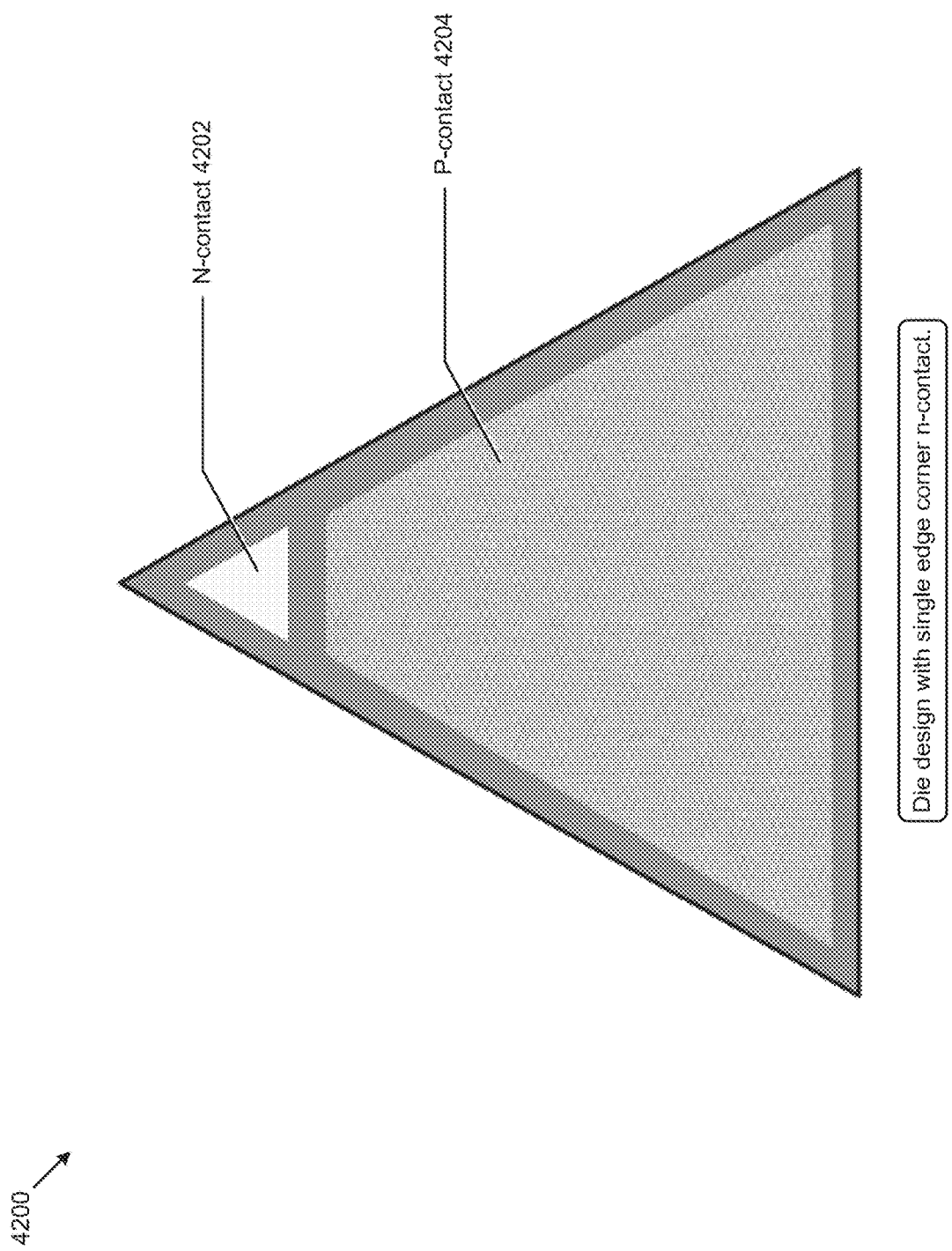
FIG. 42 depicts a die design with an edge corner n-contact for forming a high-performance light-emitting diode, according to some embodiments.

FIG. 42 depicts a die design with an edge corner n-contact 4202 for forming a high-performance light-emitting diode. The figure also shows a p-contact 4204. The shown n-contact consumes 4,311 $\mu m^2$, and the triangular die consumes 69,280 $\mu m^2$, for an n-contact area of 6.2%. The embodiment of FIG. 42 is merely one example, and others are reasonable and contemplated. For example, a die design with an edge corner n-contact 4202 for forming a high-performance light-emitting diode can be fabricated such that the n-contact is relatively larger (e.g., of 8,376 $\mu m^2$), resulting in a 12.1% coverage of the die surface area. Furthermore, in some cases the die can be fabricated to be relatively larger (or relatively smaller), thus the n-contact coverage of the die surface area can range from about 2% to about 20%.

In the embodiment discussed above, as well as in other embodiments (see the following figures), contact resistivity is <1 ohm for a 4,311 $\mu m^2$ contact, resulting in a value of <43 micro-ohm-$cm^2$. In addition to the geometry and other depicted features, there are a range of conditions that result in <1 ohm resistance/contact. Strictly as one numeric example, each additional ohm added at 100 mA drive gives 100 mV excess voltage, or an efficiency loss of ~3%.

Figure 43:
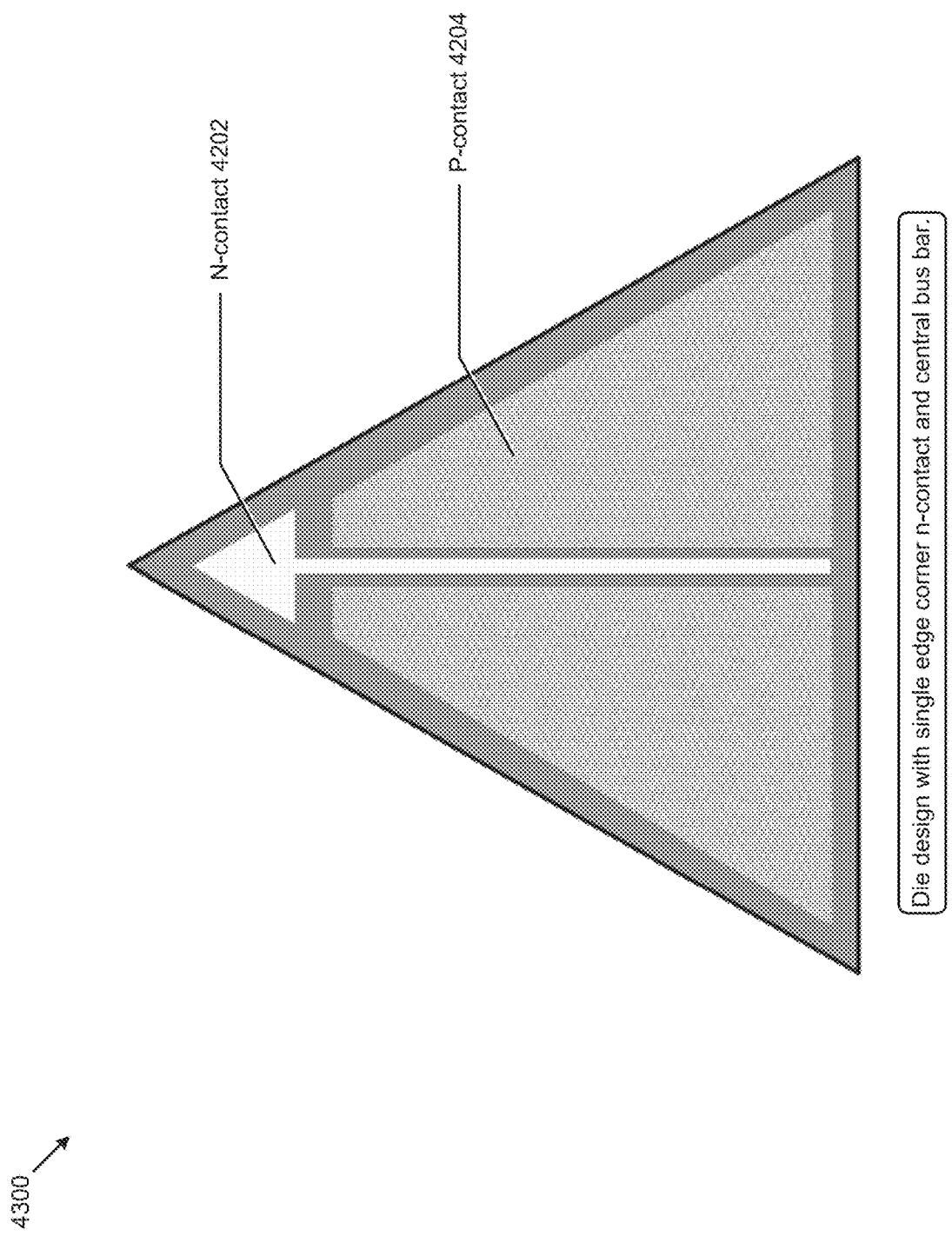
FIG. 43 depicts a die design with an edge corner n-contact and a central bus bar for forming a high-performance light-emitting diode, according to some embodiments.

FIG. 43 depicts a die design with an edge corner n-contact and a central bus bar for forming a high-performance light-emitting diode.

Figure 44:
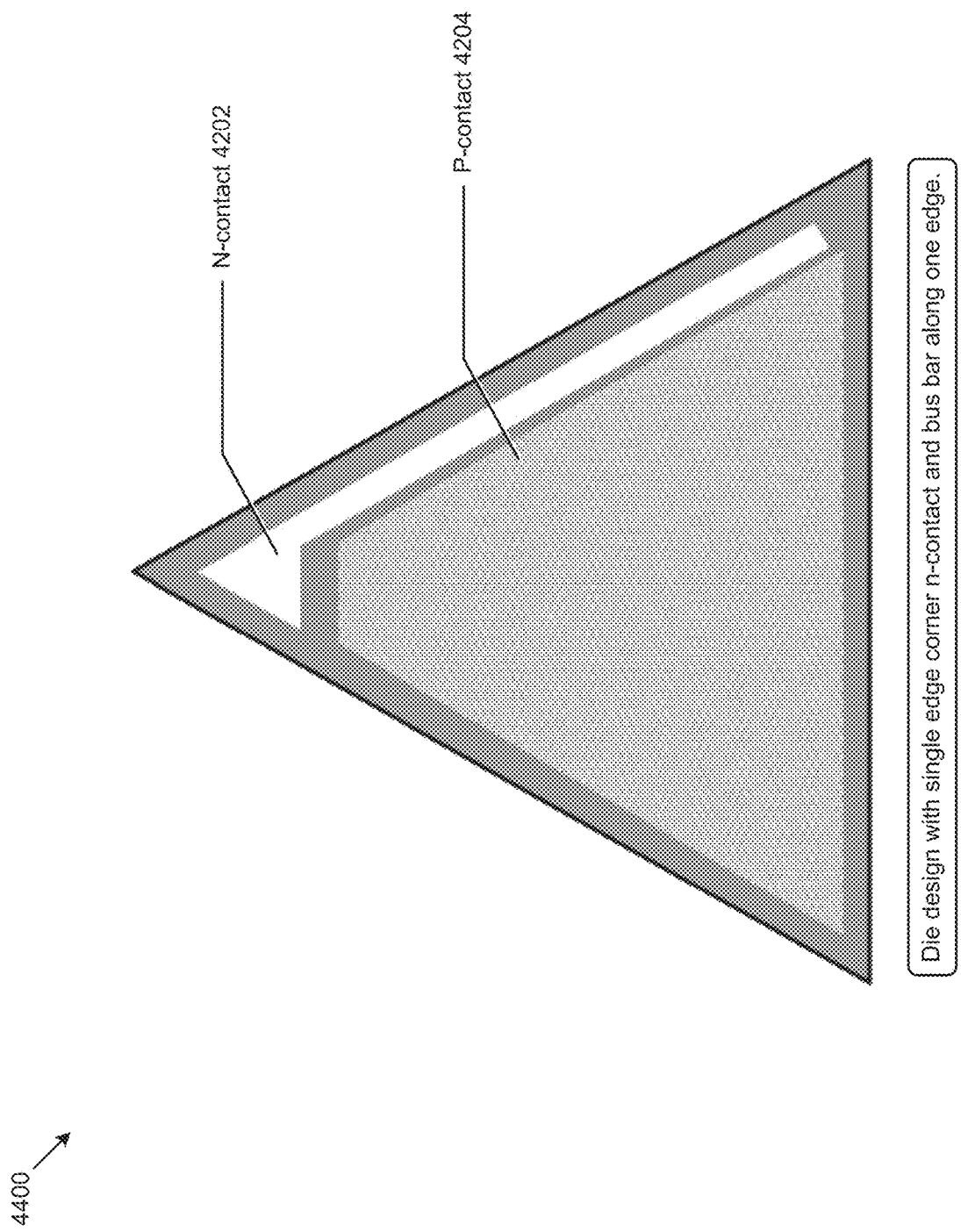
FIG. 44 depicts a die design with an edge corner n-contact and a bus bar along one edge for forming a high-performance light-emitting diode, according to some embodiments.

FIG. 44 depicts a die design with an edge corner n-contact and a bus bar along one edge for forming a high-performance light-emitting diode.

Figure 45:
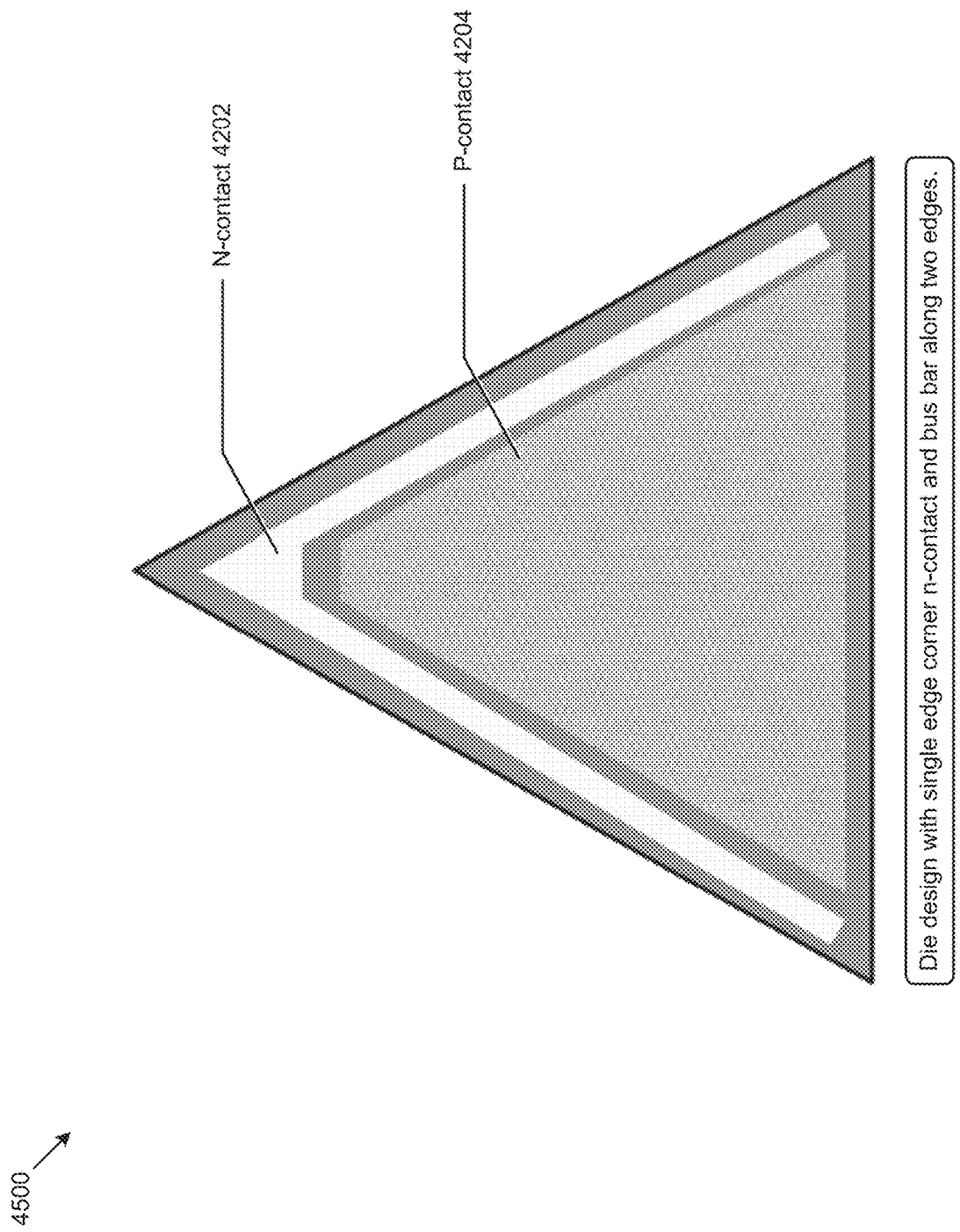
FIG. 45 depicts a die design with an edge corner n-contact and two bus bars along two edges for forming a high-performance light-emitting diode, according to some embodiments.

FIG. 45 depicts a die design with an edge corner n-contact and two bus bars along two edges for forming a high-performance light-emitting diode.

Figure 46:
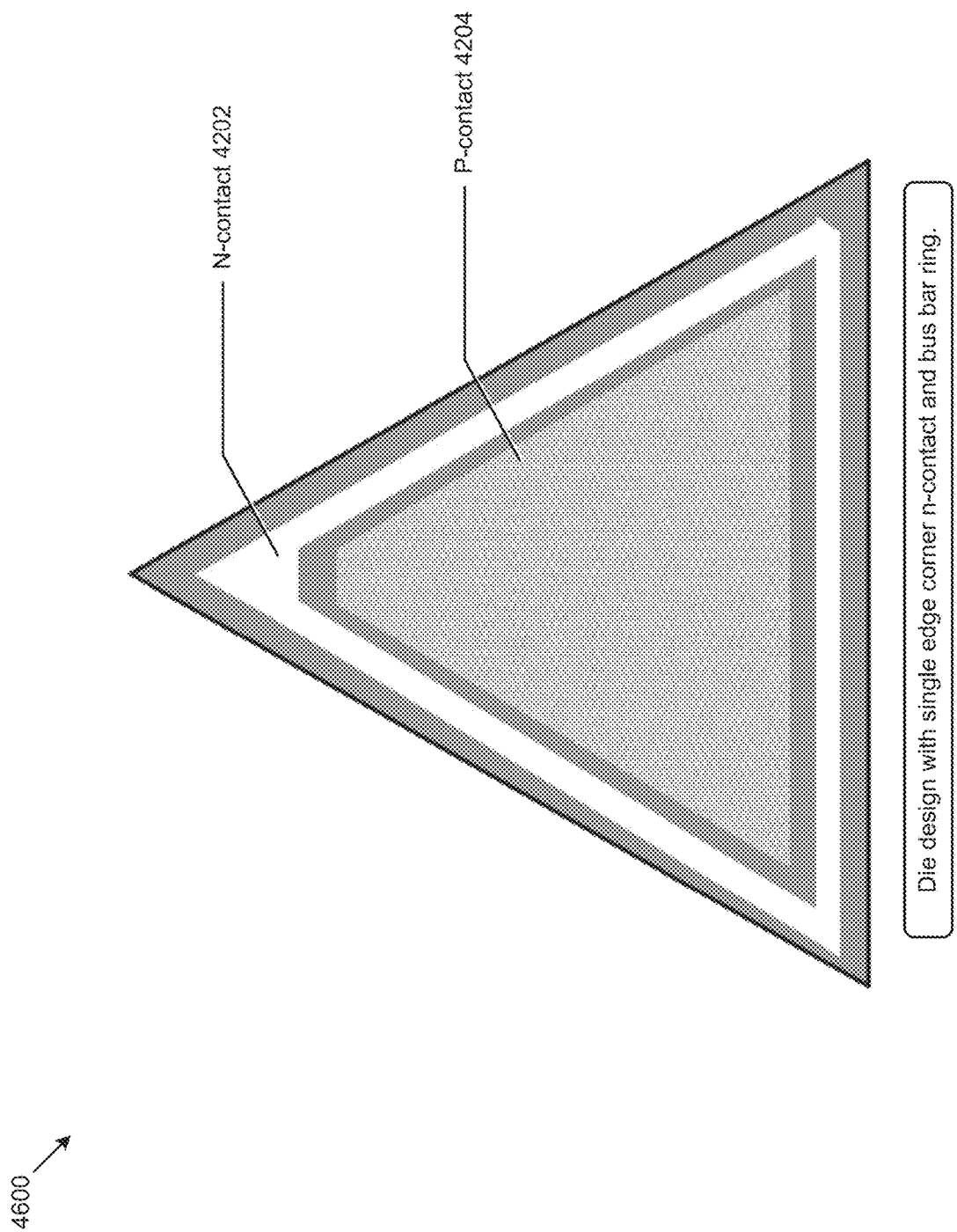
FIG. 46 depicts a die design with a single edge corner n-contact and a bus bar ring for forming a high-performance light-emitting diode, according to some embodiments.

FIG. 46 depicts a die design with a single edge corner n-contact and a bus bar ring for forming a high-performance light-emitting diode.

Figure 47:
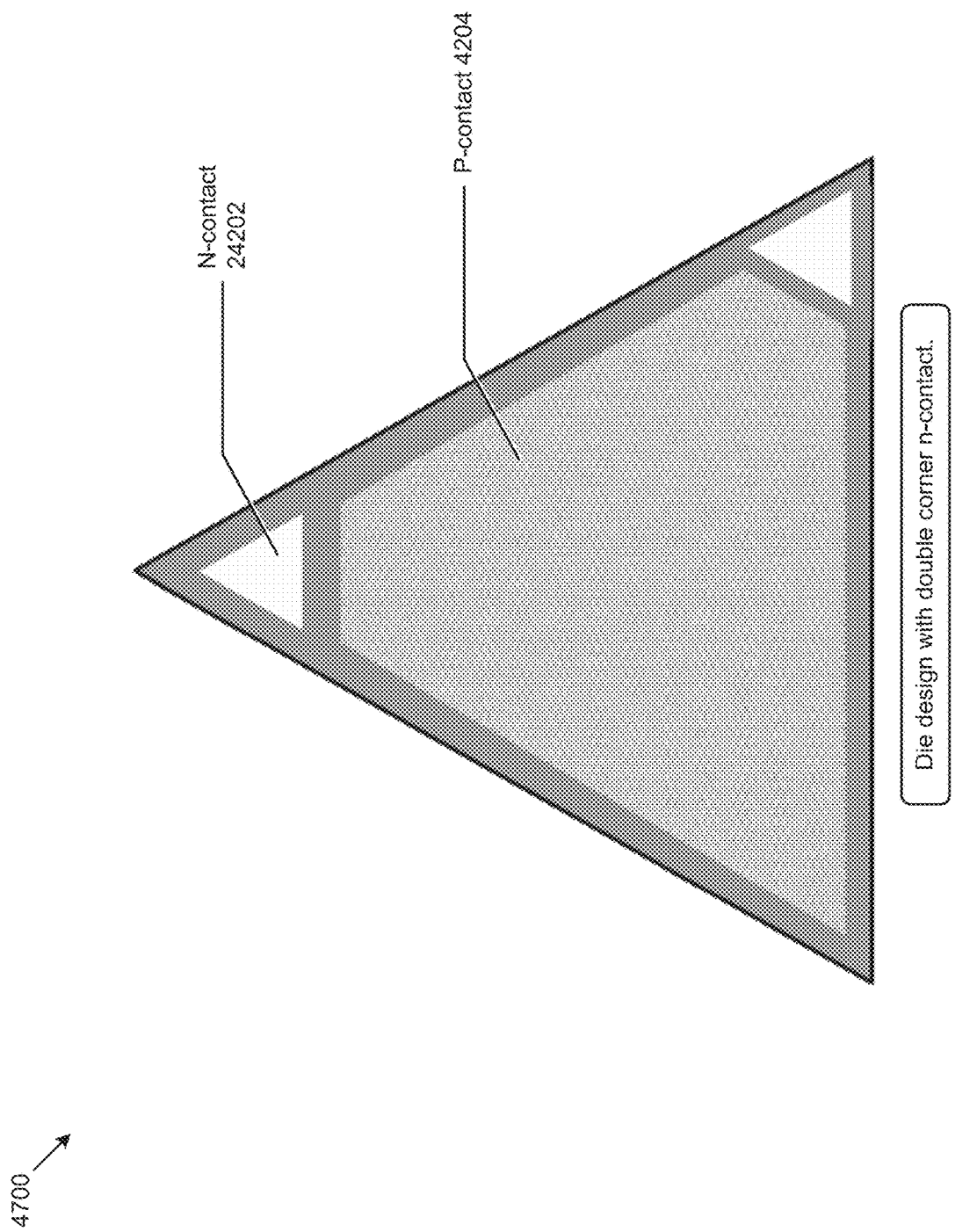
FIG. 47 depicts a die design with a double corner n-contact for forming a high-performance light-emitting diode, according to some embodiments.

FIG. 47 depicts a die design with a double corner n-contact for forming a high-performance light-emitting diode.

Figure 48:
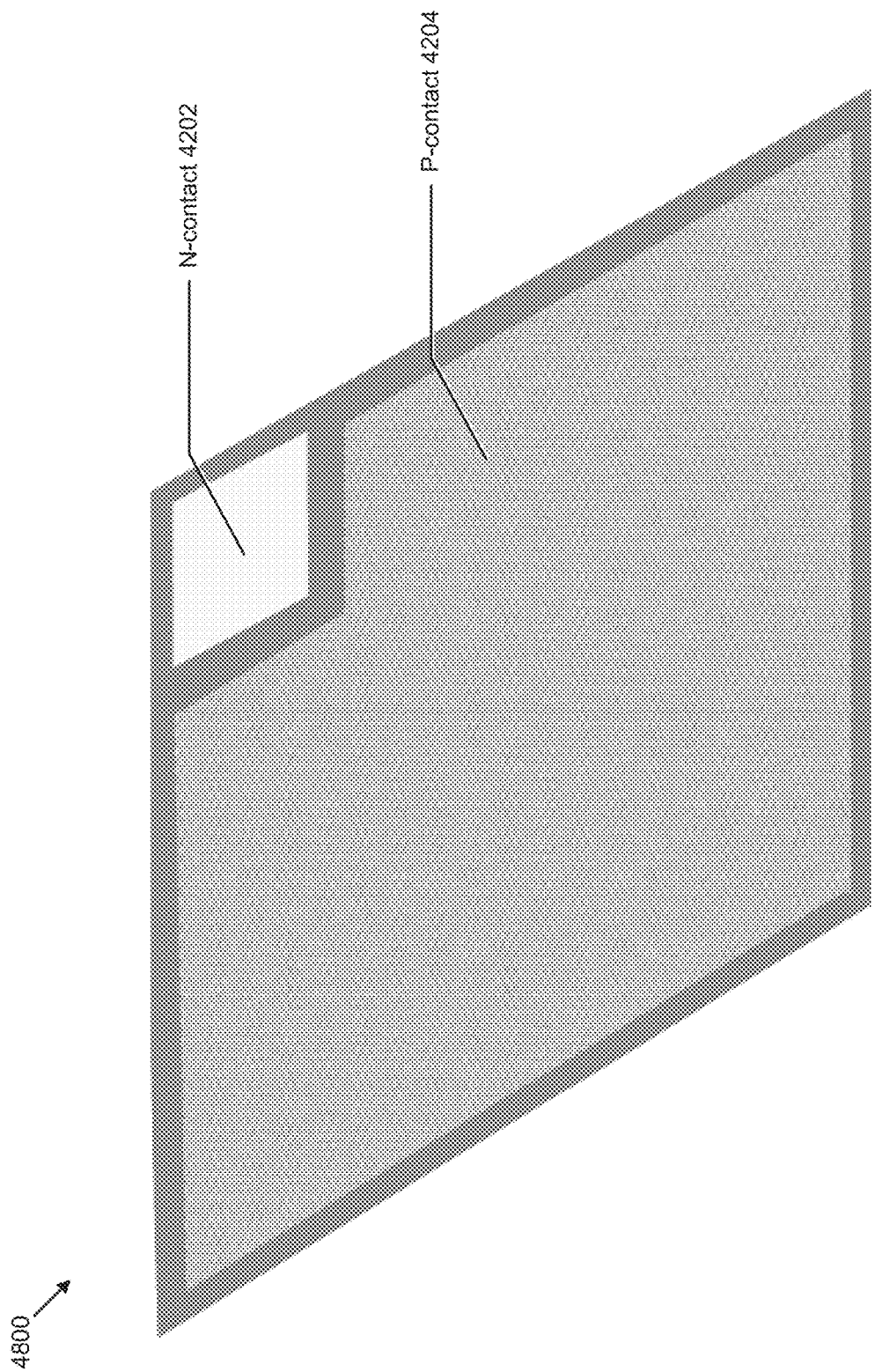
FIG. 48 depicts a rhombus die design with a single corner n-contact for forming a high-performance light-emitting diode, according to some embodiments.

FIG. 48 depicts a rhombus die design with a single corner n-contact for forming a high-performance light-emitting diode.

Figure 49:
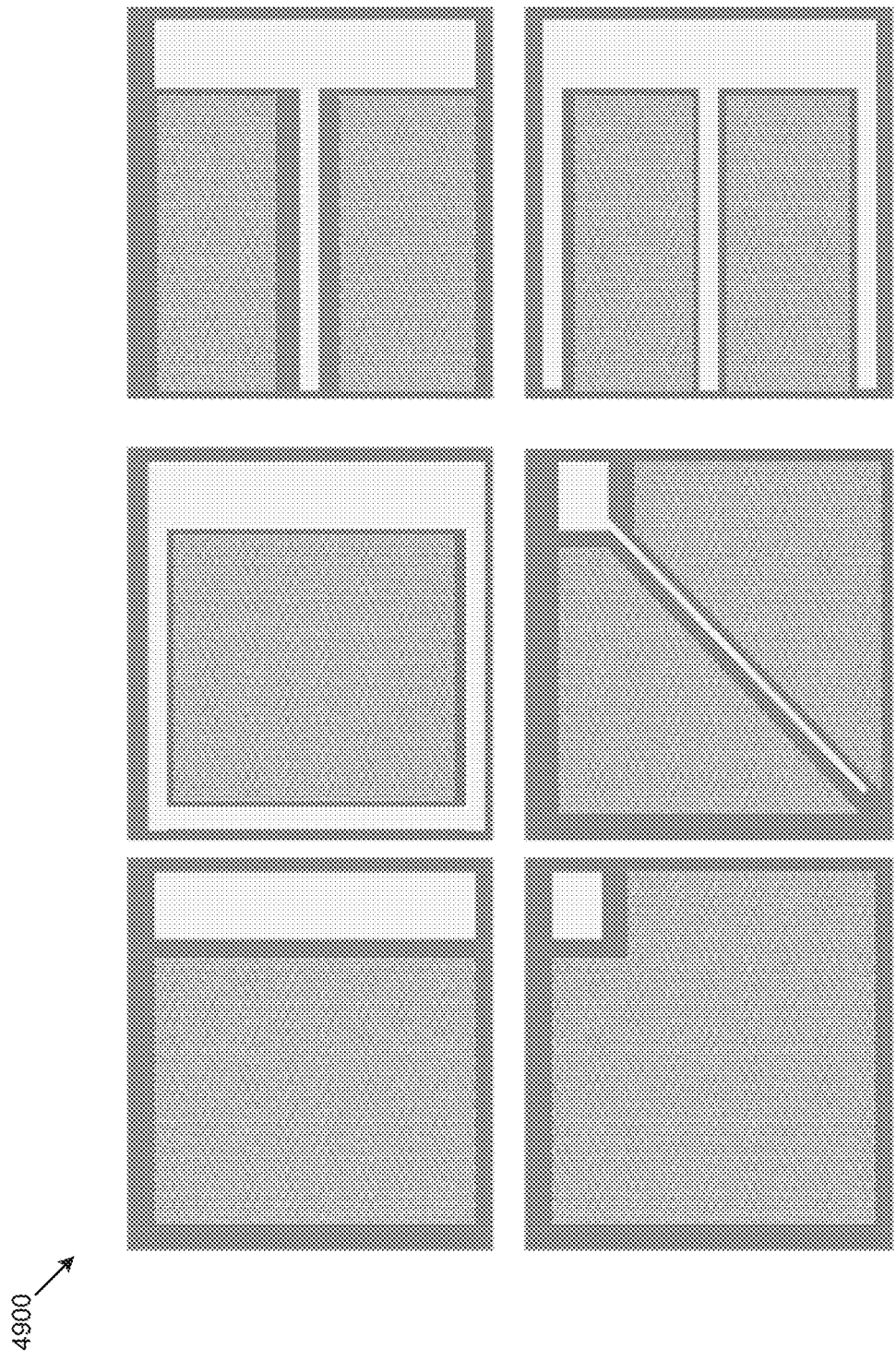
FIG. 49 depicts a rectangular die design with respective variations of n-contact and p-contact patterns for forming a high-performance light-emitting diode, according to some embodiments.

FIG. 49 depicts a rectilinear die design with respective variations of n-contact and p-contact patterns for forming a high-performance light-emitting diode.

As can be seen in FIG. 49 and previous figures, die layout may use a wide variety of n- and p-contact patterns. The area can split between n and p contacts many ways (with different shapes of pads and including ring, bus-bar, and/or interdigitated contacts) with the goal of limiting die series resistance while maximizing the area of the p-contact.

FIG. 50 depicts a subassembly 5000 comprising a highly thermally conductive, electrically isolated mirror submount with buried routing traces for use as a submount for a high-performance light-emitting diode.

One possible method for making a mirror submount results in a submount having the following characteristics:

Highly thermally conductive by construction. Techniques to construct mirrors are disclosed in U.S. application Ser. No. 14/097,481 filed on Dec. 5, 2013, which is incorporated by reference in its entirety.

Ability for the mirror surface to be anchored to the thermally conductive substrate by via/patterned region structures to dissipate heat from the mirror into the conductive substrate.

Buried routing traces for diode strings to minimize optical efficiency losses.

Separation of buried trace and contact proceeds from mirror formation process, so the submount is ready for mirror patterning at an alternate vendor if needed.

FIG. 51 depicts a series of steps of a fabrication process 5100 for forming a thermally conductive and highly reflective submount having buried routing traces for use in assembling a high-performance light-emitting diode.

Accordingly, as in FIG. 51 step 1, a barrier layer with dielectric properties that offers high voltage breakdown protection is developed on the high thermal conductivity carrier. Then, as shown in FIG. 51 step 2, a seed layer (e.g., Ti/Cu) is sputtered onto the barrier, following which a suitable photoresist is spun on (FIG. 51 step 3) and patterned using standard lithography techniques (FIG. 51 step 4).

FIG. 52 depicts a series of steps of a fabrication process 5200 for forming a thermally conductive and highly reflective submount having buried routing traces for use in assembling a high-performance light-emitting diode.

Accordingly, as shown in FIG. 52 step 5, copper is electroplated into the photoresist pattern openings, following which the photoresist is stripped (FIG. 52 step 6) and the seed layer is etched (FIG. 52 step 7) to create exemplary routing/trace elements that connect the diodes together to form circuits in the final form.

Figure 53:
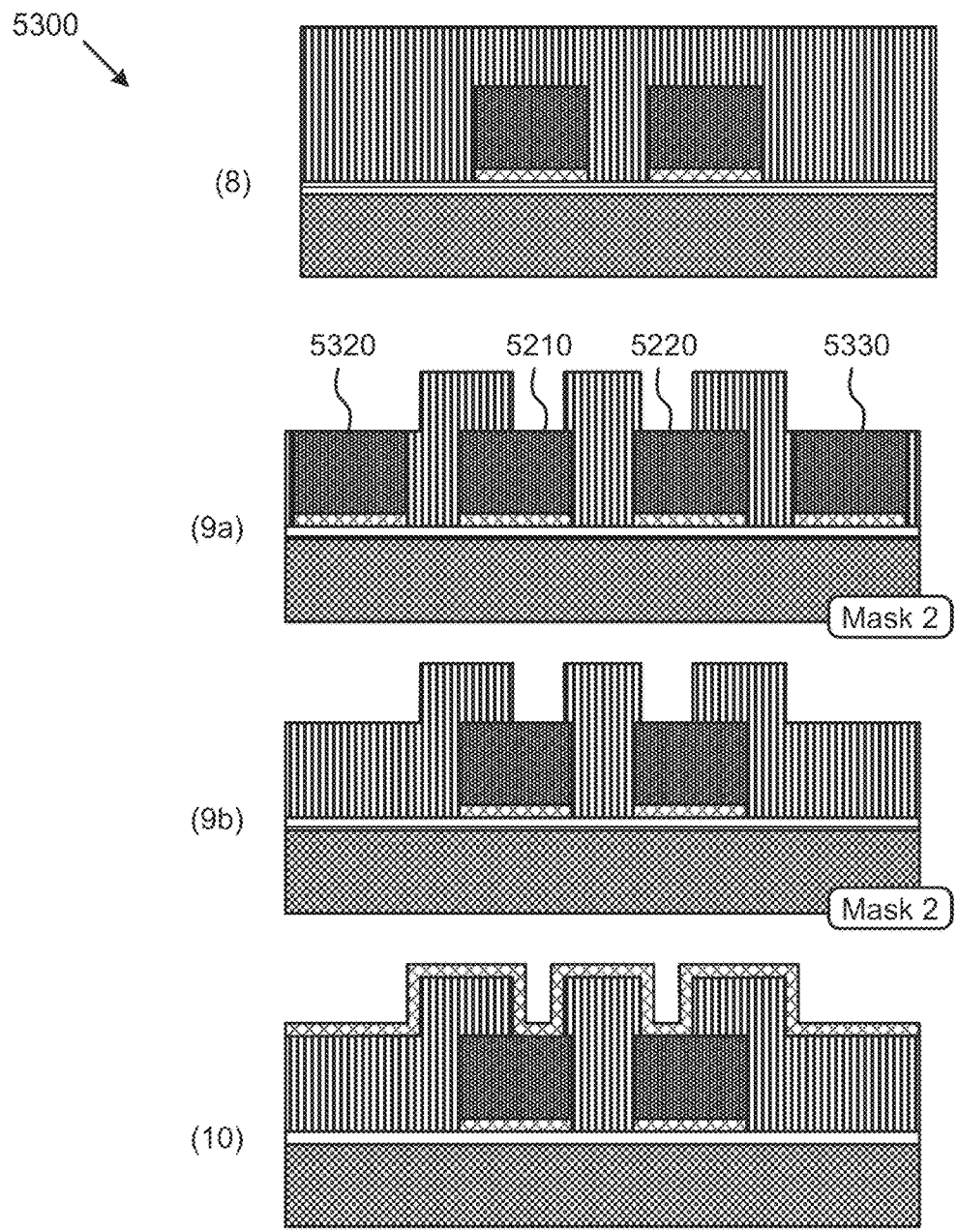
FIG. 53 depicts a series of steps of a fabrication process for forming a thermally conductive and highly reflective submount having buried routing traces for use in assembling a high-performance light-emitting diode, according to some embodiments.

FIG. 53 depicts a series of steps of a fabrication process 5300 for forming a thermally conductive and highly reflective submount having buried routing traces for use in assembling a high-performance light-emitting diode.

Accordingly, as shown in FIG. 53 step 8, a photodefinable polyimide is then patterned on the construction a second time, and subsequently patterned to expose the copper terminals plated earlier (see FIG. 53 step 9a and FIG. 53 step 9b). The polyimide serves as a stress buffer and insulating layer. Then a seed layer (e.g., Ti/Cu) is then sputtered on the polyimide (FIG. 53 step 10). In an alternate embodiment, a provision for heat sinking the mirror layer (to be deposited later) is accomplished by patterning copper 'pillars' such as 5320 and 5330 as part of the same constructional steps covered in FIG. 51 through FIG. 53. The 'pillars' exemplar 5320 and 5330 are not part of the routing circuits that terminal 5210 and terminal 5220 are tied to, and serve a different purpose i.e., heat conduction from the final phosphor configuration to the mirror and down to the high thermal conductivity substrate carrier in FIG. 52 step 1.

FIG. 54 depicts a series of steps of a fabrication process 5400 for forming a thermally conductive and highly reflective submount having buried routing traces for use in assembling a high-performance light-emitting diode.

Accordingly, as shown in FIG. 54 step 11, a suitable photoresist is patterned to expose the seed layer on the copper terminals, and the assembly is then placed in an electroplating bath to plate copper in the exposed area of FIG. 54 step 12.

FIG. 55 depicts a series of steps of a fabrication process 5500 for forming a thermally conductive and highly reflective submount having buried routing traces for use in assembling a high-performance light-emitting diode.

Accordingly, the photoresist in the prior step is now stripped (FIG. 55 step 13), and the seed layer is etched to create the final diode anode/cathode terminals 5510 and 5520 (FIG. 55 step 14). Optional steps may be done to deepen the trench where the reflective mirror will be created using standard lithographic techniques and selective etching of the polyimide layer (see FIG. 56).

Figure 56:
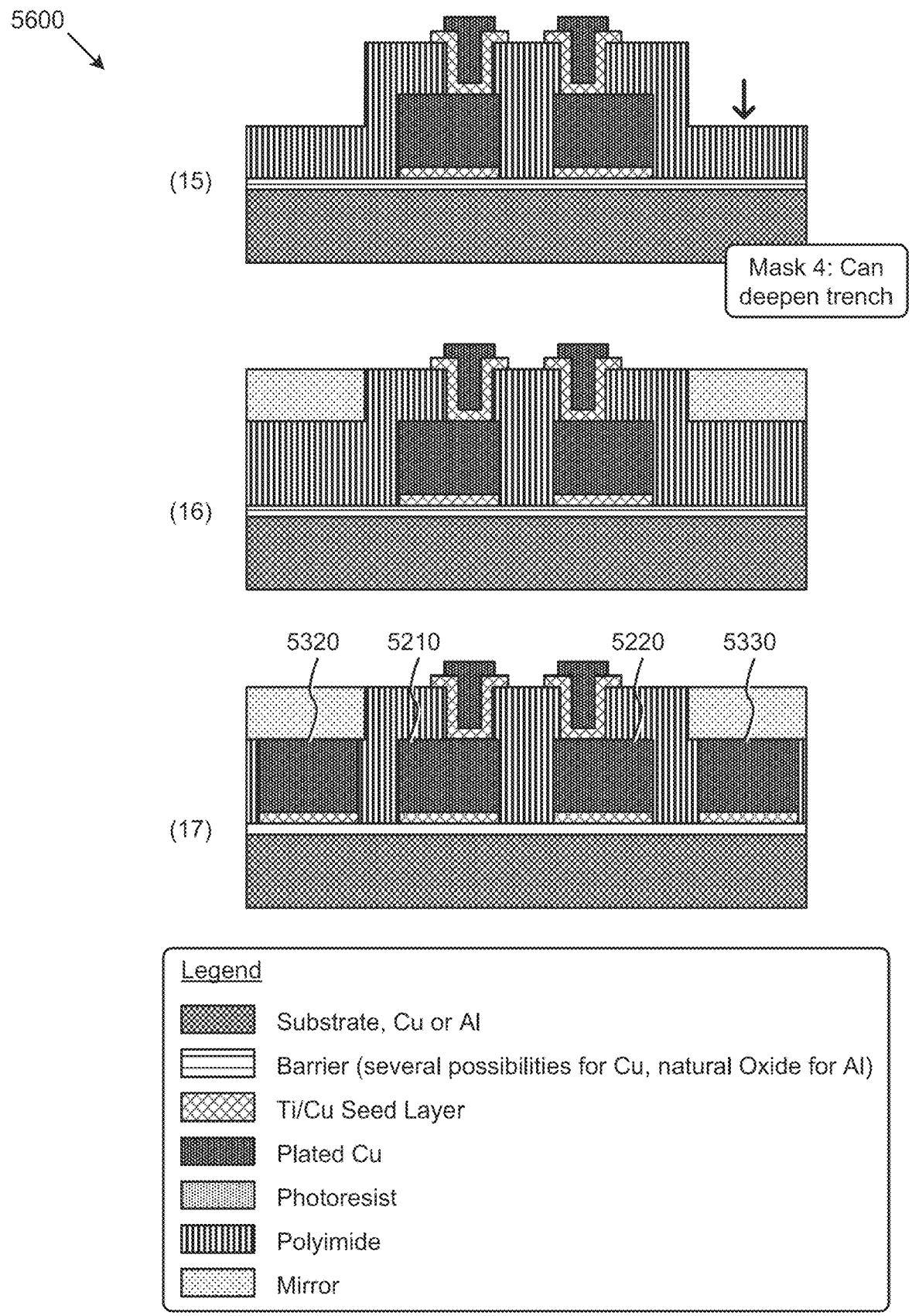
FIG. 56 depicts a series of steps of a fabrication process for forming a thermally conductive and highly reflective submount having buried routing traces for use in assembling a high-performance light-emitting diode, according to some embodiments.

FIG. 56 depicts a series of steps of a fabrication process 5600 for forming a thermally conductive and highly reflective submount having buried routing traces for use in assembling a high-performance light-emitting diode.

Steps that may be done to deepen the trench where the reflective mirror will be created using standard lithographic techniques and selective etching of the polyimide layer, see step 15. Following this, the reflective mirror is then created adjacent to the two die terminals, step 16. With the optional heat-sinking 'pillars' constructed, the final structure is as shown in FIG. 56 step 17. The heat-sinking pillars are shown as single entities for illustration, and may be created with various geometric configurations, array patterns, etc.

Figure 57:
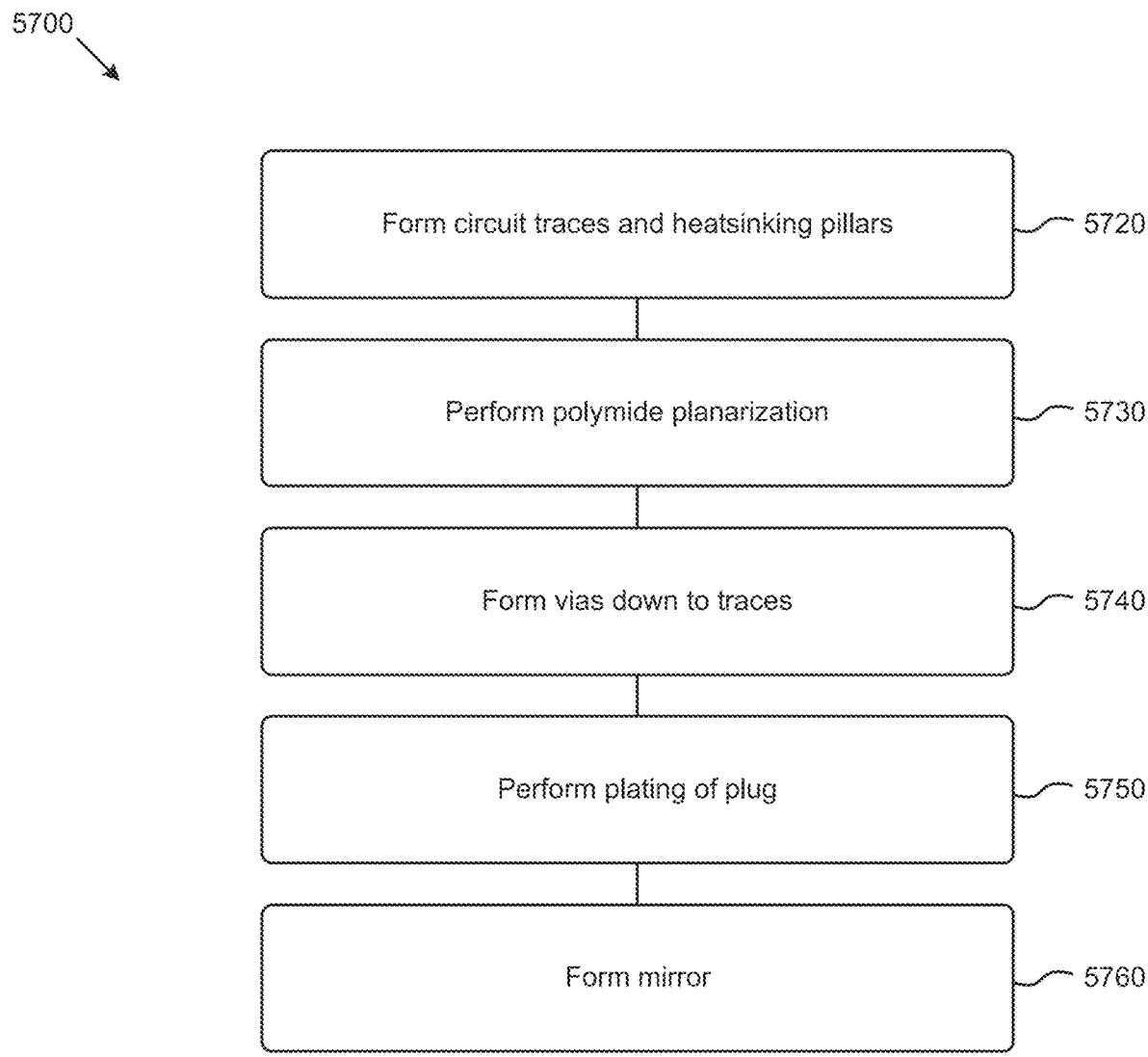
FIG. 57 is a flow chart of a process flow for forming a thermally conductive and highly reflective submount having buried routing traces for use in assembling a high-performance light-emitting diode, according to some embodiments.

FIG. 57 is a flow chart of a process flow 5700 for forming a thermally conductive and highly reflective submount having buried routing traces for use in assembling a high-performance light-emitting diode.

As shown, the process flow includes:
Formation of circuit traces and heat-sinking pillars (see step 5720);
Polyimide planarization (see step 5730);
Via formation down to traces (see step 5740);
Plating of plug (see step 5750); and
Mirror formation (see step 5760).

Improving the reflectivity of the submount is desirable to increase the system efficiency. This is especially measurable when the color-converting medium is scattering (e.g., such that photons bounce in the package several times before escaping). A simulation shows that for many embodiments of the disclosed packages, photons may bounce on average three or more times on the submount before escaping.

In the case of a dielectric mirror, a simple way to obtain high reflectivity is to make a distributed Bragg reflector (DBR) having reflectivity at a design wavelength. The wavelength range of high-reflectivity is then determined by the number of pairs and by the index contrast between the low-index and high-index materials of the mirror. A common low-index material is $SiO_2$. In some cases, the low-index material can be made porous (for instance by choosing specific deposition parameter) to further lower its index. Examples of high-index materials are $Ta_2O_5$, $Nb_2O_5$ and $Ti_2O_5$. The total thickness of the stack is often constrained by practical considerations such as ease of fabrication (i.e., deposition time and cost, difficulty to etch the layers), thermal resistance, etc.

As an example, consider a dielectric mirror stack made of two materials (n_low=1.5 and n_high=2.2). The mirror is a 6-pair DBR on silicon, with a design wavelength of 600 nm.

Figure 58:
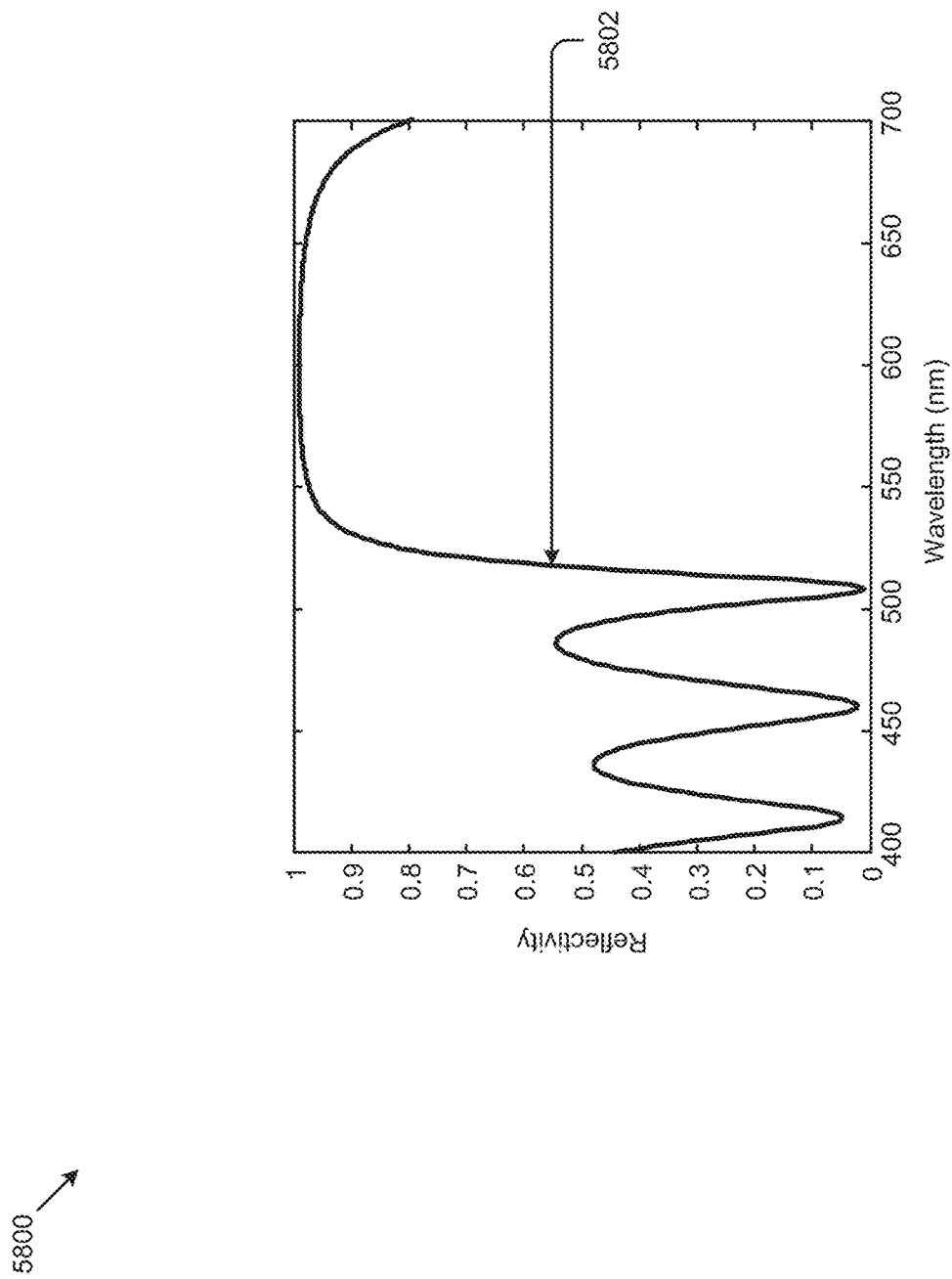
FIG. 58 plots reflectivity versus wavelength, according to some embodiments.

FIG. 58 plots reflectivity versus wavelength. FIG. 58 shows the normal-incidence reflectivity for this mirror coming from air. Reflectivity is high beginning at about 550 nm (see rise 5802) and through the range 550 nm to 680 nm. In order to increase the wavelength range of high reflectivity, one can stack multiple DBRs with different design wavelengths. As an example, consider a dielectric mirror stack made of two materials (n_low=1.5 and n_high=2.2). The mirror is a made of three 6-pair DBRs on silicon, with design wavelengths of 450 nm, 550 and 700 nm. These design wavelengths are chosen as examples only and are deemed to be "blue", "green" and "red" DBRs.

Figure 59:
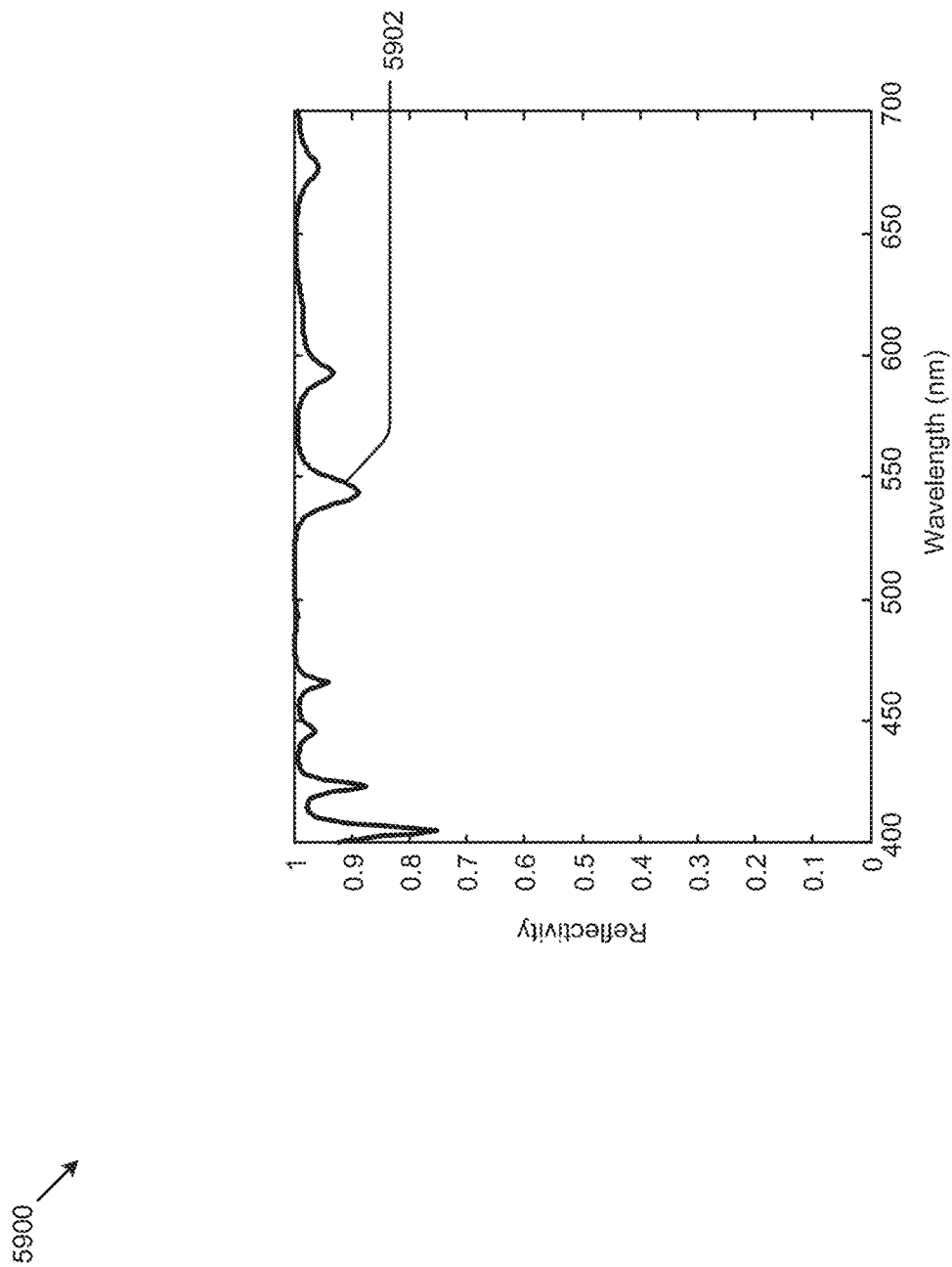
FIG. 59 plots normal incidence reflectivity versus wavelength, according to some embodiments.

FIG. 59 plots normal incidence reflectivity versus wavelength. FIG. 59 shows the normal-incidence reflectivity for this mirror coming from air. Here reflectivity is above 90% at nearly all wavelengths (e.g., see plot 5902). Such structures, with high reflectivity at normal incidence in a large wavelength range, are well-known in the art. However, the submount reflectivity should preferably be high not only at normal incidence but also at all incoming angles and polarizations, since the photons may be randomized by scattering. Besides, high-reflectivity at all angles measured from air is not a sufficient condition. In a white LED, the color-converting materials are usually embedded in an encapsulant such as a silicone, which may have a refractive index of 1.4-1.5. The light is incident on the submount from this medium so that the submount is probed at a variety of angles beyond the angles accessible from air. Hence, what is needed is a high reflectivity at all angles for light coming from the encapsulant medium.

Figure 60:
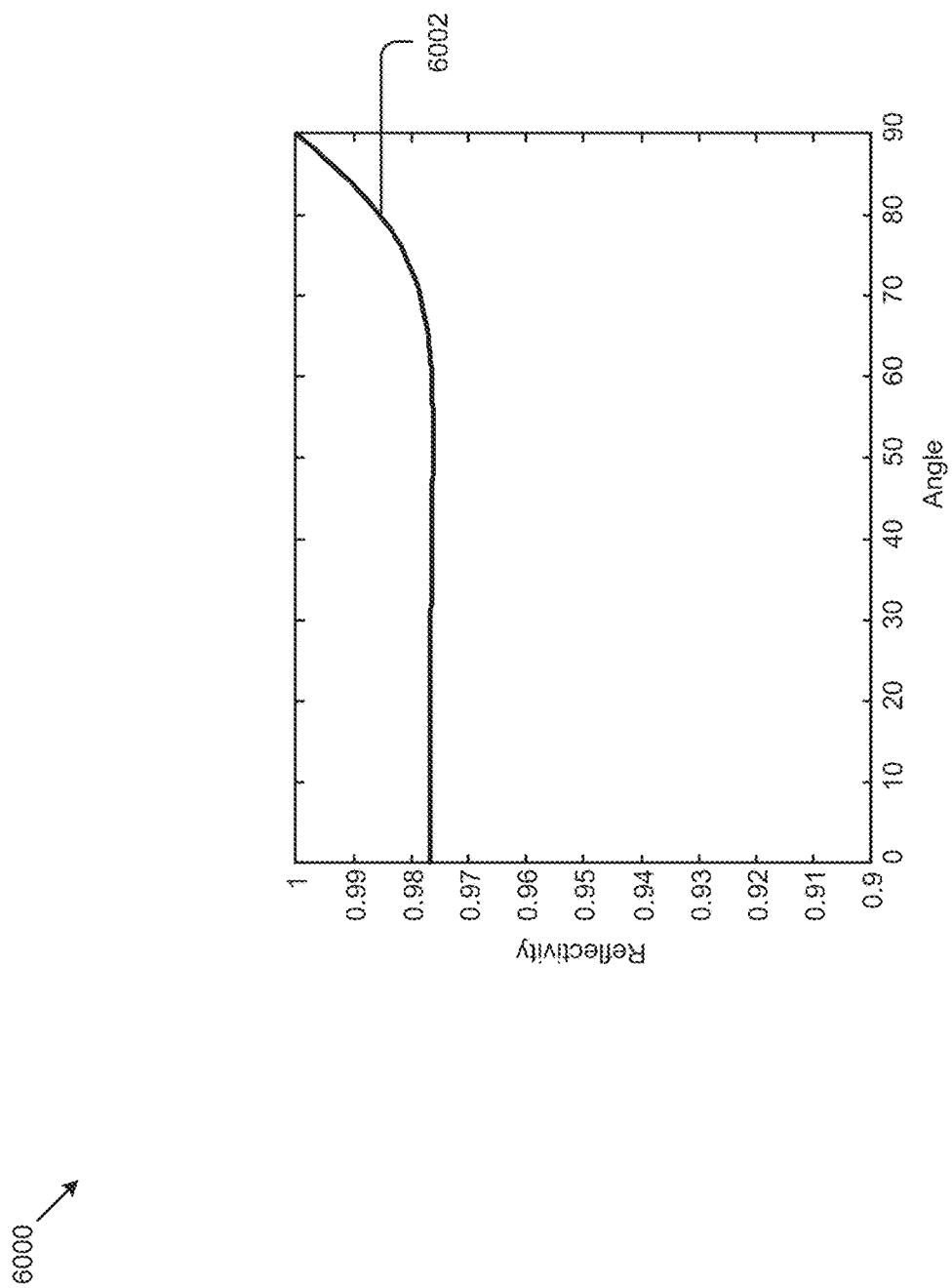
FIG. 60 plots angle-dependent reflectivity versus angle, according to some embodiments.

FIG. 60 plots angle-dependent reflectivity versus angle. For metallic mirrors, this distinction may not be crucial since the reflectivity of a metal usually varies moderately with angles. FIG. 60 shows the angle-dependent reflectivity of a silver mirror at a wavelength of 550 nm (coming from an index n=1.5, and averaged over polarization). The reflectivity is above 97% at all angles (see plot 6002). For a dielectric stack on the other hand, reflectivity can be strongly angle-dependent. For instance, for a DBR the Bragg condition is angle-dependent. Notably, the reflectivity of a dielectric stack tends to vanish for transverse-magnetic (TM-polarized) light near the Brewster angle of the dichroic mirror. If TM-polarized light impinges on the dielectric stack at such an angle, it is transmitted and can incur loss. For instance, observe various aspects of the stack as depicted in FIG. 59.

Figure 61:
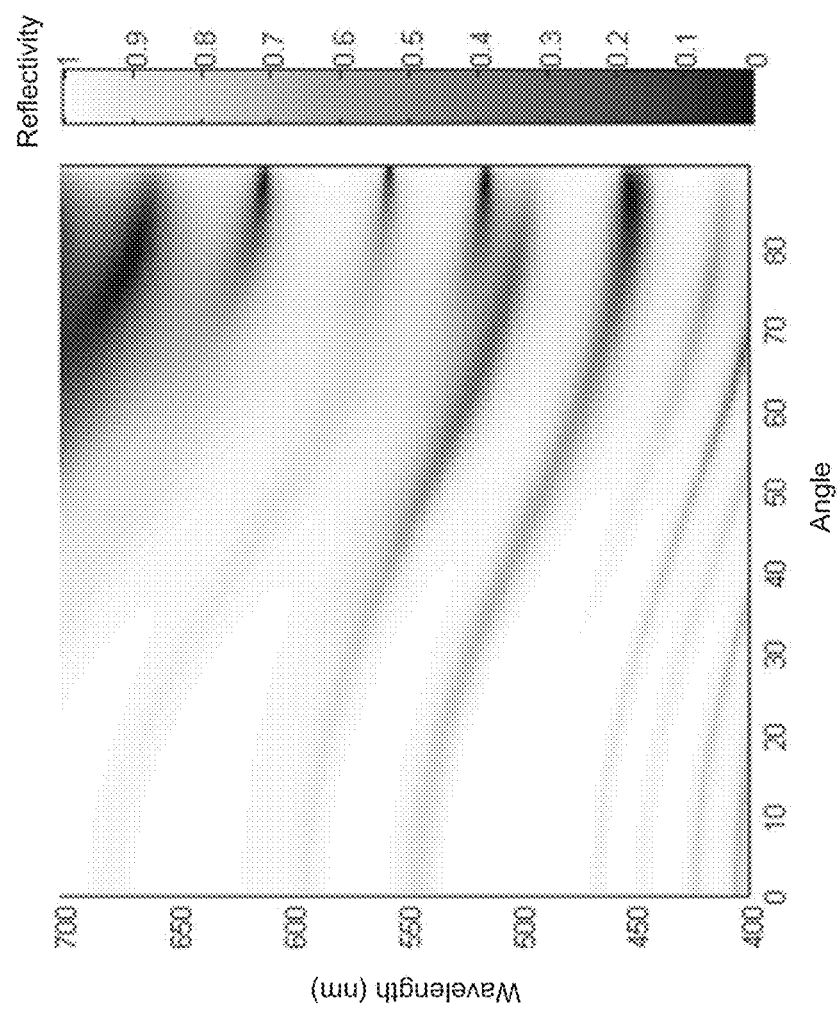
FIG. 61 plots transverse magnetic polarized light reflectivity of a stack as a function of angle and wavelength, according to some embodiments.

FIG. 61 plots TM reflectivity of the stack as a function of angle and wavelength, for light incoming from air. Here as in FIG. 59 the reflectivity is rather high overall, despite dropping to low values at some angles and wavelengths.

Figure 62:
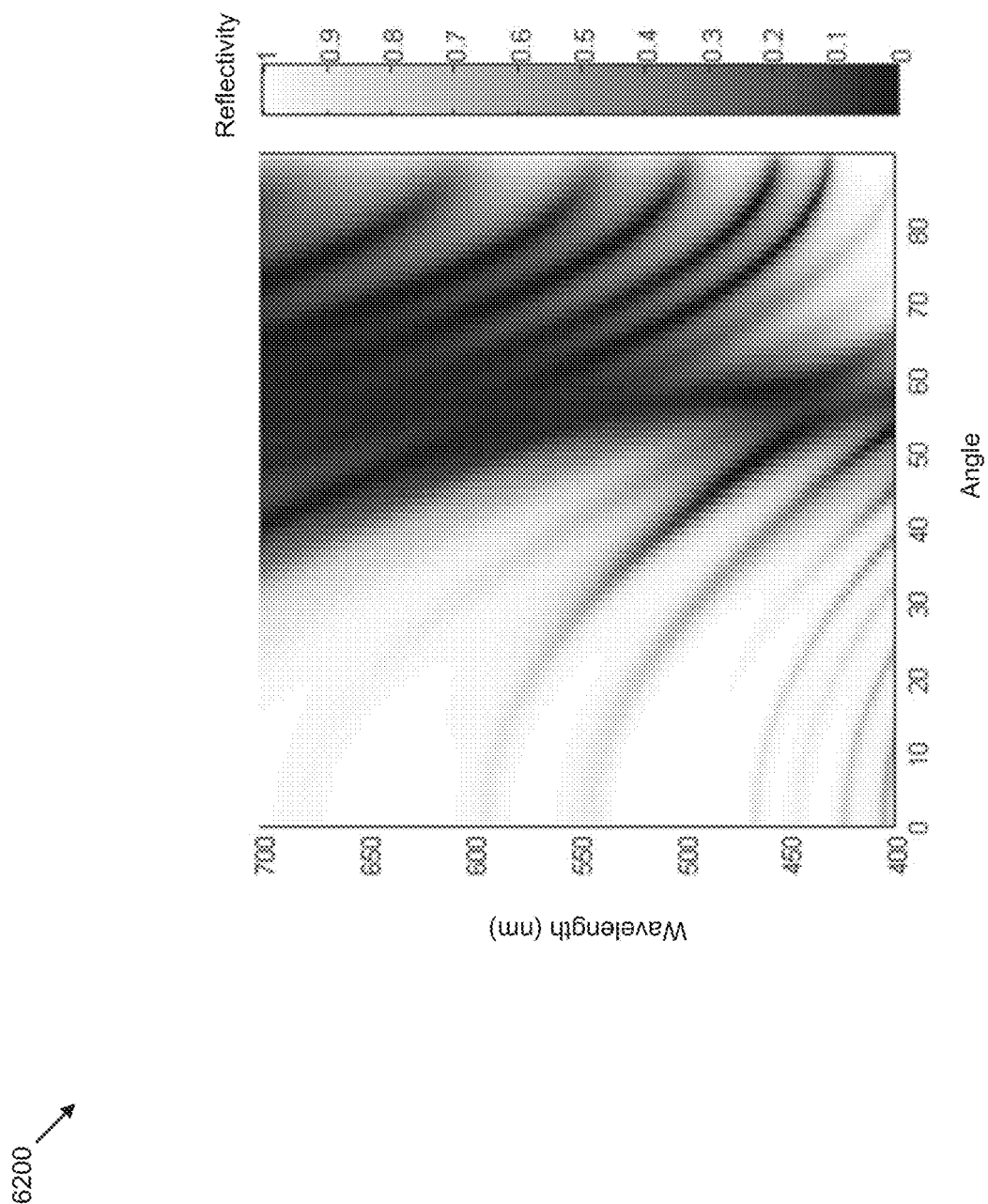
FIG. 62 plots transverse magnetic polarized light reflectivity of a stack as a function of angle and wavelength, according to some embodiments.

FIG. 62 plots TM reflectivity of the same stack as a function of angle and wavelength for light incoming from silicone (n=1.5). Here on the other hand, the reflectivity is very low for all wavelengths, for angles around 60 degrees. This corresponds to the Brewster angle of the dielectric stack; in this angular range the stack is nearly transparent and light is mostly absorbed by the silicon substrate.

This effect is not well-known in the art. Indeed, in most applications dichroic mirrors are used near normal incidence, and for light incoming from air. The present situation—namely, probing all angles from a high-index medium—is peculiar to the context of the embodiments disclosed herein. Therefore, due to the angular dependence of the reflectivity, care must be taken to design the reflectivity.

In order to evaluate the effective reflectivity, consider the angle- and wavelength-averaged one-bounce effective reflectivity:

$$R_{eff} = (\int_0^{\pi/2} R(\lambda,\theta) \cdot \cos(\theta) \cdot 2\sin(\theta) \cdot d\theta)_{400-700\ nm}$$

In this formula, the reflectivity is averaged over incoming angles and over wavelengths in the visible range. The angular factor $\cos(\theta)$ accounts for the Lambertian distribution of light, and the angular factor $2\sin(\theta)$ accounts for the solid angle term. The angles are understood as angles of propagation in the encapsulant medium.

The formula is a good predictor of the optical properties of a mirror. Other angular dependencies could be assumed, but they would typically give the same relative trends for comparing different mirrors. Besides, various improvements to the formula can be considered, for instance, taking into account the spectrum of light impinging on the submount rather than performing a uniform spectral average. These improvements can be useful to make the formula even more accurate.

Further, in cases where the substrate reflectivity varies in-plane, $R_{eff}$ can be averaged over the area of the substrate. Consider the effective loss:

$$L = 1 - R_{eff}$$

This formula quantifies mirror loss: a low value of L is desirable. Besides, loss is usually sampled several times in a scattering system (for instance, about three times) so that even a small difference in loss can have a big impact on final performance. For instance, a 1% difference in the value of L may have a significant impact on the light output of an LED system, such as a 3% impact or a 5% impact. Application of the formula to the structure that is characterized in FIG. 43 yields L=27%, which is a very poor value.

As a solution to the problem described above, embodiments of the disclosure combine the dielectric mirror with a metallic mirror. In certain embodiments, a metallic mirror is deposited on the substrate (such as silicon) and a dielectric stack is deposited on the metal. In typical embodiments, the metal is preferably silver or aluminum.

In this case, reflectivity is ensured by the dielectric stack in a wide range of angles and wavelengths. In ranges where the dielectric stack is less reflective (or even nearly transparent), the metallic mirror ensures reflectivity.

Figure 63:
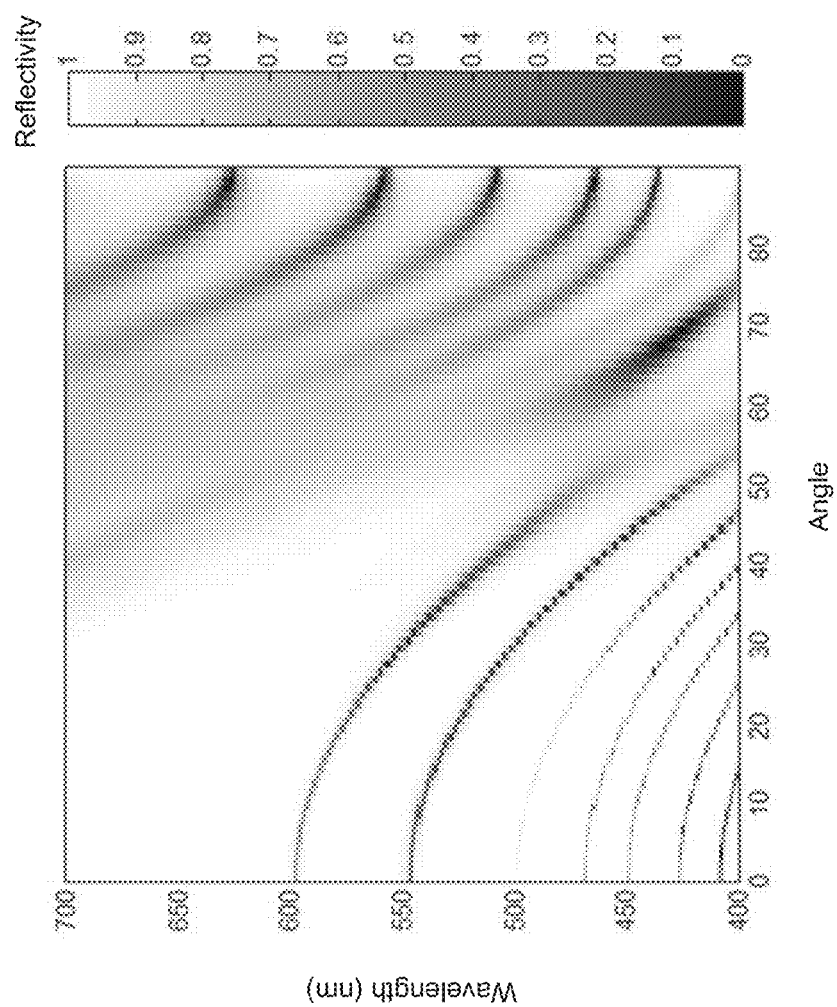
FIG. 63 plots reflectivity as a function of angle and wavelength, according to some embodiments.

FIG. 63 plots reflectivity as a function of angle and wavelength. Some embodiments use the stack as shown and described as pertaining to FIG. 59 but deposited on an aluminum layer. Around the Brewster angle of the dielectric stack, reflectivity is about 80-90% due to the presence of the aluminum mirror. Application of the loss formula to this structure yields L=7%, which is a good value.

Figure 64:
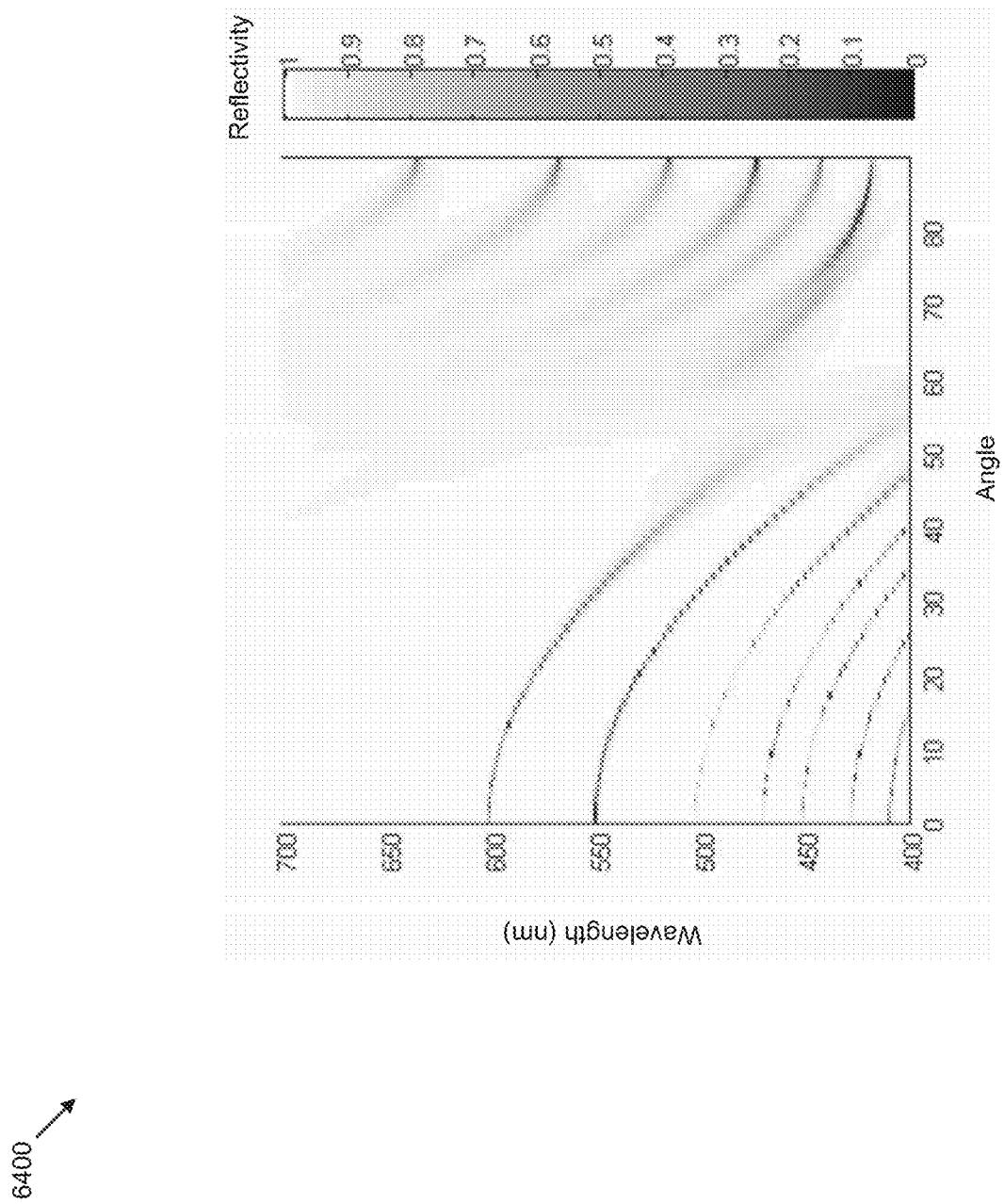
FIG. 64 plots reflectivity as a function of angle and wavelength, according to some embodiments.

FIG. 64 plots reflectivity as a function of angle and wavelength. Some embodiments use the stack as shown and described as pertaining to FIG. 59 but deposited on a silver layer. Around the Brewster angle of the dielectric stack, reflectivity is about 95% due to the presence of the silver mirror. Application of the loss formula to this structure yields L=1.5%, which is an excellent value. For comparison, using a bare silver mirror only (without the dichroic stack) yields L=2.1%. Therefore the presence of the dielectric stack reduces the one-bounce loss by about 30%. This result pertains to a non-optimal dielectric stack.

In embodiments of the structures disclosed herein, further reflectivity improvements can be achieved by optimizing the optical structure. This includes choice of the dielectric materials, fine-tuning the layer thicknesses, the addition of thin layers to produce additional optical interference, a proper choice of the design wavelengths for DBR layers, and use of more complex stacks (for instance rugate mirrors or graded-index layers instead of simple DBRs).

Figure 65:
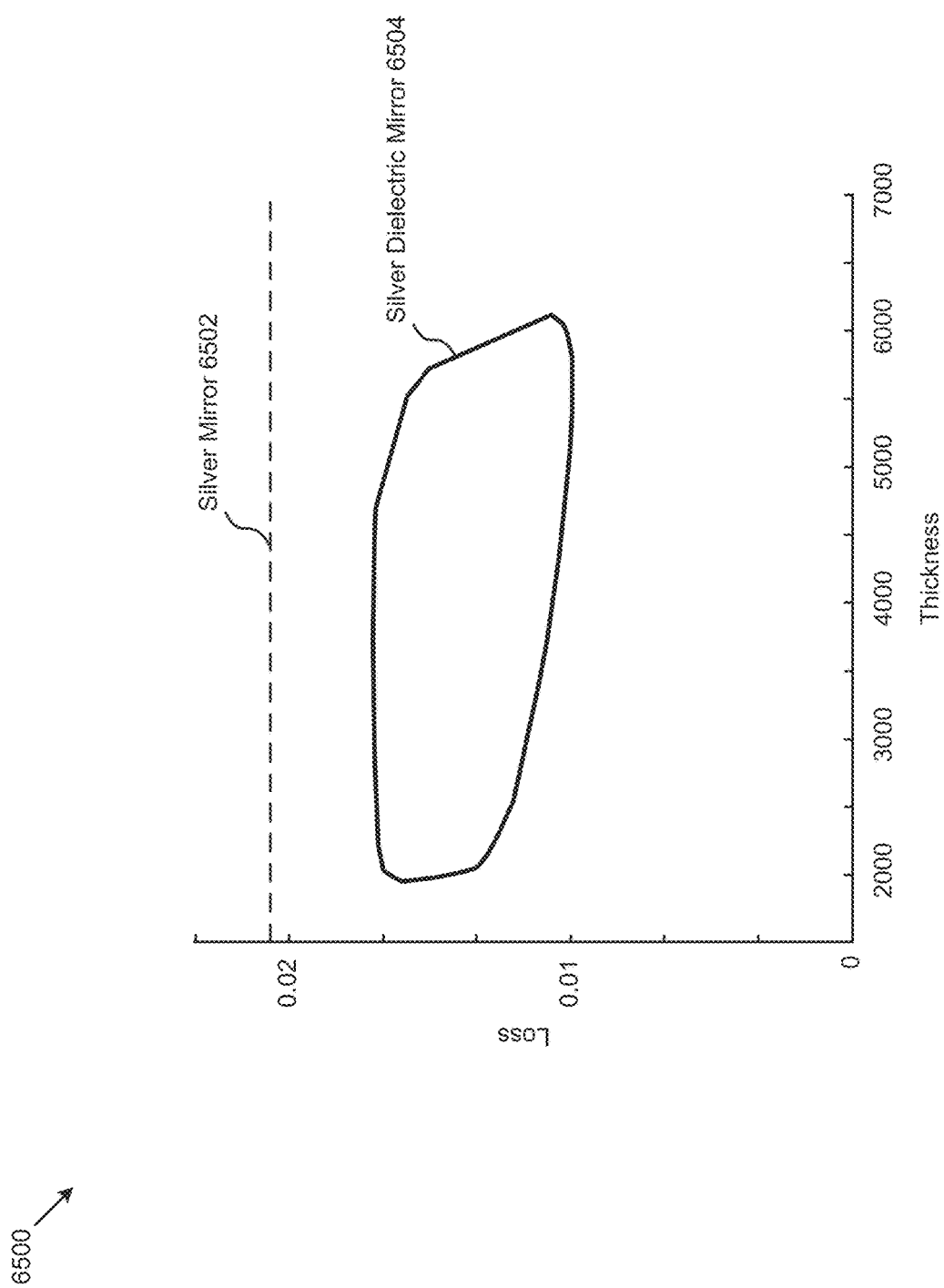
FIG. 65 illustrates the performance of various silver-dielectric stack designs, according to some embodiments.

FIG. 65 illustrates the performance of various silver-dielectric stack designs. For this figure, many dielectric stacks were simulated and evaluated with the effective loss formula for light coming from an encapsulant of index 1.5. The stacks are made of three DBRs (blue, green, red) on a silver mirror 6502, with varying design wavelengths and numbers of pairs and, therefore, varying thicknesses. Shown in FIG. 65 is the envelope of the solutions. The lower boundary of this envelope indicates the tradeoff between loss and thickness; mirrors with more pairs can have lower loss, but are thicker. This boundary is indicative of the best performance that may be achieved for a given thickness, at least within the particular set of designs considered in this simulation. Also shown in FIG. 65 is the effective loss of a simple silver mirror. Some silver-dielectric mirrors (e.g., silver dielectric mirror 6504) with a thickness of about 3 microns have a loss of about 1.1%, which is about half the loss of the silver mirror. This illustrates that design of the dielectric stack is important for best performance. As previously mentioned, this difference in loss may be magnified if light bounces several times in the LED before escaping.

FIG. 65 illustrates the performance of certain possible design of the dielectric stack. Further designs are possible. Therefore, the performance shown in FIG. 65 is illustrative, and is not intended as an indication of the best possible performance with a silver-dielectric mirror.

In embodiments where a silver mirror is employed, care must be taken to maintain the reflectivity of the silver. For instance, depositing rough silver rather than smooth silver may increase the effective loss from about 2% to about 3% or to about 4%.

High silver reflectivity may be achieved by selecting a proper deposition, including deposition technique (sputtering, e-beam, etc.); deposition parameters (temperature, rate, ambient gas or pressure, etc.); underlying metal stack, encapsulant material, etc. In some embodiments, the surface roughness of the silver mirror is minimized to improve its reflectivity. In some embodiments, the silver is deposited and encapsulated with a first protective layer of dielectric to ensure that the quality of the silver is preserved. The selection of the encapsulant material depends on the optical properties and interaction with the Ag layer during processing and operation. For example, some materials have good enough adhesion to Ag and do not degrade reflectivity during subsequent thermal cycles by reacting at the interface. Examples of good encapsulant materials are $Al_2O_3$, AlN, and SiN. The grain size and arrangement of the grain in the Ag layer can have a great impact on the reflectivity of bare Ag, and even greater impact after encapsulated with a protective dielectric since the roughness can enhance the coupling of plasmons at the interface of Ag and the first dielectric layer.

The grain structure can be controlled by designing the deposition of the layer below the Ag (starting surface) and by selecting the deposition parameters of the Ag layer itself. Additionally, the Ag stack can be annealed to consolidate the grains and create a smoother top interface prior to the deposition of the protective dielectric layer. The annealing may for instance be performed at 300° C. to 400° C. in a high purity nitrogen environment, making sure to avoid the presence of oxygen or other impurities during the high temperature steps. In an exemplary embodiment, the process includes depositing the Ag stack, annealing it, and encapsulating it in the first protective layer without breaking the vacuum.

In some embodiments, the strain of the layers composing the submount is tuned to avoid overall excessive strain. This can be achieved by choosing the deposition parameters for the various layers of the submount.

In some embodiments, one of the dielectric materials may have some absorption at short wavelength. This may, for instance, be the case for $NbO_x$ layers or $TiO_x$ layers, which sometimes absorb some blue and violet light. In this case, it is preferable that short-wavelength light be reflected first by the stack so that it does not penetrate the stack significantly, thus avoiding excess optical loss. For instance, in embodiments comprising three DBRs (blue, green and red), the blue DBR can be placed at the top of the dielectric stack. Further, the deposition of the dielectric materials may be designed to reduce optical absorption.

In some embodiments, a low-index layer is further added to the mirror. This low-index layer has a substantially lower index than the index of the encapsulant. For instance, the encapsulant may have an index of 1.4 or 1.5 and the low-index layer may have an index of 1.35 or 1.3. The low-index layer is beneficial to the reflectivity because light impinging on the submount at large angles undergoes total internal reflection and is therefore perfectly reflected. For total internal reflection to be effective, the low-index layer should be thick enough, namely on the order of one or several wavelengths. In some embodiments, the low-index layer is 500 nm thick or 1000 nm thick.

The low-index layer may contain porous $SiO_2$, $MgF_2$, or other low-index dielectrics or porous dielectrics known in the industry. Deposition techniques can be by sputtering, e-beam, or coating and baking aqueous solutions by dip coating, spin coating, or spray coating. In some embodiments, deposition is performed with the substrate at an angle to achieve a desired porosity.

In an exemplary embodiment, the mirror includes a substrate (such as silicon or silicon coated with various metal layers), a silver mirror, a dielectric seal, a dielectric stack which includes three DBR mirrors (blue, green and red) comprising $SiO_2$ and $Nb_2O_5$, and a low-index layer (n=1.3) with a thickness of 500 nm.

Figure 66:
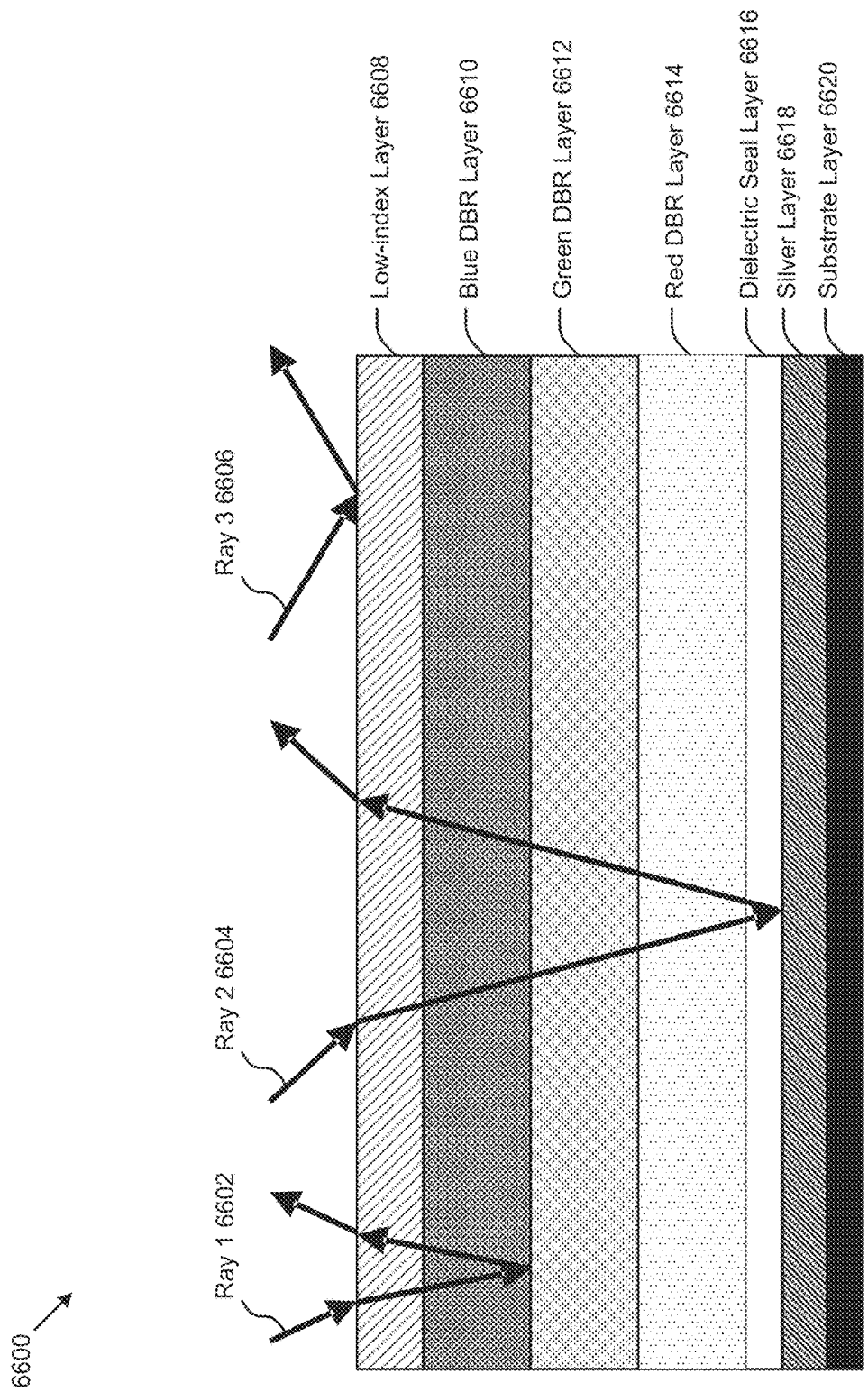
FIG. 66 plots some light trajectories, according to some embodiments.

FIG. 66 plots some light trajectories. A first ray 6602, incoming at a low angle, is reflected by one of the DBR mirrors (according to the wavelength of the ray). A second ray 6604, incoming in TM polarization near the Brewster angle of the DBR mirrors, goes through the dielectric stack and is reflected by the silver mirror. A third ray 6606, incoming at large angle, is reflected by the low-index layer.

Figure 67:
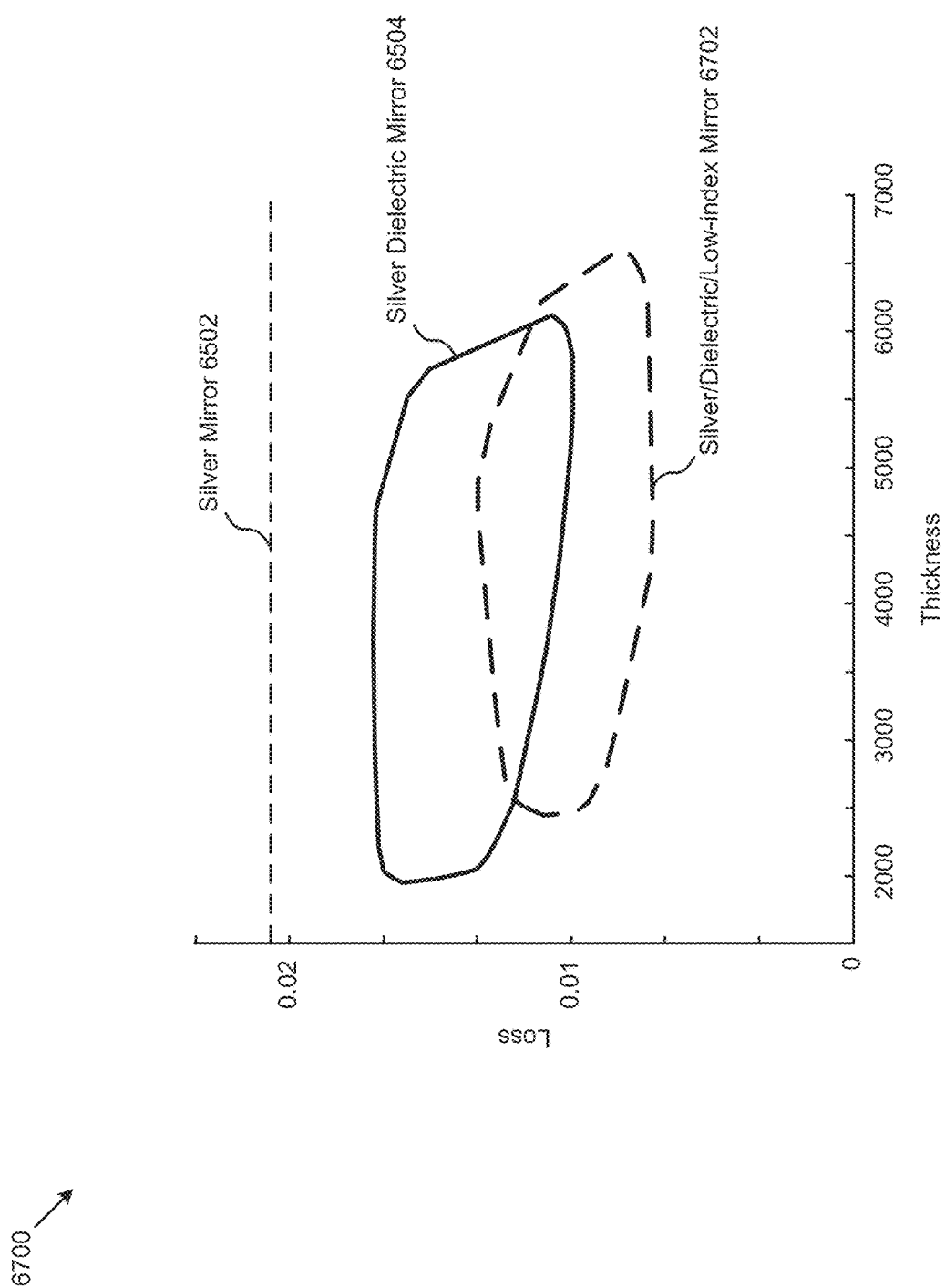
FIG. 67 illustrates the performance of different dielectric stacks, according to some embodiments.

FIG. 67 illustrates the performance of different dielectric stacks. FIG. 67 is similar to FIG. 66 in that it shows the performance of a variety of dielectric stacks (e.g., silver/dielectric/low-index mirror 6702, and silver dielectric mirror 6504). In this depiction, performance characteristics of the same designs as in FIG. 66 are plotted. Further, similar designs including a low-index layer (of index 1.3 and thickness 500 nm) are also considered. The latter designs enable lower effective loss for a given total thickness.

The index and thickness of the low-index layer may be further designed together with the rest of the optical design of the submount stack, to further improve reflectivity. In various embodiments, an electrical distribution circuit is integrated to the submount mirror so that the LEDs can be bonded and contacted.

In some embodiments, the traces are metal traces deposited on top of the mirror layers. In other embodiments, the traces are covered in dielectric layers and are a part of the mirror stack. In some cases, the traces are made of silver coated with a dielectric layer. In other cases, they are silver coated with multiple dielectric layers, which act as reflectors.

Figure 68:
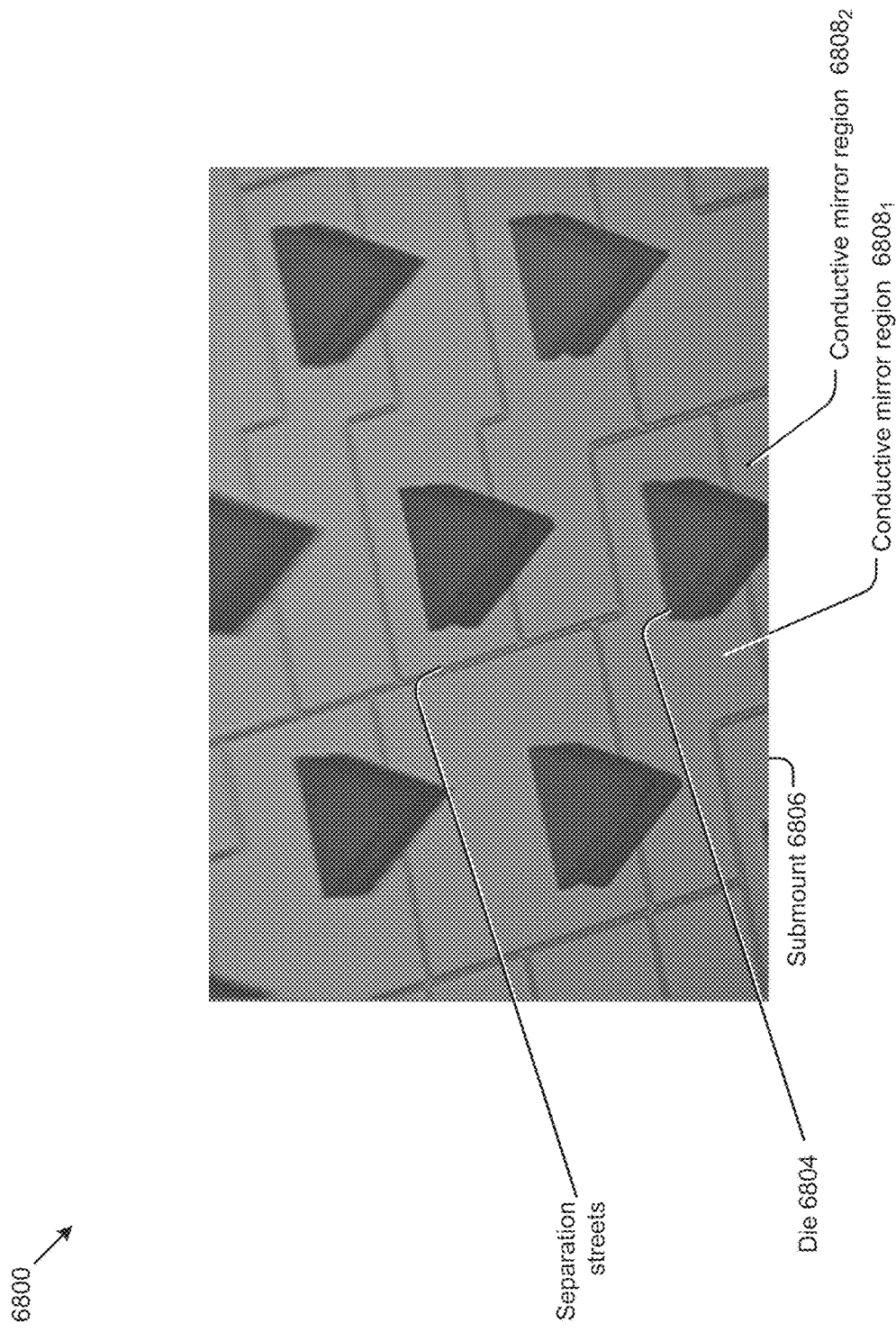
FIG. 68 depicts a submount configuration, according to some embodiments.

FIG. 68 depicts a submount configuration. In this figure, the submount 6806, a die 6804, and conductive lower mirror regions (e.g., conductive lower mirror region $6808_1$ and conductive lower mirror region $6808_2$) are indicated. The conductive lower mirror regions are separated (e.g., see separation streets as shown) so as to provide electrical isolation between conductive mirror regions. In some embodiments, streets are necessary to insulate various parts of the submount. This is for instance the case for a flip-chip architecture, where conductive islands of metal on the submount must be isolated from each other. In general, it is desirable to ensure that these separation streets have a high reflectivity. This can be implemented as described above. In some cases, the streets may be covered by metal mirrors, dielectric mirrors, or a combination of metallic and dielectric mirrors. Because the surface area of the streets are typically a small fraction of the total submount area, it may be acceptable that the reflectivity of the streets be lower than that of the rest of the submount.

The submounts and LED die and other structures as disclosed herein can be incorporated into a light source, and such light sources can be used in LED-based lighting systems.

Some of the aforementioned lighting systems and some of the aforementioned illumination products include a light source, a power supply, a heatsink or other structures for thermal management, and some include optics (e.g., lenses, filters, etc.) to modify the light emitted from the light source. The following figures show and describe selected lighting systems embodied as lamps, luminaires, display, etc.

FIG. 69A through FIG. 69I depict embodiments of the present disclosure in the form of lamp applications. In these lamp applications, one or more light emitting diodes are used in lamps and fixtures. Such lamps and fixtures include replacement and/or retro-fit directional lighting fixtures.

Figure 69A:
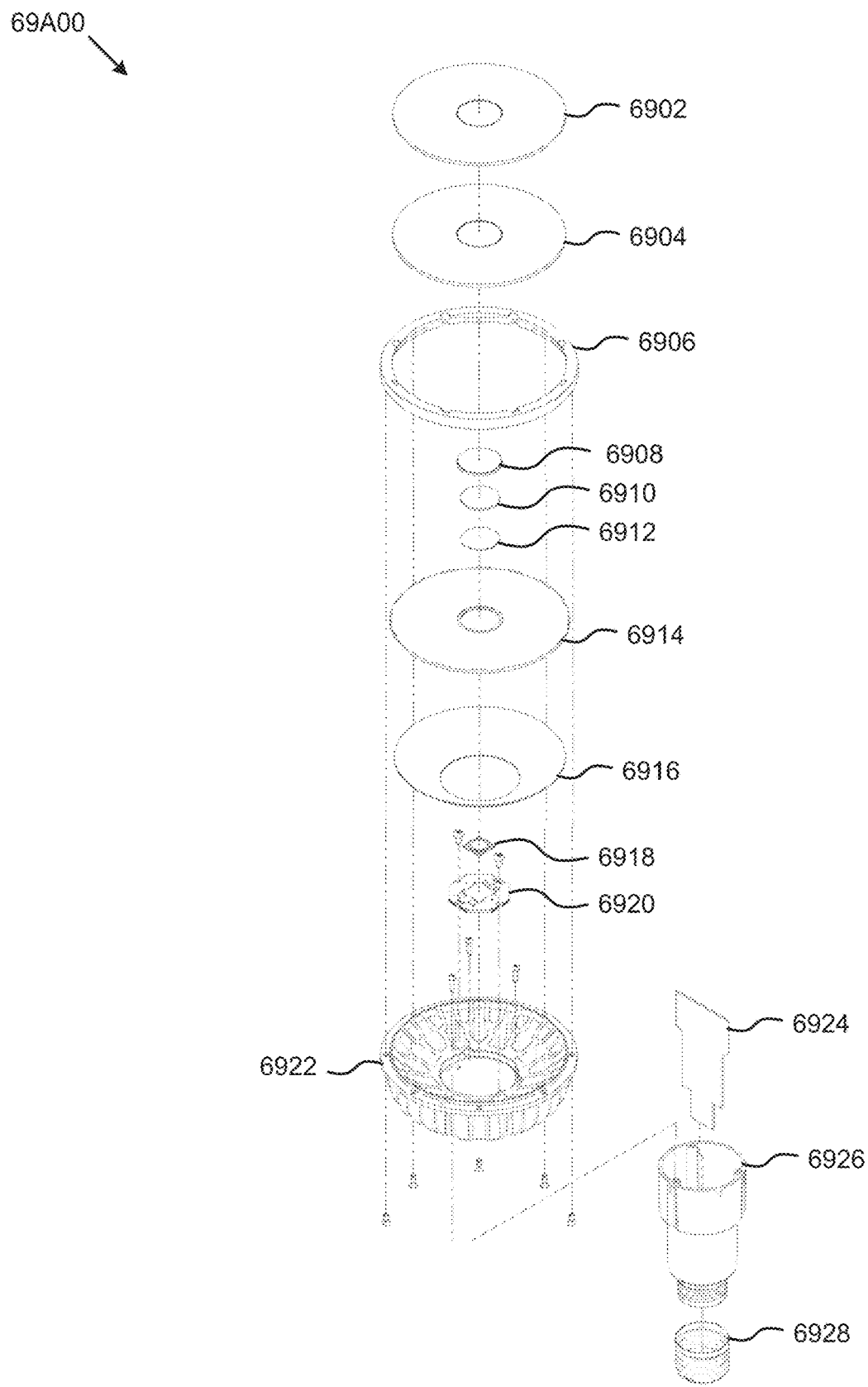

In some embodiments, aspects of the present disclosure can be used in various lighting system assemblies. As shown in FIG. 69A, the assembly comprises a base member (e.g., screw cap 6928), a driver housing 6926, a driver board 6924, a heatsink 6922, a metal-core printed circuit board 6920, an LED light source 6918, a dust shield 6916, a lens 6914, a reflector disc 6912, a magnet 6910, a magnet cap 6908, a trim ring 6906, a first accessory 6904, and a second accessory 6902.

The components of the assembly 69A00 can be fitted together to form a lamp. FIG. 69B depicts a perspective view 6930 and top view 6932 of such a lamp. As shown in FIG. 69B, the lamp 69B00 comports to a form factor known as PAR30L. The PAR30L form factor is further depicted by the principal views (e.g., left 6940, right 6936, back 6934, front 6938, and top 6942) given in array 69C00 of FIG. 69C.

Figure 69D:
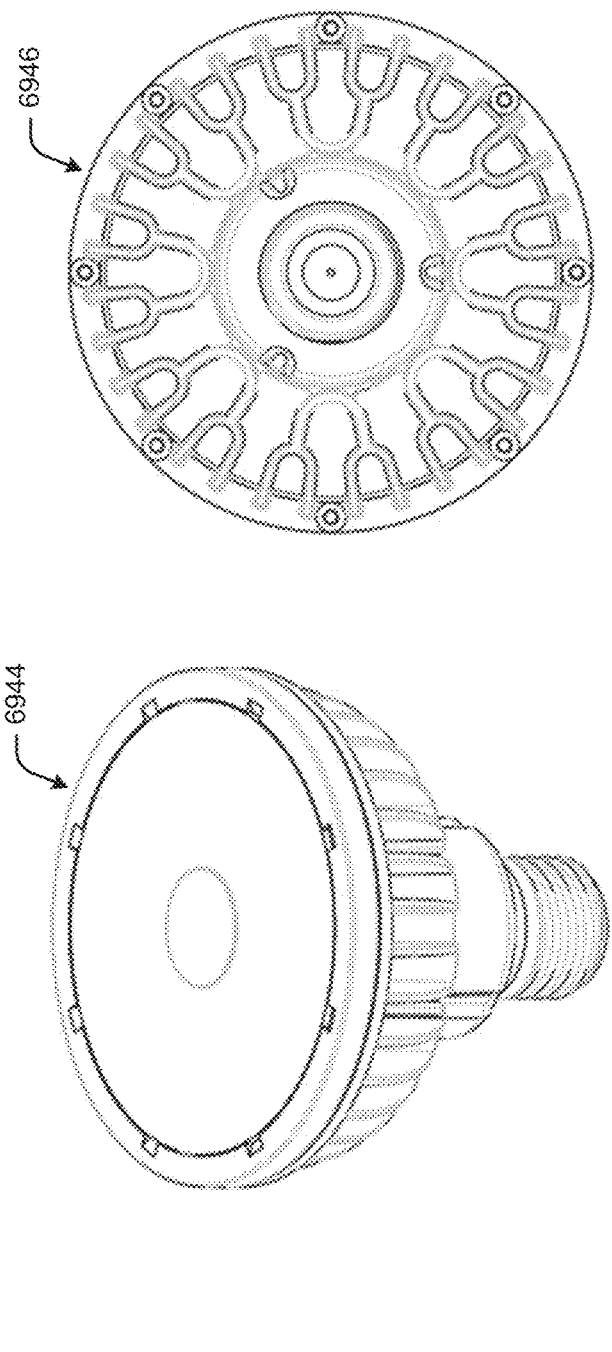

The components of the assembly 69A00 can be fitted together to form a lamp. FIG. 69D depicts a perspective view 6944 and top view 6946 of such a lamp. As shown in FIG. 69D, the lamp 69D00 comports to a form factor known as PAR30S. The PAR30S form factor is further depicted by the principal views (e.g., left 6954, right 6950, back 6948, front 6952 and top 6956) given in array 69E00 of FIG. 69E.

Figure 69F:
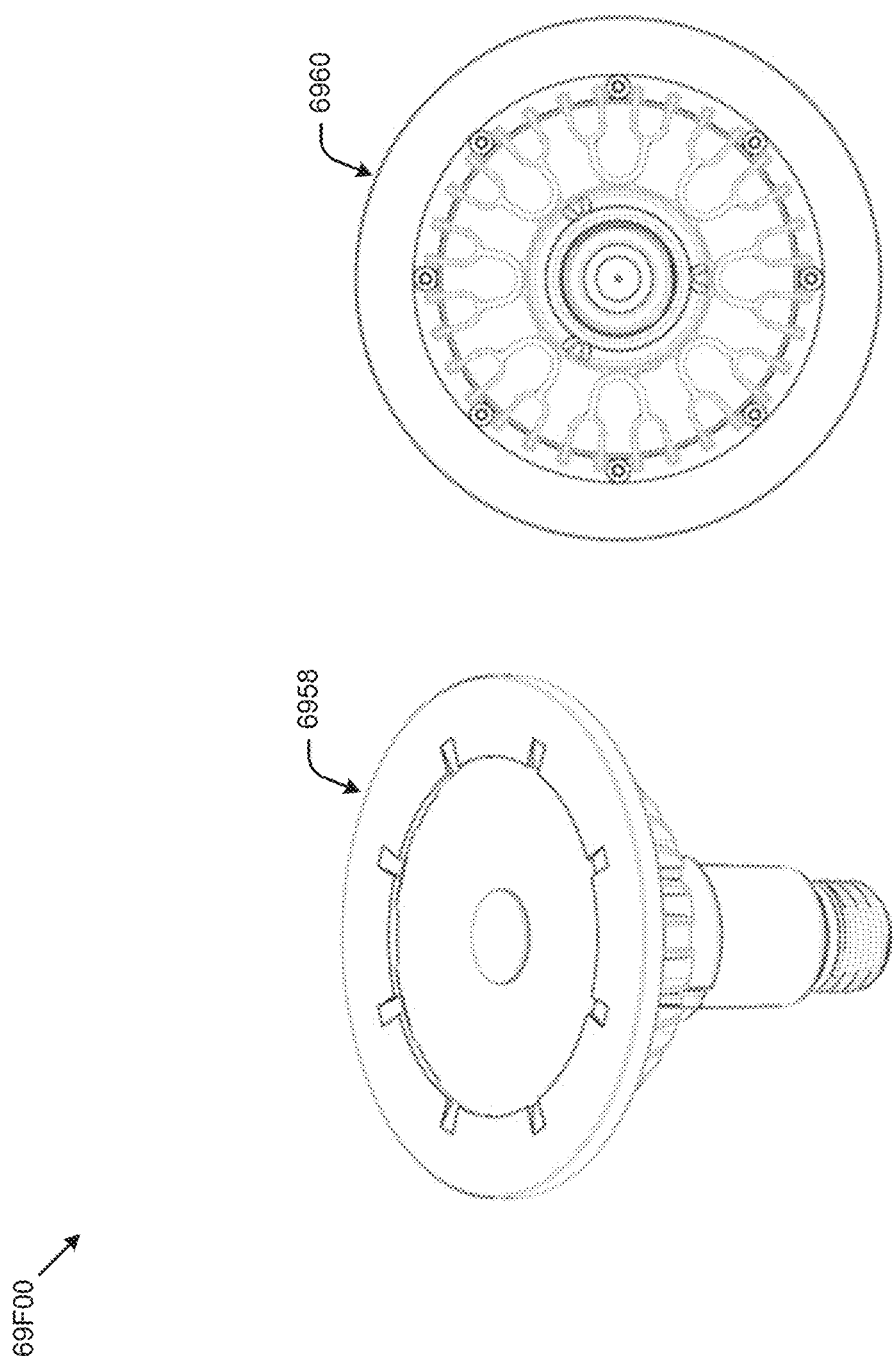
Figure 69G:
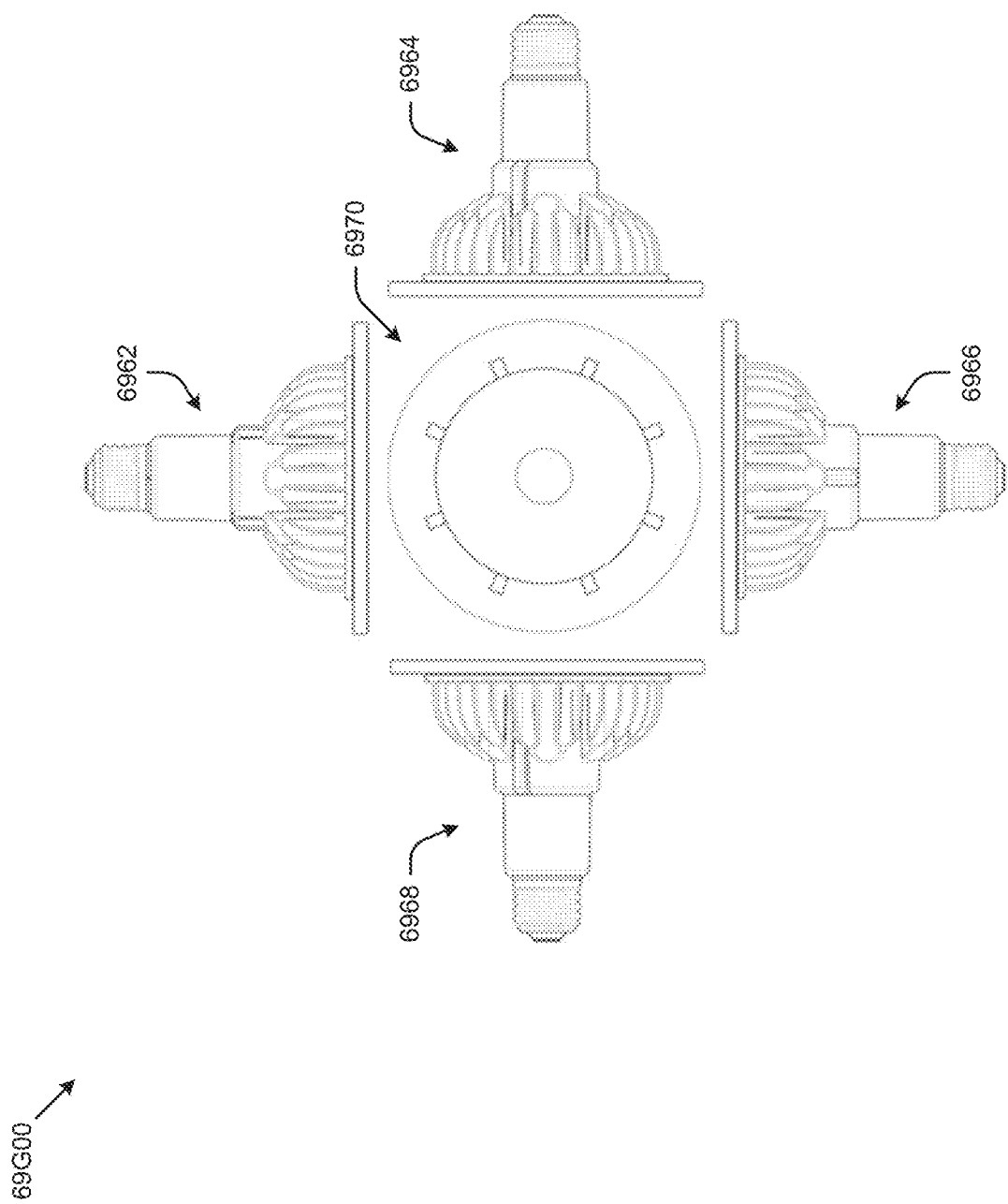

The components of the assembly 69A00 can be fitted together to form a lamp. FIG. 69F depicts a perspective view 6958 and top view 6960 of such a lamp. As shown in FIG. 69F, the lamp 69F00 comports to a form factor known as PAR38. The PAR38 form factor is further depicted by the principal views (e.g., left 6968, right 6964, back 6962, front 6966 and top 6970) given in array 69G00 of FIG. 69G.

Figure 69H:
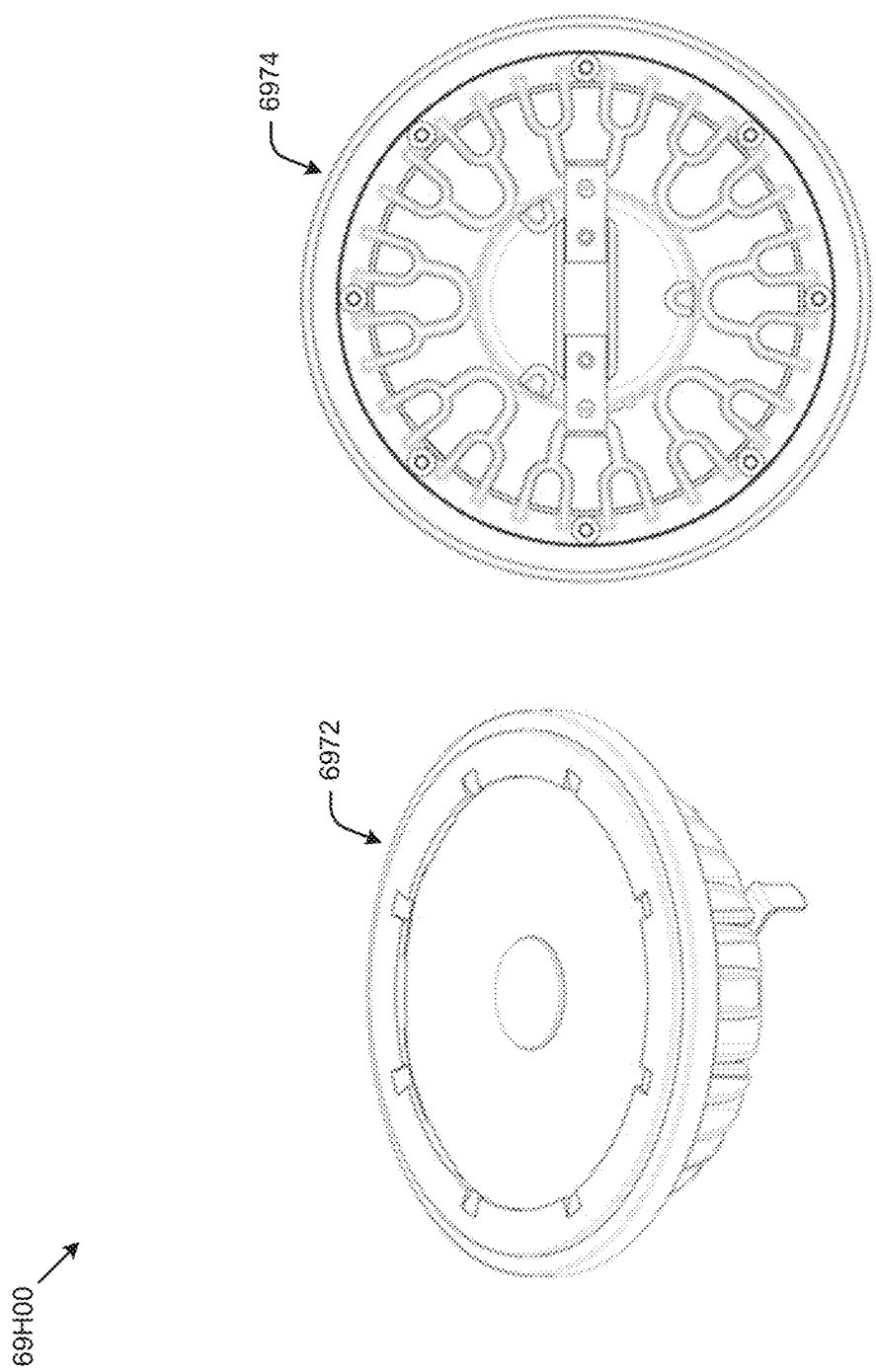

The components of the assembly 69A00 can be fitted together to form a lamp. FIG. 69H depicts a perspective view 6972 and top view 6974 of such a lamp. As shown in FIG. 69H, the lamp 69H00 comports to a form factor known as PAR111. The PAR111 form factor is further depicted by the principal views (e.g., left 6982, right 6978, back 6976, front 6980 and top 6984) given in array 69I00 of FIG. 69I.

FIG. 70A through FIG. 70I depict embodiments of the present disclosure as can be applied toward lighting applications. In these embodiments, one or more light-emitting diodes 70A10, as taught by this disclosure, can be mounted on a submount or package to provide an electrical interconnection. The submount or package can be a ceramic, oxide, nitride, semiconductor, metal, or combination thereof that includes an electrical interconnection capability 70A20 for the various LEDs. The submount or package can be mounted to a heatsink member 70B50 via a thermal interface. The LEDs can be configured to produce a desired emission spectrum, either by mixing primary emissions from various LEDs, or by having the LEDs photo-excite wavelength down-conversion materials such as phosphors, semiconductors, or semiconductor nanoparticles ("quantum dots"), or a combination of any of the foregoing.

The total light emitting surface (LES) of the LEDs and any down-conversion materials can form a light source 70A30. One or more light sources can be interconnected into an array 70B20, which in turn is in electrical contact with connectors 70B10 and brought into an assembly 70B30. One or more lens elements 70B40 can be optically coupled to the light source. The lens design and properties can be selected so that the desired directional beam pattern for a lighting product is achieved for a given LES. The directional lighting product may be an LED module, a retrofit lamp 70B70, or a lighting fixture 51C30. In the case of a retrofit lamp, an electronic driver can be provided with a surrounding member 51B60, the driver to condition electrical power from an external source to render it suitable for the LED light source. The driver can be integrated into the retrofit lamp. In the case of a fixture, an electronic driver is provided which conditions electrical power from an external source to make it suitable for the LED light source, with the driver either integrated into the fixture or provided externally to the fixture. In the case of a module, an electronic driver can be provided to condition electrical power from an external source to render it suitable for the LED light source, with the driver either integrated into the module or provided externally to the module. Examples of suitable external power sources include mains AC (e.g., 120 Vrms AC or 240 Vrms AC), low-voltage AC (e.g., 12 VAC), and low-voltage DC (e.g., 12 VDC). In the case of retrofit lamps, the entire lighting product may be designed to fit standard form factors (e.g., ANSI form factors). Examples of retrofit lamp products include LED-based MR16, PAR16, PAR20, PAR30, PAR38, BR30, A19 and various other lamp types. Examples of fixtures include replacements for halogen-based and ceramic metal halide-based directional lighting fixtures.

Figure 70B:
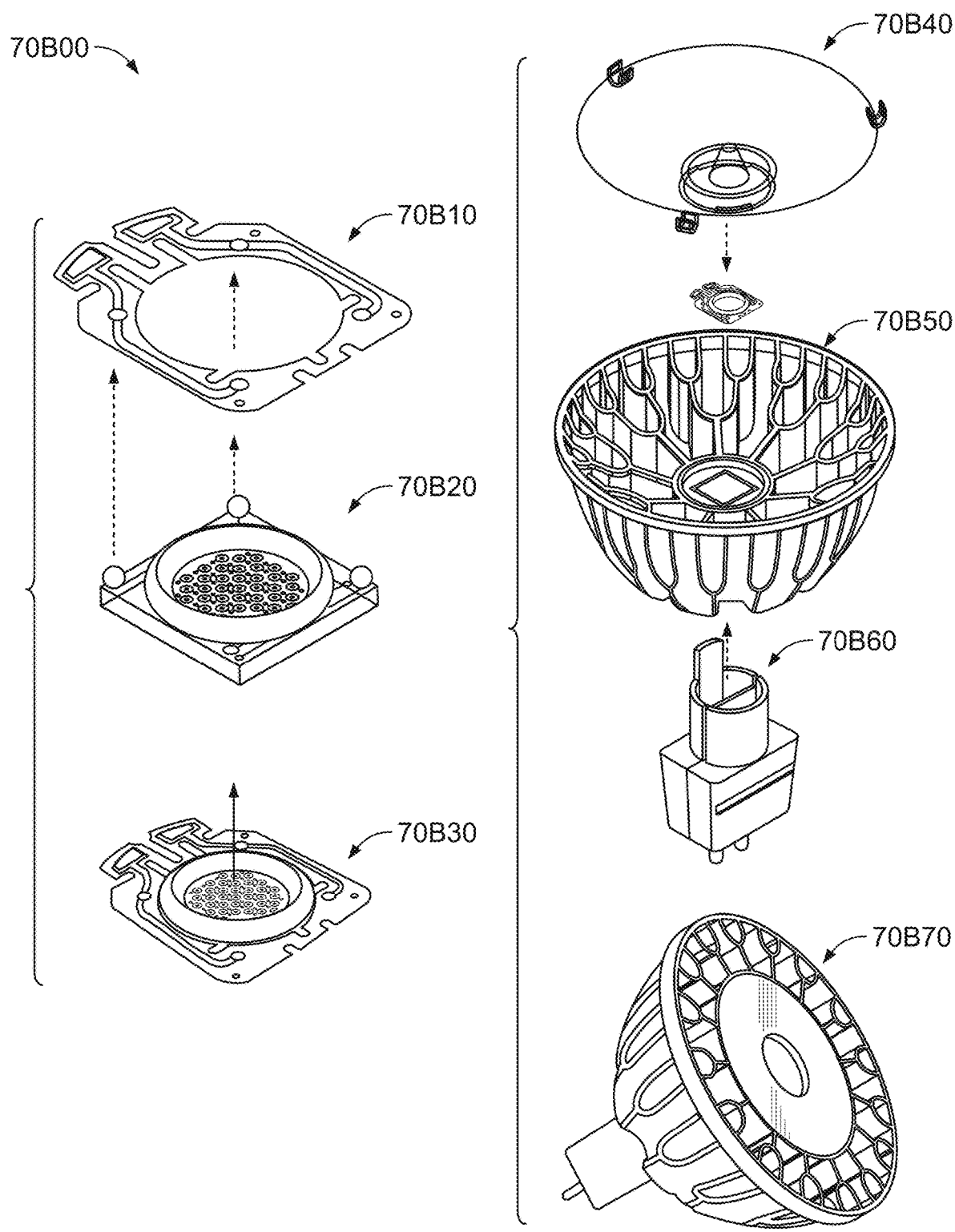
Figure 70C:
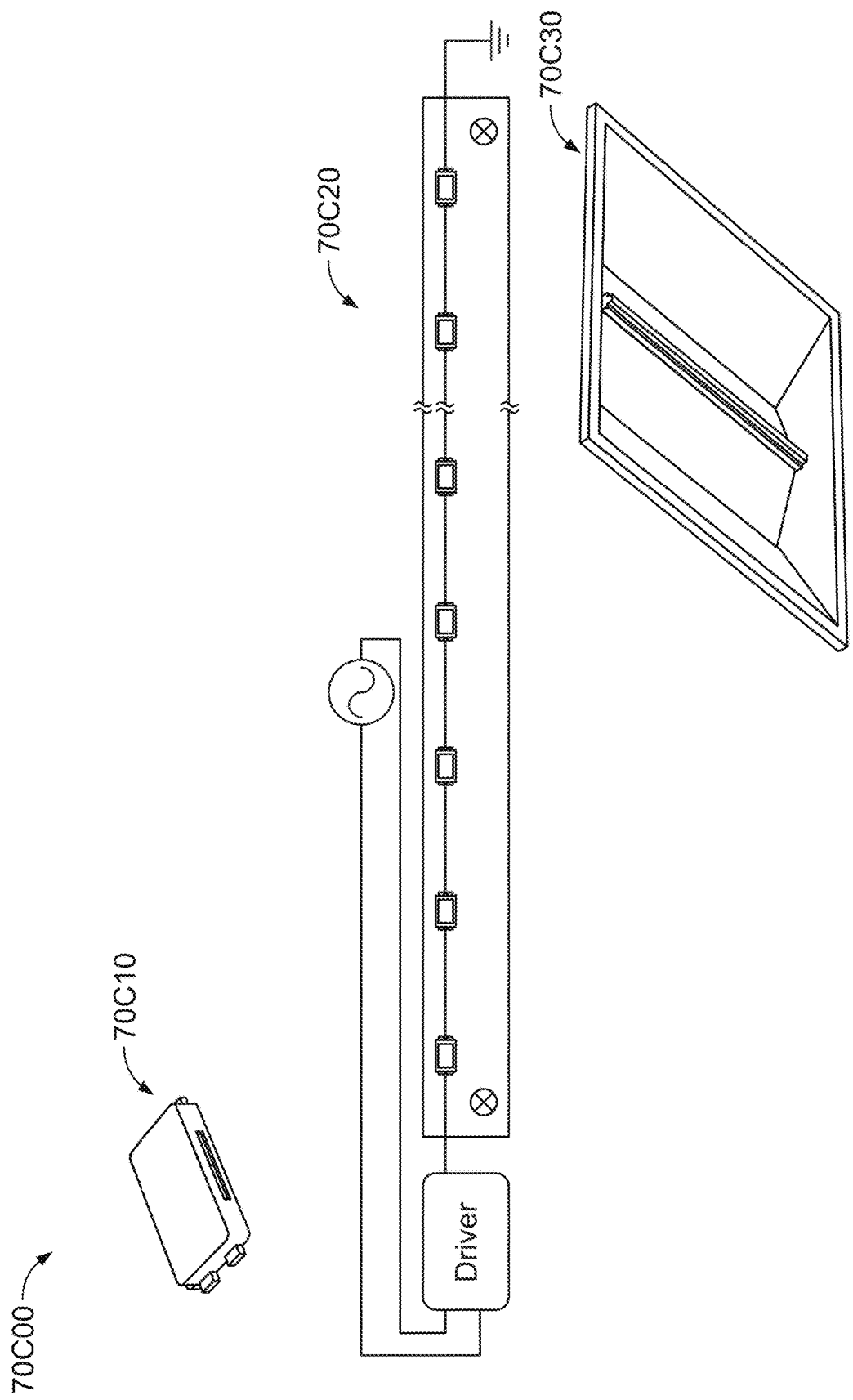

In some embodiments, the present disclosure can be applied to non-directional lighting applications. In these embodiments, one or more light-emitting diodes (LEDs), as taught by the disclosure, can be mounted on a submount or package to provide an electrical interconnection. The submount or package can be, for example, a ceramic, oxide, nitride, semiconductor, metal, or combination of any of the foregoing that includes electrical interconnection capability for the various LEDs. The submount or package can be mounted to a heatsink member via a thermal interface. The LEDs can be configured to produce a desired emission spectrum, either by mixing primary emissions from various LEDs, or by having the LEDs photo-excite wavelength down-conversion materials such as phosphors, semiconductors, or semiconductor nanoparticles ("quantum dots"), or a combination thereof. The LEDs can be distributed to provide a desired shape of the light source. For example, one common shape is a linear light source for replacement of conventional fluorescent linear tube lamps. One or more optical elements can be coupled to the LEDs to provide a desired non-directional light distribution. The non-directional lighting product may be an LED module, a retrofit lamp, or a lighting fixture. In the case of a retrofit lamp, an electronic driver can be provided to condition electrical power from an external source to render it suitable for the LED light source, with the driver integrated into the retrofit lamp. In the case of a fixture, an electronic driver is provided to condition electrical power from an external source to render it suitable for the LED light source, with the driver either integrated into the fixture or provided externally to the fixture. In the case of a module, an electronic driver can be provided to condition electrical power from an external source to render it suitable for the LED light source, with the driver either integrated into the module or provided externally to the module. Examples of external power sources include mains AC (e.g., 120 Vrms AC or 240 Vrms AC), low-voltage AC (e.g., 12 VAC), and low-voltage DC (e.g., 12 VDC). In the case of retrofit lamps, the entire lighting product may be designed to fit standard form factors (e.g., ANSI form factors). Examples of retrofit lamp products include LED-based replacements for various linear, circular, or curved fluorescent lamps. An example of a non-directional lighting product is shown in FIG. 70C. Such a lighting fixture can include replacements for fluorescent-based troffer luminaires. In this embodiment, LEDs are mechanically secured into a package 70C10, and multiple packages are arranged into a suitable shape such as linear array 70C20, and/or a packaged LED can be fitted into a housing to form a luminaire.

Some embodiments of the present disclosure can be applied to backlighting for flat panel display applications. In these embodiments, one or more light-emitting diodes (LEDs), as taught by this disclosure, can be mounted on a submount or package to provide an electrical interconnection. The submount or package can be a ceramic, oxide, nitride, semiconductor, metal, or combination of any of the foregoing that include electrical interconnection capability for the various LEDs. The submount or package can be mounted to a heatsink member via a thermal interface. The LEDs can be configured to produce a desired emission spectrum, either by mixing primary emissions from various LEDs, or by having the LEDs photo-excite wavelength down-conversion materials such as phosphors, semiconductors, or semiconductor nanoparticles ("quantum dots"), or a combination of any of the foregoing. The LEDs can be distributed to provide a desired shape of the light source. One common shape is a linear light source. The light source can be optically coupled to a lightguide for the backlight. This can be achieved by coupling at the edge of the lightguide (edge-lit), or by coupling light from behind the lightguide (direct-lit). The lightguide distributes light uniformly toward a controllable display such as a liquid crystal display (LCD) panel. The display converts the LED light into desired images based on electrical control of light transmission and its color. One way to control the color is by use of filters (e.g., color filter substrate 70D40). Alternatively, multiple LEDs may be used and driven in pulsed mode to sequence the desired primary emission colors (e.g., using a red LED 70D30, a green LED 70D10, and a blue LED 70D20). Optional brightness-enhancing films may be included in the backlight "stack". The brightness-enhancing films narrow the flat panel display emission to increase brightness at the expense of the observer viewing angle. An electronic driver can be provided to condition electrical power from an external source to render it suitable for the LED light source for backlighting, including any color sequencing or brightness variation per LED location (e.g., one-dimensional or two-dimensional dimming). Examples of external power sources include mains AC (e.g., 120 Vrms AC or 240 Vrms AC), low-voltage AC (e.g., 12 VAC), and low-voltage DC (e.g., 12 VDC). Examples of backlighting products are shown in FIG. 70D1, FIG. 70D2, FIG. 70E1 and FIG. 70E2.

Figure 70F:
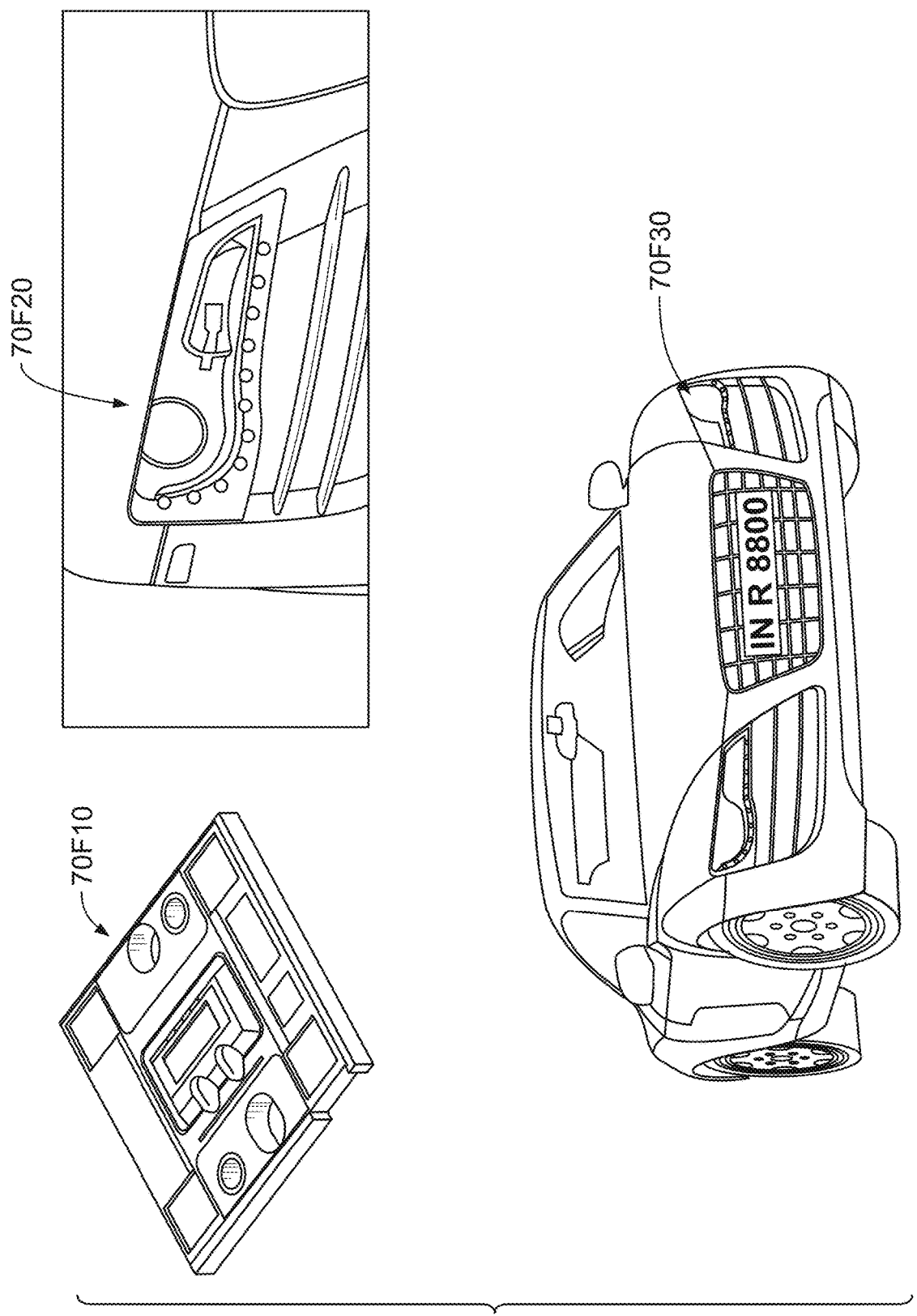

Some embodiments of the present disclosure can be applied to automotive forward lighting applications, as shown in FIG. 70F (e.g., see the example of an automotive forward lighting product 70F30). In these embodiments, one or more light-emitting diodes (LEDs) can be mounted on a submount or on a rigid or semi-rigid package 70F10 to provide an electrical interconnection. The submount or package can be a ceramic, oxide, nitride, semiconductor, metal, or combination thereof, that include electrical interconnection capability for the various LEDs. The submount or package can be mounted to a heatsink member via a thermal interface. The LEDs can be configured to produce a desired emission spectrum, either by mixing primary emission from various LEDs, or by having the LEDs photo-excite wavelength down-conversion materials such as phosphors, semiconductors, or semiconductor nanoparticles ("quantum dots"), or a combination of any of the foregoing. The total light emitting surface (LES) of the LEDs and any down-conversion materials form a light source. One or more lens elements 70F20 can be optically coupled to the light source. The lens design and properties can be selected to produce a desired directional beam pattern for an automotive forward lighting application for a given LED. An electronic driver can be provided to condition electrical power from an external source to render it suitable for the LED light source. Power sources for automotive applications include low-voltage DC (e.g., 12 VDC). An LED light source may perform a high-beam function, a low-beam function, a side-beam function, or any combination thereof.

Figure 70G:
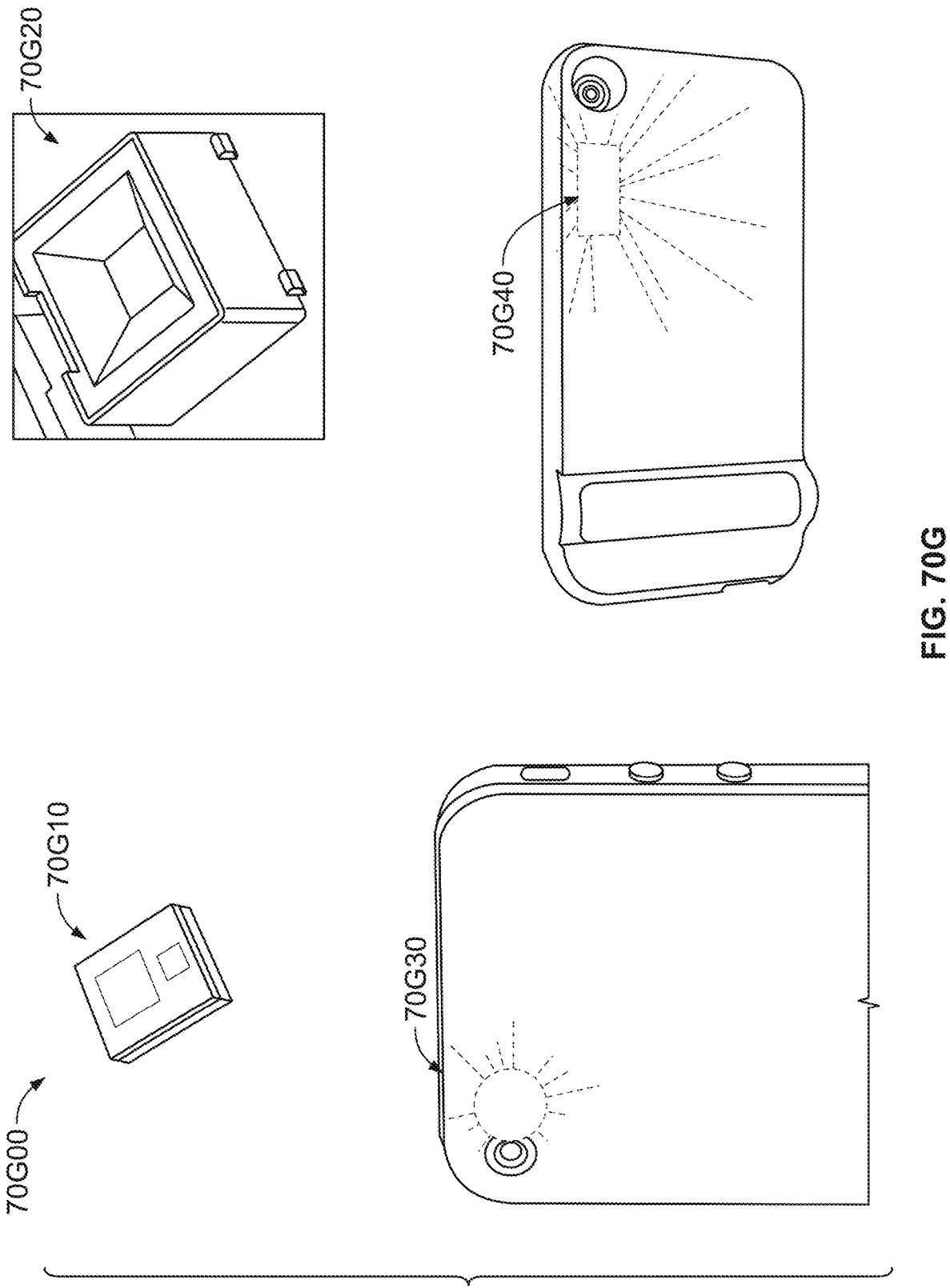

In some embodiments the present disclosure can be applied to digital imaging applications such as illumination for mobile phone and digital still cameras (e.g., see FIG. 70G). In these embodiments, one or more light-emitting diodes (LEDs), as taught by the disclosure, can be mounted on a submount or package 70G10 to provide an electrical interconnection. The submount or package can be, for example, a ceramic, oxide, nitride, semiconductor, metal, or combination of any of the foregoing, that include electrical interconnection capability for the various LEDs. The submount or package can be mounted to a circuit board member and fitted with or into a mounting package 70G20. The LEDs can be configured to produce a desired emission spectrum, either by mixing primary emission from various LEDs, or by having the LEDs photo-excite wavelength down-conversion materials such as phosphors, semiconductors, or semiconductor nanoparticles ("quantum dots"), or a combination thereof. The total light emitting surface (LES) of the LEDs and any down-conversion materials form a light source. One or more lens elements can be optically coupled to the light source. The lens design and properties can be selected so that the desired directional beam pattern for an imaging application is achieved for a given LES. An electronic driver can be provided to condition electrical power from an external source to render it suitable for the LED light source. Examples of suitable external power sources for imaging applications include low-voltage DC (e.g., 5 VDC). An LED light source may perform a low-intensity function 70G30, a high-intensity function 70G40, or any combination thereof.

Figure 70H:
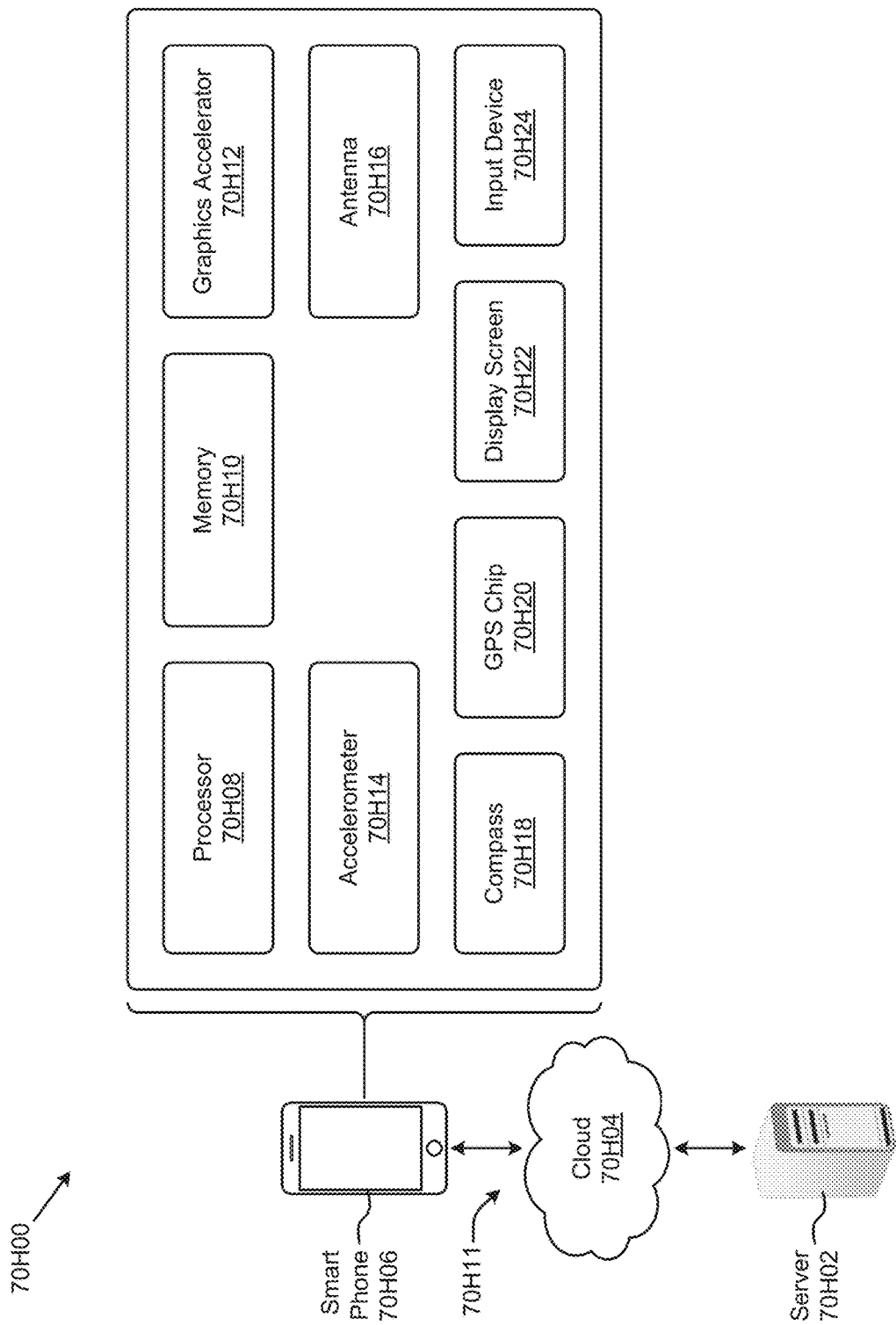
Figure 701:
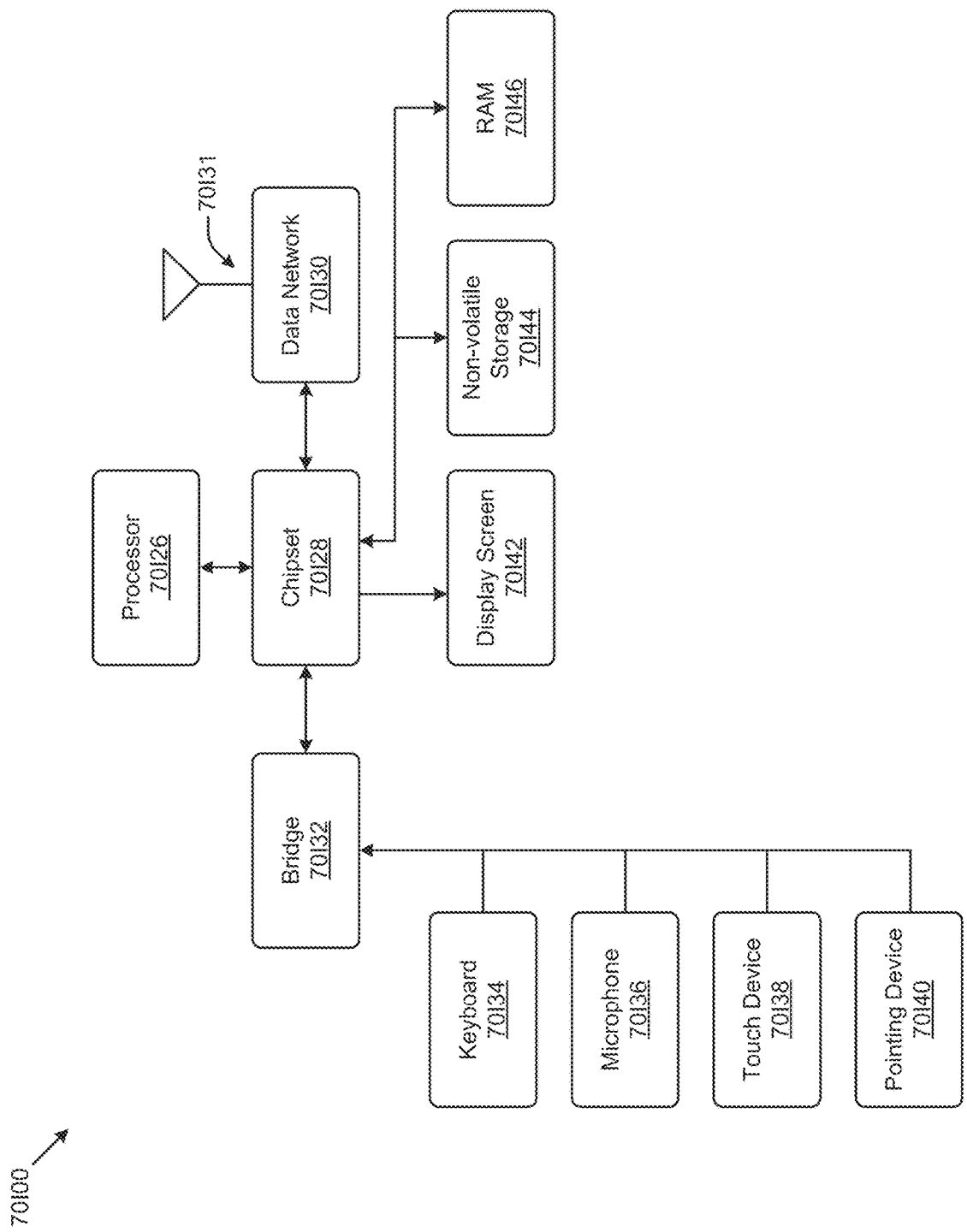

Some embodiments of the present disclosure can be applied to mobile terminal applications. FIG. 70H is a diagram illustrating a mobile terminal (see smart phone architecture 70H00). As shown, the smart phone 70H06 includes a housing, display screen, and interface device, which may include a button, microphone, and/or touch screen.

Figure 71:
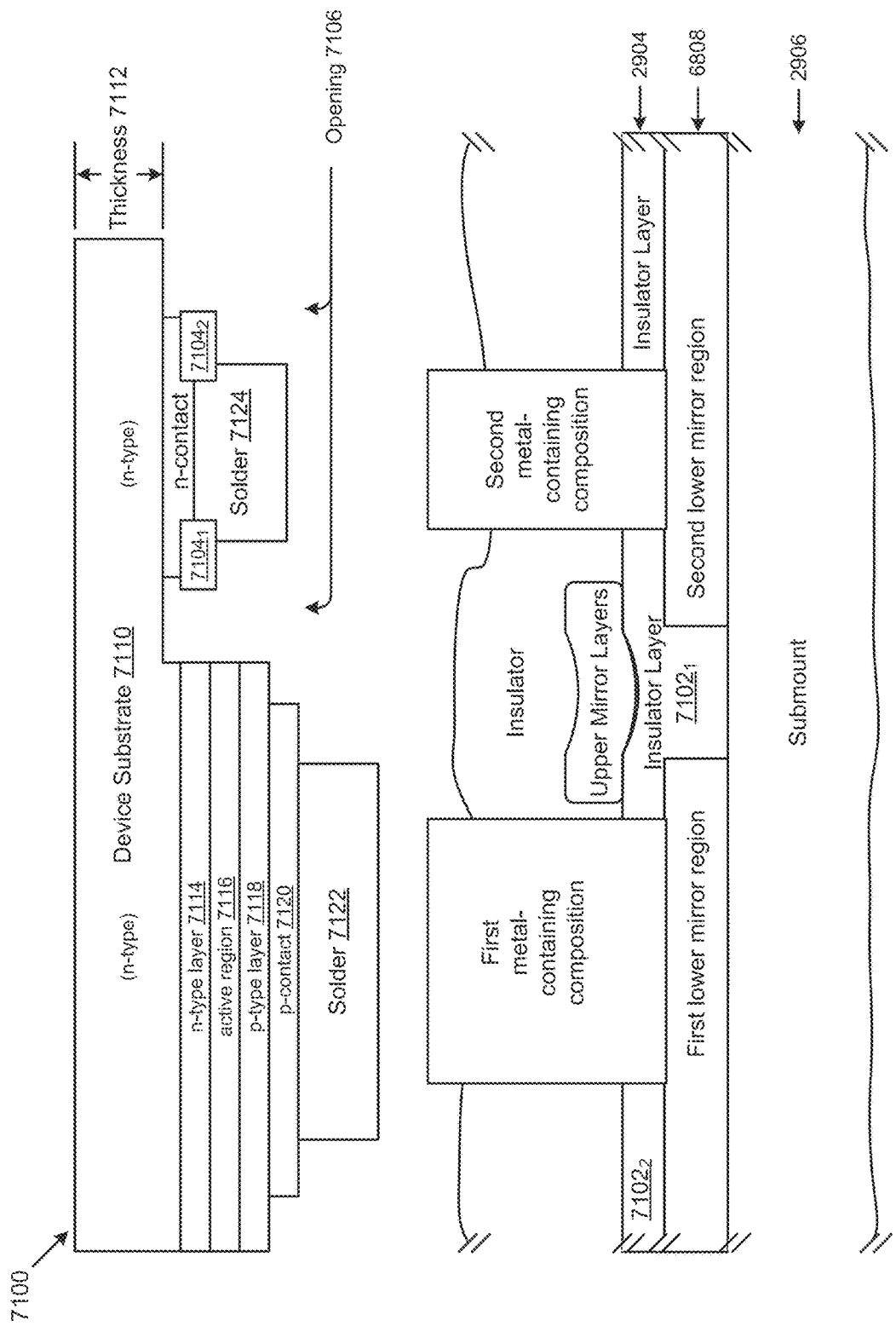
FIG. 71 depicts a side view of a flip-chip on mirror configuration, according to some embodiments.

FIG. 71 depicts a side view 7100 of a flip-chip on mirror configuration. The embodiment shown includes:
- an electrically-conductive n-doped bulk GaN-containing substrate 7110 having a thickness 7112 (the shown thickness is over 20 microns thick);
- an epitaxially-grown n-type layer 7114 overlying the substrate;
- an epitaxially-grown active region 7116 overlying the epitaxially-grown n-type layer;
- an epitaxially-grown p-type layer 7118 overlying the epitaxially-grown active region;
- a p-contact 7120 overlying at least a portion of the p-type layer;
- an opening 7106 through the epitaxially-grown p-type layer and active region that exposes the underlying n-type material;
- an n-contact formed in the opening to provide an electrically-conductive path to the substrate 7110;
- a submount comprising at least a first conductive lower mirror region (see first lower mirror region) and a second conductive lower mirror region (see second lower mirror region) to provide separate electrical connections to each of the n-contact and p-contact respectively, and wherein the first conductive lower mirror region and the second conductive lower mirror region are electrically isolated (e.g., by a separation street);
- an insulating layer (see insulating region $7102_1$ and insulating region $7102_2$);
- a third mirror region (see upper mirror layers) overlying the gaps between the lower mirror regions to provide a higher reflectivity than the submount;
- a first metal containing composition in direct contact with at least a portion of the first lower mirror region and in electrical contact with the p-contact (see first metal-containing composition); and
- a second metal containing composition in direct contact with at least a portion of the second lower mirror region and in electrical contact with the n-contact (see second metal-containing composition).

Also shown as pertaining to the LED device in FIG. 71 is a volume of solder material 7122 that is in direct contact with the p-contact to provide electrical connection between the p-contact and the metal composition in contact with the first lower mirror region. Also, solder material 7124 is in direct contact with the n-contact to provide electrical connection between the n-contact and the metal composition in contact with the second lower mirror region.

Using any of the methods heretofore described, a material that has low wettability for solder is deposited overlying a portion of the n-contact and in direct contact with the solder material such that when the solder melts it is substantially removed onto the portion of the n-contact without the material, increasing its height. As shown, some of the material that has low wettability for solder is visible in at or near the interface between the solder and the n-contact (see feature $7104_1$ and feature $7104_2$).

Finally, it should be noted that there are alternative ways of implementing the embodiments disclosed herein. Accordingly, the present embodiments are to be considered as illustrative and not restrictive, and the claims are not to be limited to the details given herein, but may be modified within the scope and equivalents thereof.

What is claimed is:

1. An LED package comprising:
   a substrate having a substrate top surface;
   a plurality of contacts;
   a reflective material disposed over at least a portion of said top surface, said reflective material not extending above said plurality of contacts; and
   a first plurality of flip-chip LEDs and a second plurality of flip-chip LEDs, each having LED contacts, said LED contacts contacting said plurality of contacts, wherein the first and second pluralities of flip-chip LEDs have different emission colors.

2. The LED package of claim 1, wherein one of the plurality of flip-chip LEDs is blue.

3. The LED package of claim 1, wherein one of the plurality of flip-chip LEDs is violet.

4. The LED package of claim 1, wherein the substrate comprises silicon.

5. The LED package of claim 1, wherein the substrate comprises ceramic.

6. The LED package of claim 1, wherein the reflective material comprises silver and at least one layer of dielectric.

7. The LED package of claim 1, wherein the reflective material comprises TiOx.

8. The LED package of claim 7, wherein the reflective material comprises at least one homogenous layer of TiOx.

9. The LED package of claim 1, further comprising a wavelength-converting material configured over the first and second pluralities of flip-chip LEDs.

10. The LED package of claim 9, wherein the wavelength-converting material is optically coupled to an emission from the first plurality of flip-chip LEDs and the second plurality of flip-chip LEDs.

11. The LED package of claim 10, wherein said wavelength-converting material comprises at least a red phosphor and at least a green phosphor.

12. The LED package of claim 1, wherein the first and second pluralities of flip-chip LEDs are grown on bulk GaN.

13. The LED package of claim 1, wherein said reflective material electrically connects at least a portion of said contacts.

14. The LED package of claim 13, wherein said LED contacts comprise an n-contact and a p-contact, and wherein said reflective material comprises at least a first conductive region and a second conductive region to provide separate electrical connections to each of said n-contact and said p-contact.

15. The LED package of claim 14, wherein the first conductive region and the second conductive region are electrically isolated.

16. The LED package of claim 15, wherein said first and second conductive regions are isolated by a separation street.

17. The LED package of claim 1, further comprising a plurality of traces electrically connecting said contacts.

18. The LED package of claim 17, wherein the plurality of traces comprise copper.

19. The LED package of claim 18, wherein the reflective material comprises TiOx.

20. The LED package of claim 19, wherein the reflective material comprises at least one homogenous layer of TiOx.

* * * * *